United States Patent
Roy et al.

(10) Patent No.: US 9,404,954 B2
(45) Date of Patent: Aug. 2, 2016

(54) FOREIGN OBJECT DETECTION IN WIRELESS ENERGY TRANSFER SYSTEMS

(71) Applicant: WiTricity Corporation, Watertown, MA (US)

(72) Inventors: Arunanshu Mohan Roy, Cambridge, MA (US); Noam Katz, Norwood, MA (US); Andre B. Kurs, Chestnut Hill, MA (US); Christopher Buenrostro, Lexington, MA (US); Simon Verghese, Arlington, MA (US); Morris P. Kesler, Bedford, MA (US); Katherine L. Hall, Arlington, MA (US); Herbert Toby Lou, Carlisle, MA (US)

(73) Assignee: WiTricity Corporation, Watertown, MA (US)

( * ) Notice: Subject to any disclaimer, the term of this patent is extended or adjusted under 35 U.S.C. 154(b) by 463 days.

(21) Appl. No.: 14/059,141

(22) Filed: Oct. 21, 2013

(65) Prior Publication Data

US 2014/0111154 A1     Apr. 24, 2014

Related U.S. Application Data

(60) Provisional application No. 61/716,432, filed on Oct. 19, 2012, provisional application No. 61/866,703, filed on Aug. 16, 2013, provisional application No. 61/877,482, filed on Sep. 13, 2013.

(51) Int. Cl.
*H02J 7/00* (2006.01)
*H01F 27/42* (2006.01)
(Continued)

(52) U.S. Cl.
CPC .......... *G01R 29/0814* (2013.01); *B60L 11/182* (2013.01); *B60L 11/1833* (2013.01);
(Continued)

(58) Field of Classification Search
USPC ........................................................ 320/108
See application file for complete search history.

(56) References Cited

U.S. PATENT DOCUMENTS 645,576 A     3/1900  Telsa
649,621 A     5/1900  Tesla
(Continued)

FOREIGN PATENT DOCUMENTS

CA          142352        8/1912
CN         101807822      8/2010
(Continued)

OTHER PUBLICATIONS

Non-Final Office Action for U.S. Appl. No. 13/608,956 dated Jul. 23, 2015 (90 pages).
(Continued)

*Primary Examiner* — Edward Tso
*Assistant Examiner* — Ahmed Omar
(74) *Attorney, Agent, or Firm* — Fish & Richardson P.C.

(57) ABSTRACT

The disclosure features apparatus, methods, and systems for wireless power transfer that include a power source featuring at least one resonator, a power receiver featuring at least one resonator, a first detector featuring one or more loops of conductive material and configured to generate an electrical signal based on a magnetic field between the power source and the power receiver, a second detector featuring conductive material, and control electronics coupled to the first and second detectors, where during operation, the control electronics are configured to measure the electrical signal of the first detector and compare the measured electrical signal of the first detector to baseline electrical information for the first detector to determine information about whether debris is positioned between the power source and the power receiver.

57 Claims, 45 Drawing Sheets

(51) Int. Cl.
*G01R 29/08* (2006.01)
*H01F 38/14* (2006.01)
*H02J 5/00* (2016.01)
*G01V 3/08* (2006.01)
*B60L 11/18* (2006.01)
*G01V 3/12* (2006.01)
*H02J 7/02* (2016.01)

(52) U.S. Cl.
CPC ............ B60L11/1846 (2013.01); G01V 3/081 (2013.01); H01F 38/14 (2013.01); H02J 5/005 (2013.01); *B60L 2210/30* (2013.01); *B60L 2210/40* (2013.01); *B60L 2240/36* (2013.01); *B60L 2250/10* (2013.01); *B60L 2270/147* (2013.01); *G01V 3/12* (2013.01); *H02J 7/025* (2013.01); *Y02T 10/7005* (2013.01); *Y02T 10/7072* (2013.01); *Y02T 10/7241* (2013.01); *Y02T 90/121* (2013.01); *Y02T 90/122* (2013.01); *Y02T 90/125* (2013.01); *Y02T 90/127* (2013.01); *Y02T 90/128* (2013.01); *Y02T 90/14* (2013.01); *Y02T 90/163* (2013.01); *Y02T 90/169* (2013.01); *Y04S 30/14* (2013.01)

(56) References Cited

U.S. PATENT DOCUMENTS

| | | | |
|---|---|---|---|
| 787,412 A | 4/1905 | Tesla | |
| 1,119,732 A | 12/1914 | Tesla | |
| 2,133,494 A | 10/1938 | Waters | |
| 3,517,350 A | 6/1970 | Beaver | |
| 3,535,543 A | 10/1970 | Dailey | |
| 3,780,425 A | 12/1973 | Penn et al. | |
| 3,871,176 A | 3/1975 | Schukei | |
| 4,088,999 A | 5/1978 | Fletcher et al. | |
| 4,095,998 A | 6/1978 | Hanson | |
| 4,180,795 A | 12/1979 | Matsuda et al. | |
| 4,280,129 A | 7/1981 | Wells | |
| 4,450,431 A | 5/1984 | Hochstein | |
| 4,588,978 A | 5/1986 | Allen | |
| 4,843,259 A | 6/1989 | Weisshaupt | |
| 5,027,709 A | 7/1991 | Slagle | |
| 5,033,295 A | 7/1991 | Schmid et al. | |
| 5,034,658 A | 7/1991 | Hierig et al. | |
| 5,053,774 A | 10/1991 | Schuermann et al. | |
| 5,070,293 A | 12/1991 | Ishii et al. | |
| 5,118,997 A | 6/1992 | El-Hamamsy | |
| 5,216,402 A | 6/1993 | Carosa | |
| 5,229,652 A | 7/1993 | Hough | |
| 5,287,112 A | 2/1994 | Schuermann | |
| 5,341,083 A | 8/1994 | Klontz et al. | |
| 5,367,242 A | 11/1994 | Hulman | |
| 5,374,930 A | 12/1994 | Schuermann | |
| 5,408,209 A | 4/1995 | Tanzer et al. | |
| 5,437,057 A | 7/1995 | Richley et al. | |
| 5,455,467 A | 10/1995 | Young et al. | |
| 5,493,691 A | 2/1996 | Barrett | |
| 5,522,856 A | 6/1996 | Reineman | |
| 5,528,113 A | 6/1996 | Boys et al. | |
| 5,541,604 A | 7/1996 | Meier | |
| 5,550,452 A | 8/1996 | Shirai et al. | |
| 5,565,763 A | 10/1996 | Arrendale et al. | |
| 5,630,835 A | 5/1997 | Brownlee | |
| 5,697,956 A | 12/1997 | Bornzin | |
| 5,703,461 A | 12/1997 | Minoshima et al. | |
| 5,703,573 A | 12/1997 | Fujimoto et al. | |
| 5,710,413 A | 1/1998 | King et al. | |
| 5,742,471 A | 4/1998 | Barbee, Jr. et al. | |
| 5,821,728 A | 10/1998 | Sshwind | |
| 5,821,731 A | 10/1998 | Kuki et al. | |
| 5,864,323 A | 1/1999 | Berthon | |
| 5,898,579 A | 4/1999 | Boys et al. | |
| 5,903,134 A | 5/1999 | Takeuchi | |
| 5,923,544 A | 7/1999 | Urano | |
| 5,940,509 A | 8/1999 | Jovanovich et al. |
| 5,957,956 A | 9/1999 | Kroll et al. |
| 5,959,245 A | 9/1999 | Moe et al. |
| 5,986,895 A | 11/1999 | Stewart et al. |
| 5,993,996 A | 11/1999 | Firsich |
| 5,999,308 A | 12/1999 | Nelson et al. |
| 6,012,659 A | 1/2000 | Nakazawa et al. |
| 6,047,214 A | 4/2000 | Mueller et al. |
| 6,066,163 A | 5/2000 | John |
| 6,067,473 A | 5/2000 | Greeninger et al. |
| 6,108,579 A | 8/2000 | Snell et al. |
| 6,127,799 A | 10/2000 | Krishnan |
| 6,176,433 B1 | 1/2001 | Uesaka et al. |
| 6,184,651 B1 | 2/2001 | Fernandez et al. |
| 6,207,887 B1 | 3/2001 | Bass et al. |
| 6,232,841 B1 | 5/2001 | Bartlett et al. |
| 6,238,387 B1 | 5/2001 | Miller, III |
| 6,252,762 B1 | 6/2001 | Amatucci |
| 6,436,299 B1 | 8/2002 | Baarman et al. |
| 6,450,946 B1 | 9/2002 | Forsell |
| 6,452,465 B1 | 9/2002 | Brown et al. |
| 6,459,218 B2 | 10/2002 | Boys et al. |
| 6,473,028 B1 | 10/2002 | Luc |
| 6,483,202 B1 | 11/2002 | Boys |
| 6,515,878 B1 | 2/2003 | Meins et al. |
| 6,535,133 B2 | 3/2003 | Gohara |
| 6,561,975 B1 | 5/2003 | Pool et al. |
| 6,563,425 B2 | 5/2003 | Nicholson et al. |
| 6,597,076 B2 | 7/2003 | Scheible et al. |
| 6,609,023 B1 | 8/2003 | Fischell et al. |
| 6,631,072 B1 | 10/2003 | Paul et al. |
| 6,650,227 B1 | 11/2003 | Bradin |
| 6,664,770 B1 | 12/2003 | Bartels |
| 6,673,250 B2 | 1/2004 | Kuennen et al. |
| 6,683,256 B2 | 1/2004 | Kao |
| 6,696,647 B2 | 2/2004 | Ono et al. |
| 6,703,921 B1 | 3/2004 | Wuidart et al. |
| 6,731,071 B2 | 5/2004 | Baarman |
| 6,749,119 B2 | 6/2004 | Scheible et al. |
| 6,772,011 B2 | 8/2004 | Dolgin |
| 6,798,716 B1 | 9/2004 | Charych |
| 6,803,744 B1 | 10/2004 | Sabo |
| 6,806,649 B2 | 10/2004 | Mollema et al. |
| 6,812,645 B2 | 11/2004 | Baarman |
| 6,825,620 B2 | 11/2004 | Kuennen et al. |
| 6,831,417 B2 | 12/2004 | Baarman |
| 6,839,035 B1 | 1/2005 | Addonisio et al. |
| 6,844,702 B2 | 1/2005 | Giannopoulos et al. |
| 6,856,291 B2 | 2/2005 | Mickle et al. |
| 6,858,970 B2 | 2/2005 | Malkin et al. |
| 6,906,495 B2 | 6/2005 | Cheng et al. |
| 6,917,163 B2 | 7/2005 | Baarman |
| 6,917,431 B2 | 7/2005 | Soljacic et al. |
| 6,937,130 B2 | 8/2005 | Scheible et al. |
| 6,960,968 B2 | 11/2005 | Odendaal et al. |
| 6,961,619 B2 | 11/2005 | Casey |
| 6,967,462 B1 | 11/2005 | Landis |
| 6,975,198 B2 | 12/2005 | Baarman |
| 6,988,026 B2 | 1/2006 | Breed et al. |
| 7,027,311 B2 | 4/2006 | Vanderelli et al. |
| 7,035,076 B1 | 4/2006 | Stevenson |
| 7,042,196 B2 | 5/2006 | Ka-Lai et al. |
| 7,069,064 B2 | 6/2006 | Gevorgian et al. |
| 7,084,605 B2 | 8/2006 | Mickle et al. |
| 7,116,200 B2 | 10/2006 | Baarman et al. |
| 7,118,240 B2 | 10/2006 | Baarman et al. |
| 7,126,450 B2 | 10/2006 | Baarman et al. |
| 7,127,293 B2 | 10/2006 | MacDonald |
| 7,132,918 B2 | 11/2006 | Baarman et al. |
| 7,147,604 B1 | 12/2006 | Allen et al. |
| 7,180,248 B2 | 2/2007 | Kuennen et al. |
| 7,191,007 B2 | 3/2007 | Desai et al. |
| 7,193,418 B2 | 3/2007 | Freytag |
| D541,322 S | 4/2007 | Garrett et al. |
| 7,212,414 B2 | 5/2007 | Baarman |
| 7,233,137 B2 | 6/2007 | Nakamura et al. |
| D545,855 S | 7/2007 | Garrett et al. |
| 7,239,110 B2 | 7/2007 | Cheng et al. |
| 7,248,017 B2 | 7/2007 | Cheng et al. |

(56) References Cited

U.S. PATENT DOCUMENTS

| | | |
|---|---|---|
| 7,251,527 B2 | 7/2007 | Lyden |
| 7,288,918 B2 | 10/2007 | DiStefano |
| 7,340,304 B2 | 3/2008 | MacDonald |
| 7,375,492 B2 | 5/2008 | Calhoon et al. |
| 7,375,493 B2 | 5/2008 | Calhoon et al. |
| 7,378,817 B2 | 5/2008 | Calhoon et al. |
| 7,382,636 B2 | 6/2008 | Baarman et al. |
| 7,385,357 B2 | 6/2008 | Kuennen et al. |
| 7,443,135 B2 | 10/2008 | Cho |
| 7,462,951 B1 | 12/2008 | Baarman |
| 7,466,213 B2 | 12/2008 | Lobl et al. |
| 7,471,062 B2 | 12/2008 | Bruning |
| 7,474,058 B2 | 1/2009 | Baarman |
| 7,492,247 B2 | 2/2009 | Schmidt et al. |
| 7,514,818 B2 | 4/2009 | Abe et al. |
| 7,518,267 B2 | 4/2009 | Baarman |
| 7,521,890 B2 | 4/2009 | Lee et al. |
| 7,525,283 B2 | 4/2009 | Cheng et al. |
| 7,545,337 B2 | 6/2009 | Guenther |
| 7,554,316 B2 | 6/2009 | Stevens et al. |
| 7,599,743 B2 | 10/2009 | Hassler, Jr. et al. |
| 7,615,936 B2 | 11/2009 | Baarman et al. |
| 7,639,514 B2 | 12/2009 | Baarman |
| 7,741,734 B2 | 6/2010 | Joannopoulos et al. |
| 7,795,708 B2 | 9/2010 | Katti |
| 7,825,543 B2 | 11/2010 | Karalis et al. |
| 7,825,544 B2 | 11/2010 | Jansen et al. |
| 7,835,417 B2 | 11/2010 | Heideman et al. |
| 7,843,288 B2 | 11/2010 | Lee et al. |
| 7,844,306 B2 | 11/2010 | Shearer et al. |
| 7,863,859 B2 | 1/2011 | Soar |
| 7,868,588 B2 | 1/2011 | Altekruse et al. |
| 7,879,483 B2 | 2/2011 | Sakakibara |
| 7,880,337 B2 | 2/2011 | Farkas |
| 7,884,697 B2 | 2/2011 | Wei et al. |
| 7,885,050 B2 | 2/2011 | Lee |
| 7,893,564 B2 | 2/2011 | Bennett |
| 7,919,886 B2 | 4/2011 | Tanaka |
| 7,923,870 B2 | 4/2011 | Jin |
| 7,932,798 B2 | 4/2011 | Tolle et al. |
| 7,936,147 B2 | 5/2011 | Kook |
| 7,948,209 B2 | 5/2011 | Jung |
| 7,952,322 B2 | 5/2011 | Partovi et al. |
| 7,963,941 B2 | 6/2011 | Wilk |
| 7,969,045 B2 | 6/2011 | Schmidt et al. |
| 7,994,880 B2 | 8/2011 | Chen et al. |
| 7,999,506 B1 | 8/2011 | Hollar et al. |
| 8,022,576 B2 | 9/2011 | Joannopoulos et al. |
| 8,030,887 B2 | 10/2011 | Jung |
| 8,035,255 B2 | 10/2011 | Kurs et al. |
| 8,076,800 B2 | 12/2011 | Joannopoulos et al. |
| 8,076,801 B2 | 12/2011 | Karalis et al. |
| 8,084,889 B2 | 12/2011 | Joannopoulos et al. |
| 8,097,983 B2 | 1/2012 | Karalis et al. |
| 8,106,539 B2 | 1/2012 | Schatz et al. |
| 8,115,448 B2 | 2/2012 | John |
| 8,131,378 B2 | 3/2012 | Greenberg et al. |
| 8,178,995 B2 | 5/2012 | Amano et al. |
| 8,188,826 B2 | 5/2012 | Okada et al. |
| 8,193,769 B2 | 6/2012 | Azancot et al. |
| 8,212,414 B2 | 7/2012 | Howard et al. |
| 8,241,097 B2 | 8/2012 | Zhu et al. |
| 8,260,200 B2 | 9/2012 | Shimizu et al. |
| 8,269,375 B2 | 9/2012 | Sogabe et al. |
| 8,304,935 B2 | 11/2012 | Karalis et al. |
| 8,310,107 B2 | 11/2012 | Jin |
| 8,314,513 B2 | 11/2012 | Aoyama et al. |
| 8,324,759 B2 | 12/2012 | Karalis et al. |
| 8,334,620 B2 | 12/2012 | Park et al. |
| 8,344,688 B2 | 1/2013 | Yoda et al. |
| 8,362,651 B2 | 1/2013 | Hamam et al. |
| 8,369,905 B2 | 2/2013 | Sogabe et al. |
| 8,395,282 B2 | 3/2013 | Joannopoulos et al. |
| 8,395,283 B2 | 3/2013 | Joannopoulos et al. |
| 8,400,017 B2 | 3/2013 | Kurs et al. |
| 8,400,018 B2 | 3/2013 | Joannopoulos et al. |
| 8,400,019 B2 | 3/2013 | Joannopoulos et al. |
| 8,400,020 B2 | 3/2013 | Joannopoulos et al. |
| 8,400,021 B2 | 3/2013 | Joannopoulos et al. |
| 8,400,022 B2 | 3/2013 | Joannopoulos et al. |
| 8,400,023 B2 | 3/2013 | Joannopoulos et al. |
| 8,400,024 B2 | 3/2013 | Joannopoulos et al. |
| 8,406,823 B2 | 3/2013 | Kondo et al. |
| 8,410,636 B2 | 4/2013 | Kurs et al. |
| 8,441,154 B2 | 5/2013 | Karalis et al. |
| 8,446,046 B2 | 5/2013 | Fells et al. |
| 8,457,547 B2 | 6/2013 | Meskens |
| 8,461,719 B2 | 6/2013 | Kesler et al. |
| 8,461,720 B2 | 6/2013 | Kurs et al. |
| 8,461,721 B2 | 6/2013 | Karalis et al. |
| 8,461,722 B2 | 6/2013 | Kurs et al. |
| 8,461,817 B2 | 6/2013 | Martin et al. |
| 8,466,583 B2 | 6/2013 | Karalis et al. |
| 8,471,410 B2 | 6/2013 | Karalis et al. |
| 8,476,788 B2 | 7/2013 | Karalis et al. |
| 8,482,157 B2 | 7/2013 | Cook et al. |
| 8,482,158 B2 | 7/2013 | Kurs et al. |
| 8,487,480 B1 | 7/2013 | Kesler et al. |
| 8,497,601 B2 | 7/2013 | Hall et al. |
| 8,552,592 B2 | 10/2013 | Schatz et al. |
| 8,569,914 B2 | 10/2013 | Karalis et al. |
| 8,587,153 B2 | 11/2013 | Schatz et al. |
| 8,587,155 B2 | 11/2013 | Giler et al. |
| 8,598,743 B2 | 12/2013 | Hall et al. |
| 8,618,696 B2 | 12/2013 | Kurs et al. |
| 8,629,578 B2 | 1/2014 | Kurs et al. |
| 8,643,326 B2 | 2/2014 | Campanella et al. |
| 2002/0032471 A1 | 3/2002 | Loftin et al. |
| 2002/0056233 A1 | 5/2002 | Gohara |
| 2002/0105343 A1 | 8/2002 | Scheible et al. |
| 2002/0118004 A1 | 8/2002 | Scheible et al. |
| 2002/0130642 A1 | 9/2002 | Ettes et al. |
| 2002/0167294 A1 | 11/2002 | Odaohhara |
| 2003/0038641 A1 | 2/2003 | Scheible |
| 2003/0062794 A1 | 4/2003 | Scheible et al. |
| 2003/0062980 A1 | 4/2003 | Scheible et al. |
| 2003/0071034 A1 | 4/2003 | Thompson et al. |
| 2003/0124050 A1 | 7/2003 | Yadav et al. |
| 2003/0126948 A1 | 7/2003 | Yadav et al. |
| 2003/0160590 A1 | 8/2003 | Schaefer et al. |
| 2003/0199778 A1 | 10/2003 | Mickle et al. |
| 2003/0214255 A1 | 11/2003 | Baarman et al. |
| 2004/0000974 A1 | 1/2004 | Odenaal et al. |
| 2004/0026998 A1 | 2/2004 | Henriott et al. |
| 2004/0100338 A1 | 5/2004 | Clark |
| 2004/0113847 A1 | 6/2004 | Qi et al. |
| 2004/0130425 A1 | 7/2004 | Dayan et al. |
| 2004/0130915 A1 | 7/2004 | Baarman |
| 2004/0130916 A1 | 7/2004 | Baarman |
| 2004/0142733 A1 | 7/2004 | Parise |
| 2004/0150934 A1 | 8/2004 | Baarman |
| 2004/0189246 A1 | 9/2004 | Bulai |
| 2004/0201361 A1 | 10/2004 | Koh et al. |
| 2004/0222751 A1 | 11/2004 | Mollema et al. |
| 2004/0227057 A1 | 11/2004 | Tuominen et al. |
| 2004/0232845 A1 | 11/2004 | Baarman |
| 2004/0233043 A1 | 11/2004 | Yazawa et al. |
| 2004/0267501 A1 | 12/2004 | Freed et al. |
| 2005/0007067 A1 | 1/2005 | Baarman et al. |
| 2005/0021134 A1 | 1/2005 | Opie |
| 2005/0027192 A1 | 2/2005 | Govari et al. |
| 2005/0033382 A1 | 2/2005 | Single |
| 2005/0085873 A1 | 4/2005 | Gord et al. |
| 2005/0093475 A1 | 5/2005 | Kuennen et al. |
| 2005/0104064 A1 | 5/2005 | Hegarty et al. |
| 2005/0104453 A1 | 5/2005 | Vanderelli et al. |
| 2005/0116650 A1 | 6/2005 | Baarman |
| 2005/0116683 A1 | 6/2005 | Cheng et al. |
| 2005/0122058 A1 | 6/2005 | Baarman et al. |
| 2005/0122059 A1 | 6/2005 | Baarman et al. |
| 2005/0125093 A1 | 6/2005 | Kikuchi et al. |
| 2005/0127849 A1 | 6/2005 | Baarman et al. |
| 2005/0127850 A1 | 6/2005 | Baarman et al. |
| 2005/0127866 A1 | 6/2005 | Hamilton et al. |

(56) References Cited

U.S. PATENT DOCUMENTS

| | | |
|---|---|---|
| 2005/0135122 A1 | 6/2005 | Cheng et al. |
| 2005/0140482 A1 | 6/2005 | Cheng et al. |
| 2005/0151511 A1 | 7/2005 | Chary |
| 2005/0156560 A1 | 7/2005 | Shimaoka et al. |
| 2005/0189945 A1 | 9/2005 | Reiderman |
| 2005/0194926 A1 | 9/2005 | DiStefano |
| 2005/0253152 A1 | 11/2005 | Klimov et al. |
| 2005/0288739 A1 | 12/2005 | Hassler, Jr. et al. |
| 2005/0288740 A1 | 12/2005 | Hassler, Jr. et al. |
| 2005/0288741 A1 | 12/2005 | Hassler, Jr. et al. |
| 2005/0288742 A1 | 12/2005 | Giordano et al. |
| 2006/0001509 A1 | 1/2006 | Gibbs |
| 2006/0010902 A1 | 1/2006 | Trinh et al. |
| 2006/0022636 A1 | 2/2006 | Xian et al. |
| 2006/0053296 A1 | 3/2006 | Busboom et al. |
| 2006/0061323 A1 | 3/2006 | Cheng et al. |
| 2006/0066443 A1 | 3/2006 | Hall |
| 2006/0090956 A1 | 5/2006 | Peshkovskiy et al. |
| 2006/0132045 A1 | 6/2006 | Baarman |
| 2006/0164866 A1 | 7/2006 | Vanderelli et al. |
| 2006/0181242 A1 | 8/2006 | Freed et al. |
| 2006/0184209 A1 | 8/2006 | John et al. |
| 2006/0184210 A1 | 8/2006 | Singhal et al. |
| 2006/0185809 A1 | 8/2006 | Elfrink et al. |
| 2006/0199620 A1 | 9/2006 | Greene et al. |
| 2006/0202665 A1 | 9/2006 | Hsu |
| 2006/0205381 A1 | 9/2006 | Beart et al. |
| 2006/0214626 A1 | 9/2006 | Nilson et al. |
| 2006/0219448 A1 | 10/2006 | Grieve et al. |
| 2006/0238365 A1 | 10/2006 | Vecchione et al. |
| 2006/0270440 A1 | 11/2006 | Shearer et al. |
| 2006/0281435 A1 | 12/2006 | Shearer et al. |
| 2007/0010295 A1 | 1/2007 | Greene et al. |
| 2007/0013483 A1 | 1/2007 | Stewart |
| 2007/0016089 A1 | 1/2007 | Fischell et al. |
| 2007/0021140 A1 | 1/2007 | Keyes, IV et al. |
| 2007/0024246 A1 | 2/2007 | Flaugher |
| 2007/0064406 A1 | 3/2007 | Beart |
| 2007/0069687 A1 | 3/2007 | Suzuki |
| 2007/0096875 A1 | 5/2007 | Waterhouse et al. |
| 2007/0105429 A1 | 5/2007 | Kohl et al. |
| 2007/0117596 A1 | 5/2007 | Greene et al. |
| 2007/0126650 A1 | 6/2007 | Guenther |
| 2007/0145830 A1 | 6/2007 | Lee et al. |
| 2007/0164839 A1 | 7/2007 | Naito |
| 2007/0171681 A1 | 7/2007 | Baarman |
| 2007/0176840 A1 | 8/2007 | Pristas et al. |
| 2007/0178945 A1 | 8/2007 | Cook et al. |
| 2007/0182367 A1 | 8/2007 | Partovi |
| 2007/0208263 A1 | 9/2007 | John et al. |
| 2007/0222542 A1 | 9/2007 | Joannopoulos et al. |
| 2007/0228833 A1 | 10/2007 | Stevens et al. |
| 2007/0257636 A1 | 11/2007 | Phillips et al. |
| 2007/0267918 A1 | 11/2007 | Gyland |
| 2007/0276538 A1 | 11/2007 | Kjellsson et al. |
| 2008/0012569 A1 | 1/2008 | Hall et al. |
| 2008/0014897 A1 | 1/2008 | Cook et al. |
| 2008/0030415 A1 | 2/2008 | Homan et al. |
| 2008/0036588 A1 | 2/2008 | Iverson et al. |
| 2008/0047727 A1 | 2/2008 | Sexton et al. |
| 2008/0051854 A1 | 2/2008 | Bulkes et al. |
| 2008/0067874 A1 | 3/2008 | Tseng |
| 2008/0132909 A1 | 6/2008 | Jascob et al. |
| 2008/0154331 A1 | 6/2008 | John et al. |
| 2008/0176521 A1 | 7/2008 | Singh et al. |
| 2008/0191638 A1 | 8/2008 | Kuennen et al. |
| 2008/0197710 A1 | 8/2008 | Kreitz et al. |
| 2008/0197802 A1 | 8/2008 | Onishi et al. |
| 2008/0211320 A1 | 9/2008 | Cook et al. |
| 2008/0238364 A1 | 10/2008 | Weber et al. |
| 2008/0255901 A1 | 10/2008 | Carroll et al. |
| 2008/0265684 A1 | 10/2008 | Farkas |
| 2008/0266748 A1 | 10/2008 | Lee |
| 2008/0272860 A1 | 11/2008 | Pance |
| 2008/0273242 A1 | 11/2008 | Woodgate et al. |
| 2008/0278264 A1 | 11/2008 | Karalis et al. |
| 2008/0290736 A1 | 11/2008 | Onishi et al. |
| 2008/0291277 A1 | 11/2008 | Jacobsen et al. |
| 2008/0300657 A1 | 12/2008 | Stultz |
| 2008/0300660 A1 | 12/2008 | John |
| 2009/0010028 A1 | 1/2009 | Baarman et al. |
| 2009/0015075 A1 | 1/2009 | Cook et al. |
| 2009/0033280 A1 | 2/2009 | Choi et al. |
| 2009/0033564 A1 | 2/2009 | Cook et al. |
| 2009/0038623 A1 | 2/2009 | Farbarik et al. |
| 2009/0045772 A1 | 2/2009 | Cook et al. |
| 2009/0051224 A1 | 2/2009 | Cook et al. |
| 2009/0058189 A1 | 3/2009 | Cook et al. |
| 2009/0058361 A1 | 3/2009 | John |
| 2009/0067198 A1 | 3/2009 | Graham et al. |
| 2009/0072627 A1 | 3/2009 | Cook et al. |
| 2009/0072628 A1 | 3/2009 | Cook et al. |
| 2009/0072629 A1 | 3/2009 | Cook et al. |
| 2009/0072782 A1 | 3/2009 | Randall |
| 2009/0079268 A1 | 3/2009 | Cook et al. |
| 2009/0079387 A1 | 3/2009 | Jin et al. |
| 2009/0085408 A1 | 4/2009 | Bruhn |
| 2009/0085706 A1 | 4/2009 | Baarman et al. |
| 2009/0095449 A1 | 4/2009 | Bandai et al. |
| 2009/0096413 A1 | 4/2009 | Partovi et al. |
| 2009/0102292 A1 | 4/2009 | Cook et al. |
| 2009/0102296 A1 | 4/2009 | Greene et al. |
| 2009/0108679 A1 | 4/2009 | Porwal |
| 2009/0108997 A1 | 4/2009 | Patterson et al. |
| 2009/0115628 A1 | 5/2009 | Dicks et al. |
| 2009/0127937 A1 | 5/2009 | Widmer et al. |
| 2009/0134712 A1 | 5/2009 | Cook et al. |
| 2009/0146892 A1 | 6/2009 | Shimizu et al. |
| 2009/0153273 A1 | 6/2009 | Chen et al. |
| 2009/0160261 A1 | 6/2009 | Elo |
| 2009/0161078 A1 | 6/2009 | Wu et al. |
| 2009/0167253 A1 | 7/2009 | Muraoka et al. |
| 2009/0167449 A1 | 7/2009 | Cook et al. |
| 2009/0174263 A1 | 7/2009 | Baarman et al. |
| 2009/0179502 A1 | 7/2009 | Cook et al. |
| 2009/0188396 A1 | 7/2009 | Hofmann et al. |
| 2009/0189458 A1 | 7/2009 | Kawasaki |
| 2009/0195332 A1 | 8/2009 | Joannopoulos et al. |
| 2009/0195333 A1 | 8/2009 | Joannopoulos et al. |
| 2009/0212636 A1 | 8/2009 | Cook et al. |
| 2009/0213028 A1 | 8/2009 | Cook et al. |
| 2009/0218884 A1 | 9/2009 | Soar |
| 2009/0224608 A1 | 9/2009 | Cook et al. |
| 2009/0224609 A1 | 9/2009 | Cook et al. |
| 2009/0224723 A1 | 9/2009 | Tanabe |
| 2009/0224856 A1 | 9/2009 | Karalis et al. |
| 2009/0230777 A1 | 9/2009 | Baarman et al. |
| 2009/0237194 A1 | 9/2009 | Waffenschmidt et al. |
| 2009/0243394 A1 | 10/2009 | Levine |
| 2009/0243397 A1 | 10/2009 | Cook et al. |
| 2009/0251008 A1 | 10/2009 | Sugaya |
| 2009/0261778 A1 | 10/2009 | Kook |
| 2009/0267558 A1 | 10/2009 | Jung |
| 2009/0267709 A1 | 10/2009 | Joannopoulos et al. |
| 2009/0267710 A1 | 10/2009 | Joannopoulos et al. |
| 2009/0271047 A1 | 10/2009 | Wakamatsu |
| 2009/0271048 A1 | 10/2009 | Wakamatsu |
| 2009/0273242 A1 | 11/2009 | Cook |
| 2009/0273318 A1 | 11/2009 | Rondoni et al. |
| 2009/0278523 A1 | 11/2009 | Yoda et al. |
| 2009/0281678 A1 | 11/2009 | Wakamatsu |
| 2009/0284082 A1 | 11/2009 | Mohammadian |
| 2009/0284083 A1 | 11/2009 | Karalis et al. |
| 2009/0284218 A1 | 11/2009 | Mohammadian et al. |
| 2009/0284220 A1 | 11/2009 | Toncich et al. |
| 2009/0284227 A1 | 11/2009 | Mohammadian et al. |
| 2009/0284245 A1 | 11/2009 | Kirby et al. |
| 2009/0284341 A1 | 11/2009 | Okada et al. |
| 2009/0284369 A1 | 11/2009 | Toncich et al. |
| 2009/0286470 A1 | 11/2009 | Mohammadian et al. |
| 2009/0286475 A1 | 11/2009 | Toncich et al. |
| 2009/0286476 A1 | 11/2009 | Toncich et al. |
| 2009/0289595 A1 | 11/2009 | Chen et al. |
| 2009/0299918 A1 | 12/2009 | Cook et al. |

(56) References Cited

U.S. PATENT DOCUMENTS

| | | |
|---|---|---|
| 2009/0322158 A1 | 12/2009 | Stevens et al. |
| 2009/0322280 A1 | 12/2009 | Kamijo et al. |
| 2010/0015918 A1 | 1/2010 | Liu et al. |
| 2010/0017249 A1 | 1/2010 | Fincham et al. |
| 2010/0033021 A1 | 2/2010 | Bennett |
| 2010/0034238 A1 | 2/2010 | Bennett |
| 2010/0036773 A1 | 2/2010 | Bennett |
| 2010/0038970 A1 | 2/2010 | Cook et al. |
| 2010/0045114 A1 | 2/2010 | Sample et al. |
| 2010/0052431 A1 | 3/2010 | Mita |
| 2010/0052811 A1 | 3/2010 | Smith et al. |
| 2010/0060077 A1 | 3/2010 | Paulus et al. |
| 2010/0065352 A1 | 3/2010 | Ichikawa |
| 2010/0066349 A1 | 3/2010 | Lin et al. |
| 2010/0076524 A1 | 3/2010 | Forsberg et al. |
| 2010/0081379 A1 | 4/2010 | Cooper et al. |
| 2010/0094381 A1 | 4/2010 | Kim et al. |
| 2010/0096934 A1 | 4/2010 | Joannopoulos et al. |
| 2010/0102639 A1 | 4/2010 | Joannopoulos et al. |
| 2010/0102640 A1 | 4/2010 | Joannopoulos et al. |
| 2010/0102641 A1 | 4/2010 | Joannopoulos et al. |
| 2010/0104031 A1 | 4/2010 | Lacour |
| 2010/0109443 A1 | 5/2010 | Cook et al. |
| 2010/0109445 A1 | 5/2010 | Kurs et al. |
| 2010/0109604 A1 | 5/2010 | Boys et al. |
| 2010/0115474 A1 | 5/2010 | Takada et al. |
| 2010/0117454 A1 | 5/2010 | Cook et al. |
| 2010/0117455 A1 | 5/2010 | Joannopoulos et al. |
| 2010/0117456 A1 | 5/2010 | Karalis et al. |
| 2010/0117596 A1 | 5/2010 | Cook et al. |
| 2010/0123353 A1 | 5/2010 | Joannopoulos et al. |
| 2010/0123354 A1 | 5/2010 | Joannopoulos et al. |
| 2010/0123355 A1 | 5/2010 | Joannopoulos et al. |
| 2010/0123452 A1 | 5/2010 | Amano et al. |
| 2010/0123530 A1 | 5/2010 | Park et al. |
| 2010/0127573 A1 | 5/2010 | Joannopoulos et al. |
| 2010/0127574 A1 | 5/2010 | Joannopoulos et al. |
| 2010/0127575 A1 | 5/2010 | Joannopoulos et al. |
| 2010/0127660 A1 | 5/2010 | Cook et al. |
| 2010/0133918 A1 | 6/2010 | Joannopoulos et al. |
| 2010/0133919 A1 | 6/2010 | Joannopoulos et al. |
| 2010/0133920 A1 | 6/2010 | Joannopoulos et al. |
| 2010/0141042 A1 | 6/2010 | Kesler et al. |
| 2010/0148589 A1 | 6/2010 | Hamam et al. |
| 2010/0148723 A1 | 6/2010 | Cook et al. |
| 2010/0151808 A1 | 6/2010 | Toncich et al. |
| 2010/0156346 A1 | 6/2010 | Takada et al. |
| 2010/0156355 A1 | 6/2010 | Bauerle et al. |
| 2010/0156570 A1 | 6/2010 | Hong et al. |
| 2010/0164295 A1 | 7/2010 | Ichikawa et al. |
| 2010/0164296 A1 | 7/2010 | Kurs |
| 2010/0164297 A1 | 7/2010 | Kurs et al. |
| 2010/0164298 A1 | 7/2010 | Karalis et al. |
| 2010/0171368 A1 | 7/2010 | Schatz et al. |
| 2010/0171370 A1 | 7/2010 | Karalis et al. |
| 2010/0179384 A1 | 7/2010 | Hoeg et al. |
| 2010/0181843 A1 | 7/2010 | Schatz et al. |
| 2010/0181844 A1 | 7/2010 | Karalis et al. |
| 2010/0181845 A1 | 7/2010 | Fiorello et al. |
| 2010/0181961 A1 | 7/2010 | Novak et al. |
| 2010/0181964 A1 | 7/2010 | Huggins et al. |
| 2010/0184371 A1 | 7/2010 | Cook et al. |
| 2010/0187911 A1 | 7/2010 | Joannopoulos et al. |
| 2010/0187913 A1 | 7/2010 | Sample |
| 2010/0188183 A1 | 7/2010 | Shpiro |
| 2010/0190435 A1 | 7/2010 | Cook et al. |
| 2010/0190436 A1 | 7/2010 | Cook et al. |
| 2010/0194206 A1 | 8/2010 | Burdo et al. |
| 2010/0194207 A1 | 8/2010 | Graham |
| 2010/0194334 A1 | 8/2010 | Kirby et al. |
| 2010/0194335 A1 | 8/2010 | Kirby et al. |
| 2010/0201189 A1 | 8/2010 | Kirby et al. |
| 2010/0201201 A1 | 8/2010 | Mobarhan et al. |
| 2010/0201202 A1 | 8/2010 | Kirby et al. |
| 2010/0201203 A1 | 8/2010 | Schatz et al. |
| 2010/0201204 A1 | 8/2010 | Sakoda et al. |
| 2010/0201205 A1 | 8/2010 | Karalis et al. |
| 2010/0201310 A1 | 8/2010 | Vorenkamp et al. |
| 2010/0201312 A1 | 8/2010 | Kirby et al. |
| 2010/0201313 A1 | 8/2010 | Vorenkamp et al. |
| 2010/0201316 A1 | 8/2010 | Takada et al. |
| 2010/0201513 A1 | 8/2010 | Vorenkamp et al. |
| 2010/0207458 A1 | 8/2010 | Joannopoulos et al. |
| 2010/0210233 A1 | 8/2010 | Cook et al. |
| 2010/0213770 A1 | 8/2010 | Kikuchi |
| 2010/0213895 A1 | 8/2010 | Keating et al. |
| 2010/0217553 A1 | 8/2010 | Von Novak et al. |
| 2010/0219694 A1 | 9/2010 | Kurs et al. |
| 2010/0219695 A1 | 9/2010 | Komiyama et al. |
| 2010/0219696 A1 | 9/2010 | Kojima |
| 2010/0222010 A1 | 9/2010 | Ozaki et al. |
| 2010/0225175 A1 | 9/2010 | Karalis et al. |
| 2010/0225270 A1 | 9/2010 | Jacobs et al. |
| 2010/0225271 A1 | 9/2010 | Oyobe et al. |
| 2010/0225272 A1 | 9/2010 | Kirby et al. |
| 2010/0231053 A1 | 9/2010 | Karalis et al. |
| 2010/0231163 A1 | 9/2010 | Mashinsky |
| 2010/0231340 A1 | 9/2010 | Fiorello et al. |
| 2010/0234922 A1 | 9/2010 | Forsell |
| 2010/0235006 A1 | 9/2010 | Brown |
| 2010/0237706 A1 | 9/2010 | Karalis et al. |
| 2010/0237707 A1 | 9/2010 | Karalis et al. |
| 2010/0237708 A1 | 9/2010 | Karalis et al. |
| 2010/0237709 A1 | 9/2010 | Hall et al. |
| 2010/0244576 A1 | 9/2010 | Hillan et al. |
| 2010/0244577 A1 | 9/2010 | Shimokawa |
| 2010/0244578 A1 | 9/2010 | Yoshikawa |
| 2010/0244579 A1 | 9/2010 | Sogabe et al. |
| 2010/0244580 A1 | 9/2010 | Uchida et al. |
| 2010/0244581 A1 | 9/2010 | Uchida |
| 2010/0244582 A1 | 9/2010 | Yoshikawa |
| 2010/0244583 A1 | 9/2010 | Shimokawa |
| 2010/0244767 A1 | 9/2010 | Turner et al. |
| 2010/0244839 A1 | 9/2010 | Yoshikawa |
| 2010/0248622 A1 | 9/2010 | Kirby et al. |
| 2010/0253152 A1 | 10/2010 | Karalis et al. |
| 2010/0253281 A1 | 10/2010 | Li |
| 2010/0256481 A1 | 10/2010 | Mareci et al. |
| 2010/0256831 A1 | 10/2010 | Abramo et al. |
| 2010/0259108 A1 | 10/2010 | Giler et al. |
| 2010/0259109 A1 | 10/2010 | Sato |
| 2010/0259110 A1 | 10/2010 | Kurs et al. |
| 2010/0264745 A1 | 10/2010 | Karalis et al. |
| 2010/0264746 A1 | 10/2010 | Kazama et al. |
| 2010/0264747 A1 | 10/2010 | Hall et al. |
| 2010/0276995 A1 | 11/2010 | Marzetta et al. |
| 2010/0277003 A1 | 11/2010 | Von Novak et al. |
| 2010/0277004 A1 | 11/2010 | Suzuki et al. |
| 2010/0277005 A1 | 11/2010 | Karalis et al. |
| 2010/0277120 A1 | 11/2010 | Cook et al. |
| 2010/0277121 A1 | 11/2010 | Hall et al. |
| 2010/0289341 A1 | 11/2010 | Ozaki et al. |
| 2010/0289449 A1 | 11/2010 | Elo |
| 2010/0295505 A1 | 11/2010 | Jung et al. |
| 2010/0295506 A1 | 11/2010 | Ichikawa |
| 2010/0308939 A1 | 12/2010 | Kurs |
| 2010/0314946 A1 | 12/2010 | Budde et al. |
| 2010/0327660 A1 | 12/2010 | Karalis et al. |
| 2010/0327661 A1 | 12/2010 | Karalis et al. |
| 2010/0328044 A1 | 12/2010 | Waffenschmidt et al. |
| 2011/0004269 A1 | 1/2011 | Strother et al. |
| 2011/0012431 A1 | 1/2011 | Karalis et al. |
| 2011/0018361 A1 | 1/2011 | Karalis et al. |
| 2011/0025131 A1 | 2/2011 | Karalis et al. |
| 2011/0031928 A1 | 2/2011 | Soar |
| 2011/0043046 A1 | 2/2011 | Joannopoulos et al. |
| 2011/0043047 A1 | 2/2011 | Karalis et al. |
| 2011/0043048 A1 | 2/2011 | Karalis et al. |
| 2011/0043049 A1 | 2/2011 | Karalis et al. |
| 2011/0049995 A1 | 3/2011 | Hashiguchi |
| 2011/0049996 A1 | 3/2011 | Karalis et al. |

(56) References Cited

U.S. PATENT DOCUMENTS

| | | |
|---|---|---|
| 2011/0049998 A1 | 3/2011 | Karalis et al. |
| 2011/0050164 A1 | 3/2011 | Partovi et al. |
| 2011/0057606 A1* | 3/2011 | Saunamaki ............ H02J 7/025 320/108 |
| 2011/0074218 A1 | 3/2011 | Karalis et al. |
| 2011/0074346 A1* | 3/2011 | Hall ..................... B60L 3/00 320/108 |
| 2011/0074347 A1 | 3/2011 | Karalis et al. |
| 2011/0089895 A1 | 4/2011 | Karalis et al. |
| 2011/0095618 A1 | 4/2011 | Schatz et al. |
| 2011/0115303 A1 | 5/2011 | Baarman et al. |
| 2011/0115431 A1 | 5/2011 | Dunworth et al. |
| 2011/0121920 A1 | 5/2011 | Kurs et al. |
| 2011/0128015 A1 | 6/2011 | Dorairaj et al. |
| 2011/0140544 A1 | 6/2011 | Karalis et al. |
| 2011/0148219 A1 | 6/2011 | Karalis et al. |
| 2011/0162895 A1 | 7/2011 | Karalis et al. |
| 2011/0169339 A1 | 7/2011 | Karalis et al. |
| 2011/0181122 A1 | 7/2011 | Karalis et al. |
| 2011/0193416 A1 | 8/2011 | Campanella et al. |
| 2011/0193419 A1 | 8/2011 | Karalis et al. |
| 2011/0198939 A1 | 8/2011 | Karalis et al. |
| 2011/0215086 A1 | 9/2011 | Yeh |
| 2011/0221278 A1 | 9/2011 | Karalis et al. |
| 2011/0227528 A1 | 9/2011 | Karalis et al. |
| 2011/0227530 A1 | 9/2011 | Karalis et al. |
| 2011/0241618 A1 | 10/2011 | Karalis et al. |
| 2011/0248573 A1 | 10/2011 | Kanno et al. |
| 2011/0254377 A1 | 10/2011 | Wildmer et al. |
| 2011/0254503 A1 | 10/2011 | Widmer et al. |
| 2011/0266878 A9 | 11/2011 | Cook et al. |
| 2011/0278943 A1 | 11/2011 | Eckhoff et al. |
| 2011/0318618 A1 | 12/2011 | Yajima et al. |
| 2012/0001492 A9 | 1/2012 | Cook et al. |
| 2012/0001593 A1 | 1/2012 | DiGuardo |
| 2012/0007435 A1 | 1/2012 | Sada et al. |
| 2012/0007441 A1 | 1/2012 | John et al. |
| 2012/0025602 A1 | 2/2012 | Boys et al. |
| 2012/0032522 A1 | 2/2012 | Schatz et al. |
| 2012/0038525 A1 | 2/2012 | Monsalve Carcelen et al. |
| 2012/0049650 A1 | 3/2012 | Bella |
| 2012/0062345 A1 | 3/2012 | Kurs et al. |
| 2012/0068549 A1 | 3/2012 | Karalis et al. |
| 2012/0086284 A1 | 4/2012 | Capanella et al. |
| 2012/0086867 A1 | 4/2012 | Kesler et al. |
| 2012/0091794 A1 | 4/2012 | Campanella et al. |
| 2012/0091795 A1 | 4/2012 | Fiorello et al. |
| 2012/0091796 A1 | 4/2012 | Kesler et al. |
| 2012/0091797 A1 | 4/2012 | Kesler et al. |
| 2012/0091819 A1 | 4/2012 | Kulikowski et al. |
| 2012/0091820 A1 | 4/2012 | Campanella et al. |
| 2012/0091949 A1 | 4/2012 | Campanella et al. |
| 2012/0091950 A1 | 4/2012 | Campanella et al. |
| 2012/0098350 A1 | 4/2012 | Campanella et al. |
| 2012/0112531 A1 | 5/2012 | Kesler et al. |
| 2012/0112532 A1 | 5/2012 | Kesler et al. |
| 2012/0112534 A1 | 5/2012 | Kesler et al. |
| 2012/0112535 A1 | 5/2012 | Karalis et al. |
| 2012/0112536 A1 | 5/2012 | Karalis et al. |
| 2012/0112538 A1 | 5/2012 | Kesler et al. |
| 2012/0112691 A1 | 5/2012 | Kurs et al. |
| 2012/0119569 A1 | 5/2012 | Karalis et al. |
| 2012/0119575 A1 | 5/2012 | Kurs et al. |
| 2012/0119576 A1 | 5/2012 | Kesler et al. |
| 2012/0119698 A1 | 5/2012 | Karalis et al. |
| 2012/0139355 A1 | 6/2012 | Ganem et al. |
| 2012/0146575 A1 | 6/2012 | Armstrong et al. |
| 2012/0146580 A1 | 6/2012 | Kitamura |
| 2012/0153732 A1 | 6/2012 | Kurs et al. |
| 2012/0153733 A1 | 6/2012 | Schatz et al. |
| 2012/0153734 A1 | 6/2012 | Kurs et al. |
| 2012/0153735 A1 | 6/2012 | Karalis et al. |
| 2012/0153736 A1 | 6/2012 | Karalis et al. |
| 2012/0153737 A1 | 6/2012 | Karalis et al. |
| 2012/0153738 A1 | 6/2012 | Karalis et al. |
| 2012/0153893 A1 | 6/2012 | Schatz et al. |
| 2012/0175967 A1 | 7/2012 | Dibben et al. |
| 2012/0184338 A1 | 7/2012 | Kesler et al. |
| 2012/0206096 A1 | 8/2012 | John |
| 2012/0223573 A1 | 9/2012 | Schatz et al. |
| 2012/0228952 A1 | 9/2012 | Hall et al. |
| 2012/0228953 A1 | 9/2012 | Kesler et al. |
| 2012/0228954 A1 | 9/2012 | Kesler et al. |
| 2012/0235500 A1 | 9/2012 | Ganem et al. |
| 2012/0235501 A1 | 9/2012 | Kesler et al. |
| 2012/0235502 A1 | 9/2012 | Kesler et al. |
| 2012/0235503 A1 | 9/2012 | Kesler et al. |
| 2012/0235504 A1 | 9/2012 | Kesler et al. |
| 2012/0235505 A1 | 9/2012 | Schatz et al. |
| 2012/0235566 A1 | 9/2012 | Karalis et al. |
| 2012/0235567 A1 | 9/2012 | Karalis et al. |
| 2012/0235633 A1 | 9/2012 | Kesler et al. |
| 2012/0235634 A1 | 9/2012 | Hall et al. |
| 2012/0239117 A1 | 9/2012 | Kesler et al. |
| 2012/0242159 A1 | 9/2012 | Lou et al. |
| 2012/0242225 A1 | 9/2012 | Karalis et al. |
| 2012/0248884 A1 | 10/2012 | Karalis et al. |
| 2012/0248886 A1 | 10/2012 | Kesler et al. |
| 2012/0248887 A1 | 10/2012 | Kesler et al. |
| 2012/0248888 A1 | 10/2012 | Kesler et al. |
| 2012/0248981 A1 | 10/2012 | Karalis et al. |
| 2012/0256494 A1 | 10/2012 | Kesler et al. |
| 2012/0262002 A1 | 10/2012 | Widmer et al. |
| 2012/0267960 A1 | 10/2012 | Low et al. |
| 2012/0280765 A1 | 11/2012 | Kurs et al. |
| 2012/0313449 A1 | 12/2012 | Kurs et al. |
| 2012/0313742 A1 | 12/2012 | Kurs et al. |
| 2013/0007949 A1 | 1/2013 | Kurs et al. |
| 2013/0020878 A1 | 1/2013 | Karalis et al. |
| 2013/0033118 A1 | 2/2013 | Karalis et al. |
| 2013/0038402 A1 | 2/2013 | Karalis et al. |
| 2013/0057364 A1 | 3/2013 | Kesler et al. |
| 2013/0062966 A1 | 3/2013 | Verghese et al. |
| 2013/0063085 A1 | 3/2013 | Takada et al. |
| 2013/0069441 A1 | 3/2013 | Verghese et al. |
| 2013/0069753 A1 | 3/2013 | Kurs et al. |
| 2013/0099587 A1 | 4/2013 | Lou |
| 2013/0154383 A1 | 6/2013 | Kasturi et al. |
| 2013/0154389 A1 | 6/2013 | Kurs et al. |
| 2013/0159956 A1 | 6/2013 | Verghese et al. |
| 2013/0175874 A1 | 7/2013 | Lou et al. |
| 2013/0175875 A1 | 7/2013 | Kurs et al. |
| 2013/0200716 A1 | 8/2013 | Kesler et al. |
| 2013/0200721 A1 | 8/2013 | Kurs et al. |
| 2013/0221744 A1 | 8/2013 | Hall et al. |
| 2013/0278073 A1 | 10/2013 | Kurs et al. |
| 2013/0278074 A1 | 10/2013 | Kurs et al. |
| 2013/0278075 A1 | 10/2013 | Kurs et al. |
| 2013/0300353 A1 | 11/2013 | Kurs et al. |
| 2013/0307349 A1 | 11/2013 | Hall et al. |
| 2013/0320773 A1 | 12/2013 | Schatz et al. |
| 2013/0334892 A1 | 12/2013 | Hall et al. |
| 2014/0002012 A1 | 1/2014 | McCauley et al. |
| 2014/0049422 A1 | 2/2014 | Von Novak et al. |
| 2014/0070764 A1 | 3/2014 | Keeling |

FOREIGN PATENT DOCUMENTS

| | | |
|---|---|---|
| CN | 102239633 | 11/2011 |
| CN | 102439669 | 5/2012 |
| CN | 103329397 | 9/2013 |
| DE | 3824972 | 1/1989 |
| DE | 100 29 147 | 12/2001 |
| DE | 200 16 655 | 3/2002 |
| DE | 102 21 484 | 11/2003 |
| DE | 103 04 584 | 8/2004 |
| DE | 10 2005 036 290 | 2/2007 |
| DE | 10 2006 044 057 | 4/2008 |
| DE | 20 2009 009693 | 11/2010 |
| DE | 10 2011 015980 | 10/2012 |
| EP | 1 335 477 | 8/2003 |
| EP | 1 521 206 | 4/2005 |
| EP | 1 524 010 | 4/2005 |
| EP | 2 357 716 | 8/2011 |

(56) References Cited

FOREIGN PATENT DOCUMENTS

| | | |
|---|---|---|
| EP | 2 410 631 | 1/2012 |
| FR | 2 968 616 | 6/2012 |
| JP | 02-097005 | 4/1990 |
| JP | 4-265875 | 9/1992 |
| JP | H6-2975 | 1/1994 |
| JP | 6-341410 | 12/1994 |
| JP | 9-182323 | 7/1997 |
| JP | 9-298847 | 11/1997 |
| JP | 10-164837 | 6/1998 |
| JP | 11-75329 | 3/1999 |
| JP | 11-188113 | 7/1999 |
| JP | 2000-134830 | 5/2000 |
| JP | 2001-309580 | 11/2001 |
| JP | 2002-010535 | 1/2002 |
| JP | 2003-179526 | 6/2003 |
| JP | 2004-166459 | 6/2004 |
| JP | 2004-201458 | 7/2004 |
| JP | 2004-229144 | 8/2004 |
| JP | 2005-57444 | 3/2005 |
| JP | 2005-149238 | 6/2005 |
| JP | 2006-074848 | 3/2006 |
| JP | 2007-505480 | 3/2007 |
| JP | 2007-266892 | 10/2007 |
| JP | 2007-537637 | 12/2007 |
| JP | 2008-17562 | 1/2008 |
| JP | 2008-508842 | 3/2008 |
| JP | 2008-206231 | 9/2008 |
| JP | 2008-206327 | 9/2008 |
| JP | 2009-213295 | 9/2009 |
| JP | 2009-273260 | 11/2009 |
| JP | 2011-72074 | 4/2011 ............... H02J 7/00 |
| JP | 2011-072074 | 4/2011 |
| JP | 2012-504387 | 2/2012 |
| JP | 2013-543718 | 12/2013 |
| KR | 10-2007-0017804 | 2/2007 |
| KR | 10-2008-0007635 | 1/2008 |
| KR | 10-2009-0122072 | 11/2009 |
| KR | 10-2011-0050920 | 5/2011 |
| SG | 112842 | 7/2005 |
| WO | WO 92/17929 | 10/1992 |
| WO | WO 93/23908 | 11/1993 |
| WO | WO 94/28560 | 12/1994 |
| WO | WO 95/11545 | 4/1995 |
| WO | WO 96/02970 | 2/1996 |
| WO | WO 98/50993 | 11/1998 |
| WO | WO 00/23823 | 4/2000 |
| WO | WO 00/77910 | 12/2000 |
| WO | WO 03/092329 | 11/2003 |
| WO | WO 03/096361 | 11/2003 |
| WO | WO 03/096512 | 11/2003 |
| WO | WO 2004/015885 | 2/2004 |
| WO | WO 2004/038888 | 5/2004 |
| WO | WO 2004/055654 | 7/2004 |
| WO | WO 2004/073150 | 8/2004 |
| WO | WO 2004/073166 | 8/2004 |
| WO | WO 2004/073176 | 8/2004 |
| WO | WO 2004/073177 | 8/2004 |
| WO | WO 2004/112216 | 12/2004 |
| WO | WO 2005/024865 | 3/2005 |
| WO | WO 2005/060068 | 6/2005 |
| WO | WO 2005/109597 | 11/2005 |
| WO | WO 2005/109598 | 11/2005 |
| WO | WO 2006/011769 | 2/2006 |
| WO | WO 2007/008646 | 1/2007 |
| WO | WO 2007/020583 | 2/2007 |
| WO | WO 2007/042952 | 4/2007 |
| WO | WO 2007/084716 | 7/2007 |
| WO | WO 2007/084717 | 7/2007 |
| WO | WO 2008/109489 | 9/2008 |
| WO | WO 2008/118178 | 10/2008 |
| WO | WO 2009/009559 | 1/2009 |
| WO | WO 2009/018568 | 2/2009 |
| WO | WO 2009/023155 | 2/2009 |
| WO | WO 2009/023646 | 2/2009 |
| WO | WO 2009/033043 | 3/2009 |
| WO | WO 2009/062438 | 5/2009 |
| WO | WO 2009/070730 | 6/2009 |
| WO | WO 2009/081115 | 7/2009 |
| WO | WO 2009/126963 | 10/2009 |
| WO | WO 2009/140506 | 11/2009 |
| WO | WO 2009/149464 | 12/2009 |
| WO | WO 2009/155000 | 12/2009 |
| WO | WO 2010/030977 | 3/2010 |
| WO | WO 2010/036980 | 4/2010 |
| WO | WO 2010/039967 | 4/2010 |
| WO | WO 2010/090538 | 8/2010 |
| WO | WO 2010/090539 | 8/2010 |
| WO | WO 2010/093997 | 8/2010 |
| WO | WO 2010/104569 | 9/2010 |
| WO | WO 2010/106648 | 9/2010 |
| WO | WO 2010/136927 | 12/2010 |
| WO | WO 2011/061388 | 5/2011 |
| WO | WO 2011/061821 | 5/2011 |
| WO | WO 2011/062827 | 5/2011 |
| WO | WO 2011/112795 | 9/2011 |
| WO | WO 2012/037279 | 3/2012 |
| WO | WO 2012/170278 | 12/2012 |
| WO | WO 2013/013235 | 1/2013 |
| WO | WO 2013/020138 | 2/2013 |
| WO | WO 2013/036947 | 3/2013 |
| WO | WO 2013/059441 | 4/2013 |
| WO | WO 2013/067484 | 5/2013 |
| WO | WO 2013/113017 | 8/2013 |
| WO | WO 2013/142840 | 9/2013 |
| WO | WO 2014/004843 | 1/2014 |

OTHER PUBLICATIONS

"Intel CTO Says Gap between Humans, Machines Will Close by 2050", *Intel News Release*, (See intel.com/.../20080821comp. htm?iid=S . . . ) (Printed Nov. 6, 2009).

"Physics Update, Unwired Energy", *Physics Today*, pp. 26, (Jan. 2007) (See http://arxiv.org/abs/physics/0611063.).

"In pictures: A year in technology", *BBC News*, (Dec. 28, 2007).

"Next Little Thing Electricity without wires", CNN Money (See money.cnn.com/galleries/2009/smallbusiness/0911/gallery. next_little_thing_2010.smb/) (dated Nov. 30, 2009).

Abe et al. "A Noncontact Charger Using a Resonant Converter with Parallel Capacitor of the Secondary Coil". IEEE, 36(2):444-451, Mar./Apr. 2000.

Ahmadian, M. et al., "Miniature Transmitter for Implantable Micro Systems", *Proceedings of the 25th Annual International Conference of the IEEE EMBS* Cancun, Mexico, pp. 3028-3031 (Sep. 17-21, 2003).

Aoki, T. et al., "Observation of strong coupling between one atom and a monolithic microresonator", Nature, vol. 443:671-674 (2006).

Apneseth et al. "Introducing wireless proximity switches" ABB Review Apr. 2002.

Baker et al., "Feedback Analysis and Design of RF Power Links for Low-Power Bionic Systems," *IEEE Transactions on Biomedical Circuits and Systems*, vol. 1(1):28-38 (Mar. 2007).

Balanis, C.A., "Antenna Theory: Analysis and Design," 3rd Edition, Sections 4.2, 4.3, 5.2, 5.3 (Wiley, New Jersey, 2005).

Berardelli, P., "Outlets Are Out", ScienceNOW Daily News, Science Now, http://sciencenow.sciencemag.org/ cgi/content/full/2006/1114/2, (Nov. 14, 2006) 2 pages.

Biever, C., "Evanescent coupling could power gadgets wirelessly", NewScientistsTech.com, http://www. newscientisttech.com/article. ns?id=dn1 0575&print=true, (Nov. 15, 2006) 2 pages.

Borenstein, S., "Man tries wirelessly boosting batteries", (The Associated Press), USA Today, (Nov. 16, 2006) 1 page.

Borenstein, S., "Man tries wirelessly boosting batteries", AP Science Writer, Boston.com, (See http://www.boston.com/business/technology/articles/2006/11/15/man_tries_wirelessly_b . . . ) (Nov. 15, 2006).

Boyle, A., "Electro-nirvana? Not so fast", MSNBC, http:/lcosmiclog. msnbc.msn.com/_news/2007/06/08/4350760-electro-nirvana-not-so-fast, (Jun. 8, 2007) 1 page.

Budhia, M. et al., "A New IPT Magnetic Coupler for Electric Vehicle Charging Systems", IECON 2010—36th Annual Conference on IEEE Industrial Electronics Society, Glendale, AZ, pp. 2487-2492 (Nov. 7-10, 2010).

(56) References Cited

OTHER PUBLICATIONS

Budhia, M. et al., "Development and evaluation of single sided flux couplers for contactless electric vehicle charging", 2011 IEEE Energy Conversion Congress and Exposition (ECCE), Phoenix, AZ, pp. 614-621 (Sep. 17-22, 2011).

Budhia, M. et al.,"Development of a Single-Sided Flux Magnetic Coupler for Electric Vehicle IPT", *IEEE Transactions on Industrial Electronics*, vol. 60:318-328 (Jan. 2013).

Bulkeley, W. M., "MIT Scientists Pave the Way for Wireless Battery Charging", The Wall Street Journal (See http://online.wsj.com/article/SB118123955549228045.html?mod=googlenews_wsj), (Jun. 8, 2007) 2 pages.

Burri et al., "Invention Description", (Feb. 5, 2008).

Cass, S., "Air Power—Wireless data connections are common—now scientists are working on wireless power", Sponsored by IEEE Spectrum, http://spectrum.ieee.org/computing/hardware/air-power, (Nov. 2006) 2 pages.

Castelvecchi, Davide, "The Power of Induction—Cutting the last cord could resonate with our increasingly gadget dependent lives", *Science News Online*, vol. 172, No. 3, Jul. 21, 2007, 6 pages.

Chang, A., "Recharging the Wireless Way—Even physicists forget to recharge their cell phones sometimes.", PC Magazine, ABC News Internet Ventures, (Dec. 12, 2006) 1 page.

Chinaview, "Scientists light bulb with 'wireless electricity'", www.Chinaview.cn, http://news.xinhuanet.com/english/2007-06/08/content_6215681.htm, Jun. 2007, 1 page.

Cooks, G., "The vision of an MIT physicist: Getting rid of pesky rechargers", Boston.com, (Dec. 11, 2006) 1 page.

Derbyshire, D., "The end of the plug? Scientists invent wireless device that beams electricity through your home", Daily Mail, http://www.dailymail.co.uk/pages/live/articles/technology/technology.html?in_article_id=4 . . . ), (Jun. 7, 2007) 3 pages.

Eisenberg, Anne, "Automatic Recharging, From a Distance", The New York Times, (see www.nytimes.com/2012/03/11/business/built-in-wireless-chargeing-for-electronic-devices.html?_r=0) (published on Mar. 10, 2012).

Esser et al., "A New Approach to Power Supplies for Robots", IEEE, vol. 27(5):872-875, (Sep./Oct. 1991).

Fan, Shanhui et al., "Rate-Equation Analysis of Output Efficiency and Modulation Rate of Photomic-Crystal Light-Emitting Diodes", IEEE Journal of Quantum Electronics, vol. 36(10):1123-1130 (Oct. 2000).

Fenske et al., "Dielectric Materials at Microwave Frequencies", Applied Microwave & Wireless, pp. 92-100 (2000).

Fernandez, C. et al., "A simple dc-dc converter for the power supply of a cochlear implant", *IEEE*, pp. 1965-1970 (2003).

Ferris, David, "How Wireless Charging Will Make Life Simpler (And Greener)", Forbes (See forbes.com/sites/davidferris/2012/07/24/how-wireless-charging-will-make-life-simpler-and-greener/print/) (dated Jul. 24, 2012).

Fildes, J., "Physics Promises Wireless Power", (Science and Technology Reporter), BBC News, (Nov. 15, 2006) 3 pages.

Fildes, J., "The technology with impact 2007", BBC News, (Dec. 27, 2007) 3 pages.

Fildes, J., "Wireless energy promise powers up", BBC News, http://news.bbc.co.uk/2/hi/technology/6725955.stm, (Jun. 7, 2007) 3 pages.

Finkenzeller, Klaus, "RFID Handbook—Fundamentals and Applications in Contactless Smart Cards", Nikkan Kohgyo-sya, Kanno Taihei, first version, pp. 32-37, 253 (Aug. 21, 2001).

Finkenzeller, Klaus, "RFID Handbook (2nd Edition)", The Nikkan Kogyo Shimbun, Ltd., pp. 19, 20, 38, 39, 43, 44, 62, 63, 67, 68, 87, 88, 291, 292 (Published on May 31, 2004).

Freedman, D. H., "Power on a Chip", MIT Technology Review, (Nov. 2004).

Gary Peterson, "MIT WiTricity Not So Original After All", *Feed Line No. 9*, (See http://www.tfcbooks.com/articles/witricity.htm) printed Nov. 12, 2009.

Geyi, Wen, "A Method for the Evaluation of Small Antenna Q", IEEE Transactions on Antennas and Propagation, vol. 51(8):2124-2129 (Aug. 2003).

Hadley, F., "Goodbye Wires—MIT Team Experimentally Demonstrates Wireless Power Transfer, Potentially Useful for Power Laptops, Cell-Phones Without Cords", Massachusetts Institute of Technology, Institute for Soldier D Nanotechnologies, http://web.mit.edu/newsoffice/2007/wireless-0607.html, (Jun. 7, 2007) 3 pages.

Haus, H.A., "Waves and Fields in Optoelectronics," Chapter 7 "Coupling of Modes—Reasonators and Couplers" (Prentice-Hall, New Jersey, 1984).

Heikkinen et al., "Performance and Efficiency of Planar Rectennas for Short-Range Wireless Power Transfer at 2.45 GHz", Microwave and Optical Technology Letters, vol. 31(2):86-91, (Oct. 20, 2001).

Highfield, R., "Wireless revolution could spell end of plugs",(Science Editor), Telegraph.co.uk, http://www.telegraph.co.uk/news/main.jhtml?xml=/news/2007/06/07/nwireless1 07.xml, (Jun. 7, 2007) 3 pages.

Hirai et al., "Integral Motor with Driver and Wireless Transmission of Power and Information for Autonomous Subspindle Drive", IEEE, vol. 15(1):13-20, (Jan. 2000).

Hirai et al., "Practical Study on Wireless Transmission of Power and Information for Autonomous Decentralized Manufacturing System", IEEE, vol. 46(2):349-359, Apr. 1999.

Hirai et al., "Study on Intelligent Battery Charging Using Inductive Transmission of Power and Information", IEEE, vol. 15(2):335-345, (Mar. 2000).

Hirai et al., "Wireless Transmission of Power and Information and Information for Cableless Linear Motor Drive", IEEE, vol. 15(1):21-27, (Jan. 2000).

Hirayama, M., "Splashpower—World Leaders in Wireless Power", PowerPoint presentation, Splashpower Japan, (Sep. 3, 2007) 30 pages.

Ho, S. L. et al., "A Comparative Study Between Novel Witricity and Traditional Inductive Magnetic Coupling in Wireless Charging", IEEE Transactions on Magnetics, vol. 47(5):1522-1525 (May 2011).

Infotech Online, "Recharging gadgets without cables", infotech.indiatimes.com, (Nov. 17, 2006) 1 page.

Jackson, J. D., "Classical Electrodynamics", 3rd Edition, Wiley, New York, pp. 201-203 and Sections 1.11, 5.5, 5.17, 6.9, 8.1, 8.8, 9.2 (1999).

Jacob, M. V. et al., "Lithium Tantalate—A High Permittivity Dielectric Material for Microwave Communication Systems", *Proceedings of IEEE TENCON—Poster Papers*, pp. 1362-1366, 2003.

Karalis, Aristeidis et al., "Efficient Wireless *non-radiative mid-range* energy transfer", *Annals of Physics*, vol. 323, pp. 34-48 (2008).

Karalis, Aristeidis, "Electricity Unplugged", Feature: Wireless Energy Physics World, physicsworld.com, pp. 23-25 (Feb. 2009).

Kawamura et al., "Wireless Transmission of Power and Information Through One High-Frequency Resonant AC Link Inverter for Robot Manipulator Applications", IEEE, vol. 32(3):503-508, (May/Jun. 1996).

Kurs, A. et al., "Wireless Power Transfer via Strongly Coupled Magnetic Resonances", *Science* vol. 317, pp. 83-86 (Jul. 6, 2007)

Kurs, A. et al., "Simultaneous mid-range power transfer to multiple devices", *Applied Physics Letters*, vol. 96, No. 044102 (2010).

Kurs, A. et al.,"Optimized design of a low-resistance electrical conductor for the multimegahertz range", *Applied Physics Letters*, vol. 98:172504-172504-3 (Apr. 2011).

Lamb, Gregory M. ,"Look Ma—no wires!—Electricity broadcast through the air may someday run your home",The Christian Science Monitor,http://www.csmonitor.com/2006/1116/p14s01-stct.html,Nov. 15, 2006,2 pages.

Lee, "Antenna Circuit Design for RFID Applications," Microchip Technology Inc., AN710, 50 pages (2003).

Lee, "RFID Coil Design," Microchip Technology Inc., AN678, 21 pages (1998).

Liang et al., "Silicon waveguide two-photon absorption detector at 1.5 μm wavelength for autocorrelation measurements," Applied Physics Letters, 81(7):1323-1325 (Aug. 12, 2002).

Markoff, J.,"Intel Moves to Free Gadgets of Their Recharging Cords", The New York Times—nytimes.com, Aug. 21, 2008, 2 pages.

(56) References Cited

OTHER PUBLICATIONS

Median, A. et al., "Design of class E amplifier with nonlinear and linear shunt capacitances for any duty cycle", IEEE Trans. Microwave Theor. Tech., vol. 55, No. 3, pp. 484-492, (2007).
Microchip Technology Inc., "microID 13.56 MHz Design Guide—MCRF355/360 Reader Reference Design," 24 pages (2001).
Minkel, J R.,"Wireless Energy Lights Bulb from Seven Feet Away—Physicists vow to cut the cord between your laptop battery and the wall socket—with just a simple loop of wire",Scientific American,http://www.scientificamerican.com/article.cfm?id=wireless-energy-lights-bulb-from-seven-feet-away,Jun. 7, 2007,1 page.
Minkel, J R.,"Wireless Energy Transfer May Power Devices at a Distance",Scientific American,Nov. 14, 2006,1 page.
Morgan, J., "Lab report: Pull the plug for a positive charge", The Herald, Web Issue 2680, (Nov. 16, 2006) 3 pages.
Moskvitch, Katia, "Wireless charging—the future for electric cars?", BBC News Technology (See www.bbc.co.uk/news/technology—14183409) (dated Jul. 21, 2011).
O'Brien et al., "Analysis of Wireless Power Supplies for Industrial Automation Systems", IEEE, pp. 367-372 (Nov. 2-6, 2003).
O'Brien et al., "Design of Large Air-Gap Transformers for Wireless Power Supplies", IEEE, pp. 1557-1562 (Jun. 15-19, 2003).
Pendry, J. B., "A Chiral Route to Negative Refraction", Science, vol. 306:1353-1355 (2004).
Physics Today, "Unwired energy questions asked answered", Sep. 2007, pp. 16-17.
Powercast LLC. "White Paper" Powercast simply wire free, 2003.
PR News Wire, "The Big Story for CES 2007: The public debut of eCoupled Intelligent Wireless Power", Press Release, Fulton Innovation LLC, Las Vegas, NV, (Dec. 27, 2006) 3 pages.
Press Release, "The world's first sheet-type wireless power transmission system: Will a socket be replaced by e-wall?", Public Relations Office, School of Engineering, University of Tokyo, Japan, Dec. 12, 2006, 4 pages.
PRESSTV, "Wireless power transfer possible", http://edition.presstv.ir/detail/12754.html, Jun. 11, 2007, 1 page.
Reidy, C. (Globe Staff), "MIT discovery could unplug your iPod forever", Boston.com, http://www.boston.com/ business/ticker/2007/06/mit_discovery_c.html, (Jun. 7, 2007) 3 pages.
Risen, C., "Wireless Energy", The New York Times, (Dec. 9, 2007) 1 page.
Sakamoto et al., "A Novel Circuit for Non-Contact Charging Through Electro-Magnetic Coupling", IEEE, pp. 168-174 (1992).
Scheible, G. et al., "Novel Wireless Power Supply System for Wireless Communication Devices in Industrial Automation Systems", IEEE, pp. 1358-1363, (Nov. 5-8, 2002).
Schneider, D. "A Critical Look at Wireless Power", *IEEE Spectrum*, pp. 35-39 (May 2010).
Schneider, David, "Electrons Unplugged. Wireless power at a distance is still far away", *IEEE Spectrum*, pp. 35-39 (May 2010).
Schuder, J. C. et al., "An Inductively Coupled RF System for the Transmission of 1 kW of Power Through the Skin", *IEEE Transactions on Bio-Medical Engineering*, vol. BME-18, No. 4, pp. 265-273 (Jul. 1971).
Schuder, J. C., "Powering an Artificial Heart: Birth of the Inductively Coupled-Radio Frequency System in 1960", *Artificial Organs*, vol. 26:909-915 (2002).
Schuder, J.C. et al., "Energy Transport Into the Closed Chest From a Set of Very-Large Mutually Orthogonal Coils", Communication Electronics, vol. 64:527-534 (Jan. 1963).
Schutz, J. et al., "Load Adaptive Medium Frequency Resonant Power Supply", IEEE, pp. 282-287 (Nov. 2002).
Sekitani et al. "A large-area wireless power-transmission sheet using printed organic transistors and plastic MEMS switches" www.nature.com/naturematerials. Published online Apr. 29, 2007.
Sekitani et al., "A large-area flexible wireless power transmission sheet using printed plastic MEMS switches and organic field-effect transistors", IEDM '06, International Electron Devices Meeting, (Dec. 11-13, 2006) 4 pages.

Sekiya, H. et al., "FM/PWM control scheme in class DE inverter", IEEE Trans. Circuits Syst. I, vol. 51(7) (Jul. 2004).
Senge, M., "MIT's wireless electricity for mobile phones", Vanguard, http://www.vanguardngr.com/articles/2002/features/gsm/gsm211062007.htm, (Jun. 11, 2007) 1 page.
Sensiper, S., "Electromagnetic wave propogation on helical conductors", Technical Report No. 194 (based on PhD Thesis), Massachusetts Institute of Technology, (May 16, 1951) 126 pages.
Soljacic, M. , "Wireless Non-Radiative Energy Transfer—PowerPoint presentation". Massachusetts Institute of Technology, (Oct. 6, 2005).
Soljacic, M. et al., "Wireless Energy Transfer Can Potentially Recharge Laptops Cell Phones Without Cords", (Nov. 14, 2006) 3 pages.
Soljacic, M. et al., "Photonic-crystal slow-light enhancement of nonlinear phase sensitivity", *J. Opt. Soc. Am B*, vol. 19, No. 9, pp. 2052-2059 (Sep. 2002).
Soljacic, M., "Wireless nonradiative energy transfer", *Visions of Discovery New Light on Physics, Cosmology, and Consciousness*, Cambridge University Press, New York, NY pp. 530-542 (2011).
Someya, Takao. "The world's first sheet-type wireless power transmission system". University of Tokyo, (Dec. 12, 2006).
Staelin, David H. et al., Electromagnetic Waves, Chapters 2, 3, 4, and 8, pp. 46-176 and 336-405 (Prentice Hall Upper Saddle River, New Jersey 1998).
Stark III, Joseph C., "Wireless Power Transmission Utilizing a Phased Array of Tesla Coils", Master Thesis, Massachusetts Institute of Technology (2004).
Stewart, W., "The Power to Set you Free", Science, vol. 317:55-56 (Jul. 6, 2007).
Tang, S.C. et al., "Evaluation of the Shielding Effects on Printed-Circuit-Board Transformers Using Ferrite Plates and Copper Sheets", *IEEE Transactions on Power Electronics*, vol. 17:1080-1088 (Nov. 2002).
Tesla, Nikola, "High Frequency Oscillators for Electro-Therapeutic and Other Purposes", *Proceedings of the IEEE*, vol. 87:1282-1292 (Jul. 1999).
Tesla, Nikola, "High Frequency Oscillators for Electro-Therapeutic and Other Purposes", *The Electrical Engineer*, vol. XXVI, No. 50 (Nov. 17, 1898).
Texas Instruments, "HF Antenna Design Notes—Technical Application Report," Literature No. 11-08-26-003, 47 pages (Sep. 2003).
Thomsen et al., "Ultrahigh speed all-optical demultiplexing based on two-photon absorption in a laser diode," Electronics Letters, 34(19):1871-1872 (Sep. 17, 1998).
UPM Rafsec, "Tutorial overview of inductively coupled RFID Systems," 7 pages (May 2003).
Valtchev et al. "Efficient Resonant Inductive Coupling Energy Transfer Using New Magnetic and Design Criteria". IEEE, pp. 1293-1298, 2005.
Vandevoorde et al., "Wireless energy transfer for stand-alone systems: a comparison between low and high power applicability", Sensors and Actuators, vol. 92:305-311 (2001).
Vilkomerson, David et al., "Implantable Doppler System for Self-Monitoring Vascular Grafts", *IEEE Ultrasonics Symposium*, pp. 461-465 (2004).
Villeneuve, Pierre R. et al., "Microcavities in photonic crystals: Mode symmetry, tunability, and coupling efficiency", *Physical Review B*, vol. 54:7837-7842 (Sep. 15, 1996).
Yariv, Amnon et al., "Coupled-resonator optical waveguide: a proposal and analysis", *Optics Letters*, vol. 24(11):711-713 (Jun. 1, 1999).
Yates, David C. et al., "Optimal Transmission Frequency for Ultralow-Power Short-Range Radio Links", IEEE Transactions on Circuits and Systems—1, Regular Papers, vol. 51:1405-1413 (Jul. 2004).
Yoshihiro Konishi, *Microwave Electronic Circuit Technology*, Chapter 4, pp. 145-197 (Marcel Dekker, Inc., New York, NY 1998).
Ziaie, Babak et al., "A Low-Power Miniature Transmitter Using a Low-Loss Silicon Platform for Biotelemetry", *Proceedings—19th International Conference IEEE/EMBS*, pp. 2221-2224, (Oct. 30-Nov. 2, 1997) 4 pages.

(56) References Cited

OTHER PUBLICATIONS

Zierhofer, Clemens M. et al., "High-Efficiency Coupling-Insensitive Transcutaneous Power and Data Transmission Via an Inductive Link", *IEEE Transactions on Biomedical Engineering*, vol. 37, No. 7, pp. 716-722 (Jul. 1990).
PCT/US2013/065963, International Search Report and Written Opinion for PCT/US2013/065963, mailed Oct. 29, 2014, 14 pages.
PCT/US2011/054544, International Preliminary Report on Patentability for PCT/US2011/054544, mailed on Apr. 18, 2013, 13 pages.
PCT/US2011/054544, International Search Report and Written Opinion for PCT/US2011/054544, mailed Jan. 30, 2012, 17 pages.
PCT/US2012/054490, International Preliminary Report on Patentability for PCT/US2012/054490, mailed on Mar. 20, 2014, 7 pages.
PCT/US2012/054490, International Search Report and Written Opinion for PCT/US2012/054490, mailed Feb. 28, 2013, 8 pages.
Final Office Action, U.S. Appl. No. 12/899,281, mailed on Jun. 24, 2014 by Adi, Amrany (14 pages).
Final Office Action, U.S. Appl. No. 12/899,281, mailed on Dec. 6, 2013 by Adi, Amrany (8 pages).
Final Office Action, U.S. Appl. No. 12/899,281, mailed on Sep. 6, 2013 by Adi, Amrany (12 pages).
Non-Final Office Action, U.S. Appl. No. 12/899,281, mailed on May 23, 2013 by Adi, Amrany (11 pages).
Restriction Requirement, U.S. Appl. No. 12/899,281, mailed on Mar. 21, 2013 by Adi, Amrany (7 pages).
Response to Office Action in U.S. Appl. No. 12/899,281, filed May 6, 2014 (15 pages).
Response to Office Action in U.S. Appl. No. 12/899,281, filed Nov. 26, 2013 (11 pages).
Response to Office Action in U.S. Appl. No. 12/899,281, filed Aug. 23, 2013 (16 pages).
Response to Restriction Requirement in U.S. Appl. No. 12/899,281, filed Apr. 19, 2013 (14 pages).
Australian Patent Examination Report No. 1 for Australian Application No. 2011312376 dated May 26, 2014 (3 pages).
Supplementary European Search Report for Application No. 11831382 dated Jan. 26, 2015 (8 pages).
PCT/US2013/065963, International Application No. PCT/US2013/065963, International Preliminary Report on Patentability, mailed on Apr. 30, 2015, 11 pages.
Supplementary European Search Report for European Application No. EP 12 83 0255 dated Apr. 8, 2015 (3 pages).
EPO Communication for European Application No. 12 830 255.1 dated Apr. 28, 2015 (6 pages).
Canadian Office Action for Application No. 2,813,678 dated Feb. 24, 2015 (4 pages).
Japanese Office Action for Japanese Application No. 2013-532855 dated Mar. 2, 2015 (9 pages).
The State Intellectual Property Office of the People's Republic of China, English Translation of the Notification of the First Office Action issued on Dec. 1, 2014 for CN Appl. No. CN201180055093.2, 41 pages.

* cited by examiner

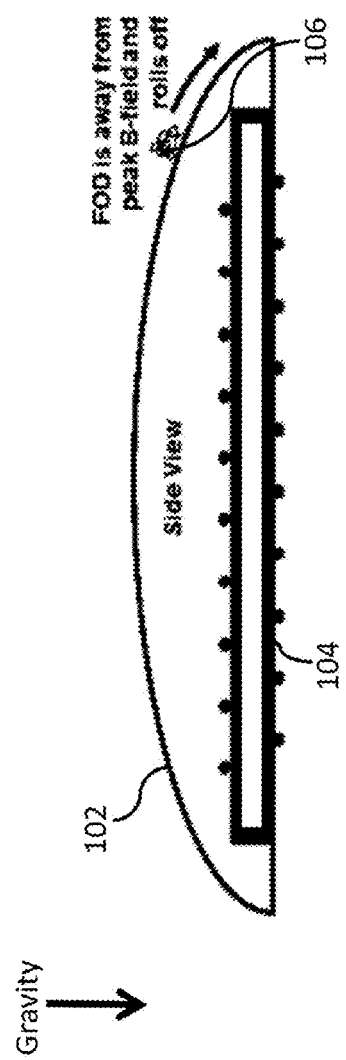

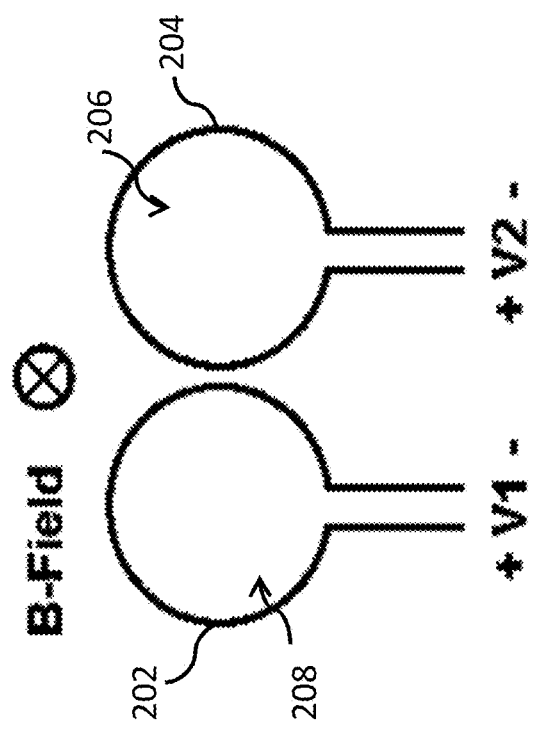

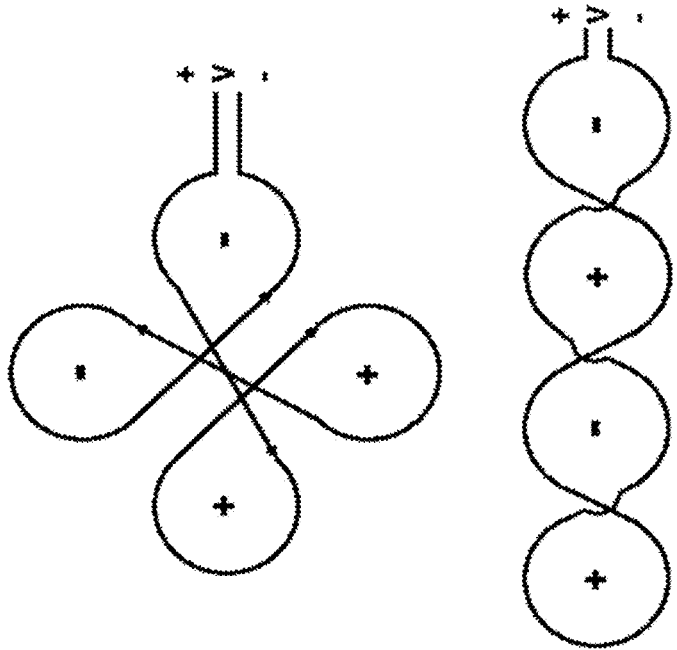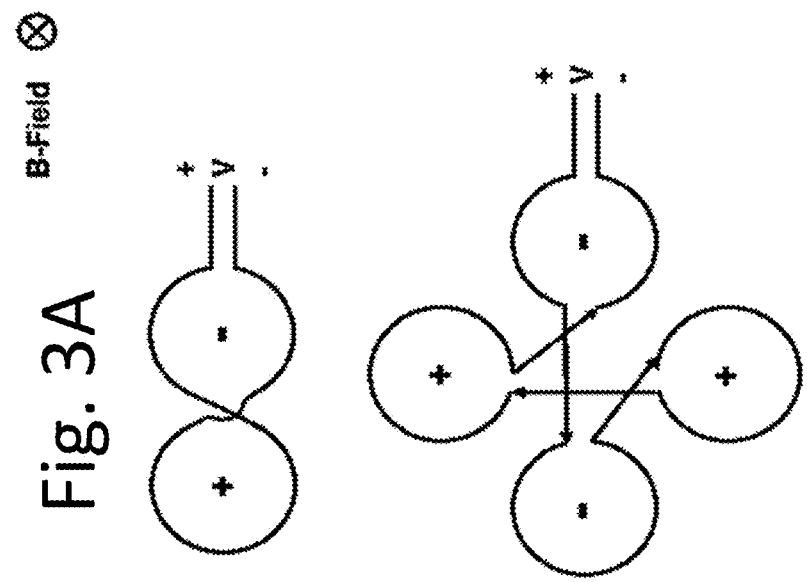

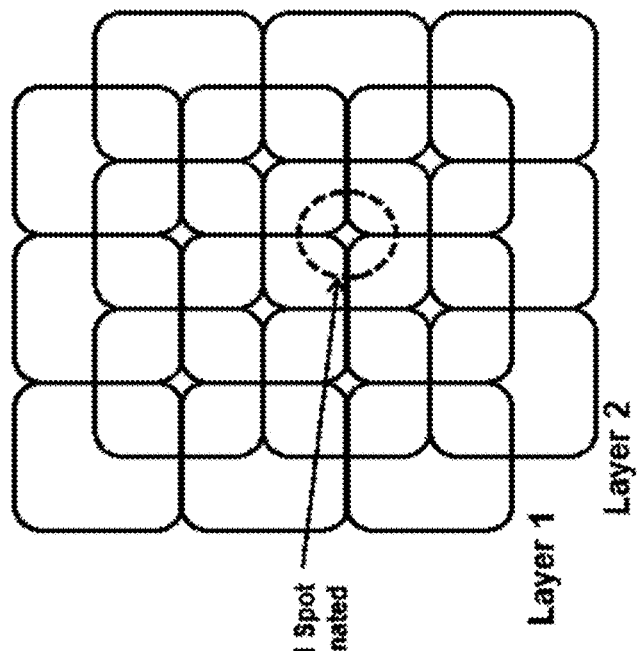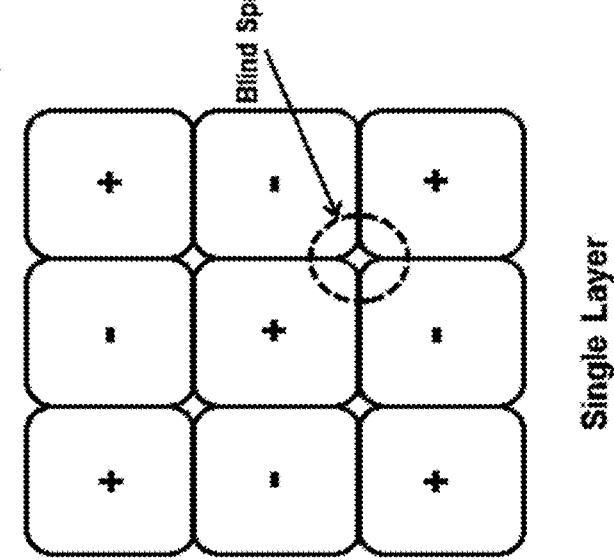

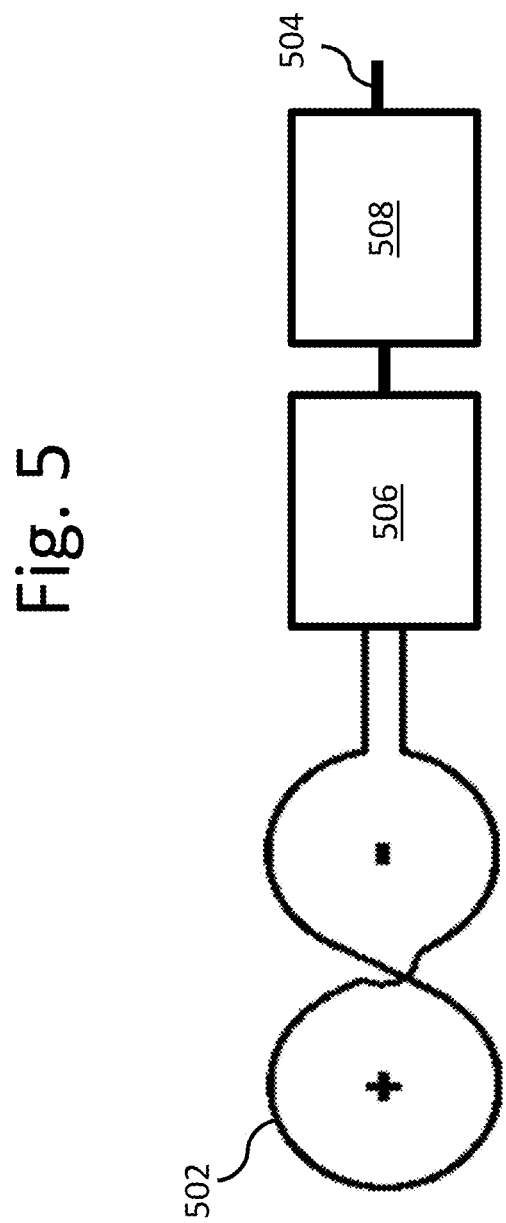

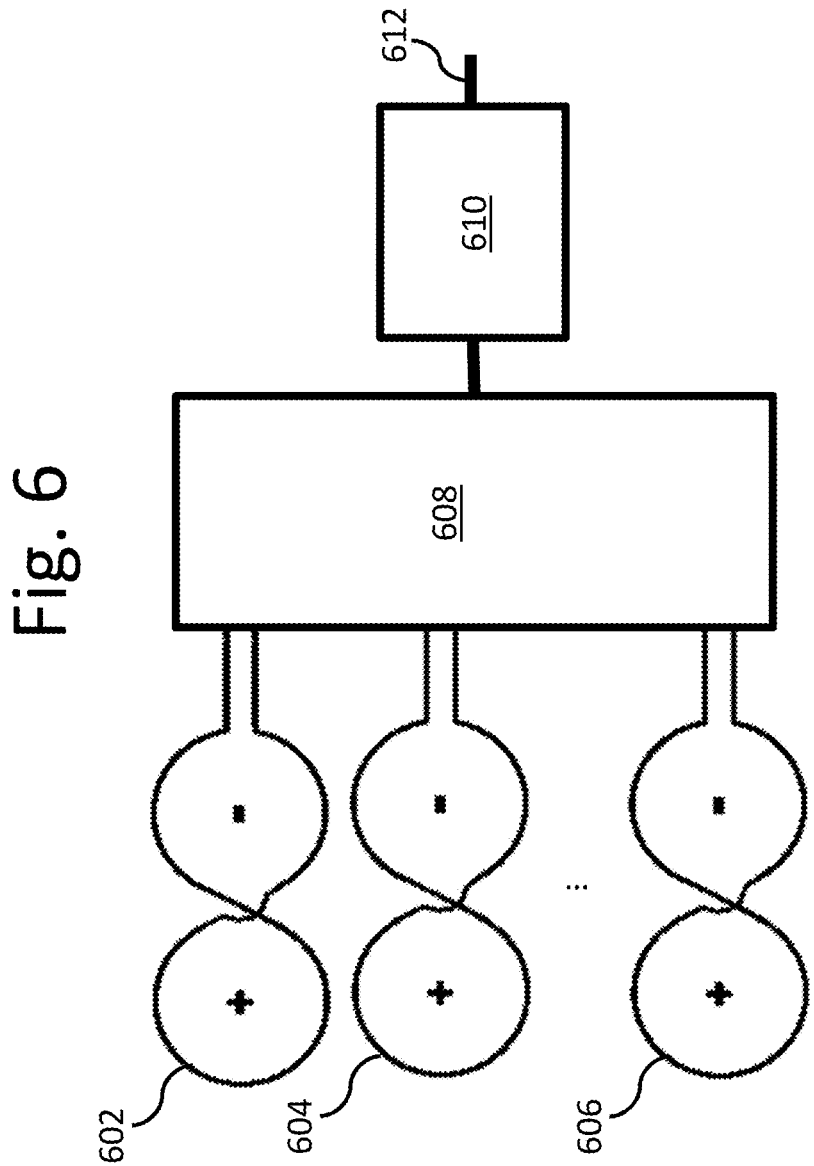

Fig. 18
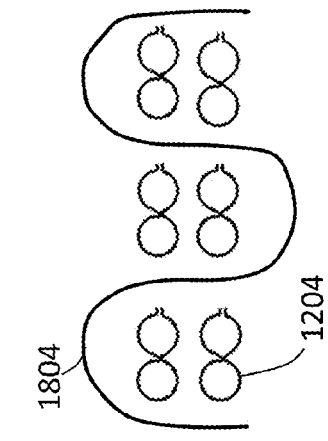
Fig. 18C
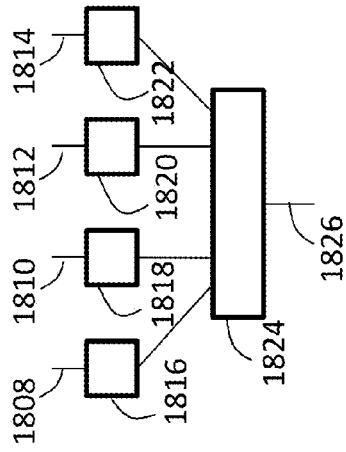
Fig. 18F
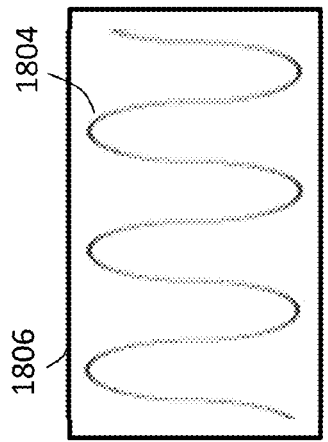
Fig. 18B
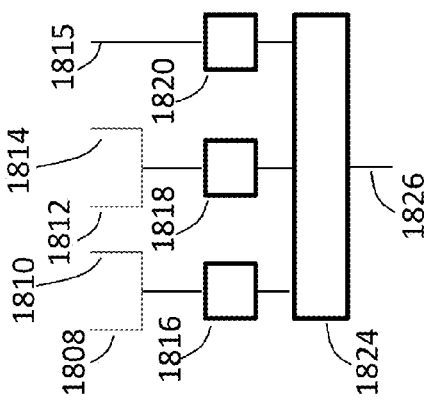
Fig. 18E
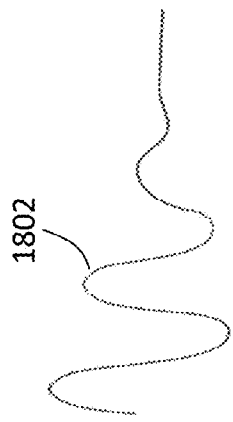
Fig. 18A
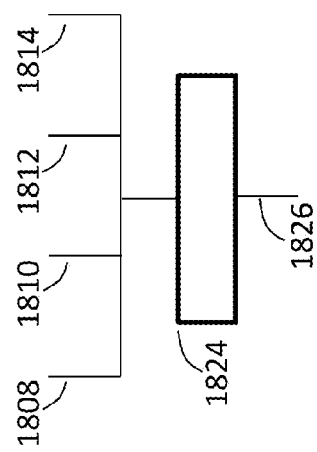
Fig. 18D

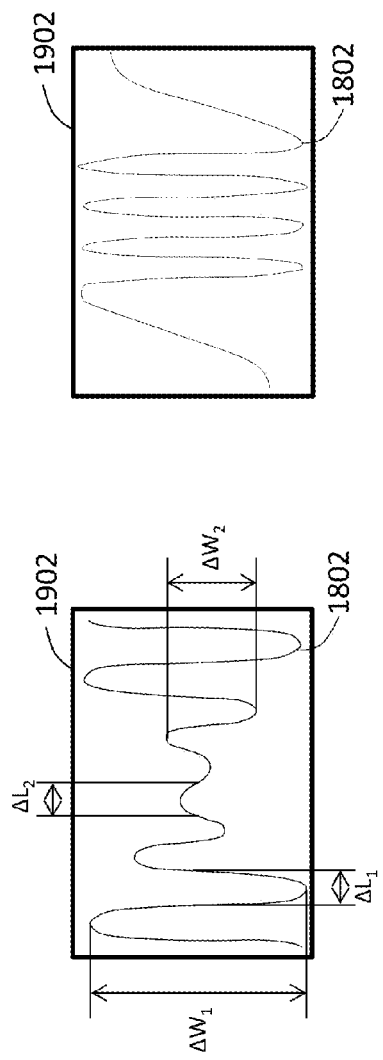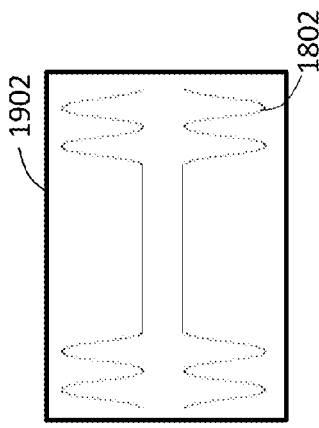
Fig. 20

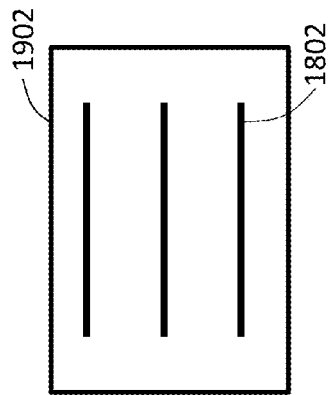
Fig. 21A
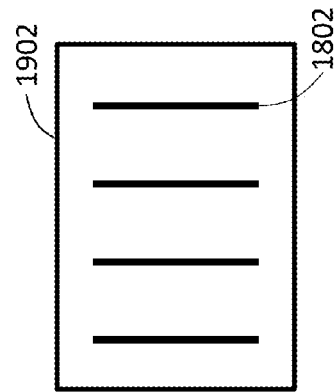
Fig. 21C
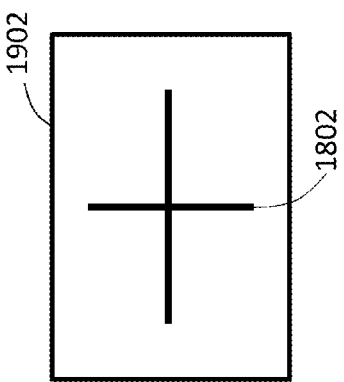
Fig. 21B
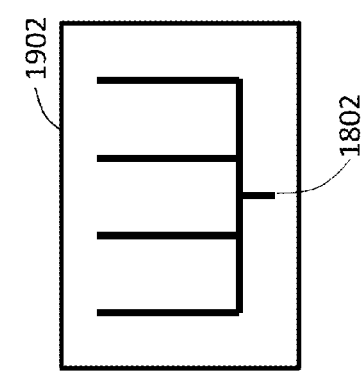
Fig. 21D
Fig. 21

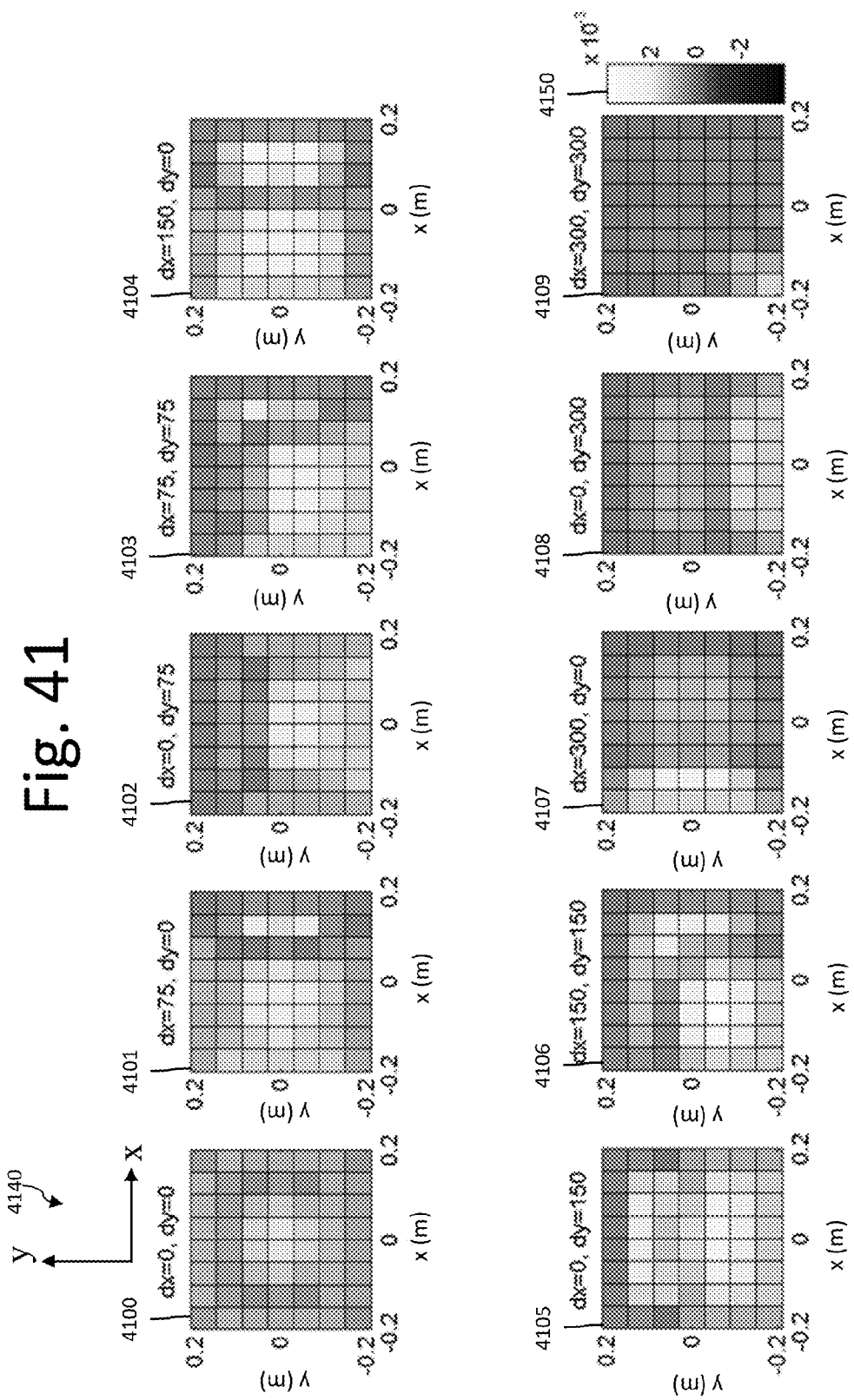

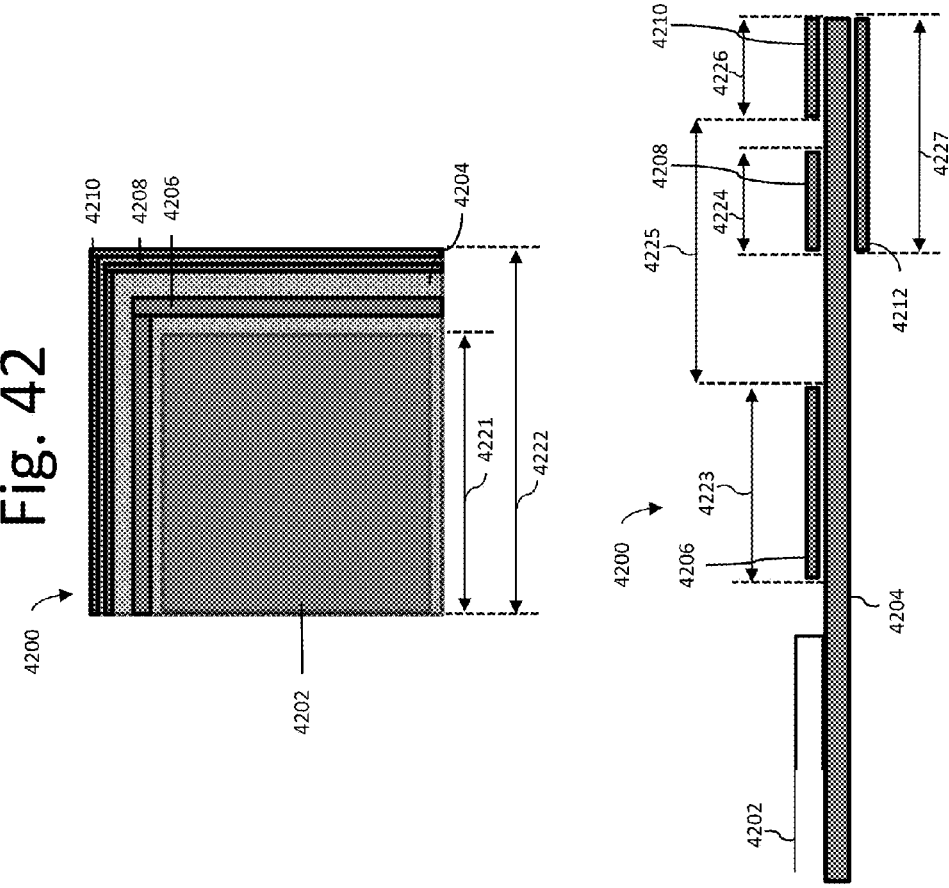

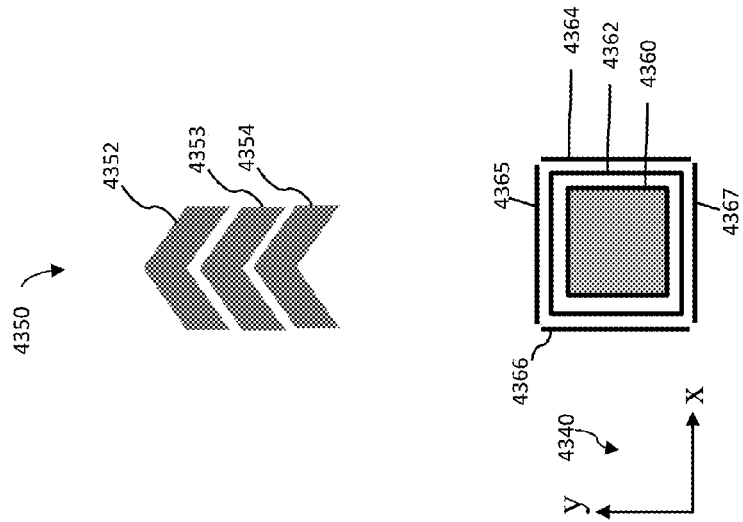
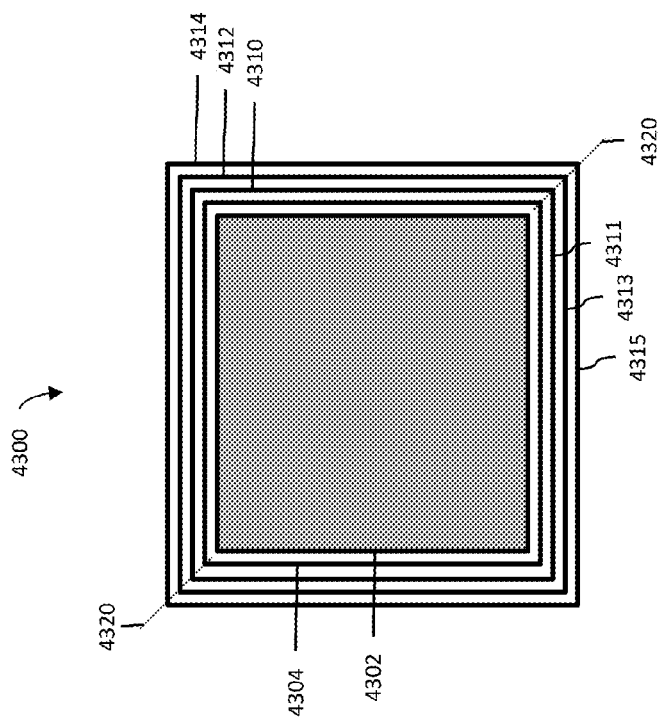
Fig. 43A
Fig. 43B

FOREIGN OBJECT DETECTION IN WIRELESS ENERGY TRANSFER SYSTEMS

CROSS-REFERENCE TO RELATED APPLICATIONS

This application claims priority to: U.S. Provisional Patent Application No. 61/716,432, filed on Oct. 19, 2012; U.S. Provisional Patent Application No. 61/866,703, filed on Aug. 16, 2013; and U.S. Provisional Patent Application No. 61/877,482, filed on Sep. 13, 2013. The entire disclosures of the above listed applications are incorporated by reference into this application.

TECHNICAL FIELD

This disclosure relates to wireless energy transfer and methods for detecting foreign object debris (FOD) on wireless power transmission systems.

BACKGROUND

Energy or power may be transferred wirelessly using a variety of known radiative, or far-field, and non-radiative, or near-field, techniques as detailed, for example, in commonly owned U.S. patent application Ser. No. 12/613,686 published on May 6, 2010 as US 2010/010909445 and entitled "Wireless Energy Transfer Systems," U.S. patent application Ser. No. 12/860,375 published on Dec. 9, 2010 as 2010/0308939 and entitled "Integrated Resonator-Shield Structures," U.S. patent application Ser. No. 13/222,915 published on Mar. 15, 2012 as 2012/0062345 and entitled "Low Resistance Electrical Conductor," U.S. patent application Ser. No. 13/283,811 published on Oct. 4, 2012 as 2012/0248981 and entitled "Multi-Resonator Wireless Energy Transfer for Lighting," the contents of which are incorporated by reference.

SUMMARY

In general, in a first aspect, the disclosure features wireless power transfer systems that include a power source featuring at least one resonator, a power receiver featuring at least one resonator, where the power receiver is configured to receive electrical power transmitted wirelessly by the power source, a first detector featuring one or more loops of conductive material, where the first detector is configured to generate an electrical signal based on a magnetic field between the power source and the power receiver, a second detector featuring conductive material, and control electronics coupled to the first and second detectors, where during operation of the system, the control electronics are configured to: measure the electrical signal of the first detector, compare the measured electrical signal of the first detector to baseline electrical information for the first detector to determine information about whether debris is positioned between the power source and the power receiver; measure an electrical signal of the second detector, where the electrical signal of the second detector is related to a capacitance of the second detector; and compare the measured electrical signal of the second detector to baseline electrical information for the second detector to determine information about whether a living object is positioned between the power source and the power receiver.

Embodiments of the systems can include any one or more of the following features.

The power source can be a component of a vehicle charging station. The power receiver can be a component of a vehicle. The electrical signal generated by the first detector can include at least one of a voltage and a current. The electrical signal of the second detector can include at least one of a voltage and a capacitance.

The baseline electrical information for the first detector can correspond to an electrical signal of the first detector when no debris is positioned between the power source and the power receiver. The baseline electrical information for the second detector can correspond to an electrical signal of the second detector when no living objects are positioned between the power source and the power receiver.

Determining information about whether debris is positioned between the power source and the power receiver can include comparing a likelihood value that debris is positioned between the power source and the power receiver to a threshold value. The control electronics can be configured to determine the likelihood value by calculating mean and covariance matrices for the baseline electrical information for the first detector, and determining the likelihood value based on the mean and covariance matrices. Determining information about whether a living object is positioned between the power source and the power receiver can include comparing the measured electrical signal of the second detector to a threshold value.

The first detector can include multiple loops of conductive material positioned in at least a first plane between the power source and the power receiver. The second detector can include a length of conductive material positioned in at least a second plane between the power source and the power receiver. The first and second planes can be parallel. The first and second planes can be the same plane.

A magnetic field generated by the power source in the second plane can have a full width at half maximum cross-sectional distribution, and a circular perimeter of minimum size that encircles the second detector in the second plane has an enclosed area that is 100% or more (e.g., 110% or more, 120% or more, 130% or more, 140% or more, 150% or more, 175% or more, 200% or more) of the full width at half maximum cross-sectional distribution.

The length of conductive material can form a serpentine pathway in the second plane. The length of conductive material can include a plurality of segments extending substantially in a common direction, and a spacing between at least some of the segments can vary in a direction perpendicular to the common direction. A magnetic flux density generated by the power source in a first region of the second plane can be larger than a magnetic flux density in a second region of the second plane, and a spacing between successive segments in the first region can be smaller than in the second region.

The first detector can include a plurality of loops spaced from one another in the first plane, and a spacing between adjacent loops can vary. A magnetic flux density generated by the power source in a first region of the first plane can be larger than a magnetic flux density in a second region of the first plane, and the spacing between adjacent loops can be smaller in the first region than in the second region. The first and second planes can be positioned closer to the power receiver than to the power source.

A total cross-sectional area of the at least one resonator of the power receiver can be 80% or more (e.g., 90% or more, 100% or more, 120% or more, 140% or more, 150% or more, 175% or more) of a full-width at half maximum cross-sectional area of a magnetic field generated by the power source at a position of the power receiver.

The power source can be configured to transfer 1 kW or more (e.g., 2 kW or more, 3 kW or more, 4 kW or more, 6 kW or more, 8 kW or more, 10 kW or more, 15 kW or more, 20 kW or more) of power to the power receiver.

The power source can be configured to transfer power at multiple different energy transfer rates to the power receiver. The control electronics can be configured to: adjust the power source to transfer power at a selected one of the multiple different energy transfer rates; and obtain baseline electrical information that corresponds to the selected energy transfer rate.

Obtaining the baseline electrical information can include retrieving the information from an electronic storage unit. The control electronics can be configured to measure the baseline electrical information by: activating the power source with no debris in the vicinity of the power source to generate a magnetic flux through the first detector; and measuring the electrical signal of the first detector in response to the magnetic flux. The control electronics can be configured to activate the power source and to measure the electrical signal of the first detector with the power source and the power receiver at least partially aligned. The control electronics can be configured to activate the power source and to measure the electrical signal of the first detector without power transfer occurring between the power source and the power receiver.

The power source can be configured to generate a magnetic flux of at least 6.25 µT (e.g., at least 7 µT, at least 8 µT, at least 10 µT, at least 15 µT, at least 20 µT, at least 30 µT, at least 50 µT) at a position between the power source and the power receiver.

The first detector can include multiple loops, and the control electronics can be configured to measure electrical signals generated by at least some of the multiple loops to determine information about misalignment between the power source and the power receiver based on the measured electrical signal. The at least some of the multiple loops can be positioned adjacent to an edge of the power source. The control electronics can be configured to determine the information about misalignment by comparing electrical signals generated by the at least some of the multiple loops.

The control electronics can be configured so that if the likelihood value corresponding to whether debris is positioned between the power source and the power receiver exceeds the threshold value, the control electronics interrupt wireless power transfer between the power source and the power receiver. The control electronics can be configured so that if the likelihood value corresponding to whether debris is positioned between the power source and the power receiver exceeds the threshold value, the control electronics reduce an energy transfer rate between the power source and the power receiver. The control electronics can be configured so that if the likelihood value corresponding to whether debris is positioned between the power source and the power receiver exceeds the threshold value, the control electronics provide a warning indicator to a user of the wireless power transfer system.

The control electronics can be configured so that if the measured electrical signal of the second detector exceeds the threshold value, the control electronics interrupt wireless power transfer power the power source and the power receiver. The control electronics can be configured so that if the measured electrical signal of the second detector exceeds the threshold value, the control electronics reduce a magnitude of a magnetic field generated by the power source. The control electronics can be configured so that if the measured electrical signal of the second detector exceeds the threshold value, the control electronics provide a warning indicator to a user of the wireless power transfer system.

Each resonator in the power source can be an electromagnetic resonator having a resonant frequency $f=\omega/2\pi$, an intrinsic loss rate $\Gamma$, and a Q-factor $Q=\omega/(2\Gamma)$, and the Q-factor for at least one of the resonators in the power source can be greater than 100. Each resonator in the power source can have a capacitance and an inductance that define the resonant frequency f. The Q-factor for at least one of the resonators in the power source can be greater than 300.

Each resonator in the power receiver can be an electromagnetic resonator having a resonant frequency $f=\omega/2\pi$, an intrinsic loss rate $\Gamma$, and a Q-factor $Q=\omega/(2\Gamma)$, and the Q-factor for at least one of the resonators in the power receiver can be greater than 100. Each resonator in the power receiver can have a capacitance and an inductance that define the resonant frequency f. The Q-factor for at least one of the resonators in the power receiver can be greater than 300.

Embodiments of the systems can also include any of the other features disclosed herein, in any combination, as appropriate.

In another aspect, the disclosure features methods that include measuring an electrical signal generated by a first detector featuring one or more loops of conductive material positioned between a power source and a power receiver in a wireless power transfer system, comparing the measured electrical signal generated by the first detector to baseline electrical information for the first detector to determine information about whether debris is positioned between the power source and the power receiver, measuring an electrical signal generated by a second detector featuring conductive material, where the electrical signal of the second detector is related to a capacitance of the second detector, and comparing the measured electrical signal generated by the second detector to baseline electrical information for the second detector to determine information about whether a living object is positioned between the power source and the power receiver.

Embodiments of the methods can include any one or more of the following features.

The power receiver can be a component of a vehicle, and the methods can include using the power source to transfer electrical power to the vehicle. The baseline electrical information for the first detector can correspond to an electrical signal of the first detector when no debris is positioned between the power source and the power receiver. The baseline electrical information for the second detector can correspond to an electrical signal of the second detector when no living objects are positioned between the power source and the power receiver.

Determining information about whether debris is positioned between the power source and the power receiver can include comparing a likelihood value that debris is positioned between the power source and the power receiver to a threshold value. The methods can include determining the likelihood value by calculating mean and covariance matrices for the baseline electrical information for the first detector, and determining the likelihood value based on the mean and covariance matrices. Determining information about whether a living object is positioned between the power source and the power receiver can include comparing the measured electrical signal of the second detector to a threshold value.

The methods can include using the power source to transfer 1 kW or more (e.g., 2 kW or more, 3 kW or more, 4 kW or more, 6 kW or more, 8 kW or more, 10 kW or more, 15 kW or more, 20 kW or more) of power to the power receiver.

The power source can be configured to transfer power at multiple different energy transfer rates to the power receiver, and the methods can include adjusting the power source to transfer power at a selected one of the multiple different energy transfer rates, and obtaining baseline electrical information that corresponds to the selected energy transfer rate. Obtaining the baseline electrical information can include retrieving the information from an electronic storage unit.

The methods can include activating the power source with no debris in the vicinity of the power source to generate a magnetic flux through the first detector, and measuring the electrical signal of the first detector in response to the magnetic flux to obtain the baseline electrical information for the first detector. The methods can include activating the power source and measuring the electrical signal of the first detector with the power source and the power receiver at least partially aligned. The methods can include activating the power source and measuring the electrical signal of the first detector without power transfer occurring between the power source and the power receiver.

The methods can include generating a magnetic flux of 6.25 $\mu$T or more (e.g., 7 $\mu$T or more, 8 $\mu$T or more, 10 $\mu$T or more, 15 $\mu$T or more, 20 $\mu$T or more, 30 $\mu$T or more, 50 $\mu$T or more) between the power source and the power receiver.

The methods can include measuring electrical signals generated by multiple loops of the first detector, and determining information about misalignment between the power source and the power receiver based on the measured electrical signals. The methods can include determining the information about misalignment by comparing electrical signals generated by the multiple loops.

The methods can include interrupting wireless power transfer between the power source and the power receiver if the likelihood value corresponding to whether debris is positioned between the power source and the power receiver exceeds the threshold value. The methods can include reducing an energy transfer rate between the power source and the power receiver if the likelihood value corresponding to whether debris is positioned between the power source and the power receiver exceeds the threshold value. The methods can include providing a warning indicator if the likelihood value corresponding to whether debris is positioned between the power source and the power receiver exceeds the threshold value.

The methods can include interrupting wireless power transfer between the power source and the power receiver if the measured electrical signal of the second detector exceeds the threshold value. The methods can include reducing an energy transfer rate between the power source and the power receiver if the measured electrical signal of the second detector exceeds the threshold value. The methods can include providing a warning indicator if the measured electrical signal of the second detector exceeds the threshold value.

The methods can also include any of the other steps and/or features disclosed herein, in any combination, as appropriate.

In a further aspect, the disclosure features an apparatus for detecting debris and living objects, the apparatus including a first detector featuring one or more loops of conductive material, where the first detector is configured to generate an electrical signal based on a magnetic field between a power source and a power receiver of a wireless power transfer system, a second detector featuring conductive material, and control electronics coupled to the first and second detectors, where during operation of the wireless power transfer system, the control electronics are configured to: measure the electrical signal of the first detector; compare the measured electrical signal of the first detector to baseline electrical information for the first detector to determine information about whether debris is positioned between the power source and the power receiver of the wireless power transfer system; measure an electrical signal of the second detector, where the electrical signal of the second detector is related to a capacitance of the second detector; and compare the measured electrical signal of the second detector to baseline electrical information for the second detector to determine information about whether a living object is positioned between the power source and the power receiver of the wireless power transfer system.

Embodiments of the apparatus can include any of the features disclosed herein, including any of the features disclosed herein in connection with any of the systems, in any combination, as appropriate.

In another aspect, the disclosure features a wireless power transfer system, including a power source featuring at least one resonator, a power receiver featuring at least one resonator, where the power receiver is configured to receive electrical power transmitted wirelessly by the power source, a detector positioned between the power source and the power receiver, where the detector is configured to generate an electrical signal based on a magnetic field between the power source and the power receiver, and control electronics coupled to the power source and detector, where the control electronics are configured to: activate the power source to generate a magnetic field between the power source and the power receiver; measure the electrical signal of the detector; and determine whether debris is positioned between the power source and the power receiver by comparing baseline information to the measured electrical signal, where the baseline information includes information about an electrical signal generated by the detector when no debris is positioned between the power source and the power receiver, and where the control electronics are configured to compare the baseline information to the measured signal by determining mean and covariance matrices for the baseline information and determining whether debris is positioned between the power source and the power receiver based on the mean and covariance matrices.

Embodiments of the systems can include any one or more of the following features.

The control electronics can be configured to calculate a likelihood value that debris is positioned between the power source and the power receiver based on the mean and covariance matrices. The control electronics can be configured to calculate a probability value between 0 and 1 that debris is positioned between the power source and the power receiver, based on the likelihood value. The control electronics can be configured to determine whether debris is positioned between the power source and the power receiver by comparing the likelihood value to a threshold likelihood value.

The control electronics can be configured to obtain the baseline information. The control electronics can be configured to obtain the baseline information by retrieving the information from an electronic storage unit. The control electronics can be configured to obtain the baseline information by activating the power source with no debris in the vicinity of the power source to generate a magnetic flux through the detector, and measuring the electrical signal of the detector in response to the magnetic flux. The control electronics can be configured to activate the power source and to measure the electrical signal of the detector with the power source and the power receiver at least partially aligned. The control electronics can be configured to activate the power source and to measure the electrical signal of the detector without power transfer occurring between the power source and the power receiver.

The baseline information can include information about electrical signals generated by the detector that correspond to different operating states of the system. The different operating states can correspond to different energy transfer rates between the power source and the power receiver. The different operating states correspond to different alignments between the power source and the power receiver. The different operating states can correspond to different spacings between the power source and the power receiver measured along a direction orthogonal to a plane defined by the at least one resonator of the power source.

The control electronics can be configured to obtain the baseline information by measuring the electrical signal of the detector multiple times in response to the magnetic flux, and the mean and covariance matrices can include contributions from the multiple measurements of the electrical signal. The control electronics can be configured to generate mean and covariance matrices that correspond to each of the different operating states. The control electronics can be configured to determine the operating state of the system by comparing the measured electrical signal of the detector to the mean and covariance matrices corresponding to each of the different operating states.

The power source can be a component of a vehicle charging station. The power receiver can be a component of a vehicle.

The electrical signal generated by the detector can include at least one of a voltage and a current. The detector can include multiple loops of conductive material positioned between the power source and the power receiver. The multiple loops can be spaced from one another in the plane, and a spacing between adjacent loops can vary.

A magnetic flux density generated by the power source in a first region of the plane can be larger than a magnetic flux density in a second region of the plane, and the spacing between adjacent loops can be smaller in the first region than in the second region.

The detector can be positioned closer to the power receiver than to the power source. A total cross-sectional area of the at least one resonator of the power receiver can be 80% or more (e.g., 90% or more, 100% or more, 120% or more, 140% or more, 150% or more, 175% or more) of a full-width at half maximum cross-sectional area of a magnetic field generated by the power source at a position of the power receiver.

The power source is configured to transfer 1 kW or more (e.g., 2 kW or more, 3 kW or more, 4 kW or more, 6 kW or more, 8 kW or more, 10 kW or more, 15 kW or more, 20 kW or more) of power to the power receiver.

The control electronics can be configured to compare the measured signal to a portion of the baseline information that corresponds to the operating state of the system.

The power source can be configured to generate a magnetic flux of 6.25 µT or more (e.g., 7 µT or more, 8 µT or more, 10 µT or more, 15 µT or more, 20 µT or more, 30 µT or more, 50 µT or more) between the power source and the power receiver.

The detector can include multiple loops of conductive material each configured to generate an electrical signal when the power source generates a magnetic field, and the control electronics can be configured to measure the electrical signals generated by at least some of the multiple loops and to determine information about misalignment between the power source and the power receiver based on the measured electrical signals. The at least some of the multiple loops can be positioned adjacent to an edge of the power source. The control electronics can be configured to determine the information about misalignment by comparing electrical signals generated by the at least some of the multiple loops. The control electronics can be configured so that if debris is positioned between the power source and the power receiver, the control electronics interrupt wireless power transfer between the power source and the power receiver.

The control electronics can be configured so that if debris is positioned between the power source and the power receiver, the control electronics reduce an energy transfer rate between the power source and the power receiver. The control electronics can be configured so that if debris is positioned between the power source and the power receiver, the control electronics provide a warning indicator to a user of the wireless power transfer system.

Each resonator in the power source can be an electromagnetic resonator having a resonant frequency $f=\omega/2\pi$, an intrinsic loss rate $\Gamma$, and a Q-factor $Q=\omega/(2\Gamma)$, and the Q-factor for at least one of the resonators in the power source can be greater than 100. Each resonator in the power source can have a capacitance and an inductance that define the resonant frequency f.

The Q-factor for at least one of the resonators in the power source can be greater than 300.

Embodiments of the systems can also include any of the other features disclosed herein, in any combination, as appropriate.

In a further aspect, the disclosure features methods that include activating a power source to generate a magnetic field between the power source and a power receiver of a wireless power transfer system, measuring an electrical signal generated by a detector positioned between the power source and the power receiver, and determining whether debris is positioned between the power source and the power receiver by comparing baseline information to the measured electrical signal, where the baseline information includes information about an electrical signal generated by the detector when no debris is positioned between the power source and the power receiver, and where comparing the baseline information to the measured signal includes determining mean and covariance matrices for the baseline information and determining whether debris is positioned between the power source and the power receiver based on the mean and covariance matrices.

Embodiments of the methods can include any one or more of the following features.

The methods can include determining a likelihood value that debris is positioned between the power source and the power receiver based on the mean and covariance matrices. The methods can include determining a probability value between 0 and 1 that debris is positioned between the power source and the power receiver, based on the likelihood value. The methods can include determining whether debris is positioned between the power source and the power receiver by comparing the likelihood value to a threshold likelihood value.

The methods can include obtaining the baseline information by retrieving the information from an electronic storage unit. The methods can include obtaining the baseline information by activating the power source with no debris in the vicinity of the power source to generate a magnetic flux through the detector, and measuring the electrical signal of the detector in response to the magnetic flux. The methods can include activating the power source and measuring the electrical signal of the detector with the power source and the power receiver at least partially aligned. The methods can include activating the power source and measuring the electrical signal of the detector without power transfer occurring between the power source and the power receiver.

The baseline information can include information about electrical signals generated by the detector that correspond to different operating states of the system. The different operating states can correspond to at least one of different energy transfer rates between the power source and the power receiver, different alignments between the power source and the power receiver, and different spacings between the power source and the power receiver measured along a direction orthogonal to a plane defined by the at least one resonator of the power source. The methods can include obtaining the baseline information by measuring the electrical signal of the detector multiple times in response to the magnetic flux, where the mean and covariance matrices include contributions from the multiple measurements of the electrical signal.

The methods can include generating mean and covariance matrices that correspond to each of the different operating states. The methods can include determining the operating state of the system by comparing the measured electrical signal of the detector to the mean and covariance matrices corresponding to each of the different operating states.

The methods can include using the power source to transfer electrical power to a power receiver in a vehicle. The methods can include using the power source to transfer 1 kW or more (e.g., 2 kW or more, 3 kW or more, 4 kW or more, 6 kW or more, 8 kW or more, 10 kW or more, 15 kW or more, 20 kW or more) of power to the power receiver.

The methods can include comparing the measured signal to a portion of the baseline information that corresponds to the operating state of the system.

The methods can include using the power source to generate a magnetic flux of 6.25 $\mu$T or more (e.g., 7 $\mu$T or more, 8 $\mu$T or more, 10 $\mu$T or more, 15 $\mu$T or more, 20 $\mu$T or more, 30 $\mu$T or more, 50 $\mu$T or more) between the power source and the power receiver.

The methods can include interrupting wireless power transfer between the power source and the power receiver if debris is positioned between the power source and the power receiver. The methods can include reducing an energy transfer rate between the power source and the power receiver if debris is positioned between the power source and the power receiver. The methods can include providing a warning indicator if debris is positioned between the power source and the power receiver.

Embodiments of the methods can also include any of the other steps or features disclosed herein, in any combination, as appropriate.

In another aspect, the disclosure features apparatus for detecting debris, the apparatus including a detector, where the detector is configured so that when the detector is positioned between a power source and a power receiver of a wireless power transfer system, the detector generates an electrical signal based on a magnetic field between the power source and the power receiver, and control electronics coupled to the detector, where the control electronics are configured to: measure the electrical signal of the detector in response to a magnetic field between the power source and the power receiver; and determine whether debris is positioned between the power source and the power receiver by comparing baseline information to the measured electrical signal, where the baseline information includes information about an electrical signal generated by the detector when no debris is positioned between the power source and the power receiver, and where the control electronics are configured to compare the baseline information to the measured signal by determining mean and covariance matrices for the baseline information and determining whether debris is positioned between the power source and the power receiver based on the mean and covariance matrices.

Embodiments of the apparatus can include any of the features disclosed herein, including any of the features disclosed herein in connection with any of the systems, in any combination, as appropriate.

In accordance with exemplary and non-limiting embodiments, a foreign object debris detection system may measure perturbations in the electromagnetic field around the resonators of a wireless energy transfer system using magnetic field sensors and/or gradiometers. The sensors and/or gradiometers may be positioned in the electromagnetic field of a wireless energy transfer system. The sensors and/or gradiometers may be positioned to substantially cover an area over which FOD should be detected. In an embodiment for a wireless power transfer system of a vehicle, an area over which FOD should be detected may include a region of the underside of a vehicle, or the entire underside of a vehicle, or a region larger than the underside of a vehicle, or a region that may not be under the underside of a vehicle. The sensors and/or gradiometers may include loops of wire and/or printed conductor traces forming loops, figure-8 loops, and/or structures including one loop or multiple loops that generate an electrical signal proportional to the amount of magnetic flux crossing the surface area enclosed by the loop and/or loops. The loop and/or loops may be connected to high-input-impedance readout circuitry. The readout circuitry may measure the voltage and/or the current and/or the relative phase of the voltages and/or currents in the loops. In embodiments, a system may include multiple layers of loops to increase the detection probability of FOD. In embodiments, the loops may be designed to operate without significantly affecting characteristics of a wireless power transfer system such as the perturbed quality factors of the resonators, the efficiency of the energy transfer, the amount of power transferred, the amount of heat generated by the system, and the like.

In this disclosure, it is understood that a gradiometer is a type of sensor. A gradiometer may include one or more detectors. For example, the one or more detectors can be used to detect a magnetic field flux around the detector.

In accordance with exemplary and non-limiting embodiments, a foreign object debris detection system may measure perturbations in the electric field around the resonators of a wireless energy transfer system using electric field sensors and/or gradiometers. The sensors and/or gradiometers may be positioned in the electromagnetic field of a wireless energy transfer system. The sensors and/or gradiometers may include lengths of wire and/or printed conductor traces and/or any type of conducting path and they may include a single or multiple conducting paths. The conducting path or paths may be constructed to substantially cover the area where FOD may need to be detected. In an embodiment, an electric field sensor may be a single conducting path that travels back and form across the FOD surface and in another embodiment there may be multiple substantially straight conducting paths that traverse the FOD surface and are sensed individually or after a parallel electrical connection and/or in a multiplexed manner. The electric field sensors and/or gradiometers may be connected to high-input-impedance readout circuitry. The readout circuitry may measure the voltage and/or the current and/or the relative phase of the voltages and/or currents in the sensors. In embodiments, a system may include multiple layers of sensors to increase the detection probability of FOD. In embodiments, sensors may be designed to operate without significantly affecting characteristics of a wireless power transfer system such as the perturbed quality factors of the resonators, the efficiency of the energy transfer, the amount of power transferred, the amount of heat generated by the system, and the like.

In accordance with exemplary and non-limiting embodiments, there is provided a wireless energy transfer system that may include at least one foreign object debris detection system. The system may include at least one wireless energy transfer source configured to generate an oscillating magnetic field. The foreign object debris may be detected by a field sensor positioned in the oscillating electromagnetic field. The voltages and/or currents of the field sensors may be measured using readout circuitry and a feedback loop based on the readings from the sensors may be used to control the parameters of the wireless energy source.

In this disclosure, FOD is used to refer to foreign object debris. It is understood that detecting FOD may be referred as foreign object detection and/or living object detection (LOD). In the industry, it is becoming more common to refer to detecting living objects as LOD, rather than FOD, but it is also generally recognized that FOD include a wide variety of materials and objects. In this disclosure, it is understood that foreign objects may include living objects. Accordingly, although the terms "FOD" and "LOD" are both used, it is understood that LOD may be considered as detecting FOD. Techniques disclosed in relation to detecting FOD are applicable to LOD, and vice versa. For example, an FOD sensor may be used as an LOD sensor, and methods for using an FOD sensor are applicable to an LOD sensor. Further, in this disclosure, a "living object" is an object that is composed, at least partially, of living organic tissue, e.g., cells. A living object can be an entire organism (e.g., a human, an animal, a plant). A living object can also be a portion of an organism (e.g., one or more limbs or body parts of a human, animal, or plant). A living object can also include an object (or a portion thereof) composed, at least partially, of organic tissue that was once living, but is now dead (e.g., a limb of a tree, a body of an animal).

BRIEF DESCRIPTION OF FIGURES

FIG. 1 is a schematic diagram that shows a side view of a resonator with a resonator cover providing passive FOD mitigation.

FIG. 2 is a schematic diagram that shows two loops of wire that may be used as individual field sensors and that may be fashioned into a gradiometer that senses the difference in the magnetic flux captured by the two individual field loops.

FIG. 3A is a schematic diagram that shows a two-lobe configuration of two small conductor loops arranged to have opposed magnetic dipoles, (such a structure may be referred to as a magnetic quadrupole); FIG. 3B is a schematic diagram that shows a 4-lobe configuration of aligned magnetic quadrupoles; FIG. 3C is a schematic diagram that shows a 4-lobe configuration of opposed quadrupoles, sometimes referred to as an octupole; and FIG. 3D is a schematic diagram that shows a 4-lobe configuration extending in a linear dimension. The "+" and "−" signs indicate the direction of the magnetic dipole of each loop, in a relative reference frame.

FIG. 4A is a schematic diagram that shows a FOD detector array including loops with a substantially square shape to achieve high area-fill factor; and FIG. 4B is a schematic diagram that shows an embodiment with two offset arrays, an arrangement that may be used to eliminate blind spots.

FIG. 5 is a schematic diagram that shows an exemplary FOD detector connected to a readout circuit.

FIG. 6 is a schematic diagram that shows an array of exemplary FOD detectors connected to readout circuitry.

FIGS. 18A-18F are schematic diagrams that show different arrangements of sensors.

FIGS. 20A-20C are schematic diagrams that show different arrangements of sensors.

FIGS. 21A-21D are schematic diagrams that show different arrangements of sensors.

FIG. 41 are plots of simulation results obtained by a FOD sensor board.

FIG. 42 is a schematic diagram of a source.

FIG. 43A is a schematic diagram of a LOD sensor arrangement.

FIG. 43B are schematic diagrams of LOD sensors.

Figure 7:
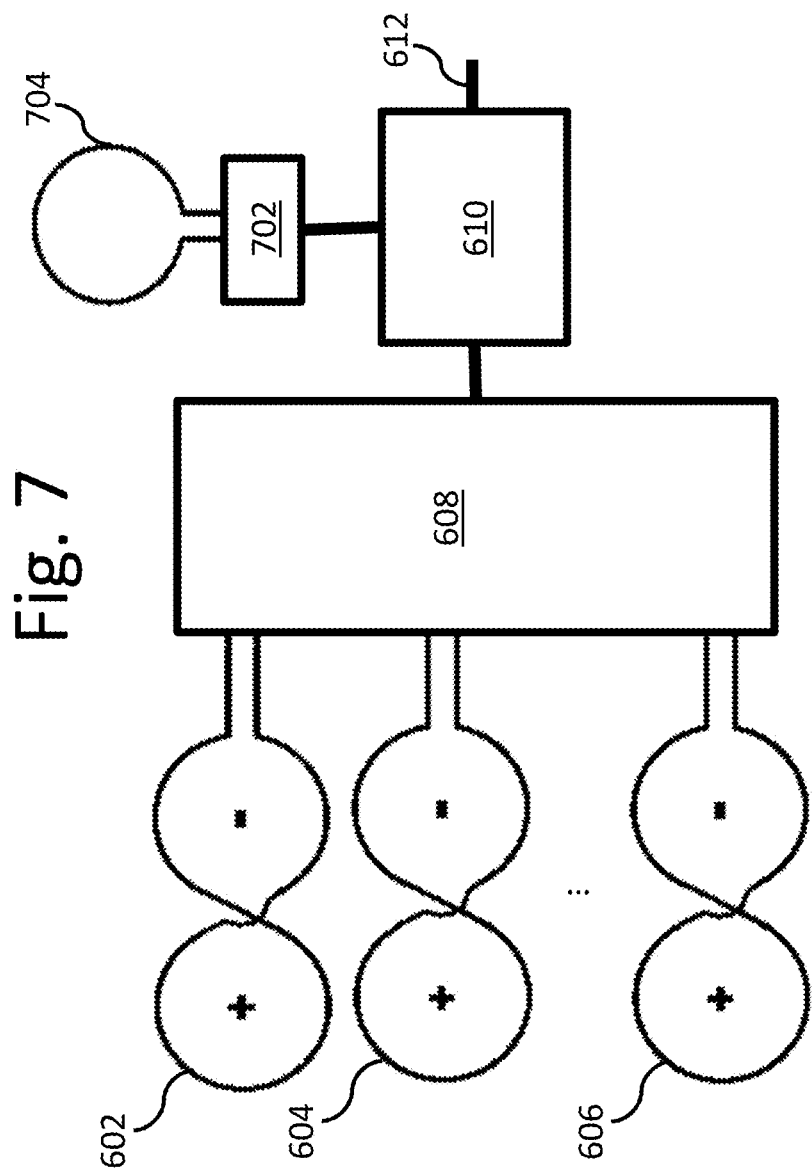
FIG. 7 is a schematic diagram that shows an array of FOD detectors connected to readout circuitry and a synchronization or reference loop.

It is understood that the figures show exemplary embodiments even if it is not explicitly stated to be exemplary.

DETAILED DESCRIPTION

Wireless power transfer systems that rely on an oscillating magnetic field between two coupled resonators can be efficient, non-radiative, and safe. Non-magnetic and/or non-metallic objects that are inserted between the resonators may not substantially interact with the magnetic field used for wireless energy transfer. In some embodiments, users of wireless power transfer systems may wish to detect the presence of these "foreign objects" and may wish to control, turn down, turn off, alarm, and the like, the wireless power transfer system. Metallic objects and/or other objects inserted between the resonators may interact with the magnetic field of the wireless power transfer system in a way that causes the metallic and/or other objects to perturb the wireless energy transfer and/or to heat up substantially. In some embodiments, users of wireless power transfer systems may wish to detect the presence of these "foreign objects" and may wish to control, turn down, turn off, alarm, and the like, the wireless power transfer system. In certain embodiments, a user may detect heating of a wireless power transfer system and control, turn down, turn off, set an alarm of the system for safe operation. Techniques for wireless power transfer, detecting the presence of foreign objects or detecting heating of a wireless power transfer system are described, for example, in commonly owned U.S. patent application Ser. No. 13/608,956 filed on Sep. 10, 2012 and entitled "Foreign Object Detection in Wireless Energy Transfer Systems," U.S. provisional application 61/532,785 filed on Sep. 9, 2011 and entitled "Foreign Object Detection in Wireless Energy Transfer Systems," U.S. patent application Ser. No. 12/899,281 filed on Oct. 6, 2010 and entitled "Vehicle Charger Safety System and Method," and U.S. patent application Ser. No. 12/567,716 field on Sep. 25, 2009 and entitled "Wireless Energy Transfer Systems," the contents of which are incorporated by reference.

Foreign Object Debris (FOD) positioned in the vicinity of wireless power transfer systems can be benign and/or may interact with the fields used for energy transfer in a benign way. Examples of benign FOD may include dirt, sand, leaves, twigs, snow, grease, oil, water, and other substances that may not interact significantly with a low-frequency magnetic field. In embodiments, FOD may include objects that may interact with the fields used for wireless power transfer in a benign way, but that may be restricted from the region very close to the resonators of the wireless transfer systems because of perceived danger, or out of a preponderance of caution. A common example of this type of FOD is a cat that may wish to sleep between the resonators and/or the resonator coils of a wireless vehicle charging system. Although unlikely, some may perceive a possibility of a human, especially a child, positioning themselves between the resonators in a high-power system where the human exposure effects may exceed certain exposure guidelines and regulations. In some cases, humans, animals, organic material, and the like may be a type of FOD in a wireless power transfer system. In some embodiments, the detection of living objects such as cats and people may be referred to as living object detection (LOD). In embodiments, some FOD may interact with the magnetic field in a way that may perturb the characteristics of the resonators used for energy transfer, may block or reduce the magnetic fields used for energy transfer, or may create a fire and or burning hazard. In some applications, special precautions may be necessary to avoid combustible metallic objects becoming hot enough to ignite during high-power charging. Some metallic objects can heat up and have enough heat capacity to cause a burn or discomfort to a person who might pick them up while they are still hot. Examples include tools, coils, metal pieces, soda cans, steel wool, food (chewing gum, burgers, etc.) wrappers, cigarette packs with metal foil, and the like.

Thus what are needed are methods and designs for detecting or mitigating the effects of FOD in the vicinity of a wireless power transfer system.

Methods for mitigating FOD risks can be categorized as passive mitigation techniques and active mitigation techniques. Passive mitigation techniques may be used to prevent FOD from entering or remaining in the regions of high electromagnetic fields (e.g., magnetic, electric fields). Passive mitigation techniques may lower the likelihood of FOD interacting hazardously with electromagnetic fields. Active mitigation techniques may be used detect and react to the presence of FOD.

In this disclosure, "wireless energy transfer" from one coil (e.g., resonator coil) to another coil (e.g., another resonator coil) refers to transferring energy to do useful work (e.g., mechanical work) such as powering electronic devices, vehicles, lighting a light bulb or charging batteries. Similarly, "wireless power transfer" from one coil (e.g., resonator coil) to another resonator (e.g., another resonator coil) refers to transferring power to do useful work (e.g., mechanical work) such as powering electronic devices, vehicles, lighting a light bulb or charging batteries. Both wireless energy transfer and wireless power transfer refer to the transfer (or equivalently, the transmission) of energy to provide operating power that would otherwise be provided through a connection to a power source, such as a connection to a main voltage source. Accordingly, with the above understanding, the expressions "wireless energy transfer" and "wireless power transfer" are used interchangeably in this disclosure. It is also understood that, "wireless power transfer" and "wireless energy transfer" can be accompanied by the transfer of information; that is, information can be transferred via an electromagnetic signal along with the energy or power to do useful work.

In some embodiments, a wireless power transfer system may utilize a source resonator to wirelessly transmit power to a receiver resonator. In certain embodiments, the wireless power transfer may be extended by multiple source resonators and/or multiple device resonators and/or multiple intermediate (also referred as "repeater" resonators.) The resonators can be electromagnetic resonator which are capable of storing energy in electromagnetic fields (e.g., electric, magnetic fields). Any one of the resonators can have a resonant frequency $f=\omega/2\pi$, an intrinsic loss rate $\Gamma$, and a Q-factor $Q=\omega/(2\Gamma)$ (also referred as "intrinsic" Q-factor in this disclosure), where w is the angular resonant frequency. A resonant frequency f of a resonator, for example, in a power source or power receiver of the system, can have a capacitance and inductance that defines its resonant frequency f.

In some embodiments, any one of a source, receiver, repeater resonator can have a Q-factor that is a high Q-factor where $Q>100$ (e.g., $Q>100$, $Q>200$, $Q>300$, $Q>500$, $Q>1000$). For example, the wireless power transfer system can include a power source having one or more source resonators, and at least one of the source resonators having a Q-factor of $Q_1>100$ (e.g., $Q_1>100$, $Q_1>200$, $Q_1>300$, $Q_1>500$, $Q_1>1000$). The wireless power transfer system can include a power receiver having one or more receiver resonators, and at least one of the receiver resonators having a Q-factor of $Q_2>100$ (e.g., $Q_2>100$, $Q_2>200$, $Q_2>300$, $Q_2>500$, $Q_2>1000$). The system can include ate least one receiver resonator having a Q-factor of $Q_3>100$ (e.g., $Q_3>100$, $Q_3>200$, $Q_3>300$, $Q_3>500$, $Q_3>1000$). Utilizing high Q-factor resonators can lead to large energy coupling between at least some or all of the resonators in the wireless power transfer system. The high Q factors can lead to strong coupling between resonators such that the "coupling time" between the resonators is shorter than the "loss time" of the resonators. In this approach, energy can be transferred efficiently between resonators at a faster rate than the energy loss rate due to losses (e.g., heating loss, radiative loss) of the resonators. In certain embodiments, a geometric mean $\sqrt{Q_iQ_j}$ can be larger than 100 (e.g., $\sqrt{Q_iQ_j}>200$, $\sqrt{Q_iQ_j}>300$, $\sqrt{Q_iQ_j}>500$, $\sqrt{Q_iQ_j}>1000$) where i and j refer to a pair of source-receiver resonator, source-repeater resonator or repeater-receiver resonators (e.g., i=1, j=2, or i=1, j=3, or i=2, j=3.) Any one of the resonators can include coils described in the following sections. Techniques for utilizing high-Q resonators are described, for example, in commonly owned U.S. patent application Ser. No. 12/567,716 field on Sep. 25, 2009 and entitled "Wireless Energy Transfer Systems," the contents of which are incorporated by reference.

Passive Mitigation Techniques

Passive mitigation techniques may be used to keep FOD from entering the regions between resonators or specific regions of high electromagnetic field, thereby preventing the interaction of the FOD with the electromagnetic fields.

By way of additional exemplary embodiments, the design of a resonator cover in a wireless power transfer system may provide a passive FOD mitigation technique. In embodiments the enclosure of a source and/or device and/or repeater resonator may be shaped to prevent FOD from coming close to the areas of the resonators and/or the resonator coils where the electromagnetic field may be large. In embodiments, a resonator enclosure may be thick enough to keep external objects from getting closer than a specified distance from the resonator or resonator coil. For example, the enclosure may include extra enclosure material and/or an air gap and/or potting materials and/or other objects and/or materials between the resonator coil and the outside surface of the resonator. In embodiments, the distance from the resonator coil surface to the enclosure surface may be 0.5 mm, 1 mm, 5 mm and the like. In embodiments, the distance between the top resonator coil surface and the top enclosure surface and the bottom resonator coil surface and the bottom enclosure surface may be different. In embodiments, the resonator coil may be positioned substantially in the middle of the thinnest dimension of the resonator enclosure. In other embodiments, the resonator coil may be positioned substantially offset from the middle of the thinnest dimension of the resonator enclosure. In embodiments, a resonator coil may be positioned substantially away from a surface that may be exposed to FOD. In embodiments, the resonator enclosure may include a keep-out zone providing for a minimum distance between FOD and the resonator components. The keep-out zone may be sufficiently large to ensure that the fields at the outside of the keep-out zone are sufficiently small to not cause safety or performance concerns.

A resonator enclosure may be designed to be curved, angled, or shaped to force any FOD on the enclosure to roll off the surface of the enclosure or cover and away from the resonator and/or high electromagnetic fields. The resonator enclosure may be shaped or positioned to allow gravity to pull objects away from the resonators. In some embodiments, the enclosures and position of the resonators may be designed to use other natural or omnipresent forces to move FOD away. For example, the force of water currents, wind, vibration, and the like may be used to prevent FOD from accumulating or staying in unwanted regions around resonators. In embodiments, the resonator surfaces where FOD may accumulate may be arranged to be substantially perpendicular to the ground so that objects may not naturally rest and accumulate on the resonators.

An example resonator cover providing a degree of passive FOD protection is shown in FIG. 1. A magnetic resonator 104 of a wireless power transfer system may be surrounded with or enclosed by or placed under a shaped cover 102. The cover 102 may be shaped to force FOD 106 to roll down the cover 102 due to the force of gravity. The shape of the cover 102 may prevent FOD 106 from accumulating on top of the cover 102 and/or in the vicinity of the resonator 104 by forcing any FOD to the sides of the resonator and/or away from the regions surrounding the resonator where the magnitude of the electromagnetic fields is high enough to cause a hazardous condition due to heating of or interaction with the FOD. In embodiments, the FOD may be forced far enough away from the high field regions to no longer pose a risk of being heated and/or ignited by the fields and/or of interacting negatively with the fields. In some embodiments, the cover may include portions shaped as cones, pyramids, mounds, ovals, spheres, and the like. In some embodiments, the cover may include materials that are slippery, such as Teflon®, for example, to make it difficult for FOD to remain situated between the source and device resonators.

In other exemplary and non-limiting embodiments, a passive FOD technique may include sizing the resonators and/or resonator components to reduce the maximum electromagnetic field density (e.g., magnetic field density, electric field density) anywhere in the region of wireless power exchange below a desired limit. In some embodiments, relatively large resonator coils may be used to mitigate a subset of FOD risks. For a fixed level of power transfer the use of larger resonator coils may reduce the electromagnetic field strength per unit area required to transfer a certain amount of power wirelessly. For example, the maximum electromagnetic field strength generated by a source may be reduced below a threshold where heating or other hazards may be known to occur. Passive mitigation techniques may not always be possible or practical or sufficient. For example, reducing a FOD hazard by increasing a resonator size may not be practical owing to the system cost or weight constraints or to the desire to integrate a resonator into a system of a specified volume. However, even in applications where a completely passive technique may not be possible, practical and/or sufficient, passive mitigation techniques may be used to at least partially reduce the FOD risk and may be complementary to active mitigation techniques. In some applications, only active mitigation techniques may be utilized.

Active Mitigation Techniques

In accordance with exemplary and non-limiting embodiments, an active mitigation technique for FOD may include a detection system that may detect certain objects, certain types of objects, metallic objects, organic objects, hot objects, perturbations in resonator parameters, and/or perturbations in magnetic field distributions.

In accordance with exemplary and non-limiting embodiments, FOD, such as metallic objects, may be of sufficient size, extent, and/or material composition to perturb the efficiency or power transfer capabilities of a wireless energy transfer system. In such cases, the presence of said FOD may be determined by examining the change in one or more of the voltage, current, and/or power associated with a source resonator and/or device resonator and/or repeater resonator of a wireless power system. One or more of the source, device, or repeater resonators may have an intrinsic quality factor of at least 100 (e.g., at least 200, at least 500). Some FOD may perturb the parameters of the resonators used for energy transfer and/or may perturb the characteristics of the energy transfer. A FOD may change the impedance of a resonator for example. In accordance with exemplary and non-limiting embodiments, these perturbations may be detected by measuring the voltage, current, power, phase, impedance, frequency, and the like of the resonators and the wireless energy transfer. Changes or deviations from expected or predicted values may be used to detect the presence of FOD. In an exemplary embodiment, dedicated FOD sensors may not be needed to detect and react to FOD in a wireless power system.

In accordance with exemplary and non-limiting embodiments, FOD may only weakly perturb the wireless energy transfer and may not be substantially detectable by monitoring electrical parameters of the resonators and/or the characteristics of the wireless energy transfer. Such objects can still create a hazard, however. For example, FOD that only weakly interacts with the magnetic field may still heat up substantially. The FOD may heat up due to the magnetic field or electric field generated during the wireless energy transfer. An example of a FOD that may only weakly interact with the electromagnetic field but that may experience significant heating is a metal-foil-and-paper wrapper such as is often found in chewing gum and cigarette packages and as is often used to wrap food from fast food establishments such as Burger King and Kentucky Fried Chicken. When placed between the resonators of a 3.3-kW wireless energy vehicle charging system, a chewing gum wrapper may not be detectable by examining the electrical parameters associated with the resonators and/or the energy transfer system. However, said wrapper may still absorb enough power to rapidly heat and for the paper backing to eventually burn.

In accordance with exemplary and non-limiting embodiments, an active mitigation system for FOD may include temperature sensors to detect hot spots, hot areas, and/or hot objects on and/or near-by a wireless energy transfer system. A system may include any number of temperature sensors, infrared detectors, cameras, and the like to detect a heat source, heat gradient and the like in and around a wireless energy transfer system. In embodiments, hot object sensing may be used alone or in addition to other active and/or passive mitigation techniques and can be used to further improve the detectability of heated FOD and/or reduce the false-alarm rate of other active FOD detection systems.

In accordance with exemplary and non-limiting embodiments, an active mitigation system for FOD objects that only weakly perturb the electromagnetic field between two resonators may include sensors for measuring small changes in the magnetic field in the proximity of the FOD objects. For example, a metal-foil-and-paper chewing gum wrapper may not substantially alter the magnetic flux between two resonators, but it might substantially alter the magnetic flux through a smaller sensor coil or loop or sensor or gradiometer if it covered and/or blocked any portion of the coil or loop area or sensor or gradiometer. In embodiments, local disturbances in the magnetic field caused by the presence of FOD may be detected by measuring magnetic field changes, variations, gradients, and the like, in the vicinity of the FOD.

In accordance with exemplary and non-limiting embodiments, a FOD sensor may be realized using a small wire loop 202 as shown in FIG. 2. Such a sensor may be placed on or near the resonators used for wireless energy transfer. During operation, a wireless energy transfer system may generate a magnetic field that may pass through the loop. The loop may develop a voltage proportional to the amount of magnetic flux threading the inside of the loop 208. In some embodiments, a voltage induced in a loop may be less than 5V. In another embodiment, a voltage induced in a loop may be less than 10V. If, for example, a chewing gum wrapper is placed so that it partially covers the loop and/or or deflects and/or absorbs magnetic flux near the loop, then the voltage developed by the loop may change and the change in voltage may be detected and determined to indicate the presence of FOD. In embodiments, a conducting loop may be used to indicate the presence of FOD in a wireless power transfer system.

In accordance with exemplary and non-limiting embodiments, a FOD sensor may be realized using two small wire loops 202, 204 as shown in FIG. 2. Such a sensor may be placed on or near the resonators used for wireless energy transfer. During operation, a wireless energy transfer system may generate a magnetic field that may pass through the two loops. Each individual loop may develop a voltage proportional to the amount of time-varying magnetic flux threading the inside of each loop 206, 208. The difference between the voltages developed by the two loops may be, to first order, proportional to the gradient of the magnetic field in proximity to the loops. If the two loops are placed in a region of substantially uniform field and the loops are substantially similar, then the difference between the magnitudes of the voltages developed by the two loops may be very small. If, for example, a chewing gum wrapper is placed so that it partially covers one of the loops but not the other, then the difference in voltage developed by the two loops may be larger than when the wrapper was not present because the metallic foil of the gum wrapper may deflect or/or absorb some of the magnetic flux that would have normally passed through that loop. In some embodiments, the magnetic flux passing through a loop may be less than $6*10^{-6}$ T·m$^{-2}$.

In embodiments, the output signals developed by the two loops may be subtracted from each other so that the structure formed by the combination of the loops produces a small signal when the sensed field is substantially uniform, and a measurably larger signal when there is a gradient in the field between the two loops. When the loops and/or coils are configured to generate a signal in the presence of a field gradient and/or a non-uniform or substantially non-uniform field, they may be referred to as being arranged as a gradiometer. Note the signals from different loops may be subtracted using analog circuitry, digital circuitry, processors, comparators, and the like. Note that the loops may be connected together in a specific configuration, such as in a figure 8 configuration, so that the voltage induced by the magnetic field crossing the surface area of one of the loops is approximately equal and opposite to the voltage induced by the magnetic field crossing the area of one of the other loops in the sensor. The sensitivity of the sensor and/or gradiometer may be related to the magnitude and/or phase of the voltage difference between the two loops.

Figure 8:
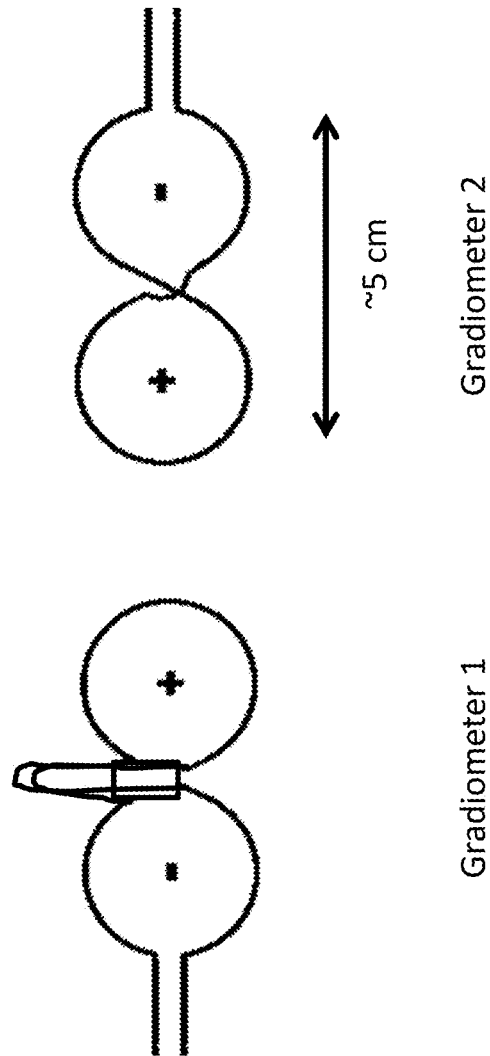
FIG. 8 is a schematic diagram that shows an example embodiment of FOD detector loops.

Note that a so-called "figure 8" conducting loop may be formed by taking one large conducting loop, pinching it in the middle so that the one large loop forms two approximately equal-sized smaller loops, and then twisting one loop relative to the other by 180 degrees, or an odd multiple of 180 degrees. In embodiments, the figure 8 conducting loops may be realized using any type of conducting traces including, but not limited to, wire, Litz wire, conducting tubing, PCB traces, conducting inks, gels, paints, ribbons and the like.

In accordance with exemplary and non-limiting embodiments, the sensitivity of the loop and/or coil and/or sensor and/or gradiometer may be adjusted to preferentially detect objects of a given size, or above a given size. The sensitivity may be adjusted to reduce false detection rates, to lower the noise of a detection system, and/or to operate over a range of frequencies. In embodiments, the size and shape of the loops may be adjusted to adjust the sensitivity of the sensor. For example, the loops of a sensor may be smaller to lower background signals and to improve sensitivity to smaller FOD. However, if the sensor loops are too small, some FOD may completely cover all the loops of the sensor, so that a signal may not be produced by the FOD. Such scenarios may be mitigated by using multiple FOD sensors and positioning them throughout the region where FOD should be detected. Then, even when one FOD sensor does not detect the FOD, it is likely that at least one other sensor will. In the example given above, the larger FOD may completely cover some sensors, but only partially cover others. The sensors that are partially covered may detect the FOD, and the system can be programmed to react appropriately. In embodiments, the loops may be adjusted to include more turns and/or to include additional loops, such as four loops, or eight loops for example. In embodiments, the loops may be positioned to have rotational symmetry or they may be arranged in a linear arrangement or they may be shaped to fill a region of any size and shape. In embodiments, the loops may be substantially two dimensional and in other embodiments that may be extended in a third dimension to improve performance. For example, loop sensors may be realized on a printed circuit board (PCB) and multiple loop sensors may be realized on one layer (or two to form the figure 8), or multiple loops sensors may be realized on more than two layers of a PCB.

In embodiments where the magnetic field density may be non-uniform in the locations where gradiometers may be placed and/or where other gradiometer and/or loop designs may be implemented, the presence of metallic objects may result in amplitude and/or phase changes in waveforms corresponding to the difference between the two loop voltages. In embodiments, the loops may have a plurality of turns. In accordance with exemplary and non-limiting embodiments, the loop areas 206, 208 may be sized according to the magnetic field strength of a wireless energy transfer system, the desired sensitivity of the detection method, the complexity of the system and the like. If the metallic FOD is substantially smaller than the loop area, only a weak signal may arise when the FOD is present. This weak signal may risk being overwhelmed by noise or interfering signals. If the loop is sized to be on the order of (e.g. within a factor of 3) of the minimum FOD size to be detected, then the signal may be sufficiently large for detection with low false-alarm rate. In embodiments, a FOD sensor and/or gradiometer may include one or more loops of different sizes, shapes and/or arrangements. In embodiments, a FOD sensor may include regions with one sensor, more than one sensor or no sensor.

In an exemplary and non-limiting embodiment, an arrangement of FOD sensors may be optimized via an algorithm, computing systems, user or market feedback data, testing, etc.

In accordance with exemplary and non-limiting embodiments, another way to measure a field gradient in the vicinity of a metallic object may be to create a coil (also referred to as a loop) in a fashion that directly outputs a voltage that may be proportional to the local gradient in the magnetic field. Such a coil may serve the purpose of the two coils depicted in FIG. 2, but may require only one voltage measurement. If, for example, one were to double the area of one of the loops depicted in FIG. 2 and then twist it into a figure-8 shape where each lobe of the figure-8 had approximately equal area, but the voltage induced in each lobe by the local magnetic field is opposite in sign, then the voltage developed across its two terminals can be proportional to the difference in magnetic flux between the two lobes. If the magnetic flux passing through both loops is substantially equal, then the output signal from the sensor may be substantially zero. FIGS. 3A-3D depict some exemplary configurations of twisted loops that may be capable of directly creating a voltage that may be proportional to a local gradient in the strength and/or density of the magnetic field.

The two loops shown in FIG. 2 may be referred to as magnetic dipoles and the loops in FIG. 3A may be referred to as gradiometers and/or magnetic quadrupoles and the loops in FIG. 3B may be referred to as gradiometers and/or octupoles. The quadrupole configuration may develop a voltage proportional to the magnetic field gradient in the left-to-right orientation. The 4-lobe configurations can be configured to measure field gradients (FIG. 3B), and gradients of field gradients (FIG. 3C). FIG. 3D is representative of embodiments where multiple lobes may extend along a linear dimension to cover a FOD detection area that is rectangular, for example. Multiple sensors configured as shown in FIG. 3D may be configured in arrays to cover FOD detection areas of any shape and size. In embodiments, higher-order multipoles with an even number of lobes can also be configured to measure spatial perturbations to the magnetic field. In embodiments, the lobes depicted in FIG. 3A-3D may use multiple turns of a conductor, a wire, a conducting trace and the like.

Each of these configurations can accomplish the goal of measuring magnetic field perturbations due to the presence of FOD. The configurations with multiple lobes may cover more area (detect FOD in more locations) without substantially reducing the likelihood of detecting FOD of similar characteristic size to the lobes.

The loop configurations in FIG. 2 and FIGS. 3A-3D are depicted as circular but loops of any shape and size may be utilized. If it is desirable that multi-loop configurations produce as close to zero net current and/or net voltage when FOD is not present, then the cross-sectional area of each of the loops should be designed to capture equal amounts of flux. In substantially uniform magnetic fields, the loop areas may be substantially equal. If the loops are placed in substantially non-uniform magnetic fields, then the loop areas may be adjusted to be smaller where the field is stronger and larger where the field is weaker so that the voltage induced in each loop is substantially equal in magnitude and opposite in sign.

In embodiments, a sensor array may be calibrated and the signal output from the sensor may be processed in order to improve the performance of the sensor array. For example, if a FOD detection algorithm utilizes a change in a sensor output as a control signal, the sensor can be configured to have its output signal when no FOD is present to be as close to zero as possible. As mentioned above, the output signal may be very close to zero if the signals on the individual sensor lobes substantially cancel each other out. This may increase the dynamic range of the sensor. If the signals developed by the sensors when no FOD is present are not substantially zero, then they may be said to have a "background offset" and the signals may be processed in the detection circuitry and the offsets may be removed. In embodiments, different sensors in an array may have different background offsets. In embodiments, the background offsets may be determined in a calibration procedure Shapes other than circles may be well suited for arrays with high-area fill factor. Examples include squares, rectangles, hexagons, and other shapes that tile with little interstitial space in between them. FIG. 4A shows an example of square-shaped coils where the array is assumed to extend further than shown and to have an equal number of plus and minus loops.

The purpose of the "+" and "−" signs in the figure is to indicate the relative signs of the induced voltages on the loops. Thus, a figure 8 sensor in a uniform field will be represented by two connected lobes, one marked as plus and the other minus because the lobes are configured so that the signal induced by the field in one loop substantially cancels the signal induced by the field in the other. That is, the plus and minus signs indicate a relative sign of the induced voltages at a given moment in time. Note that in an oscillating magnetic field, the sign of the induced voltages in a single loop or lobe is changing at the same frequency as the magnetic field oscillation. That is, if an induced voltage is positive, i.e. in the "plus" direction, at one point in time, the induced voltage is of opposite sign one half a cycle ($t_c/2$) later ($t_c=1/f=2\pi/\omega=\lambda/c$). Therefore, the purpose of the "plus" and "minus" signs in the figure is to indicate that the instantaneous voltages induced in a set of loops have either the same relative sign, as would be the case for two "plus" loops and/or two "minus" loops, or have opposing signs, as would be the case for a "plus" and "minus" loop.

In this disclosure, it is understood that a "blind spot" can refer to an area where one or more sensors may not be able to detect a piece of FOD (e.g., debris) due to the arrangement of the one or more sensors. For the configuration shown in FIG. 4A, a symmetrical piece of FOD can be placed in certain positions between adjacent loops so that the field perturbation may not generate a detectable magnetic field gradient. An example of such a so-called "blind spot" is depicted in FIG. 4A. In accordance with exemplary and non-limiting embodiments, a second layer of arrayed loops may be placed above and/or below a first layer and may be translated laterally as shown in FIG. 4B. The amount of translation may be chosen so that the "blind spots" of the first layer of sensors may correspond to locations of maximum detectability or at least adequate detectability for the second layer. In embodiments, the translation may be any translation than improves the likelihood of detection of the FOD relative to the single array detection probability. In this way, the likelihood of having substantial blind spots where a piece of FOD may not be detectable may be reduced. Similar schemes of one or more translated arrays can achieve roughly the same advantage in reducing blind spots. The orientations of the loops in multiple arrays may also be changed to handle non-uniform magnetic fields.

In embodiments, layers of arrayed loops may have similar sized and/or shaped loops. In other embodiments, layers of arrayed loops may have different sized and/or shaped loops. In embodiments with layers of arrayed loops with different sizes and/or shapes, it may not be necessary to translate the arrayed loops in order to reduce the impact of "blind spots" and/or improve the likelihood of detection of the FOD.

In embodiments the individual loops or lobes of the dipoles, quadrupoles, octupoles, and the like may be of multiple sizes and/or of non-uniform sizes. In embodiments where the gradiometer may cover areas of non-uniform magnetic field the loops may be sized to ensure a minimal voltage at the output of the gradiometer loops when no FOD is present. The loops may be sized such that a larger loop is positioned in an area of weaker magnetic field and the smaller loops are positioned in the areas of higher magnetic field. In embodiments the loops may be sized such that a larger loop is positioned in an area of more uniform magnetic field and a smaller loop is positioned in an area of less uniform magnetic field. In embodiments, the size of the gradiometers in a sensor array may vary. In embodiments, smaller gradiometers may be positioned in areas of less uniform magnetic fields. In embodiments, smaller gradiometers may be positioned in areas of larger magnetic field strength to provide detection capability of smaller FOD items, and larger gradiometers may be placed in areas of smaller magnetic field strength where it may only be desired to detect larger items of FOD.

Figures 11A, 11B, 11C:
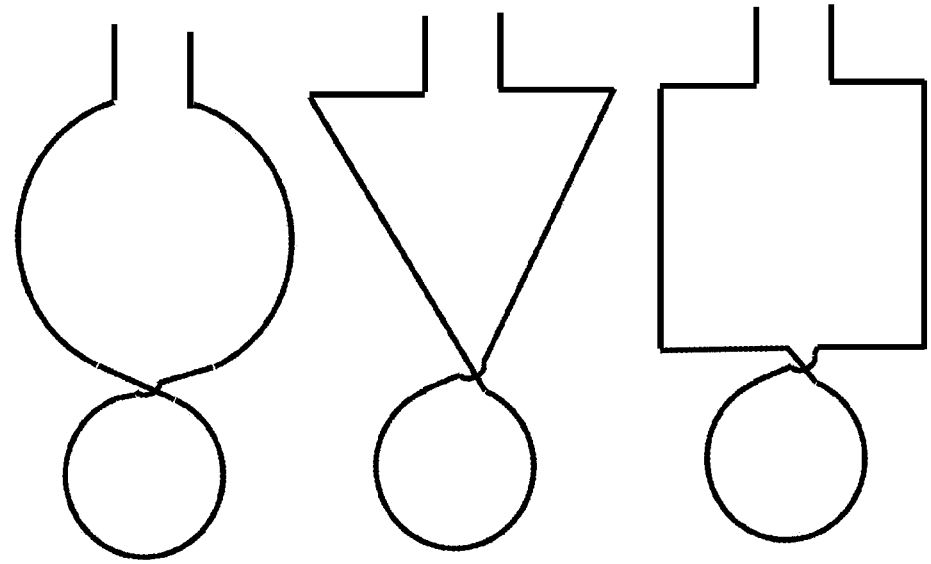
FIGS. 11A-C are schematic diagrams that show asymmetrical sensors with different shapes.
Figure 12:
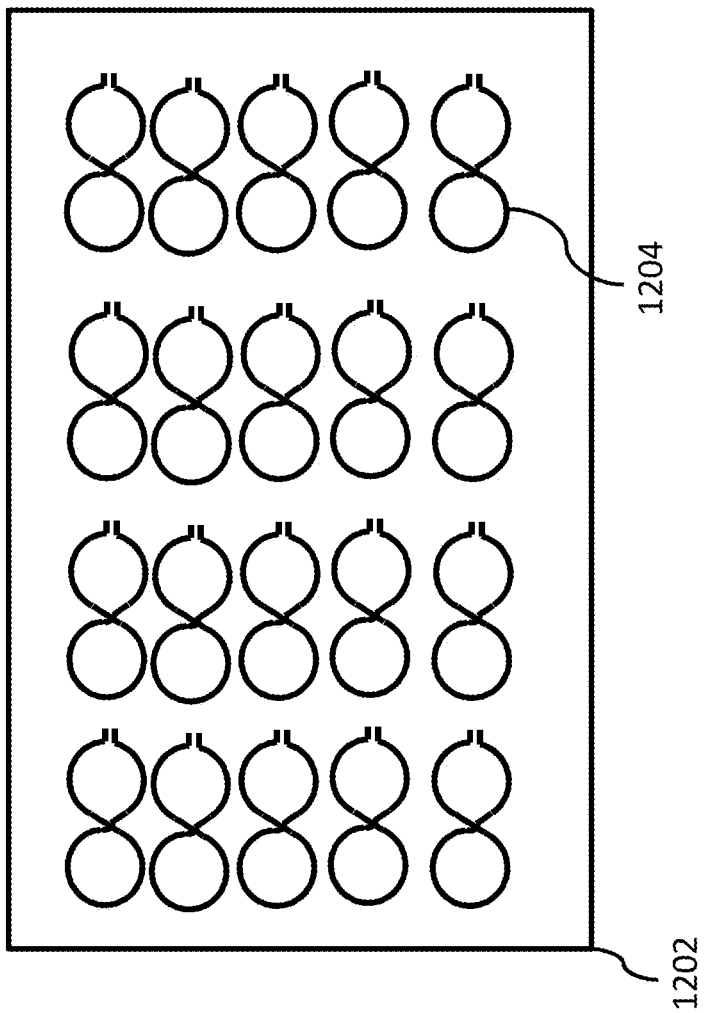
FIG. 12 is a schematic diagram that shows a symmetric arrangement of FOD sensors.
Figure 13:
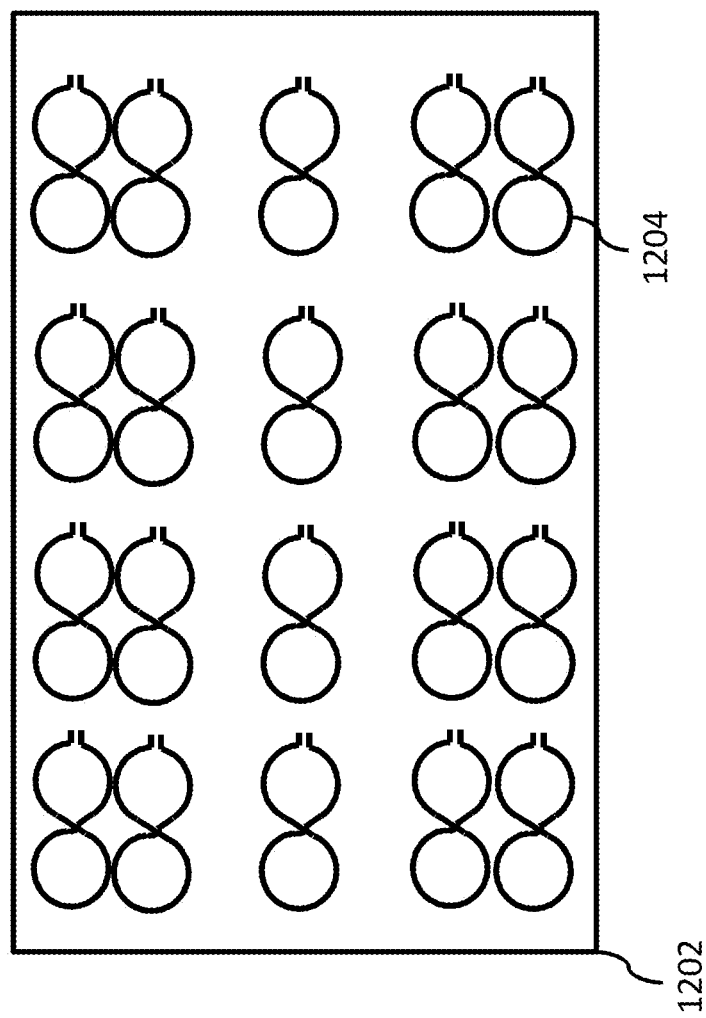
FIG. 13 is a schematic diagram that shows an asymmetric arrangement of FOD sensors.
Figure 14:
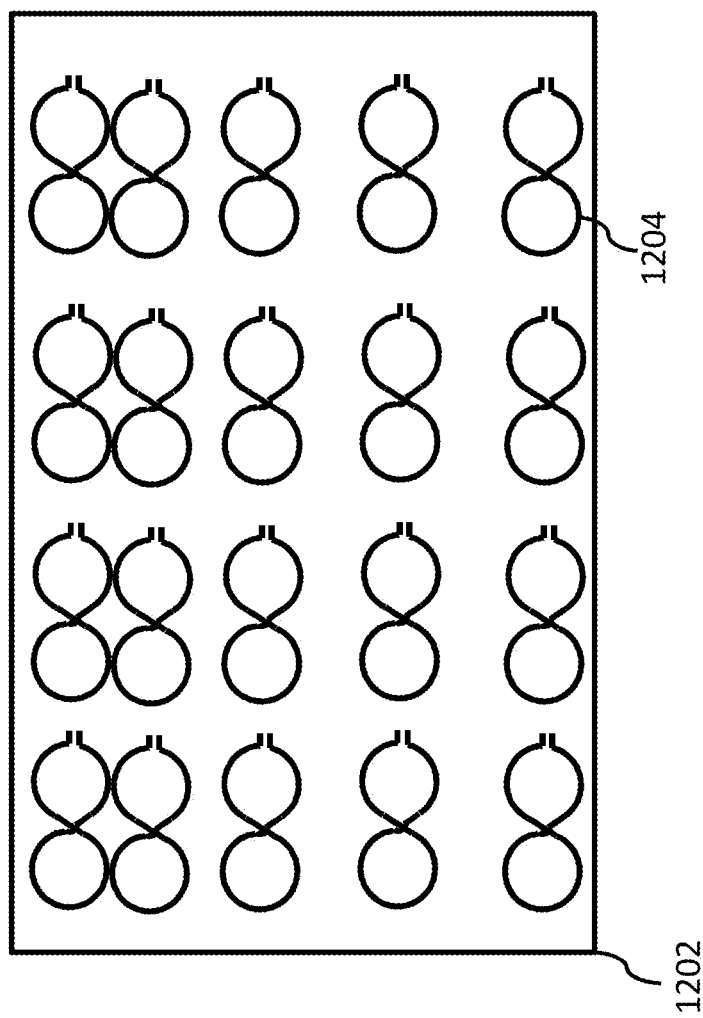
FIG. 14 is a schematic diagram that shows another asymmetric arrangement of FOD sensors.
Figure 15:
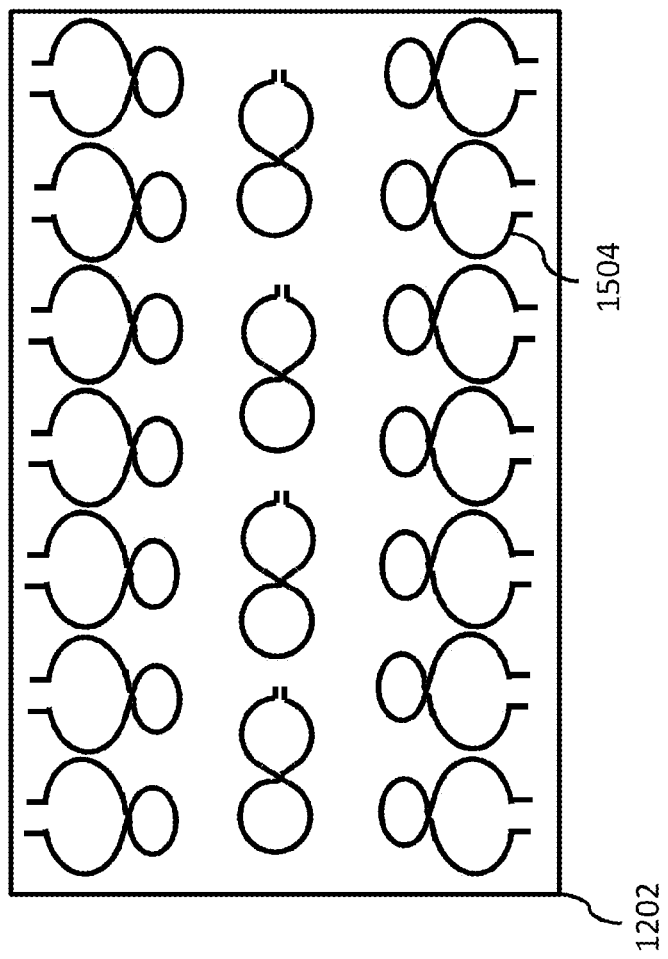
FIG. 15 is a schematic diagram that shows a further asymmetric arrangement of FOD sensors.

FIGS. 11A, 11B, 11C show several asymmetrical FOD sensor designs. The sensors may be shaped and sized to provide for a substantially zero voltage signal during normal operation when positioned in a non-uniform magnetic field. In an array of sensors 1202 on a board or across a region designed for FOD detection, FOD sensors 1204 may be arranged symmetrically throughout the region as shown in FIG. 12. In some embodiments the FOD sensors may be arranged asymmetrically as shown in FIGS. 13, 14 and 15. In embodiments the sensors may be positioned closer together in areas of high magnetic field and spaced further apart in areas of low magnetic field. For example, it may be desirable to have more sensors and/or higher sensitivity sensors in regions of highest field where FOD is most likely to be heated or to interact negatively with the field. In embodiments, there may be no reason to reduce the amount and/or type of sensors in the lower field regions. In some embodiments, it may be desirable to reduce the number of FOD sensors in an array. For example, if the sensors take up space that may be utilized for other circuitry, or if the sensors require components that add expense to a system, or for any such practical consideration, then it may be preferable to design a FOD system that includes multiple individual FOD sensors whose individual designs and placement within the array are specially designed. While some examples of such uniform and non-uniform arrays are described herein, they are just a few of many examples within the scope of the disclosed techniques.

In accordance with exemplary and non-limiting embodiments, an array of FOD sensors may include multiple types of sensors. In embodiments, a FOD sensor may include single loop sensors and/or dipole loop sensors/gradiometers and/or quadrupole loop sensors/gradiometers and/or octupole loop sensors/gradiometers and so on. Some areas of the FOD sensor may include no sensors and/or gradiometers. A FOD sensor may include temperature sensors, organic material sensors, electric field sensors, magnetic field sensors, capacitive sensors, magnetic sensors, inductive sensors, motion sensors, weight sensors, pressure sensors, water sensors, vibration sensors, optical sensors, and the like, and any combination of sensors.

In accordance with exemplary and non-limiting embodiments, an active mitigation system for FOD that only weakly perturb the electromagnetic field between two resonators may include sensors for measuring small changes in the capacitance of capacitive elements in the proximity of the FOD. For example, an object (e.g., organic, metallic material) placed on or near a wireless power transfer system may not substantially alter the magnetic flux between two resonators, but it might substantially alter the self-capacitance and/or mutual-capacitance of a length of conducting material in its vicinity. In general, when two objects—such as a length of conductive material and an organic or metallic object—approach one another (but remain separated by a dielectric material such as air), the capacitance of both objects changes, an effect referred to as "mutual capacitance". Sensitive capacitance detectors can be used to detect changes in the capacitance of either object (i.e., as a voltage change, or a direct capacitance measurement), thereby detecting the approach of the objects to one another. Using such methods, in certain embodiments, local disturbances to the capacitive value of a capacitive element caused by the presence of FOD may be detected by detecting capacitance changes, variations, gradients, and the like, in the vicinity of the FOD. Such methods are particularly useful for detecting organic objects (e.g., living objects), which typically do not significantly perturb magnetic fields.

In accordance with exemplary and non-limiting embodiments, a FOD sensor may be realized using a length of wire 1802 as a capacitive element as shown in FIG. 18. The length of wire may have a different capacitance when there is no object in its proximity than when there is an object (e.g., organic, metallic material). If the length of wire 1802 is integrated with a circuit that can measure and/or react to its change in capacitance in the proximity of the object, then the length of wire may be referred to as a capacitive sensor. If the length of wire is placed in an area and/or region of a wireless power transfer system, then its capacitance changes may be used to indicate the presence of certain types of FOD in that area and/or region of wireless power transfer. In embodiments, a length of conductive material with a capacitance that is related to the proximity of certain materials may be used to indicate the presence of FOD in a wireless power transfer system.

In embodiments, any type of material and/or structure that has a capacitance value that may be related to the proximity of certain types of materials may be used in the capacitive sensors envisioned here. A length of wire or any type of conducting path may be attractive because it may be designed to have a sensing area of almost any size and shape and because its performance should not be degraded in the presence of the electromagnetic fields of a wireless power transfer system. Also, the wire/conducting trace's capacitance may be changed when material such as organic material is near-by but not necessarily touching the sensor. In embodiments, a wire/conducting trace sensor may detect organic material that is not in physical contact with a resonator or resonator enclosure of a wireless power transfer system. In embodiments, wires/traces for use in a capacitive sensor may be integrated into circuits, PCBs, housings, modules, subsystems, and the like, of a wireless power transfer system.

In this disclosure, it is understood that a wire is an exemplary embodiment and that any type of conducting material, including but not limited to, solid wire, stranded wire, conducting tubing, printed circuit board traces, conducting inks, gels, paints, epoxies, and the like, are also suitable capacitive elements for the disclosed techniques described herein.

In embodiments, a capacitive sensor may include one or more capacitive elements. FIGS. 18A-F show several examples of capacitive elements. FIG. 18A shows an embodiment where a capacitive element 1802 may be of an asymmetrical and/or irregular shape. FIG. 18B shows an embodiment where a capacitive element 1804 may be of a sinusoidal shape and may be arranged to cover a region 1806 over which FOD should be detected. FIG. 18C shows an embodiment in which a capacitive element 1804 is arranged over FOD sensors 1204. FIGS. 18D through 18F show embodiments of an organization of one or more capacitive elements. For example, data from the one or more capacitive elements may be measured at one or more points and may be processed in one or more levels. FIG. 18D shows an embodiment where data measured at points 1808, 1810, 1812, and 1814 may be processed at a central or primary level of processing 1824. FIGS. 18E and 18F show an embodiment where data measured at points 1808, 1810, 1812, 1814, and 1815 may be processed at a primary (processor 1824) and/or secondary (processors 1816 to 1822) levels of processing. In some embodiments, the data from some points may be averaged and compared with others. For example, FIG. 18E shows an embodiment where points 1808 and 1810 may be averaged to be compared to the average of points 1812 and 1814 and may be further compared to point 1815.

The size of the capacitive elements can generally be selected as desired to permit detection of living objects. In some embodiments, for example, a power source generates a magnetic field that extends through a plane in which the capacitive elements are positioned. The field has a cross-sectional field intensity distribution with a full-width at half maximum in the plane. The capacitive elements can be positioned in the plane so that a circular perimeter of minimum size in the plane that encircles the capacitive elements has an enclosed area in the plane that is 100% or more (e.g., 110% or more, 120% or more, 130% or more, 140% or more, 150% or more, 175% or more, 200% or more) of the full-width at half maximum of the cross-sectional field distribution. In particular, by positioning some or all of the capacitive elements near the edges of the field distribution (e.g., near the edges of the power source and/or the power receiver), the capacitive elements can be used to detect living objects before the objects enter the region between the power source and the power receiver.

In general, both the power receiver and the power source can include one or more resonators, each of which can include one or more coils. In some embodiments, a total cross-sectional area of the resonators of the power receiver can be 80% or more (e.g., 100% or more, 120% or more, 140% or more, 150% or more, 175% or more, 200% or more) of a full-width at half maximum cross-sectional area of the magnetic field generated by the power source at the position of the power receiver.

To transfer power to the power receiver, the power source generates a magnetic field (i.e., a flux of magnetic field lines) between the power source and power receiver. In some embodiments, the power source is configured to generate a magnetic flux of at least 6.25 µT (e.g., 7 µT, 8 µT, 9 µT, 10 µT, 12 µT, 15 µT, 20 µT, 30 µT, 40 µT, 50 µT) between the power source and the power receiver (i.e., at one or more points between the power source and the power receiver).

Referring for example to FIG. 18C, in some embodiments, FOD sensors 1204 are positioned in a first plane between a power source and power receiver, and capacitive elements 1804 are positioned in a second plane between the power source and power receiver. The first and second planes can be the same or different planes. Either or both planes can be positioned closer to the power source, closer to the power receiver, or equidistant between the source and receiver in the region between the source and receiver.

Figure 19:
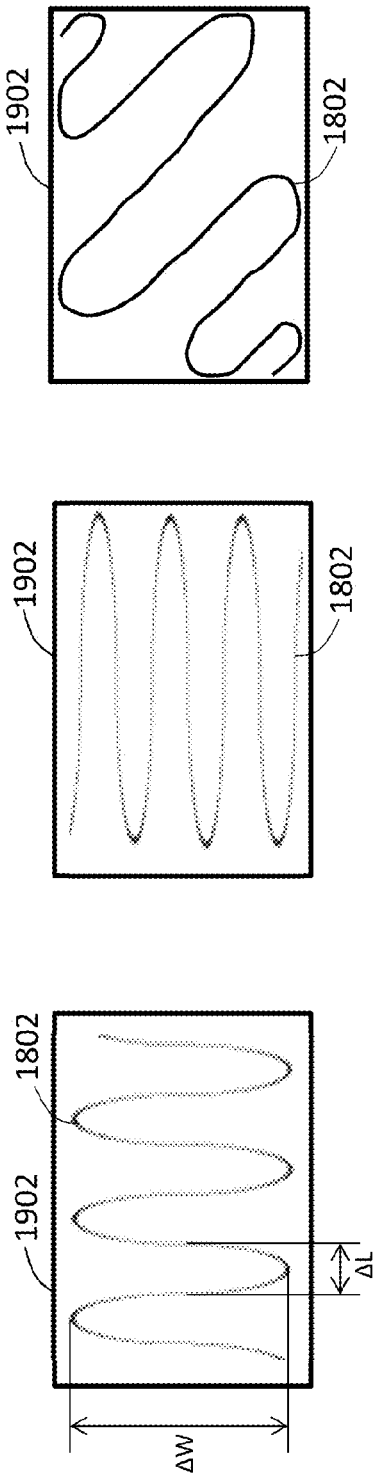
FIGS. 19A-19E are schematic diagrams that show different arrangements of sensors.

FIG. 19 shows other exemplary and non-limiting embodiments of capacitive elements. In FIG. 19A, the boxed area 1902 may represent an exemplary area or region over which FOD should be detected. In this embodiment, a capacitive element 1802 may be realized by a single wire that meanders back and forth across the FOD detection area, e.g., forming a serpentine pathway. FIGS. 19B and 19C show alternate embodiments. FIG. 19D shows a similar embodiment to 19A, but the spacing between the wire paths is smaller while the spacing shown in FIG. 19E is larger. As in the case of the magnetic FOD sensor described above, the size, shape, arrangement, and placement of the sensors may impact the sensitivity of the FOD sensors. For example, a small block of organic material placed over the sensor shown in FIG. 19D may be detected everywhere in the region 1902, whereas that same material placed over the sensor in FIG. 19E may not be detected in the areas highlighted by the dashed circles. In some embodiments, it may be desirable to detect very small pieces of FOD and the sensor design of FIG. 19D may be preferable. In some embodiments, it may be desirable to detect only larger pieces of FOD, and using a detector that detects smaller FOD or that has higher sensitivity to other types of FOD may cause detection errors or false positives, so a sensor design more similar to that shown in FIG. 19E may be preferable.

One way to describe the features of a capacitive sensor is by the spacing between wires or wire segments across the length of the FOD array, the width of the FOD array and the height (for 3-D arrangements) of the FOD array. In FIG. 19A, the wire pattern that forms the capacitive element shows substantially equal spacing between the segments of the sensor along the length ($\Delta L$) and along the width ($\Delta W$). If the sensor included segments that went out of the plane shown as the FOD region 1902, the sensor may be described as having height segment spacing ($\Delta H$). The capacitive elements shown in FIG. 19 are arranged to substantially fill the FOD detection region and may give similar sensitivity throughout the FOD region. Depending on the application, it may be preferable to have regions in the FOD area where the sensors are more sensitive and there may be regions where FOD detection is not required. Exemplary embodiments of those types of sensors are shown in FIG. 20.

In embodiments, a capacitive element may have segments with varying spacing along the length, width, and height of a FOD sensor. FIG. 20 shows several examples of the FOD sensor. Sensor 1802 shown in FIG. 20A may have higher sensitivity to small pieces of FOD on either side than at the center of the FOD region 1902. Sensor 1802 in FIG. 20B may have higher sensitivity to small pieces of FOD in the center than at the sides of the FOD region 1902. Sensor 1802 in FIG. 20C may have higher sensitivity to small pieces of FOD in the corners than at the center of the FOD region 1902. Sensors shown in FIGS. 20A-C may be described as having more than one segment spacing and/or as having variable segment spacing. In embodiments, capacitive elements for a FOD detector may have at least two width segment spacings ($\Delta W_1, \Delta W_2, \ldots, \Delta W_n$). In embodiments, capacitive elements for a FOD detector may have at least two length segment spacings ($\Delta L_1, \Delta L_2, \ldots, \Delta L_n$). In embodiments, capacitive elements for a FOD detector may have at least two height segment spacings ($\Delta H_1, \Delta H_2, \ldots, \Delta H_n$). In embodiments, capacitive elements for a FOD detector may have any combination of constant and varied segment spacing.

As in the magnetic field sensors described above, the capacitive elements may be arranged in substantially a two-dimensional (2D) plane (i.e., the same plane or a different plane as a plane containing one or more loops of conductive material, as discussed above) or they may be arranged in 3D. FIG. 21 shows exemplary embodiments of capacitive elements 1802 that traverse an area 1902 in two different directions. In embodiments, the conductors of these capacitive elements may preferably be isolated from each other so that circulating currents may not be induced by the electromagnetic field of a wireless power transfer system. Therefore, such elements might be realized using insulated wires that are stacked on top of each other and/or they may be realized by fabricating the elements of different layers of a printed circuit board.

Figure 22:
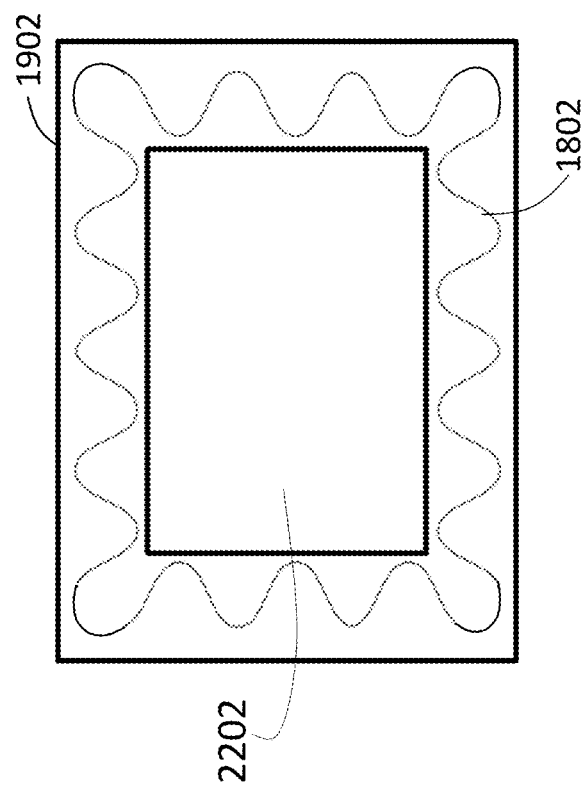
FIG. 22 is a schematic diagram that shows an arrangement of FOD sensors.

In embodiments, capacitive and inductive sensors may operate in the absence of an oscillating wireless power transfer electromagnetic field. For example, the capacitive sensors described above may operate in a similar manner in the presence of an oscillating electromagnetic field used for wireless power transfer and in the absence of the oscillating electromagnetic field. The sensors may be used to detect FOD in wireless power transfer regions where the electromagnetic fields are not large but where there may still be a desire to detect FOD. FIG. 22 shows an embodiment of a capacitive sensor 1802 that may be arranged around the edges and/or extending beyond the enclosure 2202 of the resonator of a wireless power system. The capacitive sensor 1802 may be used to detect objects and/or materials as they approach a resonator and/or before they enter the region of strongest field between the resonators. In an exemplary embodiment, an animal such as a cat walking towards a resonator enclosure may pass over a capacitive sensor 1802 and cause a capacitive change that may be detected and used to lower or shut down the power on a resonator coil. In embodiments, a capacitive sensor may be used to detect objects moving towards a wireless power transfer system and may send control signals to a wireless power system that a live object is entering a certain space, region, volume, area, and the like, of the wireless power transfer system.

In some embodiments, a capacitive sensor may be adversely affected by the oscillating magnetic fields generated during wireless energy transfer. Fields may impact the sensitivity of the readings or change the readings. Capacitive sensors may preferably be positioned and/or oriented to reduce their interaction with the fields. In some embodiments, for example, it may be preferable to orient conductors of a capacitive sensor to be parallel to the dipole moment of the resonators. FIGS. 21A-21D show possible orientations of conductors for LOD. The conductors 1802 of the detection area 1902 may be aligned with the dipole moment of the resonator as shown in FIGS. 21A-21C. In some embodiments, conductors may be arranged in multiple orientations as shown in FIG. 21D. Conductors in the orientation with a smaller interference may be automatically selected by the system.

In embodiments, a gradiometer as described above may generate its own magnetic field rather than using the magnetic field generated by a wireless power transfer system. The gradiometer may detect changes in its own magnetic field. In an exemplary embodiment, oscillating currents and or voltages may be applied to inductive sensors in the gradiometer. Changes to the oscillating currents and/or voltages detected in the presence of FOD may be signals used to indicate the presence of FOD. Oscillating currents and voltage signals may be used to directly drive the gradiometer. In some embodiments, an oscillating current signal is induced on the FOD sensor by the wireless power transfer field.

In some embodiments, the frequency of the oscillating currents and/or voltages used to directly drive a FOD sensor may be selected to make the sensor particularly sensitive or insensitive to particular types of FOD. In certain embodiments, the frequency, magnitude, and/or phase of the oscillating signals on the magnetic sensors may be varied to perform object and/or material characterization, identification and/or classification. In some embodiments, the frequency, magnitude and or phase of the induced FOD signal over a range of frequencies, magnitudes and/or phases, may be used to identify FOD and to determine whether a wireless power transfer system should react to the presence of that FOD. For example, a FOD detection system may be driven at a frequency that may evoke a reflection unique to a type, size, material, and/or location of a FOD. In another example, a FOD detection system may be driven with a broadband signal for which the reflection signature may also be unique to a type, size, material, and/or location of a FOD. In some embodiments, a FOD detection system may be driven at a frequency different than a frequency driving the wireless power transfer system. This may allow a FOD detection system and a wireless power transfer system to operate independently.

In some embodiments, a FOD sensor may include both inductive and capacitive sensors. In an example embodiment, the variable capacitance of the capacitive sensor may be integrated with a detection circuit of a magnetic field sensor. Such an embodiment has the advantage that the capacitive sensing function can be easily switched on and off, and may even be added on to a FOD detection system that was not originally designed to accept input signals from such a sensor.

In certain embodiments, a FOD detection system may include multiple sensor types. In some FOD detection systems, at least some of the different sensor types may be close together, may share the same space, and/or may detect FOD in similar or the same regions. In some embodiments, at least some of the different FOD may be apart from each other and/or may monitor different regions. In an exemplary embodiment, inductive sensors of a FOD system may be substantially separated from the capacitive elements of a magnetic resonator of the wireless power transfer system.

Active FOD Detection Processing

The loop, dipole, quadrupole, octupole, and the like coil sensor/gradiometer configurations described above may output oscillating voltages/currents/signals in the presence of oscillating electromagnetic fields. In embodiments, the oscillating electromagnetic field may be the desired measurement signal. In other embodiments, where the signals from multiple loops may be meant to substantially cancel each other out, the oscillating signals may be due to imperfect sensor and/or coil designs, imbalanced gradiometer designs and/or non-uniformities in the electromagnetic field, owing to the resonator designs, resonator positions, the presence of FOD, and the like. In accordance with exemplary and non-limiting embodiments, a read-out amplifier may be connected to a given coil, loop, sensor, gradiometer, and the like, and may have a high input impedance. This arrangement may prevent a substantial circulating current from developing in the sensor coil, loop, lobe, sensor, gradiometer and the like, which could, in turn, spoil and/or perturb the Q-factor of the resonators used for wireless energy transfer. In some embodiments, the loops, lobes, coils, gradiometers and the like may be connected to amplifiers and/or filters and/or analog-to-digital converters and/or operational amplifiers, and/or comparators, and/or processors, and/or any electronic component that may be arranged to have high input impedance. In certain embodiments, a FOD sensor may include a conducting loop and a high input impedance electronic component. In exemplary embodiments, signals induced in the loops, lobes, coils, sensors and the like may be small enough that processing circuitry of any input impedance may be used to process the FOD signal. Signal processing may include, but is not limited to, detecting the signal, amplifying the signal, combining the signal, converting the signal (from AC to DC and or from DC to AC), clamping the signal, comparing the signal, filtering the signal, storing the signal, analyzing the signal on a processor, and the like may be utilized. For example, a drive frequency for a FOD detection system may be chosen to be susceptible to a certain type of FOD. In some embodiments, the drive frequency may be lower than the frequency of a wireless power transfer system. For example, a drive frequency may be at 10 kHz because some metals create more loss at 10 kHz than at 145 kHz. In another exemplary and non-limiting embodiment, a broadband signal may be used to drive the FOD sensor and then spectral analysis may be performed on the measured and/or reflected signal to determine the presence of FOD. Different FOD may be associated with different reflection signatures. A system may include a learning algorithm that may characterize and store the reflected FOD signatures. A system may then determine the type of FOD based on its "known FOD" database.

In some embodiments, conditioning circuitry may be utilized to subtract unwanted offset signals, constant signals and/or oscillating signals from the sensors and gradiometers. Oscillating signals may be generated using any type of capture coil in the oscillating electromagnetic field, or by using a crystal oscillator and/or a processor. The magnitude and/or phase of the oscillating signal may be generated, conditioned and manipulated using any known electronic signal processing techniques. In embodiments, removing constant offsets and/or oscillating signals produced from the sensors in the absence of FOD may yield improved sensitivity and may reduce background noise and in some cases, false positive outputs from the sensors.

In accordance with exemplary and non-limiting embodiments, at least one conductor from at least one coil (loop, sensor, gradiometer) in an array may be connected to a read-out amplifier and/or an analog-to-digital converter as shown in FIG. 5. A loop conductor 502 may be connected to an amplifier 506 and/or an analog-to-digital converter 508 and may produce an output 504 that may be used by other elements of a wireless energy transfer system or as an input to a processing element (not shown) such as a microprocessor to store and analyze the output of the coil, loop, sensor and/or gradiometer.

In certain embodiments, the voltage on certain or all coils, loops, sensors, gradiometers and the like, in an array may be measured in sequence or may be multiplexed in a way that allows fewer read-out amplifiers or analog-to-digital converters to sample the array such as in an exemplary embodiment shown in FIG. 6. In an exemplary embodiment, an array of gradiometers 602, 604, 606 may be connected to a multiplexed amplifier 608 and may be connected to one or more digital-to-analog converters 610. The output of the one or more digital-to-analog converters 612 may be used by other elements of the wireless energy transfer system or as an input to a processing element (not shown) such as a microprocessor to store, process, convert, report, analyze, and the like, the output of the coil, loop, sensor and/or gradiometer.

In some embodiments, conductors of a sensor and/or gradiometer loop may be connected to active and/or passive filter circuitry to provide a high terminating impedance at high or low frequencies. In certain embodiments, conductors of a sensor and/or gradiometer loop may be connected to active and/or passive filter circuitry to provide a high terminating impedance at very high or very low frequencies.

In some embodiments, a voltage on a coil, loop, sensor, gradiometer and the like may be sampled at increments that allow a processor to determine the amplitude and phase of the waveform induced on the coil, loop, sensor, gradiometer, and the like, relative to a reference waveform. In certain embodiments, a voltage may be sampled at least twice per period of oscillation (i.e. at or above the Nyquist rate). In embodiments, a voltage may be sampled less frequently (i.e. in higher-order Nyquist bands). A voltage waveform may be filtered or conditioned before sampling. A voltage signal may be processed to improve the signal-to-noise ratio or to reduce the harmonic content of the signals being sampled. A voltage waveform may be digitally filtered or conditioned after sampling.

In some embodiments, a current on a coil, loop, sensor, gradiometer and the like may be sampled at increments that allow a processor to determine the amplitude and phase of the waveform induced on the coil, loop, sensor, gradiometer, and the like, relative to a reference waveform. In certain embodiments, a current may be sampled at least twice per period of oscillation (i.e. at or above the Nyquist rate). In some embodiments, a current may be sampled less frequently (i.e. in higher-order Nyquist bands). A current waveform may be filtered or conditioned before sampling. A current signal may be processed to improve the signal-to-noise ratio or to reduce the harmonic content of the signals being sampled. A current waveform may be digitally filtered or conditioned after sampling.

In embodiments, a time-sampled electrical signal from coils, loops, sensors, gradiometers, and the like of the FOD detector may be processed to determine the amplitude and phase with respect to a reference signal. The reference signal may be derived from the same clock used to excite the resonators used for wireless energy transfer. In embodiments, the reference signal may be derived from the signal used to drive the coils, loops, sensors, gradiometers and the like of the FOD detector. In exemplary embodiments, signals from coils, loops, sensors, gradiometers, and the like may be processed by a FOD detection system at a rate of less than 5 samples per second or less than 10 samples per second.

In some embodiments, a FOD detection system may include a separate frequency, field magnitude, and/or phase sampling loop 704 and electronics 702 to synchronize the sensor and/or gradiometer readings to the oscillating magnetic fields of a wireless energy transfer system as shown in FIG. 7.

In embodiments, the reference signal may be from a different oscillator at a different frequency.

An example of processing a figure-8 quadrupole configuration (FIG. 3A) for FOD detection may be as follows:

1. With no FOD present, collect a time-sampled voltage waveform from one of the figure-8 loops
2. Determine the amplitude and/or phase of the fundamental frequency component (or of its harmonics)
3. Store the amplitude and/or phase as a baseline reference value
4. With FOD present, collect a voltage waveform from the same figure-8 loop
5. Determine the amplitude and/or phase of the fundamental (or its harmonics)
6. Compare the amplitude and/or phase to the reference value
7. If the difference between the signal and the reference exceeds a predetermined threshold, declare a detection of FOD.

In some embodiments, the amplitude and phase of the voltage/current waveforms with and without FOD present may be compared and/or evaluated on a polar plot and/or in amplitude/phase space. In embodiments using polar plots and/or amplitude/phase space, if the distance (e.g., a distance determined by least squares method) between a measured signal and a reference signal exceeds a predetermined threshold, it may be determined that FOD is present on the sensor.

In certain embodiments, the processing of a signal may be performed using analog electronic circuits, digital electronics or both. In some embodiments, the signals from multiple sensors may be compared and processed. In certain embodiments, FOD sensors may reside on only one, or all, or some of the resonators in a wireless power transfer system. In some embodiments, the signals from FOD sensors on different resonators may be processed to determine the presence of FOD and/or to give control information to a wireless power system. In certain embodiments, FOD detection may be controllably turned on and off. In some embodiments, FOD detection and processing may be used to control the frequency of a wireless power transfer system, the power level transferred by a wireless power system, and/or the time period when wireless power transfer is enabled and/or disabled. In certain embodiments, the FOD detectors may be part of a reporting system that may report to a system user that FOD is present and/or that may report to higher level systems that FOD is present or is not present. In some embodiments, a FOD detection system may be capable of utilizing a "learning capability" that may be used to identify certain types of FOD and that may include system identification and/or system feedback to categorize types of FOD as harmless, in danger of heating, not allowed for other reasons, and the like. In an exemplary embodiment, a FOD detection system may require less than 5 W or less than 10 W or less than 20 W of power to operate.

In accordance with exemplary and non-limiting embodiments processing capabilities may be embedded into a FOD detection system and/or subsystem and/or sensor data may be sent to a remote and/or central processor. The processing may compare collected voltage waveforms to reference waveforms and look for statistically significant changes. The processing may compare collected current waveforms to reference waveforms and look for statistically significant changes. Those skilled in the art will understand that the waveforms can be compared in amplitude and phase, I or Q components, sine or cosine components, in the complex plane, and the like.

In embodiments, FOD calibration and/or reference and/or calculated and/or determined baseline information may be stored in a memory element of a FOD subsystem. In embodiments, FOD sensors may include printed circuit board traces and a FOD system may include a microcontroller residing on a printed circuit board. In embodiments, the memory element of a FOD system may be on the same printed circuit board as the FOD sensors. In other embodiments, the memory element for a FOD system may be remote from the FOD system. For example, the signals from a FOD system may be communicated to a controller/processor/ASIC/PIC/DSP and the like, and/or a memory unit included by a wireless power source resonator, device resonator, repeater resonator or any type of source, device and/or repeater electronics control unit. In some embodiments, the signals from a FOD system may be communicated to a computer. In certain embodiments, the signals from a FOD system may be used to control the operation of a wireless power transfer system.

Specific and non-limiting embodiments of FOD detection systems are described below. Data have been collected from the embodiments that show them working as FOD detectors.

Figure 9:
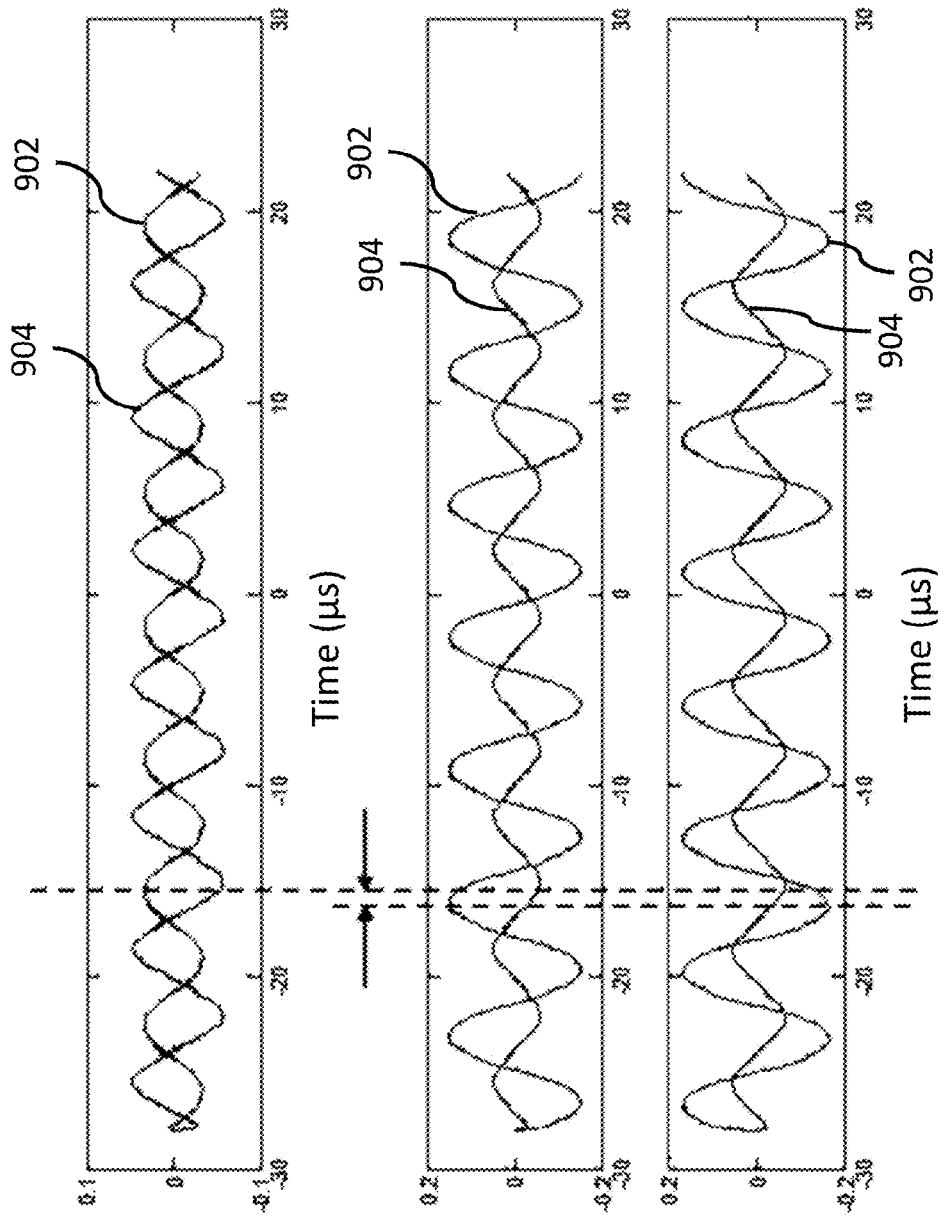
FIGS. 9A-9C are graphs that show voltage measurement curves from a figure-8 gradiometer sensor.

In the first embodiment a stranded wire was formed into a figure-8 loop forming a quadrupole as shown in FIG. 8 with a longer wire between the two loops (gradiometer 1). The second embodiment was designed as shown as gradiometer 2 in FIG. 8. The figure-8 loops were approximately 5 cm long, with each lobe approximately 2.5 cm in diameter. FIG. 9A-9C show sample voltage waveforms collected from the two sensors placed on top of a wireless energy source resonator that was configured to deliver 3.3 kW to a load attached to a device resonator. FIG. 9A shows the small residual voltage (~30 mV$_{rms}$) on the two gradiometers pictured FIG. 8. The residual voltage may be due to a combination of non-uniform magnetic field, slight variations in lobe area, and electrical interference. Results from gradiometers #1 and #2 are plotted as curve 904 and curve 902, respectively. When a metallic chewing gum foil is placed on the right lobe of gradiometer #2, at least some flux through that lobe is blocked and the gradiometer becomes more imbalanced. In that scenario, a substantial amplitude increase and slight phase shift is observable as shown in in FIG. 9B, curve 902. When the foil is moved to the left lobe of gradiometer #2, the gradiometer is again imbalanced, resulting in a similar change in amplitude to when the right lobe was blocked but with the phase changed by approximately 180° as shown in FIG. 9C. In some embodiments, these changes in phase and/or amplitude readings of a FOD sensor or gradiometer may be used to detect the presence of FOD on the sensors. In certain embodiments, these changes in phase and/or amplitude readings of a FOD sensor or gradiometer may be used to detect the position of FOD on the sensors.

An embodiment of the figure-8 sensors was also fabricated using printed-circuit board (PCB) techniques to realize the sensor coils or loops. This embodiment may have advantages including low cost, higher fill factor (since the loops can be made into any shape and easily tiled using standard PCB processing techniques), higher uniformity, higher reproducibility, smaller size and the like. A higher-fill factor was obtained using tiled rectangular loops for a 16-channel array of individual figure-8 sensors. The printed loops were highly uniform resulting in smaller (and flatter) baseline readings from the sensors when no FOD was present.

In some embodiments, the sensors and/or gradiometer sensors described above can be combined with other types of FOD sensors to improve detection likelihood and lower false alarms (system detects FOD when no FOD is present). For example, a single or an array of temperature sensors can be integrated into a resonator assembly. If a piece of FOD begins to heat up it may disturb the normally expected temperature measurement and/or spatial temperature distribution. That deviation can be detected and used to send an alarm to a system controller. In embodiments, a temperature sensor may be used alone or in combination with a metal object sensor and/or it may be used as a backup or confirming sensor to the metallic object sensor.

The presence of living objects such as humans and/or animals in the vicinity of wireless power may be detected and may cause a wireless power transfer system to turn down and/or shut down and/or produce an alarm or warning (e.g., a visual and/or auditory signal) if FOD is present between the source and receiver and/or if the living objects intrude into magnetic fields of certain field strengths. The tolerable, acceptable, permitted and the like, field strength limits may be frequency dependent and may be based on regulatory limits, safety limits, standards limits, public perception limits, and the like. In certain embodiments, a dielectric sensor may measure changes in the fringe capacitance from a conductor such as a long wire and may be used to detect the proximity of living beings. In some embodiments, this type of sensor may be used during diagnostic testing, prior to wireless energy transfer, and during wireless energy transfer. In embodiments, this type of sensor may be used alone or in combination with any type of FOD detector. In certain embodiments, FOD detectors may detect human beings, living organisms, biological matter, and the like.

Vehicle Charging Applications

Detection of FOD may be an important safety precaution in many types of wireless energy transfer systems. As an example, detection of FOD by a 3.3 kW car charging system is discussed below.

Figure 10:
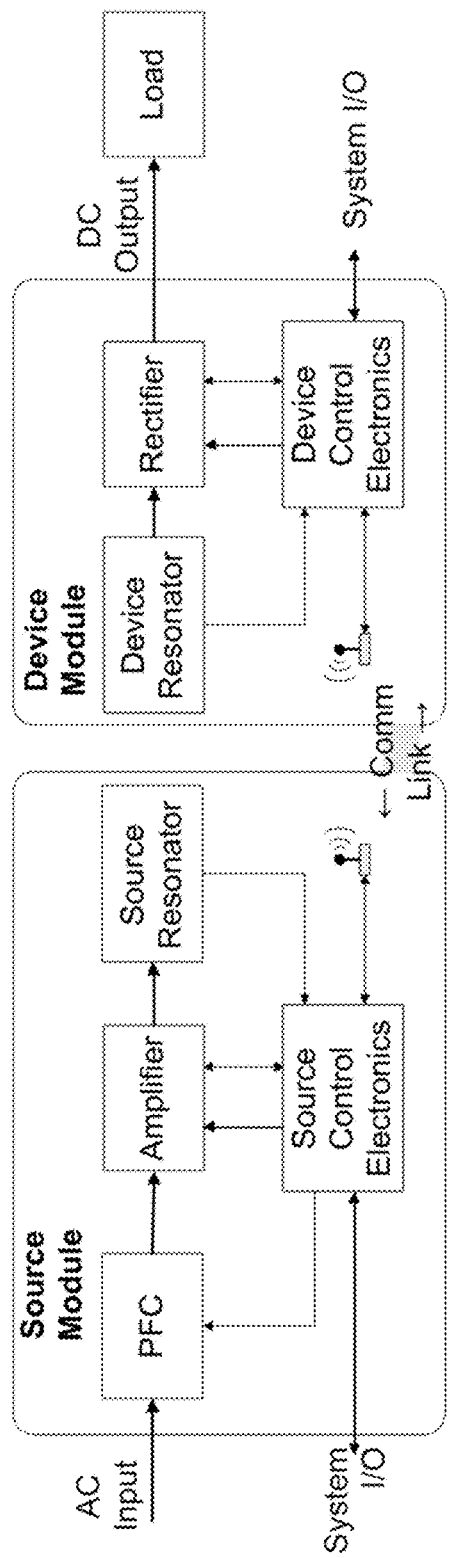
FIG. 10 is a schematic diagram that shows a block diagram of an exemplary EV charger system.

A block diagram of an exemplary EV Charger System is shown in FIG. 10. The system may be partitioned into a Source Module and a Device Module. The Source Module may be part of a charging station and the Device module may be mounted onto an electric vehicle. Power may be wirelessly transferred from the Source to the Device via the resonators. Closed loop control of the transmitted power may be performed through an in-band and/or out-of-band RF communications link between the Source and Device Modules.

A FOD detector system (not shown) can be integrated into the system in a variety of places. In some embodiments, FOD systems may be integrated into the Source Module, into the source resonator, into the housings or enclosures of the source resonator and the like. In certain embodiments, FOD systems may be integrated on the device side of the system. In some embodiments, FOD systems may be implemented on both the source and device sides of the wireless power transmission system. In certain embodiments, a FOD detection system may include multiple sensors and a processor with a discrimination algorithm. The processor can be connected to an interface that functions as an interlock in the Source control electronics. Other FOD detector systems may be connected to the charger systems through an additional interface or through an external interface. Local I/O (input/output) at each module may provide an interface for system level management and control functions in a wireless power system utilizing FOD detection.

The source resonator in a high power (3.3 kW or more) vehicle charging system may have its highest magnetic field density near the boundaries of the windings and, optionally, any magnetic material. In the areas of high magnetic field, a sensor array that includes multiple double-figure 8 coils with rectangular-shaped lobes can protect against inadvertent heating of metallic FOD. The array may be fabricated on a PCB and may have integrated filtering and signal conditioning included on the board. A second PCB of equivalent design may be positioned slightly above or below the first PCB and translated laterally in the manner described in FIG. 4B. Alternatively, a multilayer PCB may be used that contains both (or more) sets of arrays on a single board. An algorithm like that described above may run in an on-board processor whose output may be transmitted to a system controller. The system controller can compare the output of the metallic FOD detector to the outputs of additional FOD detectors, such as those measuring temperature profiles or dielectric changes. The system can then decide whether to turn down or shut down the system if FOD is detected.

Some possible operation modes of a FOD detection system are as follows:

Low-power diagnostic tests can be performed without the vehicle present to check health and status of the charging station and to check for FOD prior to a vehicle driving over the source.

After the vehicle arrives and is positioned over the source module, but prior to high-power charging, the FOD detector may verify that the source and/or a region around the source is still free of FOD.

After the vehicle arrives and is positioned over the source module, but prior to high-power charging, a FOD detector may verify that the device is free of FOD.

During high-power charging, one or more FOD detector(s) can verify that no additional FOD has moved onto the resonator coil or into the vicinity of the resonator coil.

If FOD is detected during low power diagnostics, a communication signal may be set to a vehicle, a charge station, a central processor and the like to indicate that FOD is present at a certain source location. In some embodiments, FOD sensors may include a communication facility. The communications may be in-band and/or out-of-band and may be part of the electric vehicle communication system or it may be a separate network. In certain embodiments, a source may provide an indication to a user or driver that it has FOD on it or in its vicinity. In some embodiments, a source may provide a visible indicator, and audible indicator, a physical indicator, a wireless indicator and the like, to alert a user to the presence of FOD. In certain embodiments, a resonator may include a mechanism for removing FOD from itself and/or its vicinity and may actuate such a mechanism when FOD is detected. In some embodiments, users may have equipment designed to remove FOD from resonators and may use such equipment to clear FOD from system resonators such as source resonators and/or device resonators and/or repeater resonators.

In certain embodiments, equipment designed to remove FOD may include magnets that may be used to attract certain FOD such as pieces of metal, conductors and/or magnetic materials. In some embodiments, equipment designed to remove FOD may include brushes, brooms, swiffers, rags, mops, sweeping materials, and the like that may be used to remove FOD. In certain embodiments, equipment designed to remove FOD may include vacuums, suction cups, tweezers, pinchers, sticky rollers, blowers, fans, and the like that may be used to remove FOD.

Processing of Sensor Data

In embodiments the readings from multiple FOD sensors in an array may be processed separately and compared to a baseline or expected and/or measured readings from other sensors, sensor arrays, reference readings, stored readings, look-up values and the like. In other embodiments, readings from multiple sensors may be used and analyzed together to analyze and compare the behavior of the whole array of sensors. Processing and analyzing readings from multiple sensors at the same time may provide for improved sensitivity, FOD discrimination, and the like. In this disclosure, it is understood that the processing and analyzing may be done at similar times. Processing multiple sensor readings together may provide more information due to the higher dimensionality of the data. Capturing and processing data from multiple sensors may capture effects like the inter-relation of adjacent sensors, trends and differences in complete sensor systems, and other effects that may not be captured if each sensor is analyzed separately. Some challenges with processing data from multiple sensors together may include ensuring that the data is processed efficiently and that possible information from the data is not lost during processing. A multidimensional data set may be difficult to store and analyze while data is continuing to be detected while maintaining the ability to detect small changes in the FOD sensors.

In some embodiments, readings from multiple sensors may be processed and analyzed together to calculate one or more numerical values that can be used as distinguishers or alarms for abnormal system state or the presence of FOD. The data processing methods may calculate one or more correlation, covariance, and means matrices from the multiple sensors that may be used as baseline values for comparing the readings of the system. Once a baseline is established readings from the sensors may be compared with the baseline using efficient matrix operation calculations to generate a probability or likelihood that the new readings are comparable to the baseline readings. The details of these exemplary steps are outlined below.

(i) Calculating Sensor Baseline

In some embodiments, to determine a no-FOD-present baseline, readings from at least two sensors in a sensor array may be used to calculate the mean and covariance matrix. The mean and covariance matrices may be used as a comparison for measured data during operation of a FOD detection system.

In an exemplary embodiment, a FOD system with j sensors, the amplitude $r_i$ and phase $\theta_i$ of the substantially sinusoidal signal from each sensor i may be captured from each sensor. The phase $\theta_i$ may be defined by a reference value or signal. A user may determine the reference value or signal. In some embodiment, the reference signal may be generated from a reference clock circuit. In some embodiments, where the signals produced by FOD sensors are not substantially sinusoidal, signal processing may be performed to substantially isolate and detect the fundamental component of the signal. In certain embodiments, where the signals produced by FOD sensors are not substantially sinusoidal, signal processing may be performed to substantially isolate and detect at least one harmonic component of the signal. In some embodiments, any combination of fundamental and harmonic components of the sensor signal may be measured and utilized in a FOD detection scheme. The phase $\theta$ may be calculated with respect to one or more reference signals for all sensors. For j sensors, the $r_i$, $\theta_i$ of each sensor provide 2j data points. The $r_i$, $\theta_i$ data may be represented in an array form x according to equation 1 (Eq. (1)), shown below:

$$x = \begin{bmatrix} r_1 \\ \theta_1 \\ \vdots \\ r_j \\ \theta_j \end{bmatrix}. \tag{1}$$

In some embodiments, there may more than one reference signal for comparison. Multiple reference signals may be generated via multiple reference coils in a FOD detection system. In some embodiments, an arrangement of reference coils may be dependent on the magnetic field of a wireless power transfer system. For example, for magnetic fields that are radial in shape and perpendicular to the plane of a resonator coil of a wireless power transfer system, reference coils may be arranged in a circle so that its field may be uniform from reference coil to reference coil. In another example, for magnetic fields that are parallel to the plane of a resonator coil of a wireless power transfer system, reference coils may be arranged in columns or rows, as shown in FIG. 12. Reference signals or sets of reference signals from reference coils may be compared to each other, to signals from FOD sensors, etc. A reference signal or a set of reference signals may be utilized based on the location, size, type, and/or material of detected FOD.

In certain embodiments, the readings of amplitude and phase from at least one sensor may be processed and/or modified by a function, by circuitry, by calculation and the like and the processed data may be represented in an array. In some embodiments, various functions may be used to process measured data. In certain embodiments, the function used to process and/or modify the original sensor data may not reduce the dimensionality of the data. For example, one function may be to take the sine and cosine of the phase of each reading which results in the following array x according to Eq. (2), shown below:

$$x = \begin{bmatrix} r_1 \cos\theta_1 \\ r_1 \sin\theta_1 \\ \vdots \\ r_j \cos\theta_j \\ r_j \sin\theta_j \end{bmatrix}. \tag{2}$$

In some embodiments, each data column of x may be optionally normalized by a normalization factor such as the value $$\sqrt{\sum_{i=1}^{j} r_i^2}.$$

In an exemplary embodiment, to build the no-FOD-present baseline mean and covariance matrices, the system may acquire multiple sets, say p sets, of readings of the sensors to generate multiple data matrices, x, for various operating points of the system (power transfer levels, relative positions of the source and device modules, and the like). The multiple readings of the sensors may preferably represent a useful, common, specified, expected, and the like range of operation of the system and sensor readings. With the p sets of data (optionally normalized) the mean, μ, and covariance, σ, matrices may be calculated according to Eqs. (3) and (4), shown below:

$$\mu = \frac{1}{p}\sum_{l=1}^{p} x_l \quad (3)$$

$$\sigma = \frac{1}{p}\sum_{l=1}^{p} (x_l - \mu)(x_l - \mu)^T. \quad (4)$$

In this exemplary embodiment, the covariance matrix a may be a 2 j×2 j matrix. The mean and covariance matrices may be saved by the system as a baseline for comparison against sensor readings during normal operation. The mean and covariance matrices may be used to calculate the FOD likelihood during operation.

(ii) FOD Likelihood Calculation

In an exemplary embodiment, during normal operation, the system may collect readings from the FOD sensors and compare the readings to the calibration baseline of the mean and covariance matrices to determine if FOD is present. The comparison may be based on a function that produces one or more easily analyzable or comparable numbers or likelihoods. In one embodiment, if x is the array of 2j data points from the j FOD sensors, the likelihood, y, may be computed as Eq. (5), shown below:

$$y = (x-\mu)^T \sigma^{-1}(x-\mu). \quad (5)$$

A probability, Ψ, may be computed as Eq. (5.5), shown below:

$$\Psi = (2\pi)^{-\frac{p}{2}}|\sigma|^{-\frac{1}{2}}e^{-\frac{1}{2}(x-\mu)^T\sigma^{-1}(x-\mu)}. \quad (5.5)$$

In embodiments, the inverse of the stored covariance matrix a may be pre-computed. The likelihood, y, may be used as an indicator of FOD. In embodiments a threshold value may be assigned to a value of y above or below which the sensor readings are assumed to detect an abnormal state in the system such as the presence of FOD.

In this exemplary processing technique and method, the behavior of multiple sensor readings may be used together in an efficient manner to determine the likelihood of an abnormal state of the system with relatively small data storage requirements for storing baseline or calibration readings.

In an example embodiment, a system comprising one wireless source resonator and one wireless device resonator includes a FOD detection system. The FOD detection system includes a 7 by 7 array of figure-8 sensors (49 sensors total) positioned between the source and device resonators. The figure-8 sensors are positioned in the magnetic field of the source resonator. When the source resonator generates an oscillating magnetic field, the magnetic fields generate a small oscillating voltage in the 49 FOD sensors. The voltage in the FOD sensors may be dependent on the magnetic field distribution around the sensors and therefore may function as magnetic field gradiometers during operation of the system.

During normal operation of a wireless energy transfer system, the signals from or readings of the FOD sensors may change or drift due to changes in the magnetic field distribution caused by temperature changes, changes in offsets, power levels, presence of other resonators, and the like. The sensor readings may change or drift during normal operation of a wireless energy transfer system even when no FOD is present. The system may require a calibration step to determine a baseline range of sensor readings or a range of normal sensor readings. The baseline readings may be used to compare FOD sensor readings during system operation (system stand-by, start-up, power transfer, maintenance, and the like) to detect FOD, or abnormal system states that might manifest in a FOD sensor reading different from the baseline.

For the example system, the baseline may be established during a calibration procedure. The baseline may include mean and covariance matrices calculated based on one or more of the system FOD sensor readings. To determine a baseline the system may capture the amplitude and phase of the sensor readings for one or more system states (98 data points). The sensor readings for each state may be used to calculate the mean and covariance matrix as outlined above.

As described previously, suppose p measurements are performed for the purpose of calibration. Each measurement of the sensor data contains 98 values. Each measurement of sensor data $x_i$ can thus be represented as a column matrix of size 98 according to Eq. (6), shown below:

$$x_i = \begin{bmatrix} r_1 \cos\theta_1 \\ r_1 \sin\theta_1 \\ \vdots \\ r_{49}\cos\theta_{49} \\ r_{49}\sin\theta_{49} \end{bmatrix}. \quad (6)$$

The p measurements of sensor data may preferably represent data produced over a range of operating points of the system over which the FOD may be detected. With the p measurements of data (optionally normalized) the mean μ and covariance a matrix may be calculated according to Eqs. (7) and (8), shown below:

$$\mu = \frac{1}{p}\sum_{l=1}^{p} x_l \quad (7)$$

$$\sigma = \frac{1}{p}\sum_{l=1}^{p}(x_l - \mu)(x_l - \mu)^T. \quad (8)$$

Once the system is calibrated and the mean and covariance matrix saved and computed the system may periodically or continuously take measurement of the FOD sensors during operation of the system. For each set of readings from each sensor in the FOD system the system may compute the likelihood based function, y, of FOD being present near the system according to Eq. (9), shown below:

$$y=(x-\mu)^T \sigma^{-1}(x-\mu). \tag{9}$$

A probability, $\Psi$, may be computed as Eq. (9.5), shown below:

$$\Psi = (2\pi)^{-\frac{p}{2}} |\sigma|^{-\frac{1}{2}} e^{-\frac{1}{2}(x-\mu)^T \sigma^{-1}(x-\mu)}. \tag{9.5}$$

The likelihood y and probability $\Psi$ may be used to determining the FOD likelihood. The largest likelihood y corresponds to the smallest value of $\Psi$.

Based on an input, calculated, measured, or predetermined threshold for y, the system may categorize calculated values as above the threshold to mean that FOD is present and mitigate or investigate the risk of FOD using other parts of the system.

In some embodiments of a FOD detection system, the readings from each sensor may be given equal importance or equal weight in the computation of the covariance matrix and the likelihood function. In certain embodiments, the sensors may be given unequal weight or importance. In some embodiments, readings from certain one of more sensors may be more important due to a sensors greater sensitivity, position, and the like. For example, some sensors (i.e. coils, loops, figure-8 loops) may be positioned in areas of high magnetic field while other sensors may be positioned in areas of low magnetic field. It is also understood that various sensor described in this disclosure may be positioned in areas of high magnetic field while other sensors may be positioned in areas of low magnetic field. In some embodiments, changes detected by sensors in the high magnetic field may be more important than changes detected by other sensors in the system. Such sensors may be given greater importance and their readings may be given greater weight in the calculation of the mean and covariance matrix.

In some embodiments, FOD sensors in resonator high-field or 'hot' regions may be designed to be smaller and/or more densely spaced than sensors in the low-field or 'cool' regions. The regions where a transition from a 'hot' region to a 'cool' region exists may also have smaller sensor loops to minimize the effect of non-uniformity of magnetic fields across the area of the sensor loop. In certain embodiments, certain regions of the FOD sensor may include coils, loops, gradiometers, figure-8 sensors, and the like, with unequal sized and/or shaped lobes. Such asymmetrical sensors may be designed to provide higher sensitivity, lower noise, and/or less temperature sensitive performance. In some embodiments, sensor arrays may include at least one sensor with a different size and/or shape and/or symmetry, and/or type, and/or relative placement, and/or relative orientation, and/or conductor material, from at least one other sensor in the array.

In certain embodiments, a system may have multiple baselines and/or covariance matrices. For example, a system may have baselines and/or covariance matrices for one or more specific states, positions, temperatures, humidities, power levels, and the like of the system. In some embodiments, where a covariance matrix that has been determined or computed for a limited or specific baseline does not represent the complete operating range of the system, the system may be configured to activate the FOD detection system only when the system is in the specific state, position, power level and/or range of states, positions, power levels and the like for which the baseline was determined or computed.

For example, a FOD detection system may have been only calibrated with a baseline for sensor readings at a specific power transfer level (e.g., 3 kW). It is understood that the FOD detection system may have been calibrated with a baseline for sensor readings specific power transfer levels of 0.5 kW (e.g., 1 kW, 2 kW, 3 kW, 4 kW, 5 kW, 6 kW, 8 kW, 10 kW, 15 kW, 20 kW, 50 kW). A FOD detection system may use information from other sensors or parts of the system to determine if the system is operating at a state for which the baseline was taken. For example, a FOD detection system may receive information from the source resonator amplifier control circuitry to determine if the power transfer level is at or near 3 kW. Once a FOD detection system confirms the state of the system from other subsystems or sensors, the FOD detection sensors may be measured and compared against the saved baseline readings to determine if FOD is present. In an exemplary embodiment, a FOD detection system may include power level, position, system state, temperature, humidity, and the like, detection capabilities. In such an embodiment, the FOD detection system may confirm certain operating states without receiving information or system indicators from other subsystems and/or sensors of the wireless power transfer system. In some embodiments, a combination of information and/or indicators for more than one circuit, sensor, subsystem and the like may be used to determine the operating state of the wireless power transfer system and the applicability of a stored baseline and/or covariance matrix in a FOD detection system.

In certain embodiments, the baseline and/or the calibration may be calculated for sensor readings that represent the normal and/or acceptable operation of the system. In some embodiments, the sensor readings used to calculate the baseline may be for the FOD free, or fault free, operation of a wireless energy transfer system. The sensor readings used in the calibration of the baseline may represent a partial or complete range of acceptable operating states of a wireless energy transfer system and a partial or complete range of acceptable readings from a FOD detection system.

In general, a wide variety of different operating states for a wireless power transfer system can be represented in baseline and/or calibration information. In some embodiments, for example, baseline information can be provided (e.g., retrieved or measured) for multiple different operating states that correspond to different energy transfer rates between the power source and the power receiver of the system. In certain embodiments, baseline information can be provided for multiple different operating states that correspond to different alignments between the power source and the power receiver for the system. In some embodiments, baseline information can be provided for multiple different operating states that correspond to different spacings between the power source and the power receiver for the system, measured along a direction orthogonal to a plane defined by the resonator(s) of the power source.

In certain embodiments, the sensor readings used to calculate or calibrate the baseline may be representative of an unacceptable system behavior or state. In some embodiments, the sensor readings used to calculate or calibrate the baseline may be for readings for which FOD was present in the proximity of the system. The sensor readings used to calculate the baseline may be for resonator offsets that are beyond the operating range of the system. These unusual or undesired system states may be used to build their own mean and covariance matrices. Sensor readings during normal operation may be compared against these readings by calculating the likelihood, y, to determine the likelihood that the readings match the readings used for calibration. If the likelihood is high, the system may determine that FOD is present, and initiate a system response to the detection event.

In some embodiments, a wireless power transfer system with at least one FOD detector system may use sensor readings to calculate or determine a baseline for the normal or acceptable operation of the system and sensor readings to calculate or determine another baseline for the undesired or unacceptable operation or state of the system. In some embodiments, a system may have more than one stored baseline comprising one or more stored mean and covariance matrices. In certain embodiments, the one or more mean and covariance matrices may represent sensor readings for normal, expected, and/or acceptable system state and/or behavior and the one or more mean and covariance matrices may represent sensor readings for unusual, unacceptable, and/or out-of-range system state and/or behavior. In some embodiments, during operation of a wireless energy transfer system, a FOD detection system may take readings from the FOD detection sensors and compare them against the acceptable and unacceptable baselines. The system may use additional processing to help determine if the FOD sensor readings have higher likelihood, y, when compared to the acceptable or unacceptable baselines.

In some embodiments, during calibration and calculation of the baseline, the system may be trained or calibrated over a range of states and operating environments giving each state or environment an equal importance or equal weight in the computation of the covariance matrix and the likelihood function. For example, states and operating environments may include source-device separation distance, power levels, frequency used in wireless power transfer, humidity range, temperature range, altitude level, etc. In certain embodiments, some specific system states or environmental conditions may be given higher importance or a larger weight in the computation of the baseline. In some embodiments, certain specific system states may be more important or more likely during normal operation of the system. For example, a system used in the southern part of the United States may calibrate over a higher temperature range than a system used in the northern part of the United States.

In certain embodiments, more likely system states may be given higher weight in computation of the baseline. For example, during the computation of the baseline more data points (more of the p measurements) can be collected from those states which are more likely to be useful in normal operation. In some embodiments, a preferred method for establishing a baseline may include collecting baseline samples such that the number of samples collected for each state is directly proportional to the probability of the presence of that state during operation. In certain embodiments, a preferred method may assign weights to each state which is proportional to the probability of the state being present during normal operations.

As an example, if there are p measurements included in the baseline $(x_1, x_2, \ldots, x_p)$, they may each be weighted with weights $(w_1, w_2, \ldots, w_p)$ respectively. Then, the mean and covariance matrices assembled using this method may be calculated according to Eqs. (10) and (11), shown below:

$$\mu = \frac{1}{\sum_{l=1}^{p} w_l} \sum_{l=1}^{p} w_l x_l \qquad (10)$$

$$\sigma = \frac{1}{\sum_{l=1}^{p} w_l} \sum_{l=1}^{p} w_l (x_l - \mu)(x_l - \mu)^T. \qquad (11)$$

(iii) Synchronization

In some embodiments, a FOD system may include at least one conducting coil that picks up a voltage and/or current induced by the oscillating magnetic field. In certain embodiments, the oscillating voltage/current signal may be used to determine quantities such as the frequency of the magnetic field, the amplitude of the magnetic field and the phase of the magnetic field. These signals may be referred to as reference signals as they may be used for clock recovery and phase lock loops utilized by a FOD system. In some embodiments, reference signals may also be used to set a phase reference, so that phase information from individual sensors may be defined relative to a reference phase. In certain embodiments, a coil used to detect the field used for wireless power transfer may be referred to as a "reference coil".

In some embodiments, a reference coil may be any shape and/or size and may be made from similar conductors as the FOD sensors or from different conductors. In an exemplary embodiment of a FOD system that includes sensors integrated in a printed circuit board, a reference coil may be formed using printed circuit board traces, wire traces, Litz wire traces, conducting ribbons and the like. Reference coils may overlap portions of the FOD sensors or may fit within the lobes of FOD sensors.

In certain embodiments, a FOD system may include more than one reference coil. In some embodiments, a FOD system operation may include methods to determine which reference coil or combination of reference coils may be used in different operating modes. In certain embodiments, signal processing of reference coil signals may be used to determine whether one reference signal is better than others for a certain application, or whether multiple reference signals are better. Parameters such as signal-to-noise ratio, harmonic content, sampling sensitivity and the like may be measured, calculated, compared and the like to determine which reference coil signals may be used in a FOD system.

As described previously, the output of each FOD sensor may be approximated by a sinusoidal wave. The presence of FOD may affect the magnitude as well as the phase of the sensor signal when compared with the case when no FOD is present. In order to check for changes in phases of the signals, a reference signal may be measured and the phase difference between the sensor signals and reference signals may be used to detect any changes in the phases of the sensor signals. The reference signals may be generated by measuring the voltage across a loop of wire placed in the magnetic field. In the absence of FOD, the phase difference between the sensor signals and the reference signals may remain unchanged. Thus the phase difference of a sensor signal with respect to a reference signal may be used for FOD detection.

(iv) Quadrature Sampling

Quadrature sampling can be used to calculate an amplitude and relative phase of a measured sinusoidal signal with respect to a reference signal. In the case of FOD detection, the amplitude and relative phase of the measured signal with respect to a reference signal may be used as parameters for classification of measured signals as FOD present or FOD absent. When the sampled signals are not perfectly sinusoidal, the relative phase of a trigger signal of the quadrature sampling with respect to the reference signal can affect the calculation of amplitude and relative phase of the measured signal with respect to the reference signal. This can lead to a large spread in the calculated values of signal amplitude and relative phase in the absence of FOD and reduce the sensitivity of the sensor. One solution to this problem is to ensure that the relative phase of the trigger signal of the quadrature sampling and the reference signal does not substantially change. For example, the relative phase may be maintained within 10% (e.g., within 5%, within 3%, within 1%) of its mean value. The relative phase may be maintained by generating the trigger signal of the quadrature sampling using the reference signal so as to ensure that the relative phase of sampling signal and reference signal is not substantially changed and/or actively measure and control the relative phase of the sampling trigger and the reference signal.

The reference signal is processed using analog filters and amplifiers similar to the sensor signals. However the gain for the reference signal may be chosen to be different from those of the sensor signal amplifiers.

Calibration of FOD Sensors

In some embodiments, a FOD system and sensors may have a calibration procedure. The procedure may be used to "teach" or "train" a system the normal bounds of operation or calculate the appropriate baseline data (e.g., mean and correlation matrices). It is understood that appropriate baseline data may also refer to parameters such as, but not limited to likelihood y, misalignment, temperature, humidity, etc., of the wireless power transfer system. The calibration procedure may involve the collection of sensor data (x) at p states of the system in order to determine the mean and correlation matrices as described above. The calibration procedure may provide the bounds or a range of sensor readings without FOD. In embodiments the sensor readings may change or fluctuate due to movement of the resonators, due to different offsets of resonators, temperature changes, changes in distances, or resonator types, changes in vehicles, and the like. The system may need to recognize which changes in sensor readings are within the normal bounds of operation and which changes are due to foreign objects in the vicinity of the resonators. In some embodiments, a system may require calibration or a teaching phase to identify the range and characteristics of sensor readings and changes that may be considered to be within normal operation and within normal bounds of operation of the system. The calibration operation may provide for a baseline or range of baseline sensor readings classified as "normal" or "no FOD" readings. Sensor readings that are outside of the normal readings may be used to trigger an alarm signal and/or FOD detection or mitigation procedure.

In certain embodiments, a system may be calibrated during manufacture, over a time period of regular use, each time it used, and the like. The type of calibration, the time of calibration, complexity, number of readings, and the like may depend on the use scenario of the system, the desired sensitivity or performance, the cost of the system, and the like. In some embodiments, a FOD detection system may utilize more than one calibration method. The system may be calibrated with one calibration method and use another calibration method during use or in different environmental and/or deployment scenarios.

In some embodiments a FOD detection system may be calibrated to the normal range or a "no FOD" range of sensor readings during manufacture or before deployment of the system. In certain embodiments, a system may be calibrated or "trained" over a range of offsets, heights, resonators, resonator types, power levels, orientations, vehicles, temperatures, ground surfaces, weather conditions, and the like. The teaching or calibration phase may be designed to provide sensor readings without foreign objects over the normal or expected range of expected use case scenarios. The calibration may be performed in a controlled environment gradually providing a new scenario, offset, position, environmental variables, and the like while taking sensor readings. The sensor readings may be taken continuously as the position and environmental conditions change or may be taken periodically when the position or environmental conditions change in a significant way.

For example, during a calibration procedure, a FOD detection system may be calibrated for the changes in sensor readings due to changes in the offsets or misalignment of resonators. During the calibration procedure the resonators may be offset or misaligned from one another. The sensor readings may be monitored and processed continuously while the resonators are offset from each other, perhaps even while they are transferring power. In some embodiments, a FOD detection system may be calibrated with an adaptive technique to adapt to a changing state or environment. In certain embodiments, the sensor readings may be taken at discrete offsets, such as every 5 mm, 10 mm or more of offset during the calibration. In some embodiments, the sensor readings may be taken at multiple power levels or at continuously varying power levels at every measured position or at certain measured positions. In certain embodiments, multiple system performance parameters may be set, varied, swept, and the like, to perform the measurements, p, used to determine and/or calculate the mean and covariance matrices.

In some embodiments, a covariance matrix of a system may be equal to a correlation matrix if an expected value of a system parameter, measurement, reading, etc. is zero. In this disclosure, the terms "covariance" and "correlation" matrices may be used interchangeably.

In certain embodiments, during the calibration procedure, the sensor readings may be monitored but only processed or stored when there is a significant change in the readings from the sensors. During calibration for various offsets, for example, the offset may be changed and the sensor readings monitored. The sensor readings may only be processed, stored, or added to the calibration data if the readings deviate by a predetermined threshold from the saved calibration data that has already been taken. Processing data only when it changes by a predetermined threshold may reduce the number of readings and stored points required for sufficiently accurate calibration.

Returning to the example of calibrating over a range of offsets with the adaptive technique, the operating parameters of a wireless power system may be changed until the sensor readings differ from the calibration data of the sensors already stored. Once the readings differ significantly or by a predetermined threshold from the stored data the sensor readings may be processed and added to the calibration data of possible "no FOD" sensor readings during normal operation. In that respect the sensor data may be processed at inconsistent intervals. For example, calibration data may be taken at 5 mm, 20 mm, 22 mm, and 24 mm resonator offsets in the side-to-side direction depending on the differences of the sensor readings at these locations and the stored calibrated data. Another calibration procedure on another wireless power system may include measurements taken at 10 mm and 25 mm. The calibration procedures may be highly customized and may be optimized for calibration speed or accuracy or uniformity or any number of system variables, parameters, specifications and the like. In some embodiments, a calibration procedure for FOD sensors includes at least one measurement of at least one FOD sensor when the wireless power system is in at least one operating mode. In certain embodiments, FOD calibration includes using more than one measurement of at least two FOD sensors when the wireless power system is in at least two operating modes.

In some embodiments, calibration data stored in the system may be saved with the state of the system for each calibration point. The stored calibration data may be used to determine the state of the system during normal operation. For example, for each resonator offset position the calibration data may be saved along with information about the resonator offset position. During normal operation of a system, when the sensors are generating readings similar to that of a specific calibration point, calibration may be used by the system to determine the offset of the resonators or other parameters of the state of the system. In some embodiments, a calibrated FOD system may be used as a position sensor in a wireless power transfer system. In an exemplary wireless power transfer system embodiment, there may be 'n' states which tone may wish to distinguish based on the sensor data. For example, the 'n' states may be relative resonator positions. Then one of the 'n' states may be (0,0,10) representing a relative position where the centers of the resonator coils are aligned in an x-y plane and the resonator coils are 10 cm apart (following and (x, y, z) convention, where z is the dimension perpendicular to the x-y plane). Another of the 'n' states may be (−5, 10, 15) representing that the resonator coils are offset by −5 cm in the x-direction, 10 cm in the y-direction and 15 cm in the z-dimension. Such relative resonator positions may be within the normal operating range of a wireless power transfer system and the position data may be used by the system to enhance or alter its operation including, but not limited to, tuning impedance matching networks, determining appropriate power levels, determining an appropriate driving frequency, and/or any combination thereof. In other embodiments, the relative position of the resonators may be determined to be out-of-range for the system and the system control may generate an alarm, restrict power turn on, initiate repositioning algorithms, and the like.

In an exemplary embodiment, calibration data may be associated with certain system operating positions, orientations, power levels, frequencies and the like. In such embodiments, baseline computations may be established and/or stored for every operating state i. Each state i may be characterized using p data points (measurements) and may be represented as $(x_{(i,1)}, x_{(i,2)}, \ldots, x_{(i,p)})$, where i ranges from 1 to n, or 0 to n−1, or over a range of values such that the set contains n state values. For each of these n states, and every state i may have its own mean and covariance matrix which may be calculated according Eqs. (12) and (13), shown below:

$$\mu_i = \frac{1}{p}\sum_{l=1}^{p} x_{(i,l)} \qquad (12)$$

$$\sigma_i = \frac{1}{p}\sum_{l=1}^{p} (x_{(i,l)} - \mu_i)(x_{(i,l)} - \mu_i)^T. \qquad (13)$$

Given a new measurement x, the most likely state of the system is determined by calculating the following matrix product as previously described and according to Eq. (14), shown below:

$$y_i = (x-\mu_i)^T \sigma_i^{-1} (x-\mu_i). \qquad (14)$$

A probability, $\Psi_i$, may be computed as Eq. (14.5), shown below:

$$\Psi_i = (2\pi)^{-\frac{p}{2}} |\sigma|^{-\frac{1}{2}} e^{-\frac{1}{2}(x-\mu_i)^T \sigma^{-1}(x-\mu_i)}. \qquad (14.5)$$

The state which has the highest value of y is then the most likely state of the system. The highest value of y corresponds to the smallest value of $\Psi$ in the distribution of $\Psi_i$.

Information about the state of a system from the readings of the FOD detection system may be used by other parts of a wireless energy transfer system. Information about resonator offsets, resonator separations, and the like, may be used by the power and control circuitry of the wireless energy source amplifiers to control the power output of the source and its output parameters such impedance, frequency, and the like based on the state of the system. In some embodiments, information from other sensors may be used to refine or complement the system state predictions from a FOD detection system. Information from temperature sensors, inductive sensors, power and voltage readings on the resonators, and the like may be used to supplement or refine the system state predictions from a FOD detection system.

In certain embodiments, system state information may be used by other devices or systems. The information may be, for example used by a vehicle for guidance purposes to align the resonators during a parking operation in vehicle charging applications.

In some embodiments, depending on the cost, tolerances of the components that are used in the system, the sensitivity requirements, and the like each system may require a calibration procedure. In certain embodiments, each FOD detection system may undergo an individual calibration procedure using the wireless energy transfer resonators and system with which it will be paired. In some embodiments, each FOD detection system may undergo an individual calibration procedure using at least one special or standard wireless energy transfer resonator and system. The FOD detection system may then be paired with different wireless energy transfer resonator sets.

In certain embodiments, a calibration procedure for FOD subsystems may only be required for each type of wireless energy transfer system or resonator type. The calibration may be performed once for a test system and the calibration data from the one system may be used in all identical or similar wireless energy transfer systems without having to recalibrate each system.

In some embodiments, a calibration procedure may only be required for each distinct type of wireless energy transfer system or resonator type. After the readings from FOD detection sensors from the system type have been characterized they may be used as a baseline characterization data for other like systems, simplifying the calibration procedure for other copies of the system. With baseline calibration data loaded from the base system calibration, each successive system copy may only need to be calibrated at a specific subset of positions or system states to complete the calibration data collection for each system. Additional calibration procedures may be necessary for each additional system copy in case there are small differences in system characteristics due to component variation, manufacturing uncertainty, and the like.

In certain embodiments, information from one characterization or calibration may be used in other systems. For some systems it may be possible to compute the average matrix by sweeping power over only one position which may be the most likely operation position or state. The covariance matrix can then be computed using this value of the average even though it is not strictly an average of all the data points.

Suppose m measurements are taken at the most likely state of operation and the effective average $\mu_{eff}$ may be calculated according to Eq. 15:

$$\mu_{eff} = \frac{1}{\sum_{l=1}^{m} w_l} \sum_{l=1}^{m} w_l x_l. \qquad (15)$$

The effective covariance may then computed by measuring p data points over all possible states of operation but using this effective value of average according to Eq. (16):

$$\sigma_{eff} = \frac{1}{\sum_{l=1}^{p} w_l} \sum_{l=1}^{p} w_l (x_l - \mu_{eff})(x_l - \mu_{eff})^T. \qquad (16)$$

Using this method, when a new system is used, the effective covariance remains approximately the same and the calibration requires only new effective average which can be measured faster since it is only computed for one state of the system.

A system that is calibrated prior to deployment may be able to detect FOD at different phases of a wireless energy transfer system's use and initialization. In embodiments in which the calibration includes sensor readings without a device resonator the system may detect FOD before the arrival of a device resonator. For example, in vehicle charging applications the source resonator may check for FOD prior to the arrival of the vehicle. In some embodiments, the wireless energy source may turn on or ramp up in power prior to arrival of a vehicle. The source resonator may power up to full power or a fraction of its full power to excite the FOD detection sensors and get a reading. The readings may be compared with the calibration data of the system operating and/or powering up without FOD. If the readings deviate from the stored calibration data, a FOD detection system may be used to alert the user of possible FOD before a vehicle is parked over the source and/or before the wireless power exchange is turned partially or fully on.

If it is desirable to perform a check for FOD without a vehicle present, it may be necessary for a wireless power system source to excite the source coil without a device coil in proximity. In this case the source may excite the source coil in the same way it does with the device present during normal power transfer, or it may operate in a different mode to excite the source coil. For example, the impedance presented by the source coil without the device coil present may not allow normal operation of the source amplifier. In this case there may be one or more elements in the impedance matching network that can be switched in to the circuit to modify the impedance presented by the source coil in such a way that it is possible to operate the amplifier and the FOD detection system. Once the FOD check has been completed, the element or elements can be switched out of the circuit to allow normal power transfer operation when a vehicle is present.

A system that is calibrated prior to deployment may be immediately able to detect FOD that may have been positioned in proximity to the wireless energy transfer resonators at system startup. After a vehicle is parked, for example, and the wireless energy transfer turns on, the FOD detection sensors may be energized and can provide readings that may be compared to the saved calibration readings. If the detected readings deviate from stored values, the FOD detection system may generate a signal, an alarm, an indication, and the like, that FOD is present. In some embodiments, a wireless power transfer system may operate differently when FOD is present than when FOD is not present.

In certain embodiments, a FOD detection system may be calibrated during system deployment. In some embodiments, a FOD detection system may collect calibration data each time the system initiates or begins energy transfer and/or when the system is transferring power at any level. In some embodiments a system may perform system calibration during the start of energy transfer. In certain embodiments a system may be assured to be clear of FOD at system startup. The FOD free environment of the system during startup may be assured by a user, by another system, by a FOD clearing device, and the like. During initial wireless energy transfer, the system may use the initial FOD sensor readings as the baseline readings to store, compare to, and/or calibrate the normal expected set of readings during operation. In certain embodiments, during the first seconds of operation or during the first minutes of operation one or more readings of the FOD sensors may be taken and used to calculate a reference or a baseline for the sensors (i.e. compute a mean and a covariance matrix). It is understood that calculating the reference or the baseline for the sensors may also refer to calculating parameters such as, but not limited to, likelihood y, misalignment, temperature, humidity, etc., of the wireless power transfer system. During this calibration phase the system may dither, change or sweep parameters of a wireless energy transfer system to provide a range of possible sensor readings during operation. Parameters such as power, phase, frequency, and the like may be modified. Once a base line is established the system may operate normally with the FOD sensors being continuously or periodically monitored and compared to the baseline readings calculated and measured during the calibration phase at startup of the system. Sufficient deviation from the baseline readings may be used to signal that the system state has changed and FOD may be present.

In some embodiments, in the use of FOD calibration during system startup, the calibration may be performed each time the system is moved, changed, or started. In certain embodiments, changes in the system operating parameters such as resonator offset, distance, power level, temperature, environment, and the like may result in significantly different FOD sensor readings that may not be due to the presence of FOD. Therefore, a system may continue to add calibration data to its baseline matrices over the life of the FOD systems. In embodiments, a FOD system may self-calibrate on system turn-on and/or initiation and/or during wireless power transfer. In some embodiments, a variety of algorithms may be used to capture calibration data in the field. For example, the FOD system may collect calibration data each time the system turns on, or every other time the system turns on, or every n-th time the system turns on (where n is a positive integer such as 10) and the like. In certain embodiments, a system may collect additional calibration data at certain operating temperatures, power levels, coupling values and the like. In some embodiments, the collection of calibration data may be adaptive and may change over time. For example, if calibration data has been collected over a range of temperatures deemed to be sufficient, a FOD system may no longer collect additional calibration data based on temperature readings. While temperature is used as an example, any system parameter may be used including, but not limited to, types of resonators, resonators at certain separations, resonators attached to certain vehicle types, resonators at certain power levels, resonators in certain environments, and/or any combination thereof.

In a vehicle charging applications for example, a system may perform a FOD sensor calibration each time the vehicle parks over the source. During calibration, once the vehicle is parked, the source may initiate energy transfer and modulate the parameters of the energy transfer while FOD sensors are measured and the baseline is calculated and stored. During the initial calibration the resonator area may be manually or automatically cleared or checked of FOD to ensure the calculated baseline captures the sensor readings during normal (non-FOD or low-FOD or non-dangerous FOD, etc.) operation of the system. In some embodiments, each time the vehicle is parked and charged the system may be recalibrated during the initial startup of the system. Each time the vehicle is parked, the vehicle position, type, height, and the like may be different causing previously captured FOD sensor calibration data to no longer be representative of the normal or expected FOD sensor readings in the current state of the system. In certain embodiments, previous baseline may be altered by recalibration. In some embodiments, previous baselines may be discarded, overwritten, moved, ignored, and the like, and the recalibrated baselines may be used on their own. In certain embodiments, some combination of recent, previous and stored calibration data may be used in the FOD detection algorithm. In some embodiments a FOD detection system may be calibrated by the user over time and/or the system may include self-learning or machine learning methods to determine or learn normal and non FOD sensor readings.

Figure 16:
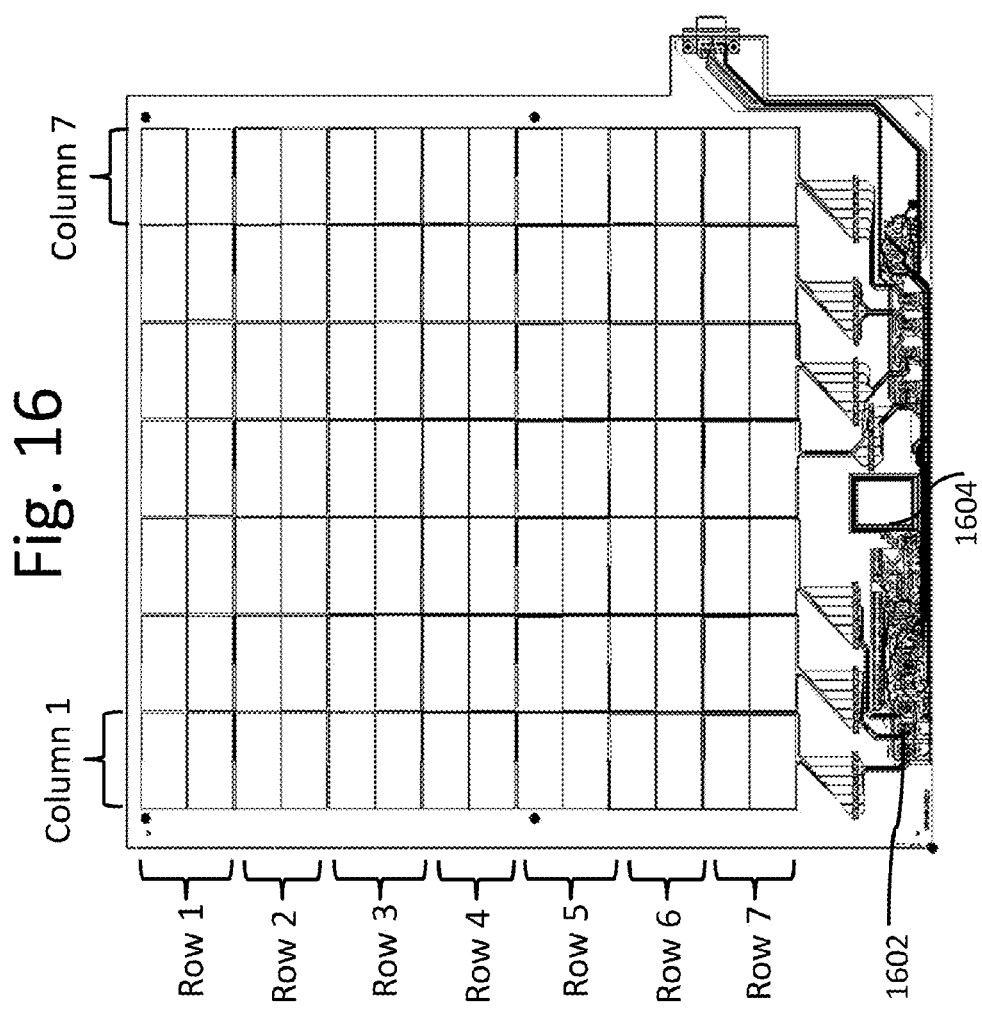
FIG. 16 is a schematic diagram that shows an exemplary layout of a FOD detection sensor board.

In another exemplary embodiment, a FOD sensor may include a printed circuit board. The printed circuit board may include traces that form conducting coils, loops, lobes, sensors, gradiometers and/or figure-8's. The conducting traces may be on a single layer of the printed circuit board or the conducting traces may traverse multiple layers of the printed circuit boards. The traces of an example circuit board having seven rows and seven columns of square figure 8 FOD is shown in FIG. 16. The circuit board also includes FOD sensor readout circuitry 1602 and a synchronization coil 1604 for synchronizing the FOD sensor phase and magnitude readings to the oscillating fields used for energy transfer.

Conducting traces may also be used to connect the FOD sensors to other electronics components of the FOD sensors. In certain embodiments, a FOD system may include at least one FOD sensor connected to at least one electronic multiplexer. Exemplary multiplexers may be referred to as IC multiplexers, 2×8 multiplexers, and the like. In an exemplary embodiment, a FOD system may include an Analog Devices IC multiplexer. In embodiments, a FOD system may include an ADG1607BRUZ multiplexer or a multiplexer with similar functionality. In some embodiments, multiple multiplexers may be used to process FOD sensor signals. In certain embodiments, IC multiplexers with high input impedance may be used in FOD systems.

In some embodiments, a FOD system may include a communication facility to enable information exchange between the FOD system and a wireless power transfer system and/or a controller of a wireless power transfer system. In certain embodiments, the communication facility may be a wired facility and/or a wireless facility. In some embodiments, a FOD system may be able to transmit and/or receive information, control signals, alarms, report, TTL signals, microcontroller commands, and the like. In certain embodiments, a FOD system may include a transceiver. In some embodiments, a FOD system may include a microcontroller.

In certain embodiments, a FOD sensor and/or system may be an add-on to an existing wireless power system. For example, a FOD sensor and/or system may be packaged separately to attach to or rest on a resonator of a wireless power system and to communicate with the wireless power system through wired and/or wireless communication links. In some embodiments, a FOD sensor and/or system may be integrated into at least one component of a wireless power system. For example, an enclosure for a wireless power component may include a FOD sensor and/or system. As another example, a plastic cover that fits over and attaches to a resonator housing may include a FOD sensor and/or system.

Figure 17:
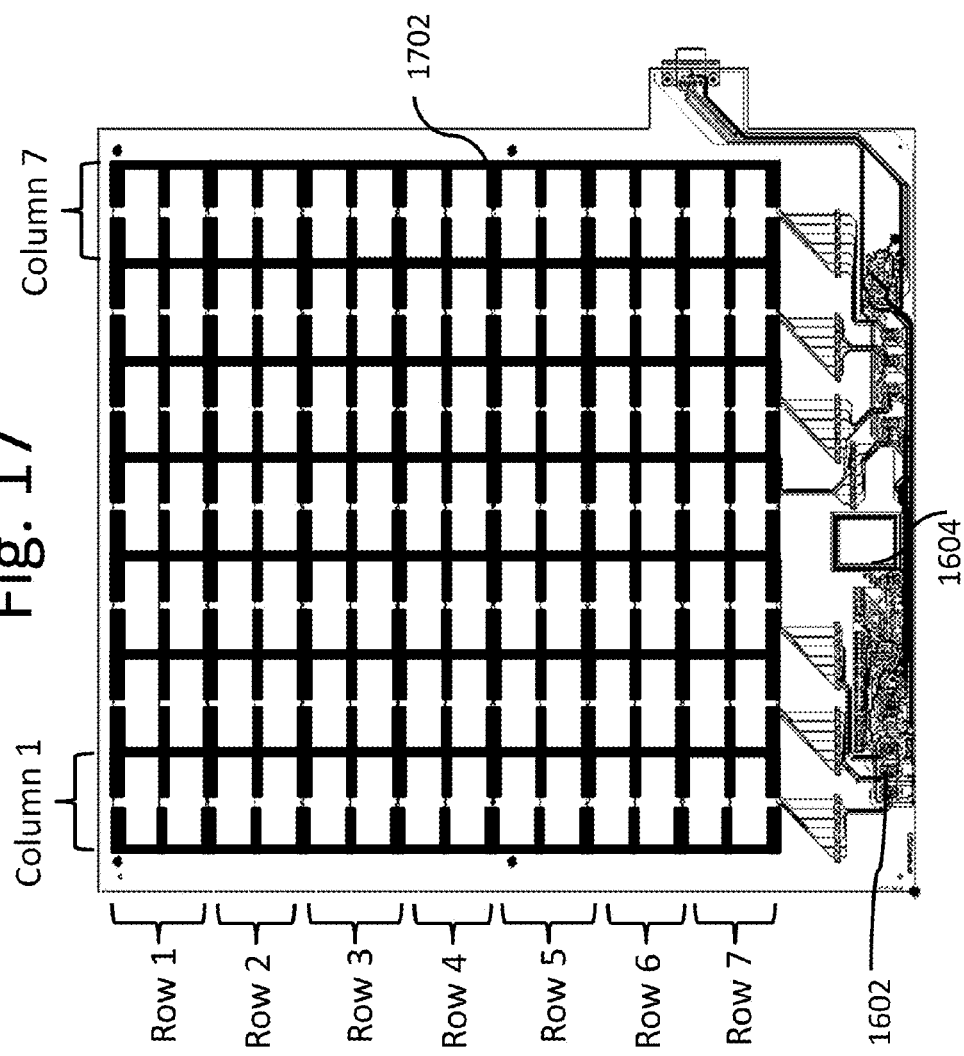
FIG. 17 is a schematic diagram that shows an exemplary layout of a FOD detection sensor board with shielding traces.

In certain embodiments, a FOD sensor may preferably sense either the oscillating magnetic fields of a wireless power transfer system or the oscillating electric fields of a wireless power transfer system. In some embodiments, the FOD sensors may be designed to sense mostly or only the oscillating magnetic fields and partially or minimally the oscillating electric fields. In certain embodiments, a FOD system may be designed to substantially overlap the resonator coil of a magnetic resonator. In some embodiments, FOD sensors may be substantially separated from the capacitive elements of a magnetic resonator. In some embodiments, the conducting loops of the FOD systems may be designed to be relatively insensitive to the oscillating electric fields of a wireless power transfer system. In certain embodiments, the FOD sensors may include shielding to minimize their exposure to and detection of oscillating electric fields. In embodiments, additional "non-loop" conducting traces may be added above and/or below the conducting traces of the FOD sensor. FIG. 17 shows an exemplary arrangement of non-loop conductors 1702 (thick black traces) that may be utilized on one layer of a conducting layer of a PCB sensor array to reduce their sensitivity to ambient electric fields.

In certain embodiments, particular design methods may improve the performance of a FOD system. For example, the conductors used to connect the FOD sensors to the sensing electronics may be arranged so that they may be shielded from the ambient fields. In some embodiments, it may be preferable to run conducting traces one substantially above or below the other, it what is sometimes referred to as a "stripline" arrangement. Such an orientation of the conductors may allow a smaller and/or narrow conducting pad to shield these signal carrying conductors from the ambient fields.

In some embodiments, the sensors may be used to detect system damage, system malfunction, enclosure penetration, or any other type of damage. System damage may affect sensor readings by completely blocking or changing one or more readings from sensors. Erroneous sensor readings may be used to determine the type and extent of the system damage. In some embodiments, a sensor or set of sensors may be able to act as a back-up to sensors that have been damaged. In certain embodiments, a signal or message may be sent to the user of the system to notify of system damage.

The presence of human tissues (hands, arms, etc.) may be detected by the inductive loop FOD sensors described herein. In some embodiments, inductive loop sensors may be tuned to detect organic and/or biological tissues.

In certain embodiments, at least one FOD sensor may reside on the device side of a wireless power transfer system. The at least one FOD sensor may operate separately or in conjunction with a FOD sensor on the source side to improve the detection performance of items between the resonators of a wireless power transfer system. The signals from the FOD sensors may be used to determine other properties of the system such as the relative position of the source and device resonators and/or resonator coils.

As disclosed previously, other types of sensors, such as capacitive sensors, can be integrated with a metallic FOD detector to provide additional detection capability of other types of objects that may be present in the region between or around the resonators. These additional sensors may operate independently of the metallic FOD sensor, or the sensor signals may be combined with the signals from the metallic FOD sensors and processed together.

Misalignment and Field Detection

A wireless power transfer system may include magnetic field sensors. Magnetic field sensors may be useful in high-power systems which transfer 50 W, 200 W, 1 kW or more of power. In accordance with an exemplary and non-limiting embodiment, magnetic field sensors may be installed on or near the source, device, or repeater resonators and/or components of a wireless power transfer system. In vehicle applications, for example, magnetic field sensors may be located on or near the source resonator located on the ground, garage floor, pavement, and the like. Magnetic field sensors may be integrated, attached, or positioned on or near the source resonator enclosure, electronics, and other components. In some installations, magnetic field sensors may be embedded in the ground, floor, concrete, asphalt, and the like around the source in a parking area around a vehicle. In some embodiments the magnetic field sensors may be completely covered by the ground material such as concrete or asphalt but the sensors may also be placed, attached, or glued to the top of the ground surface depending on the location of the parking (e.g., public, private, indoors, outdoors, etc.). The magnetic field sensors may be integrated, attached, or positioned on or near the device of the wireless power transfer system. For example, the magnetic field sensors may be attached in various locations around the underbody of the vehicle, around the perimeter of the vehicle, and inside the cabin of the vehicle. The magnetic field sensors may be wired to the electronics of the wireless power transfer system providing readings. In some embodiments the sensors may be wireless, and may harvest or use energy captured from the wireless power transfer system and/or other energy sources and may use a wireless communication channel to transfer magnetic field readings to one or more components of the wireless power transfer system.

In wireless power transfer systems configured for wireless charging of battery electric and hybrid electric vehicles, or other application in where large amounts of power are to be transferred, magnetic fields in user-accessible areas may be monitored. Magnetic fields in user-accessible areas may be, for example, required to be kept low enough to satisfy human exposure and EMI/EMC regulations. Variability in alignment of the source and device resonators may result in larger or smaller magnetic field levels in these user accessible areas for the same power transfer level. Magnetic field sensors may be used to detect high fields, changes in fields, or specific distributions of fields and used to indicate potential high fields in user-accessible areas. The indication from the sensors may be used by the wireless power transfer system and the system may, for example, reduce the level of power transfer to reduce the fields. Rather than limit the power transfer to the same level for all resonator alignments in the wireless power transfer system, it may be desirable to sense the magnetic field in one or more locations and use this information in a feedback loop to control the level of power delivered wirelessly in order to operate at the largest power level that can be delivered within regulatory limits, and/or other safety, user comfort, or interference limits. One or more magnetic field sensors located near the boundary of user accessible areas, such as at the edge of the vehicle, on the source resonator enclosure, on the device resonator enclosure, near-by any of the resonators, and the like can be used to determine if the magnetic field in the user accessible area has exceeded certain safety regulations. In certain embodiments, readings from magnetic field sensors nearest to the user accessible spaces may be used alone or may be given higher priority in a set of multiple sensor readings and may be processed and used in power control feedback loops. The power of the system can be adjusted based on such feedback, and/or in conjunction with data input from other detection systems to ensure high power wireless power transfer systems are operating within established regulatory requirements.

In some embodiments, the magnetic field sensors may provide a direct or normalized reading of the magnetic field strength. The sensors may be calibrated to provide a reading proportional or related to the actual field strength. In some embodiments, the sensors may provide a relative reading. In some embodiments, the relative readings of multiple sensors may be used to infer or determine potential high magnetic fields. For example, in vehicle charging applications, where source and device resonators of the wireless power transfer system are positioned under a vehicle it may be desirable to monitor for potentially high magnetic fields around the perimeter of the vehicle that a person standing near the vehicle may be exposed to. To detect potentially high magnetic fields that may reach a person standing near the vehicle magnetic field, sensors may be positioned around the perimeter of the vehicle. The sensors may provide a direct reading of the magnetic field strength. In some embodiments, the sensors may be configured to provide an indication of a relative strength of the fields near the sensors. The relative indication may be used to determine or infer potential high magnetic fields due to misalignment of the device and source resonators. Misalignment of resonators may result in a different magnetic field distribution compared when the resonators are aligned. In some embodiments, the larger the misalignment the larger the change in distribution. Relative readings from the sensors may be used to detect the changes, and potential high magnetic fields in user accessible areas.

For example, when the source and device resonators are aligned, the magnetic field distribution may be substantially uniform with respect to the left and right sides of a vehicle. Under aligned conditions, the maximum field strength between the left and right sides of a vehicle may differ by 10% or less (e.g., 5% or less). When a source and device resonators are misaligned, due to inaccurate parking, for example, field distribution relative to the left and right sides of the vehicle may change and may not be as uniform as when the source and device resonators are aligned. In certain embodiments, the maximum field strength between or the left and right sides of a vehicle when the source and device resonators are misaligned may differ by 11% or more (e.g., 20% or more). The difference in field strength may, in some system, be proportional or related to the misalignment between the source and device resonators and/or the potential high fields outside the boundary of the vehicle.

In some embodiments, the system may be configured to monitor the relative readings of magnetic field sensors in different areas around the wireless energy transfer resonators. The relative readings may be compared to expected readings. In certain embodiments, when the readings between sensors differ from the expected readings by more than 15% or more the wireless system may be configured to reduce the level of energy transfer. In some embodiments when the relative readings between sensors differ by 11% or more the wireless energy transfer system may be configured to reduce the level of energy transfer. In certain embodiments, the power transfer level between a source and device resonators may be inversely proportional or inversely related to the relative difference of field strength readings between sensors. For example, when magnetic field strength readings between the left and right sides of a vehicle differ by 20%, the wireless energy transfer system may be configured to operate at 80% of normal power level. When the magnetic field strength readings between the left and right sides of vehicle differ by 40%, the wireless energy transfer system may be configured to operate at 50% of the normal power level. It is understood that the described percentage values are exemplary.

In some embodiments, the magnetic field sensors may be positioned close to areas where potential high field exposure to people or animals may occur, such as near the perimeter of vehicle, near seats, front of the car, and the like. In some embodiments, the magnetic field sensors may be positioned in areas where there may be relatively large changes in the magnetic field distributions when the source and device resonators are misaligned. In some embodiments, the magnetic field sensors may be positioned close to or in line with the dipole moment of the source resonator for example.

In certain embodiments, the magnetic field sensors may include coils of wire, loops, Hall effect sensor, magneto-diode sensors, magneto-transistors, MEMS sensor and the like and use any number of voltage, frequency, or optical sensing methods.

In certain embodiments, the FOD system and the FOD sensors may be used to measure fields and/or the relative field distribution around one or more resonators. In some embodiments, a system with one or more FOD sensors may be used to measure the relative distribution of fields around the resonator. As resonators are misaligned, the field distribution around the resonator may change. A FOD system with one or more FOD sensors may detect changes in the field distribution by measuring the differential readings from sensors located near different parts of the resonator. Large or unexpected differentials may indicate a misalignment of the resonators which may results in a field distribution that may extend into a user accessible area.

The FOD system may have one or more modes of operation. In one mode, the FOD system may be used to detect FOD, in another mode the FOD sensors may be used to directly measure fields, field distributions, and the like to determine vehicle alignment and or field strength. In some embodiments, the readings from the FOD system may be simultaneously processed to determine or detect FOD and/or provide potential alerts and indications of misalignment and/or misalignment that may result in high fields in a person accessible area.

Figure 23:
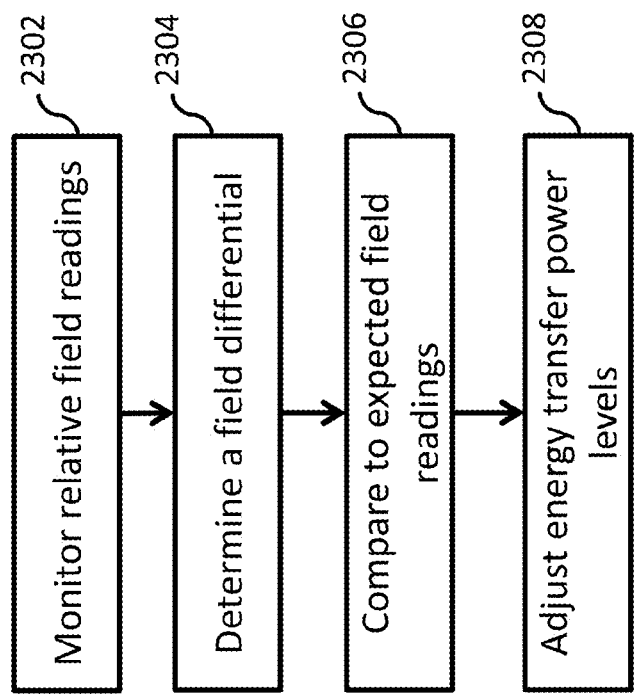
FIG. 23 is a flow chart that shows a series of steps for detecting high fields using field sensors.

An example embodiment of a method for using magnetic field sensors for detecting misalignment and/or potentially high magnetic fields in person accessible areas is shown in FIG. 23. In block 2302 the field sensors may take readings of the field strength at or near magnetic field resonators. The field readings may be collected by a sensor module of wireless power transfer system and processed. In some embodiments, the readings may be generated from the FOD system using FOD sensors. In block 2304, the sensor readings may be used to determine field differential between the sensors. The sensor readings may be compared with one another. In block 2306, the sensor readings may be analyzed in relation to expected readings or baseline readings. The baseline readings may include sensor readings or differential ranges for when the resonators are aligned. The baseline readings may also include expected sensor readings or expected sensor reading differentials for various misalignments of the system. In some embodiments, the system may include most likelihood computations to determine the most likely misalignment of the system. In block 2308, based on the determined misalignment and/or direct sensor readings, the power level of the system may be adjusted to prevent potential high fields in a user accessible location near the resonators.

In some embodiments, readings from external or other field sensors may be used by the FOD system. Misalignment information may be used to refine FOD readings and/or improve calibrations of the FOD system.

It is to be understood that although magnetic field sensors were described in above examples, similar approach may be used with electric field sensors for detecting potentially high or abnormal electric fields at, near, or around resonators, and/or electronic components of a wireless energy transfer system.

In embodiments, a FOD detection system may use more than one baseline and/or calibration files or configuration for sensors such as mean and covariance matrices. Baseline or calibration configurations may be used to define normal or expected readings from the FOD sensors. Calibration, baseline and configuration files may include information of readings and/or thresholds for which a FOD is determined to be present. For example, a baseline file may be a data file including information of baseline values (also referred as "baseline parameter") such as likelihood, mean matrices, covariant matrices. In some embodiments, a calibration file may be a data file including information such as likelihood, mean matrices, covariant matrices. In embodiments, a baseline or calibration file or configuration may be defined for more than one position, misalignment, resonator type, temperature and/or the like. In embodiments, a calibration or baseline that defines normal or expected FOD sensor readings under no FOD conditions for a range of offsets or misalignments in the system may reduce the sensitivity of the FOD detection. A calibration or a baseline that defines normal or expected FOD sensor readings for range of resonator offsets or misalignments may have wider range of expected or acceptable readings for the FOD sensors than a calibration of baseline that defines normal FOD sensor readings for one or a couple resonator alignments. A narrower baseline or calibration may increase the sensitivity or detection capability of the sensors.

In some embodiments of a wireless energy transfer system with a FOD detection system, more than one baseline and/or calibration files, ranges, and/or settings can be used. In some embodiments, if a position, environment, misalignment of the resonators, and/or the like during operation is known it may be preferable to use or load a baseline and calibration that defines the expected or normal sensor readings under no FOD conditions for the specific position, environment, misalignment of the resonators, or the expected or normal sensor readings under no FOD conditions for narrower subset of possible positions, environments, misalignments of the resonators and/or the like. In some embodiments, a baseline or calibration may be performed prior to energy transfer for a fixed position of the resonators to define a narrower baseline or calibration.

For example, position detection systems in a vehicle application may be used to determine the misalignment of resonators. The misalignment information may be used to select a specific baseline or calibration. If the misalignment is determined to be 4 cm, for example, a baseline or configuration may be used that is configured or represents normal FOD sensor readings for a misalignment of 4 cm or less. If the position or misalignment of the resonators cannot be determined then a baseline of configuration that defines normal FOD sensor readings for all acceptable offsets, for example 15 cm or more, may be used as the default baseline.

In another example, during the first seconds of operation or during the first minutes of operation one or more readings of the FOD sensors may be taken and used to calculate a reference or a baseline for the sensors (i.e. compute a mean and a covariance matrix). It is understood that calculating the reference or the baseline for the sensors may also refer to calculating parameters such as, but not limited to, likelihood y, misalignment, temperature, humidity, etc., of the wireless power transfer system. Once a base line is established the system may operate normally with the FOD sensors being continuously or periodically monitored and compared to the baseline readings calculated and measured during the calibration phase at startup of the system. Sufficient deviation from the baseline readings may be used to signal that the system state has changed and FOD may be present. In some embodiments, separate calibration files may be used when the wireless system is in a stand-alone configuration where a source is not coupled to a device, when the alignment of the resonators is known, for different temperatures and/or environments, for different source configurations, vehicles, and/or the like.

FOD detection using the FOD system may be active or performed when one or more resonators are coupled and transferring power. In embodiments FOD detection using the FOD system may be active or performed when the resonators are not coupled. In the example or a vehicle application, where the source resonator is positioned on or near the ground the device resonator is positioned under the vehicle, FOD detection may be performed before a vehicle parks or travels over the source. In some embodiments, the FOD system may be activated periodically or upon an indication of an incoming vehicle to check for FOD before the vehicle approaches. When FOD is detected and indication may be provided to a user, vehicle, or other parts of the system that FOD is present and may need to be cleared before charging can occur. An indication of FOD before a vehicle is parked over a source may make it easier to clear the FOD and/or check for FOD on or near the source resonators.

In accordance with an exemplary and non-limiting embodiment, a FOD detection system can be calibrated for stand-alone detection of FOD. Stand-alone FOD detection may be performed when a single resonator or set of resonators and their respective FOD detection systems are in an open environment and not coupled to another resonator. The resonator or set of resonators may be a source or device resonator that is paired with a FOD detection system. For example, in vehicle applications, a source resonator with a FOD detection system may be installed in a garage, parking lot, or another location where a vehicle equipped with a device resonator may park. In stand-alone FOD detection, a source resonator paired with a FOD detection system may need to detect FOD without the presence of a device resonator. In some embodiments, for example, stand-alone FOD detection may be performed in a vehicle charging application when a vehicle and its device resonator are not positioned over the source resonator. In some embodiments, the FOD detection system and/or the source resonator may need to detect whether a device resonator is present and may choose to calibrate accordingly. To support such modes of operation, a FOD detection system may be able to detect FOD within a specified region when another wireless power resonator is not present or is not strongly coupled, with an acceptable error rate. In an exemplary embodiment, an acceptable error rate may be equal to or less than 1 false positive per 100,000 readings. In another exemplary embodiment, an acceptable error rate may be equal to or less than 1 false positive per 1,000,000 readings.

In some embodiments, a FOD detection system may use different calibration files depending on the sensor environment. Calibration files may be data files including identifiers such as, but not limited to, temperature, humidity, power, frequency, range above the source, etc., relating to the wireless power transfer system. In some embodiments, a baseline file may include information temperature, humidity, power, frequency, range above the source, etc., relating to the wireless power transfer system. In some embodiments, stand-alone calibration of FOD sensors and/or systems may include using calibration data, files, tables, and the like stored by a source (or by whichever resonator to which the FOD detector is associated) and/or accessed by a source through wired or wireless communication to a server, database, cloud location, and the like. In an exemplary embodiment, calibration data may be stored within a FOD detection system.

In some embodiments, a FOD detection system may be able to tune its operating frequency and may compare FOD measurements at various frequencies relative to each other and/or relative to at least one calibration file to determine the presence of FOD. In other embodiments, a baseline calibration file may be used as a comparison for acquired measurements during FOD detection in a user's environment.

In some embodiments, stand-alone FOD detection may detect FOD on the surface of the source and in regions above the source. In certain embodiments, the height above a resonator at which FOD may be detected may be specified as $Z_{spec}$. In applications where FOD sensors are on both source and device resonators, the FOD sensors may only need to detect FOD in a region approximately $Z_{spec}=Z_{gap}/2$ where $Z_{gap}$ is the largest specified resonator separation that operates at the expected efficiency. In an exemplary embodiment, $Z_{gap}$ may be less than 5 cm (e.g, less than 10 cm, less than 20 cm).

In some embodiments, a calibration scheme may be a continuous calibration scheme. This exemplary scheme of calibration may be useful for slowly varying conditions such as temperature, humidity, and the like. In other embodiments, the stand-alone calibration may be a periodic or intermittent calibration scheme.

In some embodiments, the calibration may be performed as part of the manufacturing and/or installation of the FOD detection system. In other embodiments, the calibration may be performed after installation.

In some embodiments, a source FOD detection system may use very low power to achieve stand-alone calibration. For example, a source may not turn up above 100 W to perform FOD calibration. In some embodiments, a source may not turn up above 50 W to perform FOD calibration. In certain embodiments, a source may not turn up above 300 W, or 500 W or 1 kW, to perform FOD calibration.

Figure 24:
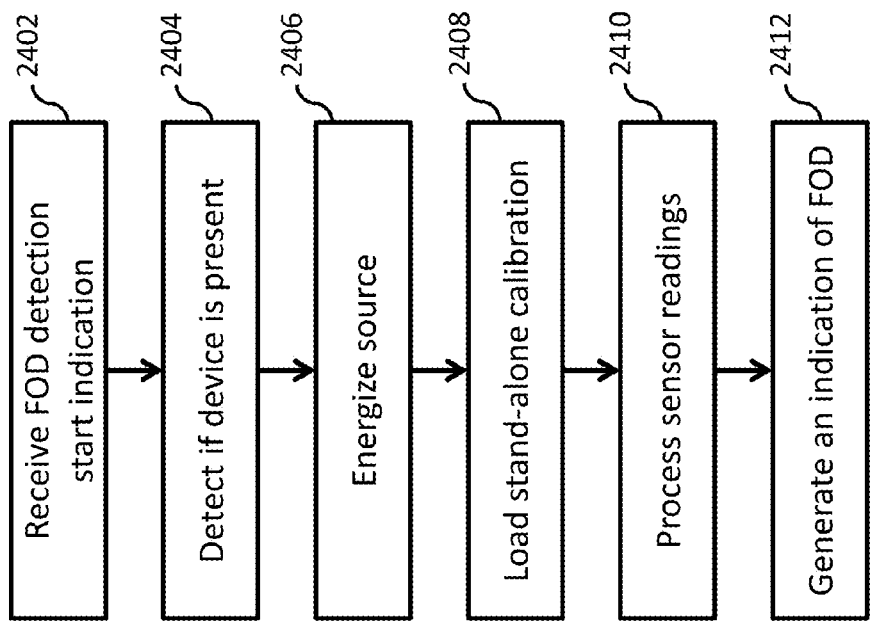
FIG. 24 is a flow chart that shows a series of steps for stand-alone FOD detection.

An embodiment of a FOD detection method for stand-alone FOD detection is shown in FIG. 24. In block 2402, the FOD detection system may receive an indication to perform FOD detection. The indication may be received from another part of the system, such as a timer, for example. In some embodiments the FOD detection may be triggered by an indication of an incoming vehicle. An incoming vehicle may be configured to transmit identification to a source of a wireless power transfer system when it is close by. In some systems the source may detect an incoming vehicle via wireless communication channel, GPS location, or other means. An indication that a vehicle is approaching for charging may trigger the FOD detection system to activate and check for FOD before the vehicle arrives. In block 2404 the source, or other parts of the system may perform a detection routine to check if there is a device present. If no device is detected the FOD detection system may perform a stand-alone FOD detection routine. Detection of a device may be performed through sensing loading on the source, communication channels, and/or other sensors.

In block 2406 the source may be energized to generate a magnetic field to enable the FOD sensors to detect FOD. In embodiments where the FOD sensors are wire loops or differential loops as described herein a magnetic field may be necessary for the sensors take measurements. In some embodiments, the source may be energized and output a fraction of its normal power, the power output may be limited to only generate enough magnetic field to activate the FOD sensors. In certain embodiments, the source may be energized and output at less than 5% (e.g., less than 10%, less than 20%) of its peak power. In some embodiments, the source may be energized and output power of 10 W or more (e.g., 50 W or more). In some embodiments, the source may be energized by the same power source and amplifier that is used during the normal wireless power transfer from the source. In some embodiments, an additional amplifier and/or power source may be used to energize the source. A smaller amplifier that may be more efficient at the lower power levels may be used. In some embodiments of the system, during stand-alone FOD detection, the magnetic field necessary to activate the FOD sensors may be generated by a separate wire loop, coil, resonator, and/or the like driven by a separate amplifier. The magnetic field used for FOD detection may not be generated by the resonator normally used for wireless energy transfer. Additional coils, or loops configured to generate a magnetic field when energized by an oscillating voltage and/or current may be positioned or located near the FOD sensor coils. Magnetic field generating coils may be printed, assembled, or integrated with the FOD sensor coils.

In block 2408, the FOD detection system may load specific configuration and baseline files for stand-alone FOD detection. The configuration files may be data files including information of expected sensor readings, likelihood, mean matrices, covariance matrices and the like. In block 2410 the FOD detection system may process the FOD sensor readings and apply the detection analysis as described herein. If FOD is detected, the FOD system may generate an indication of FOD and transmit the indication to other components or parts of the wireless power transfer system, to vehicle systems, to a user, and/or the like. For example, once FOD is detected an indication of FOD may be transmitted to the vehicle to alert the user of possible FOD on or near the source. A user may then know to check or clear the source of FOD before parking and obscuring the source.

FOD detection may be performed on a device resonator in a stand-alone configuration. A device may include an amplifier for energizing the device resonator to generate an oscillating magnetic field to active the FOD sensors. The device may include additional loops, coils, and the like that may be integrated or near the FOD sensors for generating a magnetic field. The loops or coils may be energized to generate a magnetic field to detect FOD near the device even if wireless energy transfer is not active.

In this disclosure, it is understood that information included in a "baseline file" can be included in a "calibration file" and/or a "configuration file." Similarly, information included in a "calibration file" can be included in a "baseline" and/or a "configuration file." Similarly, information included in a "configuration file" can be included in a "baseline" and/or a "calibration file."

Fixed-Position Device Recognition

In accordance with an exemplary and non-limiting embodiment, a source FOD detection system can be calibrated when a device moves to a fixed position relative to the source. For example, when a vehicle with a device fixed to its underside first parks over a source and/or before a charge cycle is initiated between the source and device, a source FOD detection system can be calibrated to include any potential impact of the presence of the device on its FOD detection program. By including the device in a calibration, a source FOD detection system may more accurately detect FOD that may be in the space between the source and device. In an exemplary embodiment, a FOD detection system may be able to detect FOD that has been introduced before a stand-alone FOD reading and after a vehicle has parked. For example, a FOD detector can detect debris that is dragged by the underside of a vehicle as it is parking and/or debris than may fall off the underside of the vehicle onto and/or near-by the source resonator.

In some embodiments, fixed-position device recognition calibration may be performed for each parking event. In other embodiments, a user may determine whether or not the calibration may be performed.

In some embodiments, there may be communication between the device and source that initiates a fixed-position device calibration.

In some embodiments where the presence of a device resonator alters the field too much for a calibration procedure to initiate, the device resonator and/or resonator coil may be opened, or shorted, or driven with a current that makes its alteration of the field small enough that a source FOD detection system may operate, calibrate, initiate, and the like. In certain embodiments, the device resonator and/or resonator coil may be driven with a signal that causes the tailoring of the magnetic field at the source so that fixed-position device calibration can be initiated. In some embodiments, the device may be covered with a material that could reduce the effect of the device on a source-side FOD detection system.

In embodiments where a FOD sensor may be directly driven by an applied electrical signal, the source-side FOD detection system's field may be made as small as possible or may be generated at a frequency that is different from that of the device so that the impact of the device's presence on the source-side FOD detection system is minimized.

In some embodiments where the vehicle itself creates a significant perturbation to a source-side FOD detection system's field, there may be communication between the device and source that identifies the parameters of the vehicle so that the source-side FOD detection system may account for the vehicle's presence in its fixed-position device calibration. That is, a FOD detection system may be able to process, adjust, enhance, and the like, its calibration files and/or procedures and its FOD detection algorithms to account for the presence of the vehicle.

Fixed-Position FOD Detection

In accordance with an exemplary and non-limiting embodiment, a FOD detection system may perform a fixed-position FOD detection calibration in which the system may detect FOD when the device is fixed in space relative to the source. For example, in vehicle applications, once a vehicle with the device attached to its underside parks over a source, a FOD detection system may initiate a fixed-position FOD detection calibration. In some embodiments, a system may perform a one-time FOD detection calibration. In some embodiments, the data generated by a one-time FOD detection calibration may be stored and used until the device has moved away from the source. This may occur, for example, when a vehicle with the device attached to its underside pulls away from its parking spot. In some embodiments, the data generated by a one-time FOD detection calibration may be used as the calibration file for as long as the charge cycle is running. If the charge cycle is interrupted, or stopped and started for any reason, the fixed-position device calibration may be re-run followed by the fixed-position FOD detection. In some embodiments, fixed-position FOD calibration files may be compared to other calibration files and/or may be incorporated into existing calibration files and/or may be used to build up custom calibration files and/or may be used to train FOD detection systems.

In some embodiments, fixed-position FOD detection may detect FOD $Z_{spec}/2$ above the surface of the source, where $Z_{spec}$ is the largest specified resonator separation that works between the source and device in a wireless energy transfer system. In some embodiments where the FOD is over $Z_{spec}/2$ above the surface of the source, a device-side FOD detection system may be responsible for detecting FOD.

Misalignment Tolerance

In certain embodiments, a FOD detection system may calibrated to be tolerant of misalignment of a resonator with respect to another resonator. For example, if the user of an electric vehicle equipped with wireless energy transfer capabilities parks the vehicle repeatedly within a positional range of the source resonator, a FOD detection system may calibrate to be tolerant for the user's range of parking positions. This range may be unique to the user.

In some embodiments, a user may initiate or control this type of calibration. This may be useful if the user desires to train the FOD system at a different rate than it would otherwise require. For example, a vehicle equipped with a wireless power transfer system and a FOD detection system may change users and thus may need to be re-calibrated for misalignment. This re-calibration may be custom for each user.

Drift Correction

In some embodiments, a FOD detection system may calibrate to correct for drift in its detection of FOD. The sensitivity and/or specificity) of the FOD detection system may change with time. This may cause the system to become more or less sensitive over time and deviate from normal operation. To compensate for this possible change, a FOD detection system may re-calibrate to or towards, and/or reset itself to, its original, factory-set detection function.

In some embodiments, a living object detection calibration may be performed during the manufacture and/or installation of the FOD detection system. In other embodiments, this type of detection calibration may be performed after installation or when a user initiates the calibration. In some embodiments, calibration, baseline determination, and detection may be performed in a similar manner as for FOD sensors. During calibration and baseline procedures sensor readings may be collected under normal operating conditions with no living objects present. Based on the readings, a mean and a covariance matrix may be computed which may be used to determine if additional sensor readings fall within the normal conditions or if living objects are present.

Each of the above described types of calibration may be employed individually or in combination with other types of calibration. Each of the above described types of calibration may be employed by a FOD detection system related to any resonators in a wireless power transfer system. That is, FOD may be utilized by any and all resonators in a wireless power transfer system including source resonators, device resonators and repeater resonators.

In some embodiments where detection of FOD results from a type of calibration or any combination of the types of calibrations listed above, a wireless energy system may be shut down, turned down, and/or locked out based on signals in a FOD detection system. In some embodiments, an operator or user of a vehicle is notified.

In certain embodiments where detection of FOD may be erroneous, the user can restart the calibration process. Following the user's restarting of the charging process, a type of calibration or any combination of the types of calibration listed above may be initiated.

Figure 25:
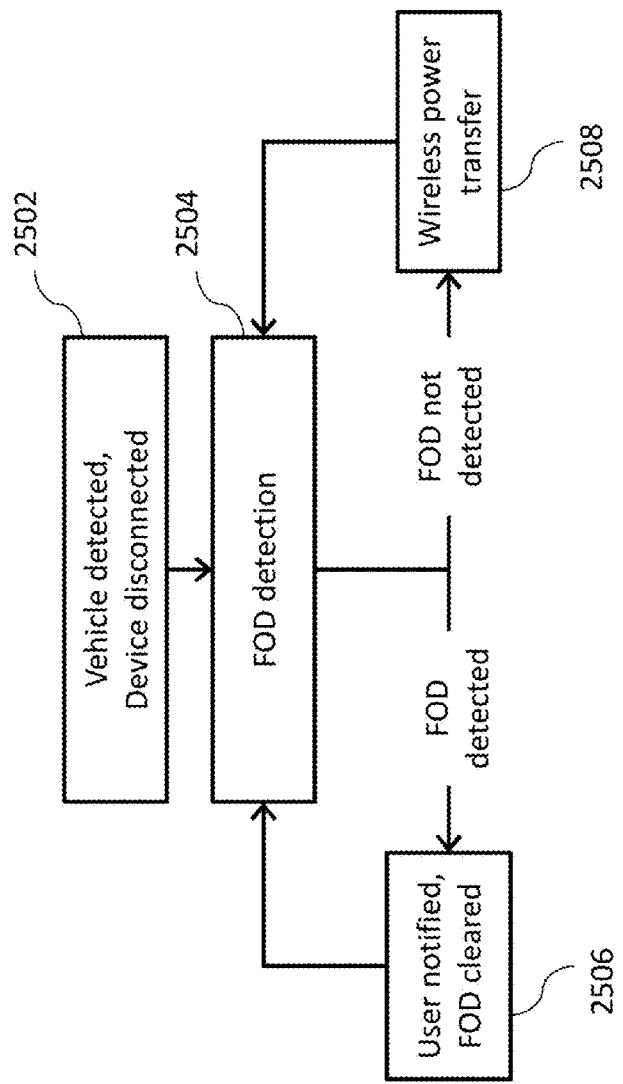
FIG. 25 is a flow chart that shows a series of steps for implementing different modes of operation of a FOD detection system.

An example embodiment of a method for using a FOD detection system to detect FOD in a wireless power transfer system for a vehicle application is shown in FIG. 25.

In block 2502, the FOD detection system recognizes a vehicle equipped with a device resonator as the vehicle arrives in a parking area equipped with a source resonator. The vehicle can be recognized, for example, based on identifying signals transmitted by the vehicle and/or based on one or more detecting loops mounted to the underside of the vehicle which generate electrical signals when a portion of the field generated by the source resonator passes through the loops. The electrical signals can be measured by the vehicle and an identification signal can be transmitted to the source resonator. In some embodiments, the presence of the vehicle can be recognized by optical sensors and/or by pressure sensors. The device resonator stays disconnected.

In block 2504, the FOD detection system begins to detect any FOD in the wireless power transfer system. Detection includes detecting FOD that may be on or around the source resonator as well as FOD that may have been brought by the vehicle while parking. This type of detection may be calibrated during manufacture or installation of the wireless power transfer system, also called a "factory calibration".

In block 2506, the FOD detection system notifies a user if a FOD is detected. The FOD is cleared and FOD detection is performed again.

In block 2508, the wireless power transfer begins, if FOD is not detected in block 2504. FOD detection continues and may occur continuously, or intermittently, or periodically during wireless power transfer.

The wireless power transfer system stops power transfer if FOD is detected during wireless power transfer. Wireless power transfer may not resume until the FOD is removed and/or user of the system is notified. Once FOD is cleared, FOD detection begins again, as shown in block 2504.

In some embodiments, a living object detection system may be able to detect a living object within a specified region with an acceptable error rate. In an exemplary embodiment, an acceptable error rate may be equal to or less than 1 false positive per 100,000 readings. In another exemplary embodiment, an acceptable error rate may be equal to or less than 1 false positive per 1,000,000 readings.

Figure 26:
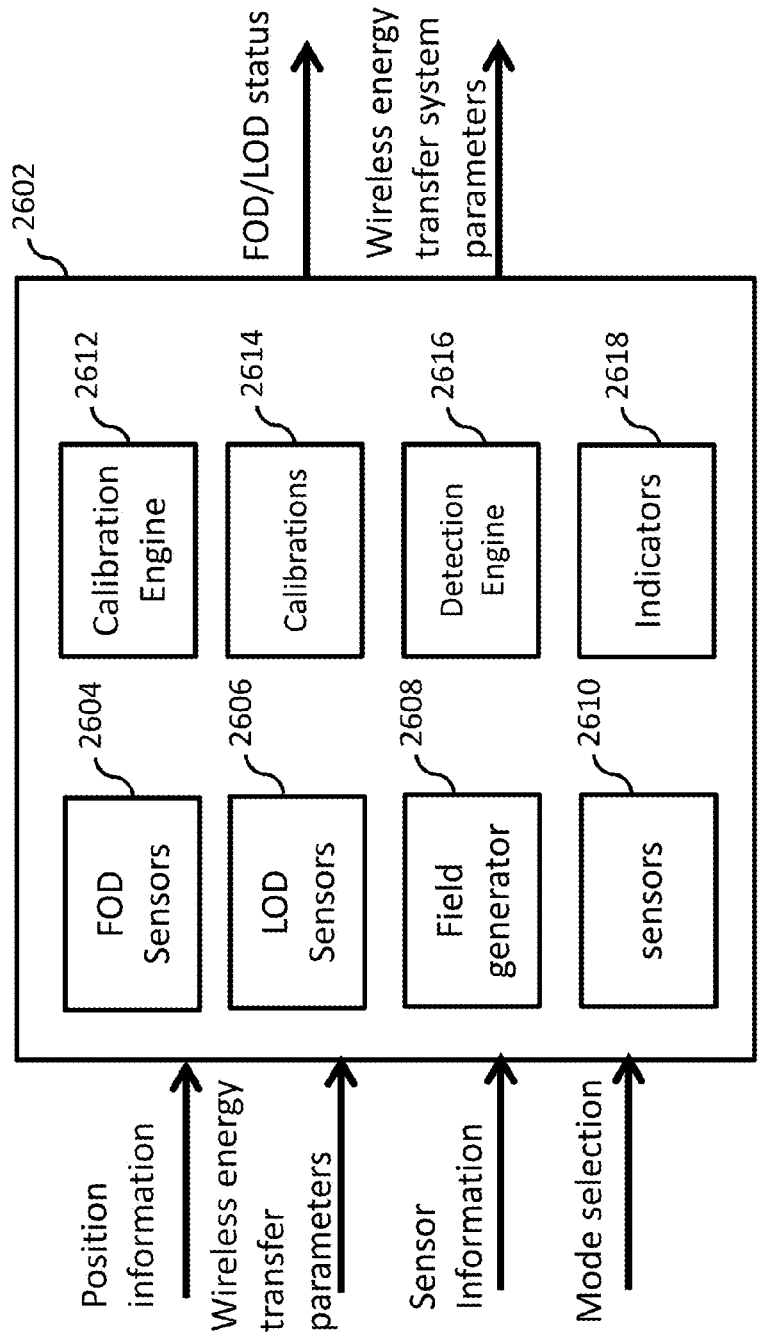
FIG. 26 is a schematic diagram of an embodiment of a combined foreign object debris and living object debris detection system.

An embodiment of a foreign object debris detection system is shown in FIG. 26. The system may include several modules, block and components that may be used to detect foreign objects and in some embodiments detect living organisms (such as cats, mice, people, etc.) when the objects and organisms are near the resonators used for wireless energy transfer. In some configurations, the FOD system may receive position information from external sensors, vehicle information, or other sources. The position information may include, or may be used, to determine environmental parameters, resonator alignment, resonator distance, positions of wireless energy transfer components, relative position of lossy objects, and position of area with living organisms. Changes in position may be used by the system 2602 to change the calibration, adjust sensitivity, detection algorithms, and the like of the system. For example, the field distribution around resonators transferring energy may change depending on the offset of misalignment between the resonators. The change in the magnetic field distribution may change the readings of the FOD sensors in the system and may trigger false positives and/or reduce the sensitivity of system for FOD detection. The system may load new configurations, change processing algorithms, and perform other functions to compensate for changes in sensor readings when position information is received.

In some embodiments, the system may also receive information pertaining to wireless power transfer parameters. The parameters may include data regarding the status of wireless power transfer, how much power is transmitted, at what frequency, phase, and the like. In some embodiments, the system may further receive information from other sensors and system components. The system 2602 may receive information from temperature sensors, infrared sensors, pressure sensors, and the like which may be used to change calibrations or baselines used by the FOD system, or to supplement FOD readings.

The FOD system may include one or more FOD sensors and/or LOD sensors. The FOD sensors may include an electrical conductor forming or more loops as described herein. The LOD sensors may include electrical conductors or other capacitive sensors. The FOD and/or LOD sensors may be formed using wires, formed on a printed circuit board, or deposited/printed on resonator packaging or other substrates. The sensors may be arranged and positioned near resonators, near high magnetic fields, near areas where living organisms may be present, and the like. In some embodiments, the sensors may be configured to be positioned a distance away from the resonators, 10 cm away, or even 1 m away. The sensors may be wired, or wireless, receiving power from the wireless power transfer system using wireless communication for data. The sensors may be coupled to read out circuitry that may sample and digitize the sensor readings such that they can be processed by other modules of the system.

In some embodiments, the sensors such as FOD sensors may require an oscillating magnetic field to activate the sensors. The oscillating magnetic field may be generated by a source resonator of the wireless power transfer system. The system 2602 may output instructions or indications to elements of the wireless power transfer system to generate magnetic fields using the resonators or change the characteristics of the fields generated by the resonators. In some embodiments, the system 2602 may include a field generator 2608 configured to generate an oscillating magnetic field to active FOD sensors. The field generator 2608 may include one or more loops of a conductor coupled to an amplifier. The amplifier may generate an oscillating voltage to drive the loops and generate a magnetic field.

In some embodiments, the system 2602 may be configured to have a calibration mode and a sensing mode that may be selectable based on external input or automatically selected based on sensor readings or the state of other elements of the system. During a calibration mode the system may gather sensor information and generate a configuration and baseline sensor data.

During the calibration mode of operation, a calibration engine 2612 of the system 2602 may be used to define a sensor configuration or baseline readings. In some embodiments, the calibration engine may be configured to detect an energy transfer condition. For example, the energy transfer condition may include misalignment, temperature, humidity of the wireless power transfer system. The energy transfer condition may include baseline parameters such as mean matrix, covariant matrix, and likelihood. The calibration engine 2612 may include one or more set of procedures and routines for generating a baseline readings. In certain embodiments, the baseline readings may include taking readings from one or more FOD and/or LOD sensors under normal operating conditions with no FOD present. The readings may be taken at different temperatures, orientations, offsets, positions of the resonators and the like. The readings may be used to calculate a baseline which may include calculating a mean and covariance matrix as described herein. In certain embodiments, a mean and covariance matrix may be calculated for different temperatures, orientations, positions, environmental conditions, and the like. The mean and covariance matrices and other baseline readings and settings may be stored in a calibrations repository 2614. Each set of calibrations and baseline readings stored in the calibration repository 2614 may be tagged or associated with specific temperatures, resonator positions, environmental conditions, and the like. The positions, power levels, orientations, temperatures, and the like may be received by the system from external sensors and systems. The baseline and calibration files may be, periodically or in response to a user's input, refined and updated. Additional readings from the sensors may be periodically gathered and the mean and covariance matrix periodically updated, for example.

In some embodiments, the calibration engine 2612 may be used to define baseline readings in the presence of FOD or living objects. The calibration engine may capture sensor readings in various positions, temperatures, orientations, with FOD present near the system. The FOD and living objects may be used to train the system as to the expected or typical sensor readings when FOD or living organisms are present.

During the sensing mode of operation of the system, a detection engine 2616 may be used to analyze readings from the sensors to determine if FOD or living objects may be present on or near the resonators. The detection engine 2616 may receive readings from the sensors 2604, 2606 and process the readings to determine if the sensor readings are indicative of a FOD or living organism being present near the sensors. The detection engine may compare the sensor readings to one or more baseline files or calibrations stored in the calibrations repository 2614. The comparison may involve calculating a likely system state using the mean and covariance matrices as described herein. The detection engine 2616 may receive information pertaining to the system position, temperature, alignment, energy transfer parameters, and the like to select the most appropriate baseline and calibration file. In some embodiments the detection engine may use two or more different baseline and calibration files. The different base line and calibration files may be used to refine a sensor reading, confirm a FOD detection, reduce or increase sensor sensitivity, and the like. For example, in one embodiment, the system may first use a general baseline that corresponds to a wide range of system positions, misalignments, and the like. When a potential FOD reading is sensed, the system may use a second, different baseline or calibration file to increase the sensitivity or the discrimination of the analysis. The second baseline may correspond to normal sensor readings for a narrow range of system positions and offsets, for example.

In some embodiments, sensing and calibration modes may be run simultaneously. The calibration engine 2612 of the system may run simultaneously with the detection engine 2616 of the system. If FOD or living organisms are not detected, the calibration engine may use the readings to refine the baseline and calibration files.

During the operation of the system 2602, one or more indicators 2618 may be used to display or signal the status of the system using visual or audio indicators such as lights, graphic or video displays and sounds. When FOD is detected, for example, one or more lights may be activated to indicate to a user that possible debris may be located near the resonators. In some embodiments the system may also signal the system and FOD/LOD status to external systems and components. An indication of the system status may be transmitted to a vehicle, for example.

When FOD or living organisms are detected by the detection engine 2616 the system may initiate one or more counter measures to move the FOD or living organism, to adjust the system to avoid the debris, and the like. In one embodiment, the system 2602 may signal the wireless energy transfer system to change or adjust the wireless energy transfer. For example, the detection engine may be able to classify or determine the size and impacts of the FOD or living object, e.g., based on the magnitudes and/or phases of electrical signals generated by FOD and/or living object sensors. Classifications can include, for example, simple binary classification schemes in which FOD and/or living objects are classified as being either "problematic" or "not problematic". Different threshold values for measured electrical signals can be used for the classification of FOD and living objects. Based on the classification of FOD, the system 2602 may indicate to the wireless energy transfer system to turn down power, change frequency, disable resonators, change resonator configuration and the like. For some FOD, for example, energy transfer may at full power (e.g., 3.3 kW) may induce unacceptably high temperatures in the FOD (e.g., 70° C.). Reducing the wireless energy transfer power to half the power may limit the heating of the FOD to less than 70° C. (e.g., less than 60° C., less than 50° C., less than 40° C.), for example. In embodiments, a feedback loop with additional sensors such as temperature sensors, infrared sensors, and the like may be used to adjust the power of the energy transfer to reduce or control the heating of FOD or to control the field exposure to living organisms. In another example, in wireless energy transfer systems with two or more source and/or device resonators, resonators may be enabled or disabled conditionally on the FOD sensor readings. The resonators for which FOD is detected in the vicinity may be disabled or turned down to a lower power while the FOD free resonator may be operated at full power.

It is to be understood that the structure, order, and number of modules, blocks, and the like shown and described in the figures of this disclosure may be changed or altered without deviating from the spirit of the disclosure. Modules may be combined or divided into multiple other modules, for example. For example, a single module may function as a calibration engine module and a detection engine module. The functionality of the modules may be implemented with software, scripts, hardware and the like. For example, the detection engine 2616 of the system 2602 depicted in FIG. 26 may be implemented as a software module, an application specific integrated circuit, as logic in a field programmable gate array, and the like.

Figure 28:
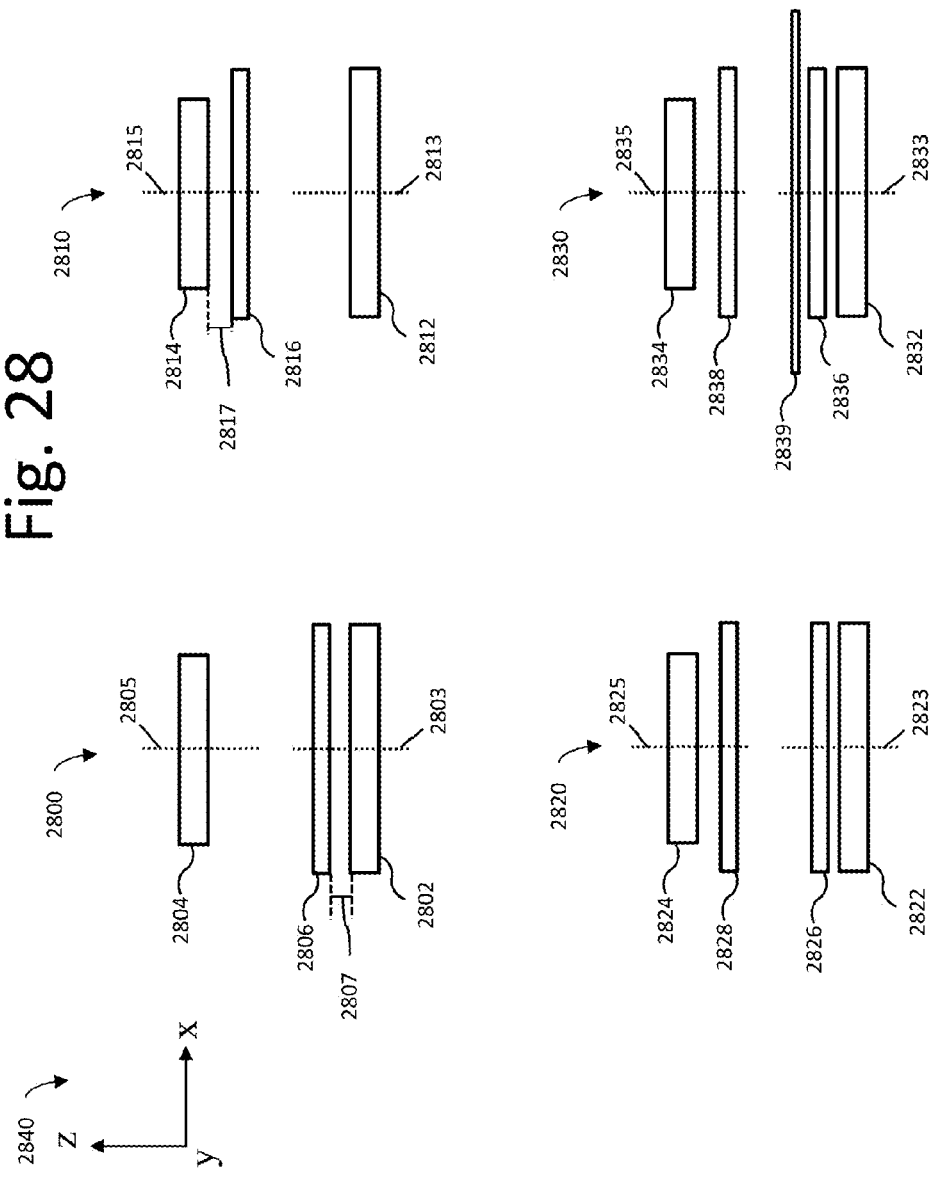
FIG. 28 is a schematic diagram showing example arrangement of wireless power transfer systems.

FIG. 28 is a schematic diagram showing example arrangements of wireless power transfer systems including one or more FOD sensor boards (also referred as "FOD detection sensor boards") in side views. The one or more FOD sensor boards can be used to detect magnetic field distributions generated by a source coil (e.g., a resonator coil of a power source) or alternatively by an additional coil. Information (e.g. field distribution, field gradient distribution) related to the detected magnetic field can be used to determine misalignment between one or more resonators in a power source coil and one or more resonators in a power receiver within a device. Coordinate 2840 shows the x-direction pointing in the right direction and the z-direction pointing in upward direction of the drawing plane, respectively. The y-direction points into the drawing plane.

On the top left of FIG. 28, arrangement 2800 includes a source coil 2802 of a power source resonator which can transfer power to a device coil 2804 (e.g., of a power receiver resonator.) A FOD sensor board 2806 is positioned between the source coil 2802 and the device coil 2804. In this example, the FOD sensor board 2806 is placed above the source coil 2802 with a distance 2807 of about 10 mm. In other examples, the distance 2807 can be between 3-5 mm (e.g., 4-8 mm, 5-10 mm, 7-12 mm, 10-15 mm, 15-20 mm). The distance 2807 can be more than 20 mm. The FOD sensor board 2806 can be fixed relative to the source coil 2802 by a support structure (not shown), which holds the FOD sensor board 2806. For example, the support structure can be one or more poles, which fixes the FOD sensor board 2806 relative to the source coil 2802. In some embodiments, a dielectric substrate can be placed on top of the source coil 2802, and the FOD sensor board 2806 can be fixed on top of the dielectric substrate. In the example arrangement of 2800, center axis 2803 of the source coil 2802 and center axis 2805 of the device coil are aligned with each other. It is understood that when the device coil 2805 is moved relative to the source coil 2802, center axes 2803 and 2805 become misaligned. In this example, the position of the FOD sensor board 2806 relative to the source coil 2802 does not change due to the support structures. Accordingly, the FOD sensor board 2806 may be referred as a "source-side FOD sensor board." In some embodiments, the FOD sensor board 2806 can be used to determine the misalignment between the center axes 2803 and 2805 along the x- and y-directions.

On the top right of FIG. 28, arrangement 2810 includes a source coil 2812 of a power source resonator which can transfer power to a device coil 2814 of a power receiver resonator. The source coil 2812 has a center axis 2813 and the device coil 2814 has a center axis 2815. A FOD sensor board 2816 is positioned between the source coil 2812 and the device coil 2814. In this example, the FOD sensor board 2816 is placed below the device 2814 with a distance 2817 of about 50 mm. In other examples, the distance 2817 can be between 5-15 mm (e.g., 15-25 mm, 25-35 mm, 35-45 mm, 45-55 mm). The distance 2817 can be more than 50 mm. In this example, the FOD sensor board 2816 is fixed relative to the device coil 2814, and thereby may be referred as a "device-side FOD sensor board." The FOD sensor board 2816 can be used determine the misalignment between the center axes 2813 and 2815 along the x- and y-directions.

On the bottom left of FIG. 28, arrangement 2820 includes a source coil 2822 of a power source resonator which can transfer power to a device coil 2824 of a power receiver resonator. The source coil 2822 has a center axis 2823 and the device coil 2824 has a center axis 2825. A FOD sensor board 2826 (which is a source-side sensor board) is fixed relative to the source coil 2826, and a FOD sensor board 2828 (which is a device-side sensor board) is fixed relative to the device coil 2824. The FOD sensor boards 2826 and 2828 can be used either independently or in conjunction to determine the misalignment between the center axes 2823 and 2825 along the x- and y-directions.

On the bottom right of FIG. 28, arrangement 2830 includes a source coil 2832 of a power source resonator which can transfer power to a device coil 2834 of a power receiver resonator. The source coil 2832 has a center axis 2833 and the device coil 2834 has a center axis 2835. A FOD sensor board 2836 (which is a source-side sensor board) is fixed relative to the source coil 2836, and a FOD sensor board 2838 (which is a device-side sensor board) is fixed relative to the device coil 2834. In some embodiments, only one of the FOD sensor boards 2836 and 2838 may be present. The arrangement 2830 also includes an additional coil 2839 which is fixed relative to the source coil 2832. In other examples, the additional coil 2839 is fixed relative to the device coil 2834. The additional coil 2839 can generate magnetic fields, which the FOD sensor boards 2836 and 2838 can detect to either independently or in conjunction with other detectors be used to determine the misalignment between the center axes 2833 and 2835 along the x- and y-directions.

It is understood that the FOD sensor boards 2806, 2816, 2826, 2828, 2836 and 2838 can include an array of FOD sensors which are described in relation to other figures (e.g., FIGS. 1-27) in this disclosure. In some embodiments, the source and device coils can operate between 10 kHz-100 MHz. For example, the source coils can transmit power at approximately 145 kHz. In other embodiments, source resonators may transfer power at approximately 85 kHz, approximately 44 kHz, approximately 20 kHz, approximately 250 kHz, approximately 2.26 MHz, approximately 6.78 MHz and/or approximately 13.56 MHz. In embodiments, the source may have a tunable frequency. For example, a source may operate in a frequency 145 kHz±10 kHz, or 85 kHz±10 kHz. In embodiments, the operating range of frequencies may be ±5%, ±10%, or ±20%, of the center operating frequency. The source and device coils can be fabricated from a variety of conducting materials including, for example, litz wire, solid core wire, copper tubing, copper ribbon and any structure that has been coated with a high conductivity material such as copper, silver, gold, or graphene. In certain embodiments, the FOD sensor boards can have a different shapes and sizes than that of the source and device coils. A FOD sensor board can have a larger areal size than the source or device coil it is fixed relative to. For example, the FOD sensor board can have width larger by about 5 inches than a width of the source or device coil. In some embodiments, the size of a FOD sensor board may be determined by the area of the magnetic field where the field is strongest. In other embodiments, the size and shape of the FOD board may be determined by the area in which certain objects are determined to be heated to undesirable levels, or the size and shape may be set to be larger than such areas by a factor such as 10%, 20%, 50% or 100% in order to provide a certain extra "safety factor" to the overall design. It is also understood that the arrangements 2800, 2810, 2820 and 2830 can include shields adjacent to the source coils to reduce energy loss of magnetic fields generated by the source coils. Similarly, the arrangements 2800, 2810, 2820 and 2830 can include shields adjacent to the device coils to reduce energy loss of magnetic fields induced in the device coils.

In some embodiments, that the FOD sensor boards 2806, 2816, 2826, 2828, 2836 and 2838 can be used to determine the distance between the source and device coils in the z-direction.

Figure 29:
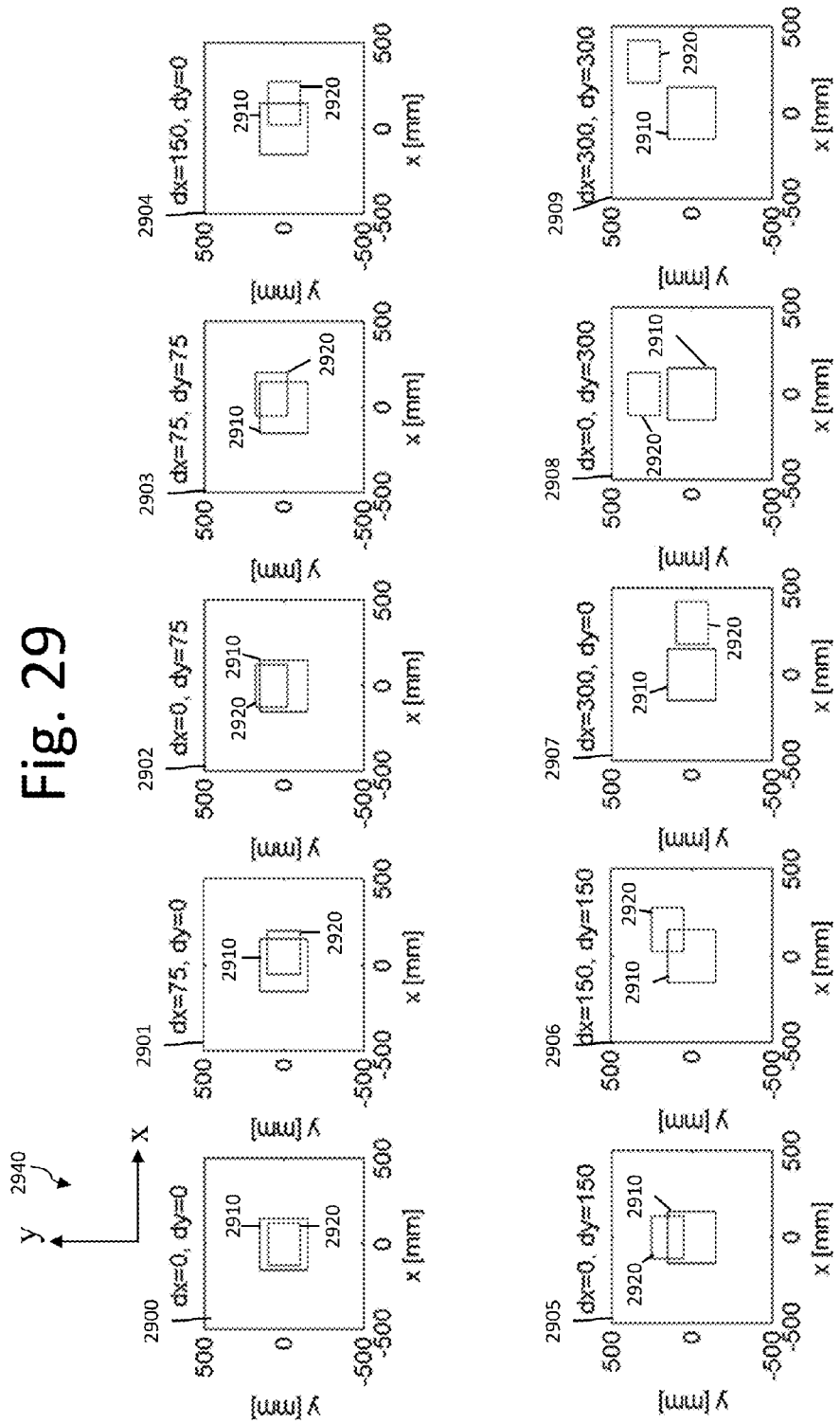
FIG. 29 is a schematic diagram showing example alignments between a source coil and a device coil.

FIG. 29 is a schematic diagram showing example alignments between a source coil 2910 of a power source resonator and a device coil 2920 of a power receiver resonator, which can correspond to the source and device coils shown in FIG. 28, respectively. Coordinate 2940 shows the x-direction and the y-direction. In FIG. 29, the center of the source coil 2910 is fixed at x=0 mm and y=0 mm. In this example, the source coil 2910 has a dimension of 200 mm by 200 mm Arrangements 2900-2909 show the device coil 2920 at various positions relative to the source coil 2910.

Arrangement 2900 shows the device coil 2920 with its center positioned at x=0 mm and y=0 mm (also denoted as dx=0, dy=0). Arrangement 2901 shows the device coil 2920 with its center positioned at x=75 mm and y=0 mm (also denoted as dx=75, dy=0). Arrangement 2902 shows the device coil 2920 with its center positioned at x=0 mm and y=75 mm (also denoted as dx=0, dy=75). Arrangement 2903 shows the device coil 2920 with its center positioned at x=75 mm and y=75 mm (also denoted as dx=75, dy=75). Arrangement 2904 shows the device coil 2920 with its center positioned at x=150 mm and y=0 mm (also denoted as dx=150, dy=0). Arrangement 2905 shows the device coil 2920 with its center positioned at x=0 mm and y=150 mm (also denoted as dx=0, dy=150). Arrangement 2906 shows the device coil 2920 with its center positioned at x=150 mm and y=150 mm (also denoted as dx=150, dy=150). Arrangement 2907 shows the device coil 2920 with its center positioned at x=300 mm and y=0 mm (also denoted as dx=300, dy=0). Arrangement 2908 shows the device coil 2920 with its center positioned at x=0 mm and y=300 mm (also denoted as dx=0, dy=300). Arrangement 2909 shows the device coil 2920 with its center positioned at x=300 mm and y=300 mm (also denoted as dx=300, dy=300).

The disclosure related to FIGS. 30-39 and 41 describe electromagnetic simulation results of measurement using a FOD sensor board based on the arrangements 2900-2909. The FOD sensor board includes an 8 by 7 array of FOD sensors and the plots in FIGS. 30-39 and 41 show the measured voltage signal of each FOD sensor as a gray colored square pixel. In these figures, the notation dx and dy refer to the relative position between the source coil 2910 and the device coil 2920 as described in relation to FIG. 29.

Figure 30:
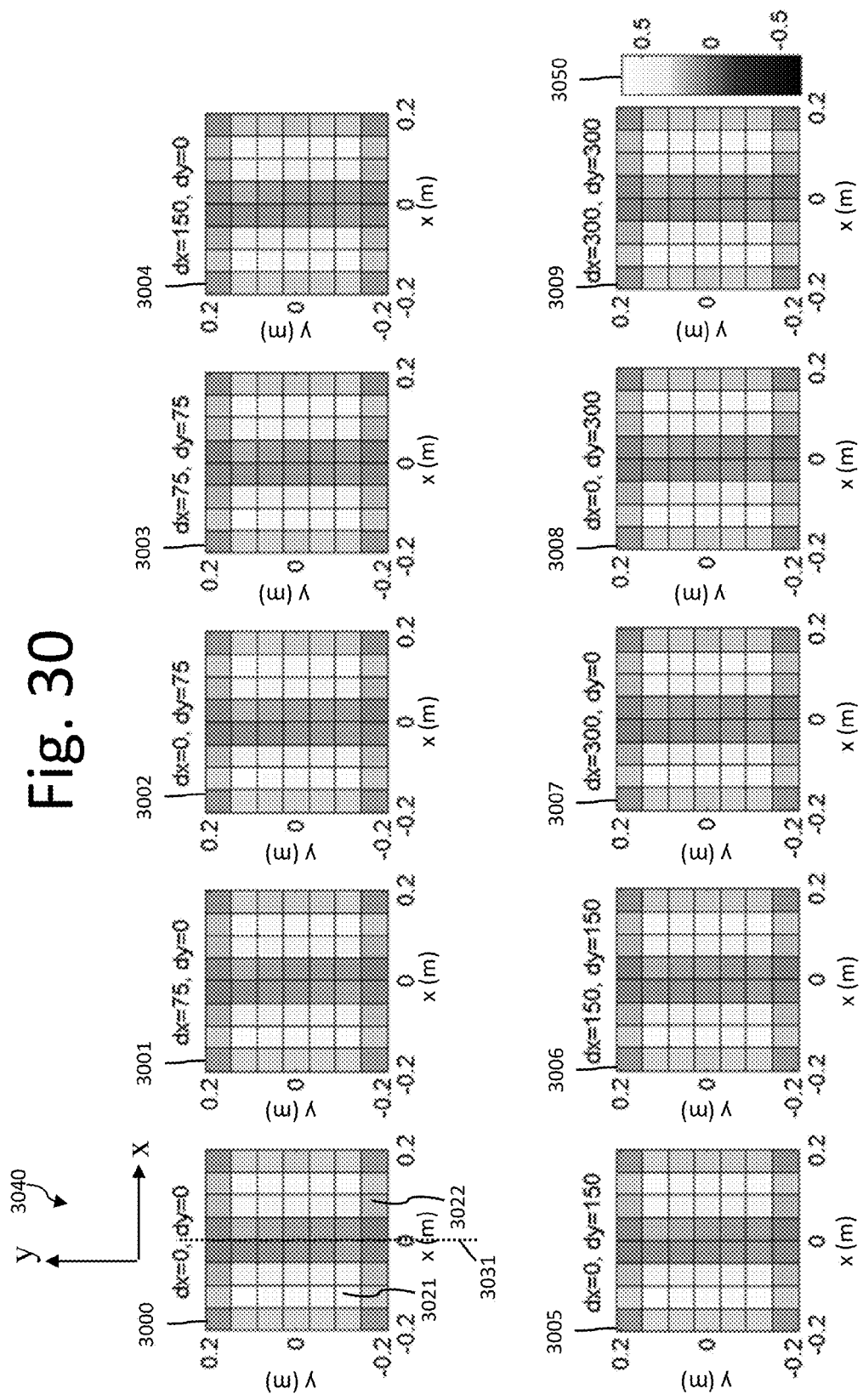
FIG. 30 are plots of simulation results obtained by a FOD sensor board.

FIG. 30 are plots of simulation results for the FOD sensor board 2806 described in the arrangement 2800 of FIG. 28. In this example, source coil 2802 generates magnetic fields with a 3 A maximum amplitude oscillating current in the source coil 2802. In these simulations, the device coil 2804 is open circuited so that substantially no current oscillates in the device coil 2804. Coordinate 3040 shows the x-direction and y-direction. The FOD sensor board 2806 detects the magnetic field at its position depending on the misalignment of center axes 2803 and 2805 in the x- and y-directions. Plots 3000-3009 show simulated voltages measured by the FOD sensor board 2806 for the ten corresponding arrangements 2900-2909 shown in FIG. 29. Color bar 3050 indicates the voltage amplitude between −0.5 V and 0.5 V.

Plot 3000 shows the voltage measured by each of the 8 by 7 array of FOD sensors in the FOD sensor board 2806. The measurement of each sensor is indicated by a shaded pixel. For example, pixel 3021 represents a measured voltage signal of one FOD sensor and pixel 3022 represents a measured voltage signal of another FOD sensor in the FOD sensor board 2806. Pixel 3021 corresponds to a higher voltage than pixel 3022. Accordingly, the FOD sensor board 2806 measures a pattern of voltages. In plot 3000, the pattern of voltages is relatively symmetric with respect to axis 3031.

In some embodiments, any of the FOD sensors can include a loop or loops, for example, as described in relation to FIG. 2. In certain embodiments, any of the FOD sensors can include a figure 8 conducting loop.

Plots 3001-3009 show the voltage measured by each of the 8 by 7 array of FOD sensors in the FOD sensor board 2806 for the different alignments of the source coil 2802 and device coil 2804 as denoted by the arrangements 2901-2909. Plots 3000-3009 have qualitatively similar pattern of voltages which are relatively symmetric with respect to the axis 3031.

Figure 31:
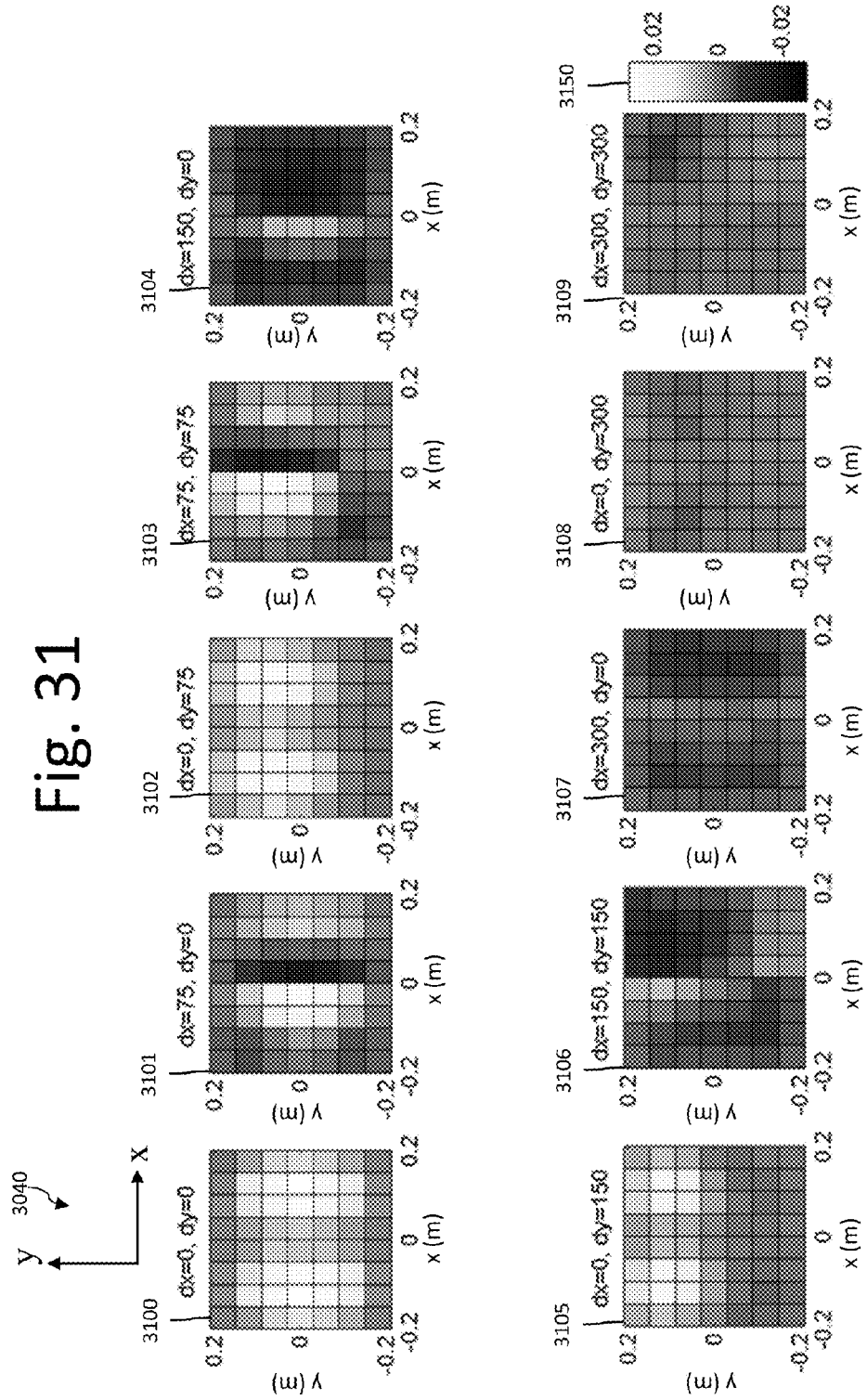
FIG. 31 are plots of simulation results shown in FIG. 30 subtracted by a baseline pattern.

FIG. 31 shows a series of plots 3100-3109 generated from the corresponding simulation results of plots 3000-3009 by subtracting a baseline pattern. In this example, the baseline pattern is determined as the pattern of voltages measured by the 8 by 7 array of FOD sensors in the FOD sensor board 2806 without the presence of the device coil 2804. Color bar 3150 indicates the amplitude of voltages between −0.02 V and 0.02 V. Because the baseline pattern is subtracted, the range of voltages is about 25 times smaller than the range of the color bar 3050, and the plots 3100-3109 show substantially distinct patterns of voltages relative to one another. The distinct patterns can be used as a signature for determining the relative alignment between the source coil 2802 and the device coil 2806 when the relative alignment is unknown. For example, pattern of voltages for various known alignments between the source coil 2802 and the device coil 2806 can be experimentally measured as a calibration step. The experimentally measured patterns can be saved as a library in data storage. Then when an alignment between the source coil 2802 and the device coil 2806 is unknown, the FOD sensor board 2806 can be used to measure a pattern of voltages and the measured pattern is compared with the patterns saved in the library to determine the extent of misalignment and/or the relative alignment between source coil 2802 and device coil 2806. The comparison result can be used to determine the unknown alignment, for example, by determining a match between the measured pattern and a saved pattern in the library. The match can indicate that that the unknown alignment corresponds to an alignment corresponding to the matched saved pattern.

Figure 32:
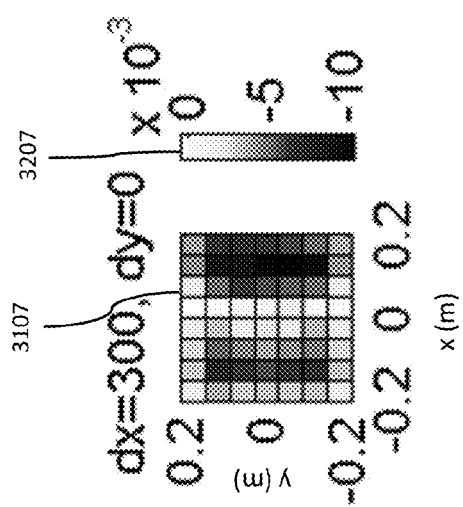
FIG. 32 are plots of simulation results with rescaled color bars.

Referring back to FIG. 31, the pattern of voltages of plots 3107-3109 are difficult to visually distinguish from one another. In this case, the pattern of voltages can be rescaled to adjust the color range of each plot. FIG. 32 shows plots 3107-3109 with rescaled color bars to clearly show their respective pattern of voltages. Due to the rescaled range of voltages, plots 3107-3109 in FIG. 32 visually show substantially distinct patterns of voltage from each other. These distinct patterns can be used to distinguish the corresponding alignments represented by plots 3107-3109.

Figure 33:
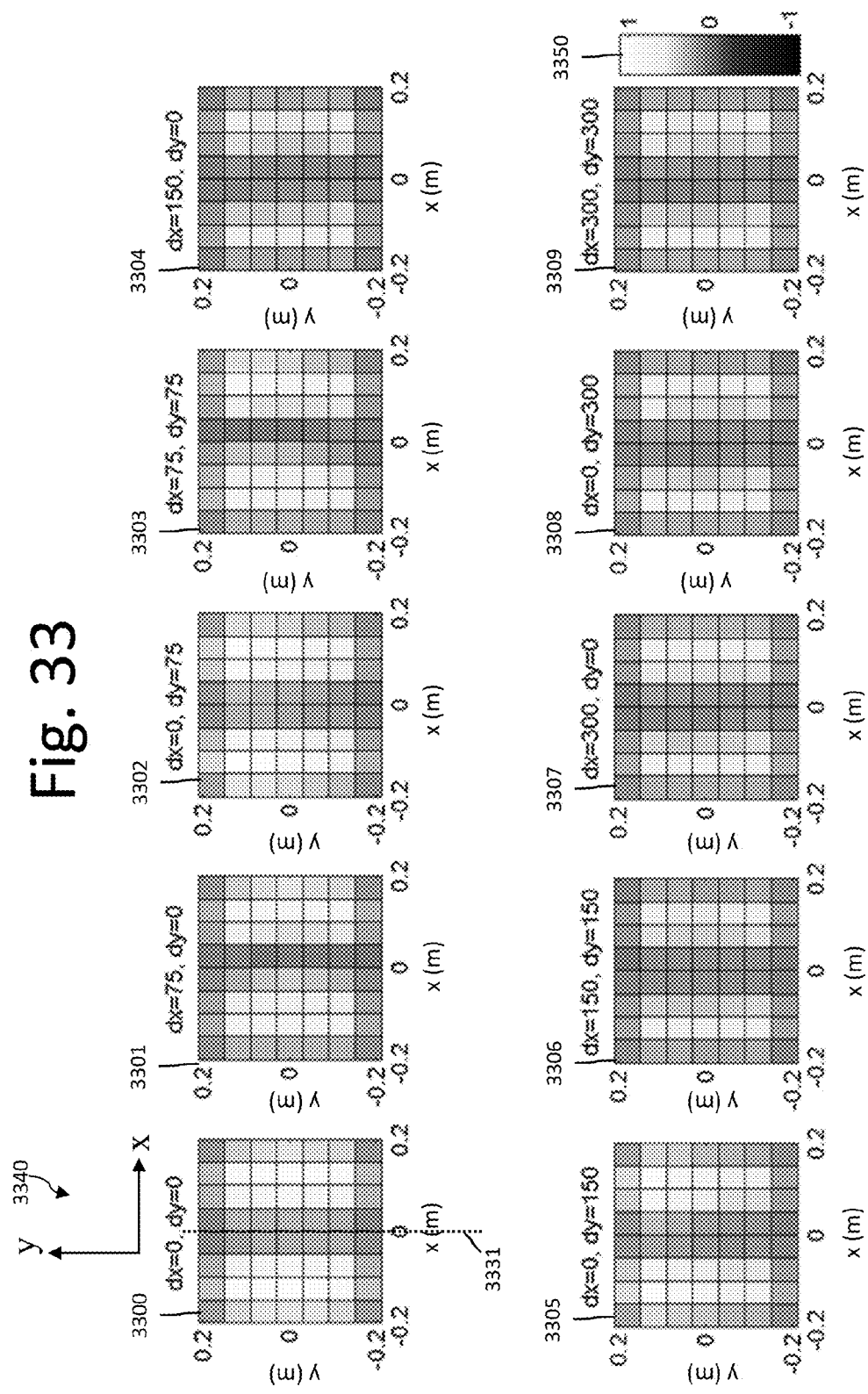
FIG. 33 are plots of simulation results obtained by a FOD sensor board.

FIG. 33 shows plots of simulation results for FOD sensor board 2806 described in arrangement 2800 of FIG. 28. In this example, source coil 2802 generates magnetic fields with 3 A maximum amplitude current oscillating in the source coil 2802. In these simulations, the device coil 2804 is connected a load, potentially through power conditioning, impedance matching and resonant circuitry, so that currents induced by the source coil 2802 magnetic field may oscillate within the device coil 2804. Coordinate 3340 shows the x-direction and y-direction. The FOD sensor board 2806 detects the magnetic field at its position depending on the misalignment of center axes 2803 and 2805 in the x- and y-directions. Plots 3300-3309 show simulated voltages measured by the FOD sensor board 2806 for the ten corresponding arrangements 2900-2909 described in FIG. 29. Color bar 3350 indicates voltage amplitude between −1.0 V and 1.0 V. In this example, plots 3300-3309 have patterns of voltage with similar shapes but the voltage amplitude varies depending on the relative alignment between the source coil 2802 and the device coil 2804. For plot 3300, the voltage amplitude is high (even higher than that of plot 3000) because currents are present in the device coil 2804. Changes in the voltage amplitude due to the change of relative alignment of the source coil 2802 and the device coil 2804 are larger than in plots 3000-3009 when the device coil 2804 is open circuited. For example, the voltage amplitude in plot 3309 is smaller by about half than the voltage amplitude in plot 3300. In some embodiments, a larger variation of the voltage amplitude in the measured patterns can improve the accuracy of determining the relative alignment.

Figure 34:
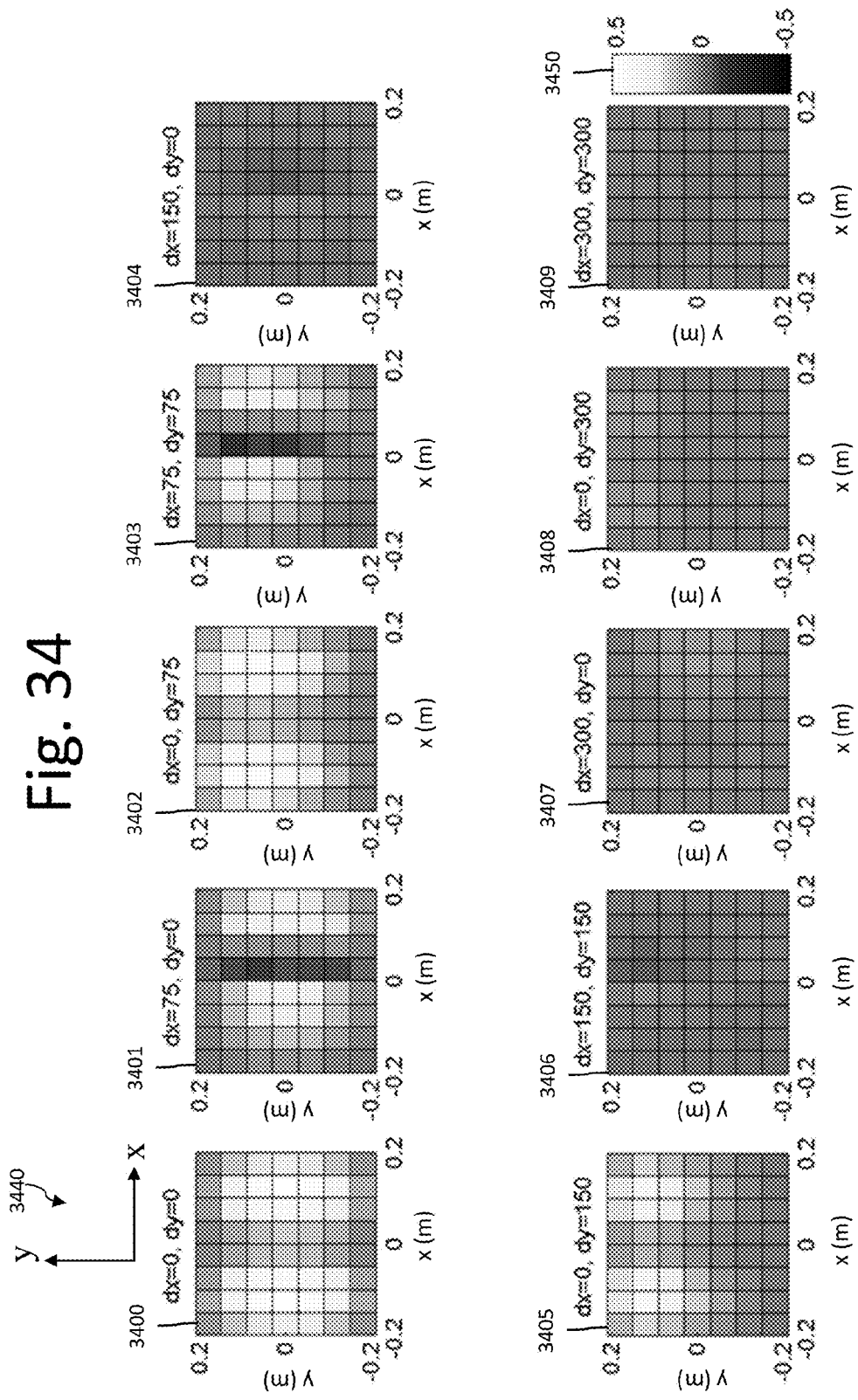
FIG. 34 are plots of simulation results shown in FIG. 33 subtracted by a baseline pattern.

FIG. 34 shows plots of simulation results derived from plots 3300-3309 by subtracting a baseline pattern. In this example, the baseline pattern is determined as the pattern of voltages measured by the 8 by 7 array of FOD sensors in the FOD sensor board 2806 without the presence of the device coil 2804. Color bar 3450 indicates the voltage amplitude from −0.5 V to 0.5 V. Plots 3400-3403 and 3405 have a larger voltage amplitude than plots 3100-3103 and 3105 because currents are allowed to flow in the device coil 2804 during the measurements. The larger voltage amplitude improves the signal-to-noise ratio (SNR) of measured voltage signals. In this example, the plots 3400-3403 and 3405 show visually distinct patterns of voltages from each other. The distinct patterns can be used as a signature for determining the relative alignment between the source coil 2802 and the device coil 2804 when the relative alignment is unknown, in a similar manner described in relation to FIG. 31.

Figure 35:
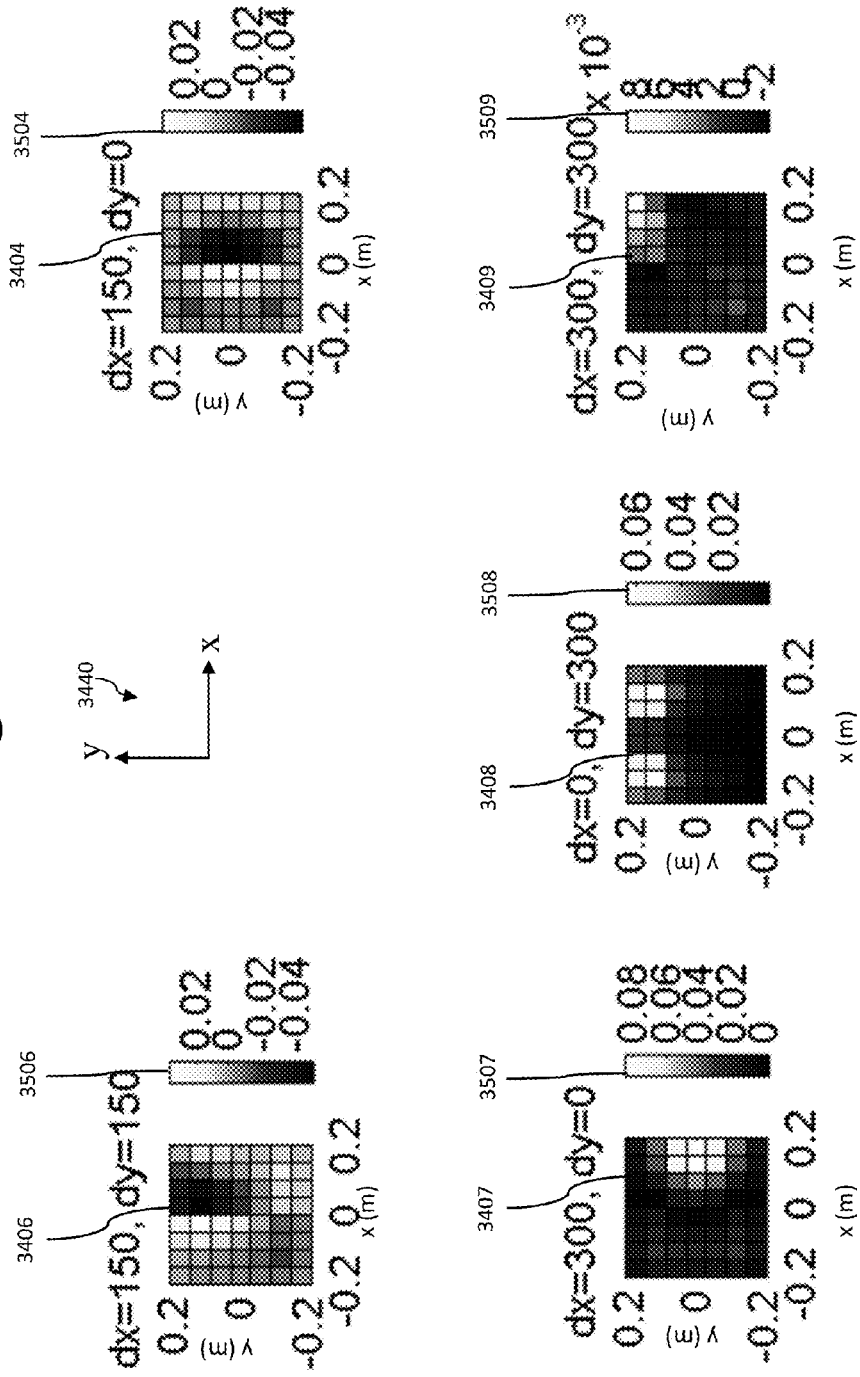
FIG. 35 are plots of simulation results with rescaled color bars.

Referring to FIG. 34, the patterns of voltages in plots 3404 and 3405-3409 are difficult to visually distinguish one another. The pattern of voltages can be rescaled to adjust the color range of each plot. FIG. 35 shows plots 3404 and 3405-3409 with rescaled color bars to clearly show variations in the respective patterns of voltages among the plots. Due to the rescaled range of voltages, the plots 3404 and 3406-3409 in FIG. 35 show visually distinct patterns, which can be used to distinguish the corresponding alignments of the plots 3404 and 3406-3409.

In some embodiments, the FOD sensors can have a large dynamic range to be able to measure the voltage levels of plots 3400-3409. The FOD sensors can also have high sensitivity and resolution for distinguishing the patterns of plots 3404 and 3406-3409. Accordingly, the FOD sensors can measure large variations of voltages as well as being capable of distinguishing small variations. In certain embodiments, an analog-to-digital converter can receive the measured signal from the FOD sensors. For example, a 20 bit analog-to-digital converter can provide a resolution of $10^{-6}\times$ maximum detectable voltage of the FOD sensors. In this example, if the maximum detectable voltage is 1V, the resolution can be 1 μV. The analog-to-digital converter may be included in a control electronics as described in relation to FIG. 27.

Figure 36:
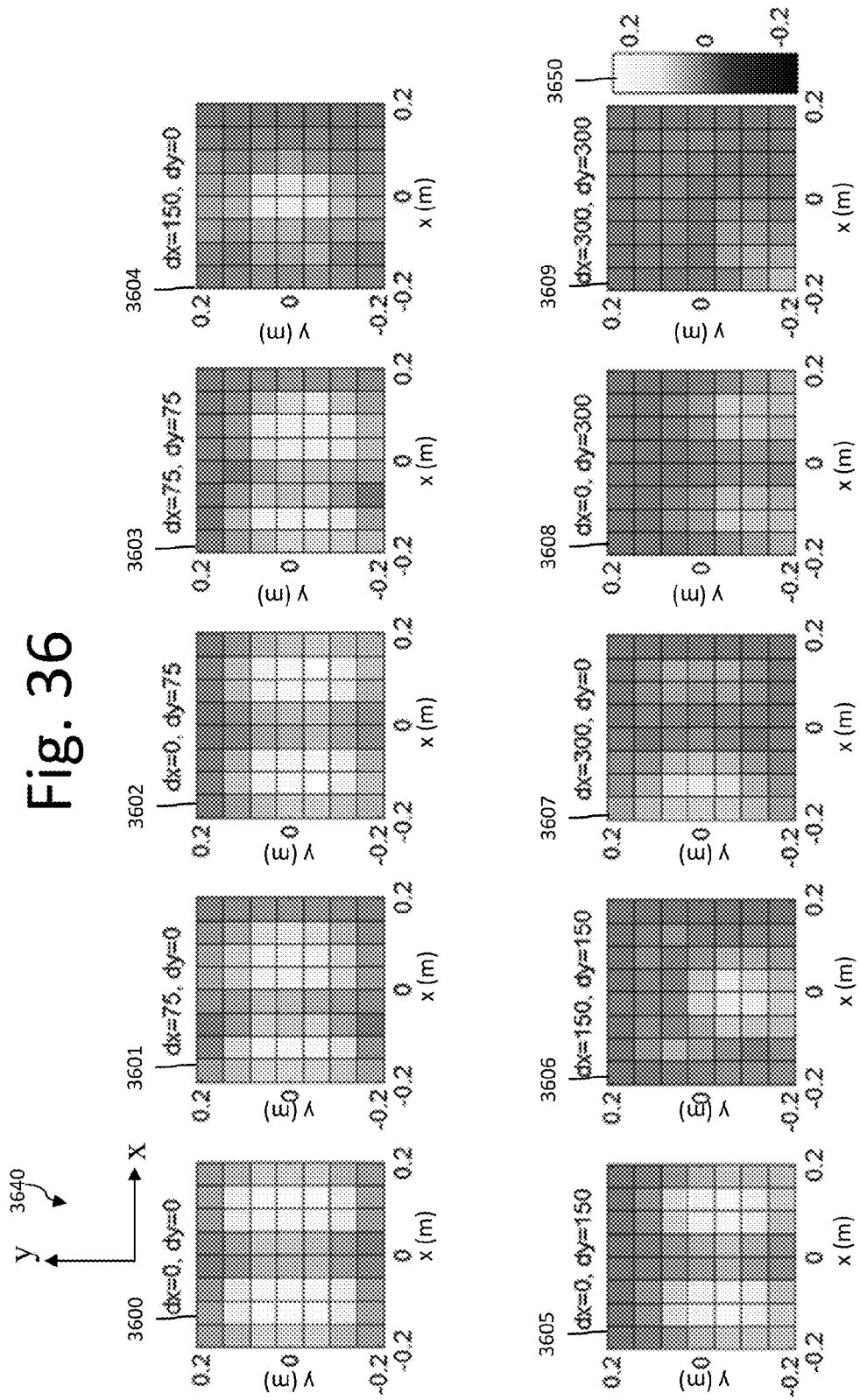
FIG. 36 are plots of simulation results obtained by a FOD sensor board.

FIG. 36 shows plots of simulation results obtained by the FOD sensor board 2816 described in the arrangement 2810 of FIG. 28. In this example, source coil 2812 generates magnetic fields with 3 A maximum amplitude currents oscillating in the source coil 2812. The device coil 2814 is open circuited so that substantially no current oscillates in the device coil 2814. Coordinate 3640 shows the x-direction and y-direction. The FOD sensor board 2816 detects the magnetic field generated by the source coil 2812 depending on the misalignment of center axes 2813 and 2815 in the x- and y-directions. Plots 3600-3609 show the voltages measured by the FOD sensor board 2816 for the ten arrangements 2900-2909 described in FIG. 29. Color bar 3650 indicates the voltage amplitude between −0.2 V and 0.2 V. In this example, plots 3600-3609 show distinct patterns of voltages even without a baseline pattern subtraction. This approach can have advantages of reduced computation time and cost by eliminating the step of baseline subtraction.

In the example shown in FIG. 36, the voltage amplitude of the patterns shown in plots 3600-3609 depend strongly on the relative alignment between the source coil 2812 and the device coil 2814. This is because the FOD sensor board 2816 is a device-side sensor board, and thereby moves relative to the source coil 2814 which generates the detected magnetic field. As the FOD sensor board 2816 becomes misaligned with the source coil 2812, the measured voltages change faster than the case where a FOD sensor board is fixed relative to a source coil. This approach may be advantageous because the measured pattern of voltages can depend strongly on the alignments of a source and device coil.

Figure 37:
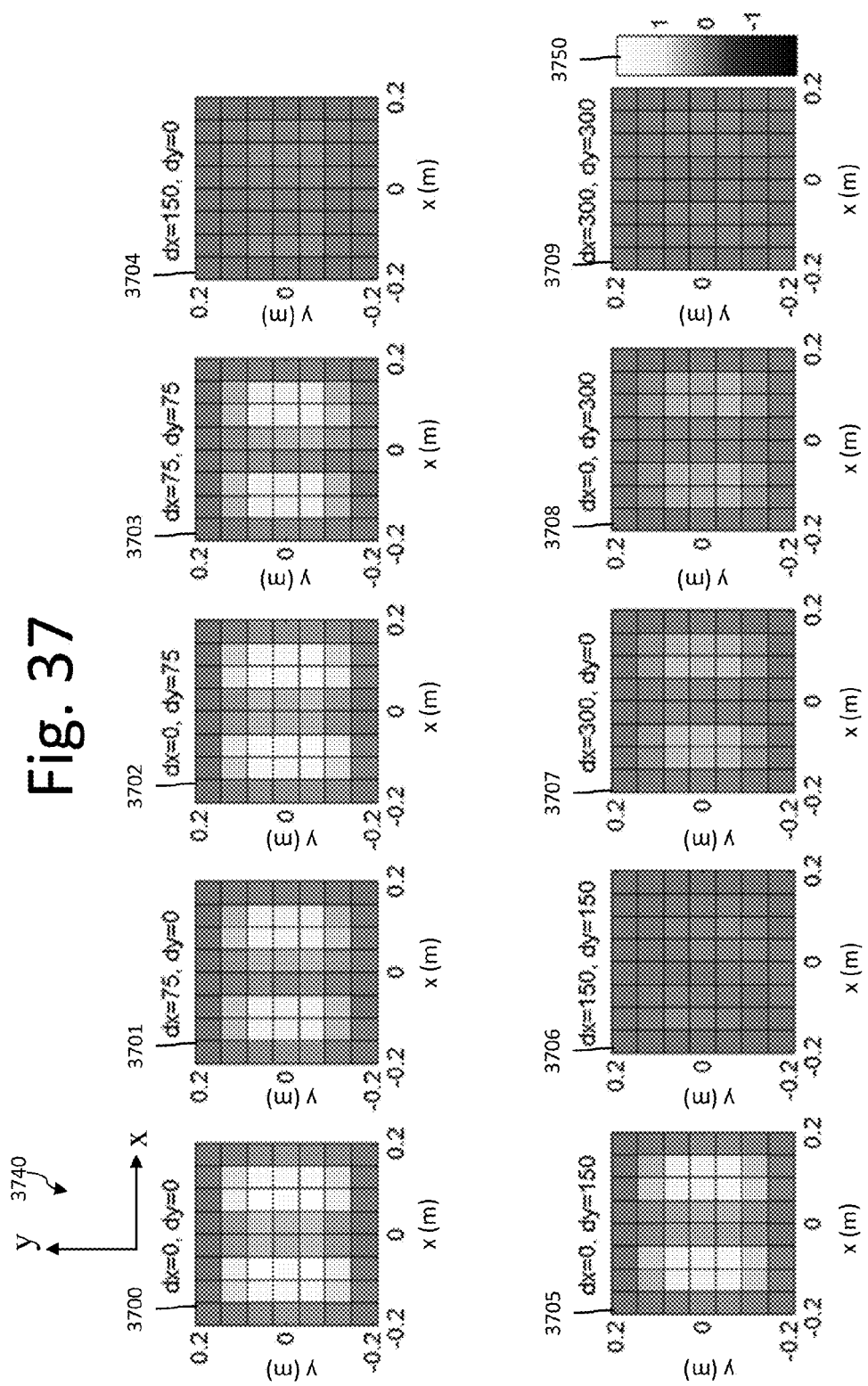
FIG. 37 are plots of simulation results obtained by a FOD sensor board.
Figure 38:
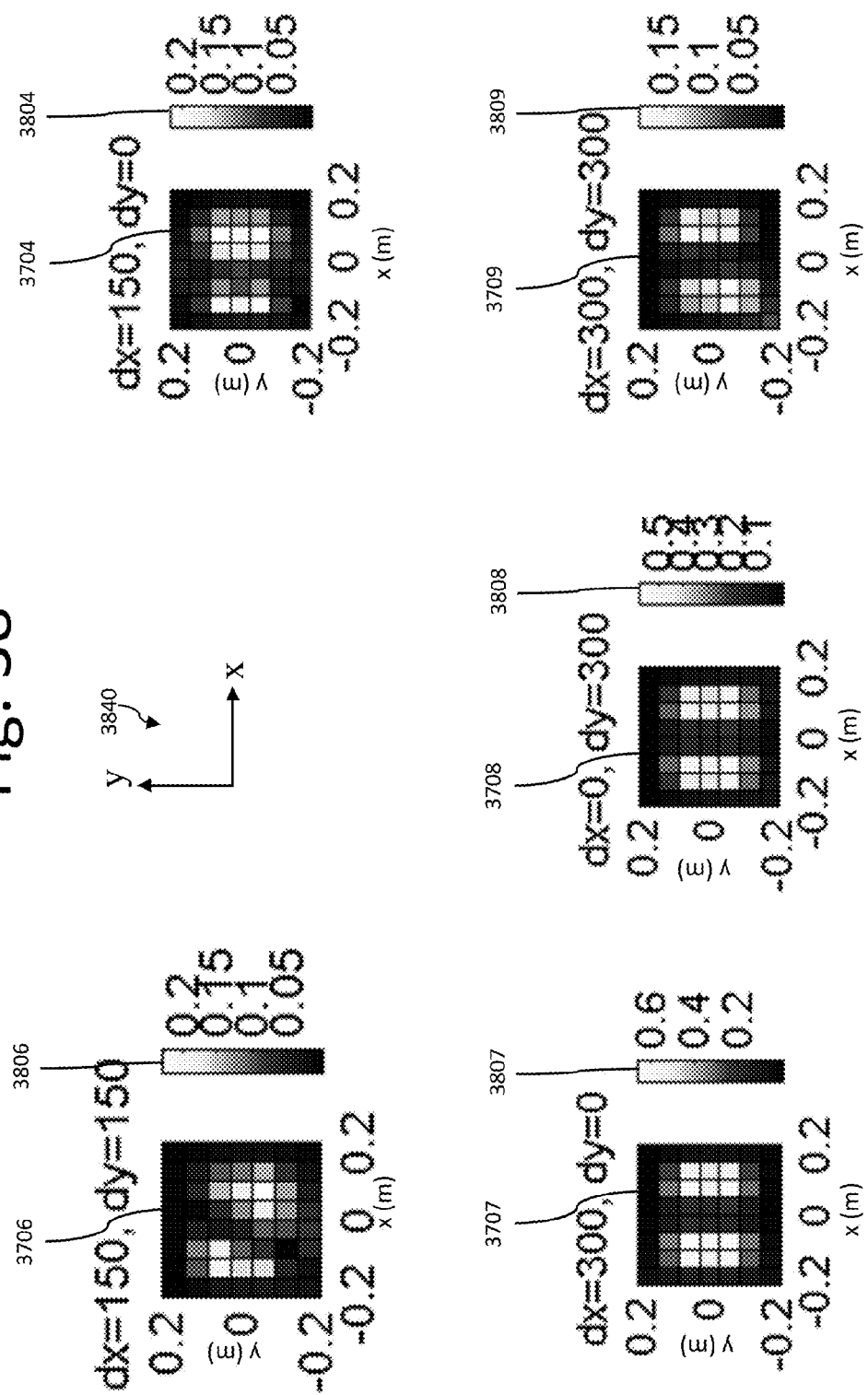
FIG. 38 are plots of simulation results with rescaled color bars.

FIG. 37 shows plots of simulation results obtained by the FOD sensor board 2816 described in the arrangement 2810 of FIG. 28. In this example, source coil 2812 generates magnetic fields with 3 A maximum amplitude currents oscillating in the source coil 2812. The device coil 2814 is connected to a load and currents oscillate in the device coil 2814. Coordinate 3740 shows the x-direction and y-direction. The FOD sensor board 2816 detects the magnetic field generated by the source coil 2812 depending on the misalignment of center axes 2813 and 2815 in the x- and y-directions. Plots 3700-3709 show the voltage measured by the FOD sensor board 2816 for the ten arrangements 2900-2909 described in FIG. 29. Color bar 3750 indicates the voltage amplitude. Similar to the example of FIG. 36, the patterns of voltage amplitudes shown in plots 3700-3709 depend strongly on the alignment position. However, the patterns of voltages in plots 3704, 3706 and 3709 are difficult to visually distinguish from one another. The patterns of voltages can be rescaled to adjust the range of each plot. Referring to FIG. 38, each of the color bars of plots 3704 and 3706-3709 are rescaled to show their respective pattern of voltages. As a result, the patterns of the plots 3704 and 3406-3409 can be clearly distinguished. These patterns can be used to determine the corresponding alignments of the plots 3704 and 3706-3709.

Figure 39:
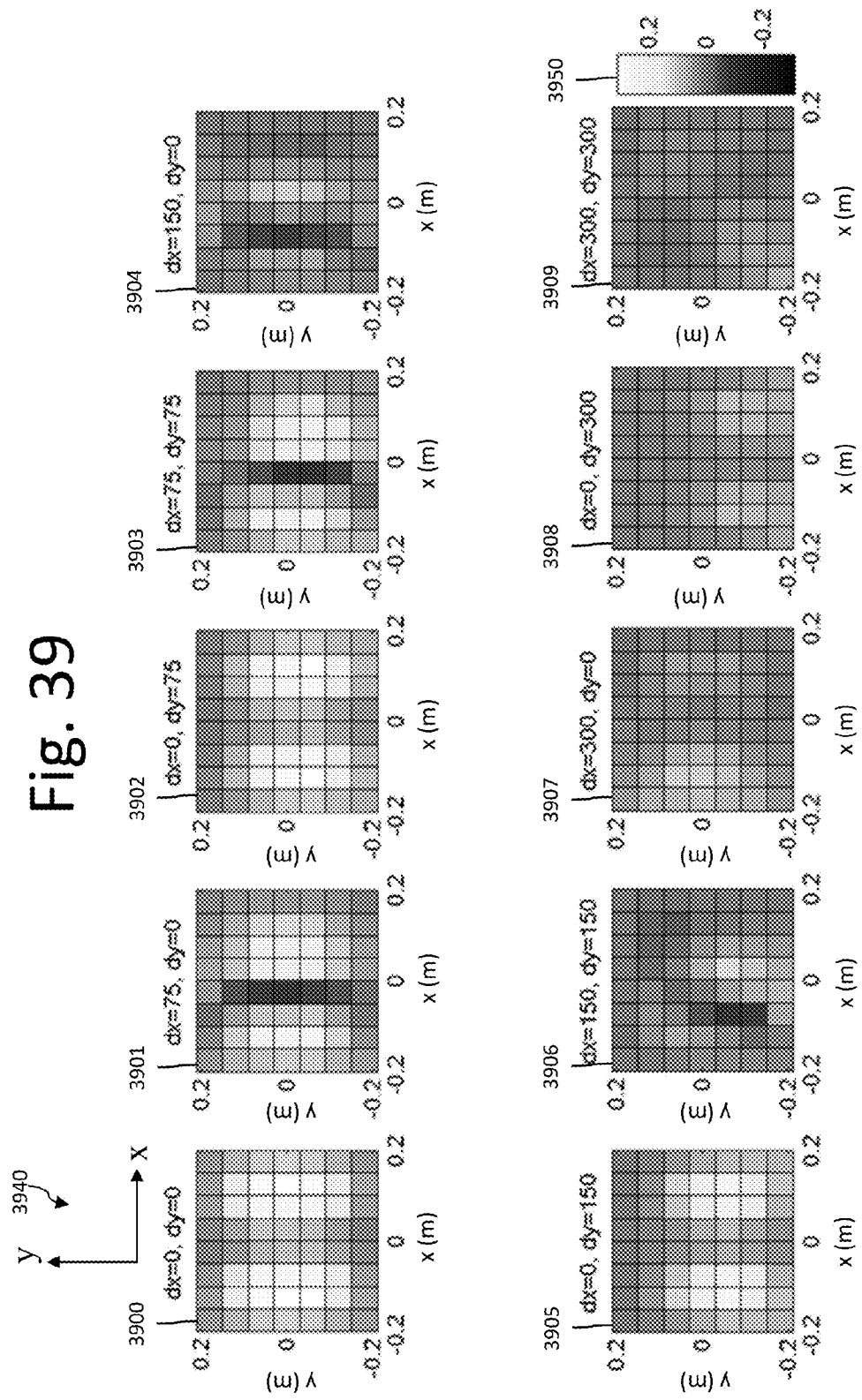
FIG. 39 are plots of simulation results shown in FIG. 37 subtracted by a baseline pattern.

FIG. 39 shows plots of simulation results derived from plots 3700-3709 by subtracting a baseline pattern. In this example, the baseline pattern is determined as the pattern of voltages measured by the 8 by 7 array of FOD sensors in the FOD sensor board 2816 without the presence of the source coil 2812. To measure the baseline pattern, the FOD sensors can measure a magnetic field generated by currents provided in the device coil 2814. For example, the currents can be provided by a small power source connected to the device coil 2814.

Plots 3900-3909 show patterns of voltages following subtraction of the baseline pattern from the plots 3700-3709. Color bar 3950 indicates the voltage amplitude of the plots shown in FIG. 39. After the subtraction, plots 3904 and 3906-3909 show a more distinct pattern of voltages compared to the plots 3704 and 3706-3709 in FIG. 37. Accordingly, the plots 3900-3909 with subtracted baseline pattern may improve detectability of the alignment between the source coil 2812 and the device coil 2814 compared to the case of FIG. 37.

Figure 40:
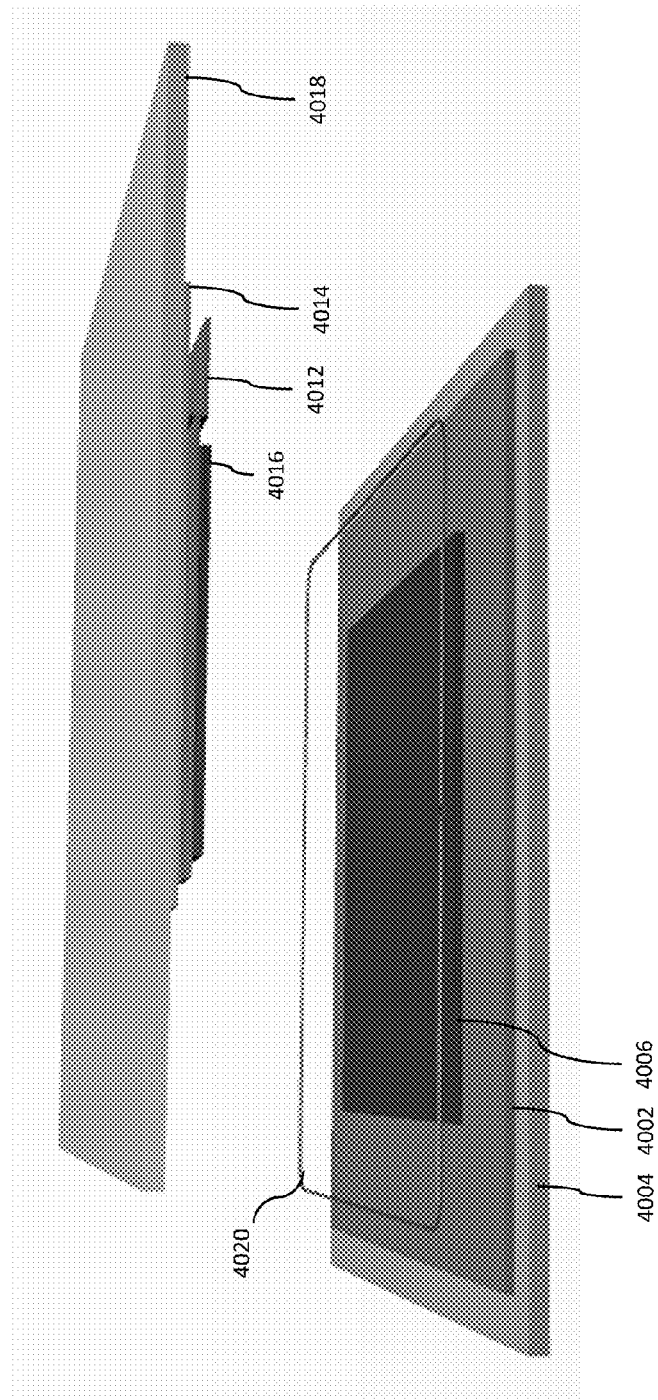
FIG. 40 is a schematic diagram of a wireless power transfer system 4000.

FIG. 40 is a schematic diagram of a wireless power transfer system 4000 including a source coil 4002 of a power source resonator and a device coil 4012 of a power receiver resonator. The source coil 4002 is positioned above a shield 4004 and the device coil 4012 is positioned below a shield 4014. A source-side FOD sensor board 4006 is positioned above the source coil 4002 and a device-side FOD sensor board 4016 is positioned below the device coil 4012. The device coil 4012, shield 4014 and FOD sensor board 4016 are positioned below a device cover 4018. In some embodiments, the areal size of the FOD sensor boards 4006 and 4016 can be larger than the areal size of the source coil 4002 and device coil 4012, respectively. Coordinate 4040 shows the x- and z-directions. The system 4000 can include a magnetic material (e.g., ferrite) on either or both the source-side and device-side. For example, either or both the source coil 4002 and device coil 4012 may be wound around a magnetic material, respectively. It is understood that the arrangement shown in FIG. 40 is an example, and that the relative separations and dimensions may be modified.

The source coil 4002 and the device coil 4012 may each have plurality of loops wound around an axis parallel to the x-direction such that oscillating current in the loops induces a dominant magnetic dipole parallel to the x-direction. On the other hand, FOD sensors in the FOD sensor boards 4006 and 4016 each have plurality of loops wound around an axis parallel to the z-direction such that oscillating currents in the loops induce a dominant magnetic dipole parallel to the z-direction. The wireless power transfer system may further include an additional coil 4020 which can be connected to a power source. The additional coil 4020 may be arranged such that oscillating currents within the coil 4020 induces a dominant magnetic dipole parallel to the z-direction.

In some embodiments, the FOD sensors can couple more strongly to the additional coil 4020 than the source coil 4002 because the FOD sensors and the additional coil 4020 can induce magnetic dipoles in the z-direction. As such, the FOD sensors can be configured to detect the magnetic field generated by the additional coil 4020 and use the measured voltages to determine the alignment between the source coil 4002 and the device coil 4012. This approach can eliminate the need to power the source coil 4002 for determining the alignment. Instead, the additional coil 4020 can be used at a lower power than what the source coil 4002 would require to obtain a given voltage level detected by the FOD sensors. This can reduce the time required for position measurements because the time needed to activate the source coil 4002 is eliminated. In some embodiments, the additional coil 4020 is fixed relative to the source coil 4002. Alternatively, the additional coil 4020 can be fixed relative to the device coil 4012.

FIG. 41 shows plots of simulation results obtained by the FOD sensor board 4006 described in the system 4000 of FIG. 40. In this example, the additional coil 4020 is a single loop of wire with a 1 A maximum amplitude current oscillating, in contrast to the 3 A current in the source coils of the examples described in FIGS. 30-39. The device coil 4012 is open circuited so that substantially no current oscillates in the device coil 4012. Coordinate 4140 shows the x-direction and y-direction. The FOD sensor board 4006 detects the magnetic field generated by the additional coil 4020 depending on the misalignment of the source coil 4002 and the device coil 4012 in the x- and y-directions. Plots 4100-4109 show the voltages measured by the FOD sensor board 4006 for the ten arrangements described in FIG. 29. Color bar 4150 indicates the amplitude of the voltages. In this example, plots 4100-4109 show visually distinct patterns of voltages without a baseline pattern subtraction. This approach can have advantages of reduced computation time and circuitry by eliminating the step of baseline subtraction. In some embodiments, the additional coil 4020 can have multiple loops of wire which can increase the magnetic field generated by a 1 A maximum amplitude current oscillating within the additional coil 4020, and thereby increasing a signal strength. In this case, if the signal strength is higher than a detectable strength by a sensor, the maximum amplitude current can be decreased from 1 A, which may reduce operational costs of the additional coil 4020.

In the examples described in connection with FIGS. 30-39 and 41, a measured pattern of voltages can be compared to a pattern in a database library. The comparison can be implemented by statistically correlating the measured pattern and the stored pattern. Accordingly, an alignment of a source coil and a device coil providing the measured pattern can be determined to have an alignment corresponding to the saved pattern.

In certain embodiments, a calibration step can be implemented to calculate and store mean $\mu$ and covariance $\sigma$ matrices, which can be used to calculate a likelihood y and probability $\Psi$ for a measurement in order to determine the alignment between a source coil and a device coil. In this case, a smaller value of likelihood y and a larger value of $\Psi$ indicates the corresponding alignment of the measurement. For example, in a calibration step, j sensors in a FOD sensor array can measure data in a array form x according to Eq. (17), shown below:

$$x = \begin{bmatrix} |s_1| \\ |s_2| \\ \vdots \\ |s_j| \end{bmatrix}. \quad (17)$$

where $|s_1| \ldots |s_j|$ corresponds to voltage magnitude of each sensor. In this step, x is measured for n states of different relative alignment positions between the source and device coil. Each state i of the n states may be characterized using the p measurements of various operating conditions (e.g., orientations, power levels, frequencies) of the system and may be represented as $(x_{(i,1)}, x_{(i,2)}, \ldots, x_{(i,p)})$, where i ranges from 1 to n, or 0 to n−1, or over a range of values such that the set contains n state values. For each of these n states, and every state i may have its own mean and covariance matrix which may be calculated according Eqs. (18) and (19), shown below:

$$\mu_i = \frac{1}{p}\sum_{l=1}^{p} x_{(i,l)} \quad (18)$$

$$\sigma_i = \frac{1}{p}\sum_{l=1}^{p} (x_{(i,l)} - \mu_i)(x_{(i,l)} - \mu_i)^T. \quad (19)$$

Given a new measurement x, the most likely state of the system is determined by calculating the following matrix product as previously described and according to Eq. (20), shown below:

$$y_i = (x-\mu_i)^T \sigma_i^{-1}(x-\mu_i). \quad (20)$$

A probability, $\Psi_i$, may be computed as Eq. (21), shown below:

$$\Psi_i = (2\pi)^{-\frac{p}{2}}|\sigma|^{-\frac{1}{2}} e^{-\frac{1}{2}(x-\mu_i)^T \sigma^{-1}(x-\mu_i)}. \quad (21)$$

The smallest value of y corresponds to the largest value of $\Psi$ in the distribution of $\Psi_i$. For the new measurement x, its corresponding relative alignment between the source and device coil can be determined to correspond to the i state which has $\mu_i$ and $\sigma_i$ leading to the largest value of $\Psi$ or a value of $\Psi$ above a calibrated threshold value. It is understood that this determination is different from the process of FOD detection, where a largest value of likelihood y may indicate a presence of a FOD. In some embodiments, based on an input, calculated, measured, or predetermined threshold for the likelihood y, a power transfer system may categorize calculated values of likelihood y as below the threshold for the likelihood y to identify an alignment of a source and device coil.

In FIGS. 30-39 and 41, the plots present patterns of voltage amplitudes. In some embodiments, patterns can be generated from magnitudes and/or phases of the measured voltages and used as described above to determine alignment information between power source resonators and power receiver resonators. This approach may provide additional information in determining an alignment between a source coil and a device coil. For example, in a calibration step, data array x for the j sensors can be measured according to Eq. (22), shown below:

$$x = \begin{bmatrix} r_1 \\ \theta_1 \\ \vdots \\ r_j \\ \theta_j \end{bmatrix}, \quad (22)$$

where $r_i$, $\theta_i$ correspond to amplitude and phase, respectively, of measured voltages of the j sensors. In another example, the data array x can be measured by taking the sine and cosine of the measured voltages according to Eq. (23), shown below:

$$x = \begin{bmatrix} r_1\cos\theta_1 \\ r_1\sin\theta_1 \\ \vdots \\ r_j\cos\theta_j \\ r_j\sin\theta_j \end{bmatrix}. \quad (23)$$

It is understood that at least some techniques described in relation Eqs. (1)-(16) may be applied to determining a relative alignment between a source coil and a device coil.

The plots in FIGS. 30-39 and 41 show simulated voltages measured by an array of FOD sensors. In certain embodiments, the array of FOD sensors measure patterns of induced currents in the FOD sensors. In some embodiments, the FOD sensors can be gradiometers which measure voltage gradients. In this case, the techniques described in relation to FIGS. 30-39 can be applied to patterns of voltage gradients.

It is understood that a FOD sensor board can have an array of sensors other than an 8 by 7 array. The number of sensors can be adjusted based on the resolution needed to measure a pattern of voltages. For example, a FOD sensor board can include any of the arrangements of sensors disclosed herein to measure patterns of voltages and/or currents.

The plots in FIGS. 30-39 correspond to simulation results for a single FOD sensor board on either the source-side or the device-side. The techniques described in relation to FIGS. 30-39 can be applied to arrangements using multiple FOD sensor boards, for example, at both the source-side and the device-side.

The disclosed alignment measuring techniques can be used in vehicle battery charging applications. For example, a source coil can be connected to a power source in a home garage, driveway, parking lot, or other location where a vehicle is stationed for recharging, and a device coil can be fixed to a vehicle. The techniques can be used to determine whether the device coil is sufficiently aligned with the source coil when a vehicle driver parks the vehicle over the device coil. For example, the techniques can be used to align the centers of the source and device coils within 300 mm (e.g., within 200 mm, within 100 mm, within 50 mm) of each other. In some embodiments, when a device-side FOD sensor board is used, the measured position can be communicated to a visual or audio device in the vehicle through a hard-wired or wireless connection. In certain embodiments, when a source-side FOD sensor board is used, the measured position can be wirelessly transmitted to the visual or audio device in the vehicle. The visual or audio device can then convey information to the driver about the extent of misalignment between the vehicle and the power source, prompting the driver to adjust the position of vehicle if necessary.

The disclosed techniques for determining a relative alignment between two coils (also referred as "alignment measurements") can be used in wireless power transfer systems which transfer power at any power level. Determining the relative alignment through an alignment measurement can be useful in ensuring efficient wireless power transfer as well as for safe operation of the systems. For example, a wireless power transfer system transferring power of 2 kW or above (e.g., 3 kW or above, 5 kW or above) (referred as a "high-power wireless transfer system" in this disclosure) can be used to transfer power to industrial machinery or robots that may need alignment measurements with various power sources installed in parts of a factory. In another example, a wireless power transfer system transferring power of 0.5 kW or less (e.g., 0.1 kW or less, 0.05 kW or less) (referred as a "low-power wireless transfer system" in this disclosure) can be used as wireless lighting systems which may require a power transmitter to be on one side of a wall and a lighting device connected to a power receiver on the other side of a wall. In such cases, the disclosed techniques can be used to align the power transmitter and power receiver can in order to find the highest efficiency and best coupling alignment when it may not be easy to see each side of a wall for alignment of resonators or coils. In some embodiments, the discloses techniques for alignment measurements can be applied to wireless power transfer systems for powering lightings in cabinets or electronic devices such as displays (e.g., TVs, monitors, projectors) or printers.

In some embodiments, alignment measurements may be useful in wireless power transfer systems including multiple wireless sources and receivers, such as in a room where one or more power sources may be transferring power to one or more power receivers. In certain embodiment, the one or more power sources can be controlled to deliver power to one or more power receivers preferentially and the alignment measurements can be used to find the optimized best coupling or highest efficiency alignment. In some embodiments, alignment measurements can be used to align or position repeater resonators for optimal transfer of wireless power from one or more sources to one or more receivers. For example, locations of repeater resonators in a room may be determined using the disclosed techniques for alignment measurements. This approach can be advantageous by allowing a user to easily position the repeater resonators relative to the one or more source or one or more receiver resonators in rooms or spaces where it may be difficult for a user to visually align the resonators due to the presence of walls or object blocking the user's view. For example, the repeater resonators may be easily positioned around walls, around corners, around objects, under floors, in ceilings and inside furniture.

FIG. 42 is a schematic diagram of a source 4200 used to wirelessly transmit power, which includes sensors for detecting foreign objects. In this example, the sensors are LOD sensors where each sensor measures a voltage signal induced by a capacitive change in the sensor by the presence of an object (e.g., a living object.)

In the top view of FIG. 42, the source 4200 may include a PCB 4204 where a source coil 4202 is formed. The source coil 4202 may be surrounded by a ground electrode 4206. A shield 4208 may surround the ground electrode 4206. A sensor 4210 may surround the shield 4208. In some embodiments, for example, the source coil 4202 has a width 4221 of about 20 inches, and the length 4222 is about 22 inches. In the bottom cross-sectional view of FIG. 42, a shield 4212 is positioned on the other side of the PCB 4204 below the shield 4208 and the sensor 4210. In some embodiments, for example, the ground electrode has a width 4223 about ½ inches, the shield 4208 has a width 4224 about ¼ inches, the sensor 4210 has a width 4226 about ¼ inches, the shield 4212 has a width 4227 about $^9\!/_{16}$ inches, and the distance 4225 between the ground electrode 4206 and the sensor 4210 is about 1 inch. More generally, however, each of these dimensions can vary widely depending upon specific applications in which a source 4200 transfers power to a power receiver. In some other embodiments, the source coil 4020 can be positioned below the PCB (on the same side of the PCB as the shield 4212) instead of its current position above the PCB shown in FIG. 42. In this case, sensors can be positioned above the source coil 4020 (at the current position of source coil 4020 shown in FIG. 42.)

In certain embodiments, the shield 4208 can affect a distribution of electric fields formed around the source 4200 (e.g., by the source coil 4202 or sensor 4210). For example, the shield 4208 can be driven at the same potential as the sensor 4210 to make the distribution of the electric fields extend a larger range around the PCB 4204 before reaching the ground electrode 4206 compared to the case when driven at a different potential. This approach may increase the detection range of the sensor 4210 by reducing the contribution of the electric fields to the capacitive change of the sensor 4210. Thus, the shield 4208 can act to block or reduce the effect of unwanted electric fields to the sensor 4210. In this example, the shield 4208 is not a ground electrode.

In some embodiments, the sensor 4210 can be a LOD sensor. For example, the LOD sensor can detect capacitive changes when a living object approaches the LOD sensor.

Source 4200 can be modified in a number of ways. For example, FIG. 43A is a schematic diagram of a LOD sensor arrangement 4300 including a source coil 4302 surrounded by a shield 4304. The arrangement 4300 can include multiple sensors. In this example, the shield 4304 is surrounded by sensors 4310, 4312 and 4314 which are arranged on the top and right side of the shield 4304. The shield 4304 is surrounded by sensors 4311, 4313 and 4315 which are arranged on the bottom and left side of the shield 4304. The dash line 4320 indicates that the sensors 4310, 4312 and 4314 are separated from the sensors 4311, 4313 and 4315. Alternatively, the sensors 4310, 4312 and 4314 can be connected to the sensors 4311, 4313 and 4315, respectively. The dash line 4320 also indicates that the shield 4304 is discontinuous at the location of the dash line 4320. This may prevent the formation of circulating currents with amplitudes larger than the damage threshold of the shield 4304. It is understood that the dash line 4320 can be located at positions of the arrangement 4300. In the example shown in FIG. 43A, the sensors 4310-4315 are each formed from a strip of copper-based conductive material (e.g., metallic copper). Measurements from the multiple sensors 4310-4315 can be used to determine a position of a moving object. For example, when a live object passes over the multiple sensors 4310-4315, each of the sensors 4310-4315 can provide a peak in its measurement signal that differs in time from that of another sensor. By comparing the difference in time, the speed and direction of the moving object may be determined.

In some embodiments, sensors 4310-4315 can be discrete sensors. For example, the top of FIG. 43B is a schematic diagram of an array of LOD sensors 4350 including chevron shaped sensors 4352-4354. When a live object passes over the chevron shaped sensors 4352-4354, the measured signals by the sensors 4352-4354 can be gradual rather than abrupt due to their shape. These measured signal may be used to easily interpolate the position of the live object which may be located between two of the sensors 4352-4354. The bottom of FIG. 43B is a schematic diagram of an array of LOD sensors 4364-4367 surrounding a shield 4362. A source coil 4360 is positioned at the center of the shield. Coordinate 4340 indicates the x- and y-directions.

In certain embodiments, signals measured with different sensors (e.g., signals that correspond to changes in sensor capacitance) can have different signal-to-noise ratios (SNRs). For example, referring back to FIG. 43A, the sensor 4314 may detect signal levels that exceed noise levels for sensor 4314, while sensor 4310 may detect signal levels that are comparable to noise levels for sensor 4310 because sensor 4310 is closer to source coil 4302 which may be generating electromagnetic fields. The same type of noise can contribute to both the measurements of the sensors 4310 and 4314. In this case, the noise level of one sensor (e.g., sensor 4314) can be used to eliminate or reduce the noise level of another sensor (e.g., sensor 4310), for example, by using weighted subtraction or correlation techniques. For example, sensor 4310 can be intentionally shielded from the presence of detecting objects (e.g., live objects), and thereby the sensor 4310 can measure only noise. The sensor 4314 can measure a signal from both noise and the presence of detecting objects. The signal contribution from the presences of the detecting objects may be determined by subtracting the measured signals from sensors 4310 and 4314 to eliminate or reduce the contribution of the noise. This approach can be generalized for multiple sensors.

Figure 44:
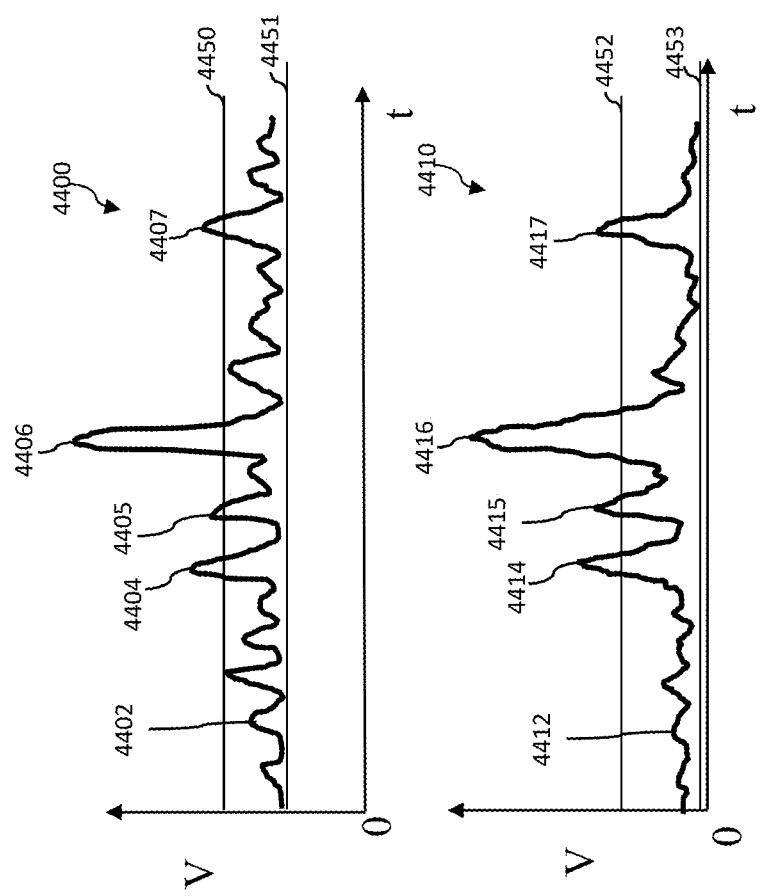
FIG. 44 is a schematic diagram of plots graphing an example measurement of two sensors.

FIG. 44 shows plots 4400 and 4410 which display examples of measurements from two sensors, respectively, as a function of time (t) and voltage (V). Plot 4400 shows a voltage measurement 4402 of one sensor and plot 4410 shows a voltage measurement 4412 of another sensor. The voltages are indicative of capacitive changes detected by the respective sensors. Measurement 4412 has a smaller background level 4453 than background ground level 4451 of measurement 4402. Measurement 4412 has a SNR about N times higher than that of measurement 4402. The two measurements can be correlated with each other to eliminate the noise contributing to both measurements 4402 and 4412. For example, in some embodiments, measurement signal 4402 can be subtracted from measurement 4412 after weighting their magnitudes based on their SNR ratios. In so doing, the magnitude of measurement 4402 can be reduced by N times and then subtracted from measurement 4412. This approach may reduce the noise contribution and improve the resulting SNR.

Plot 4400 has a threshold level 4450 and plot 4410 has a threshold level 4452. The threshold levels 4450 and 4452 can be determined by a calibration step. In some embodiments, the signals of measurements 4402 and 4412 can be identified by voltage peaks exceeding the respective voltage thresholds. For example, peaks 4404, 4405, 4406 and 4407 are identified as signals induced by a dielectric object approached its sensor because their peaks are higher than the threshold level 4450. Peaks 4414, 4415, 4416 and 4417 are identified as signals when the dielectric object approached its sensor because their peaks are higher than the threshold level 4452. Comparison of the identified peaks can be used to determine the useful peaks and eliminate peaks originating by noise contributing to both sensors.

In some embodiments, comparison of measurement signals of multiple LOD sensors can use techniques described in relation to Eqs. (1)-(23). For example, a calibration step can be performed to generate a mean $\mu$ and covariance $\sigma$ matrix. At this step, intrinsic noise of the multiple LOD sensors that results in noise peaks or drifts can be included in the mean $\mu$ and covariance $\sigma$ matrix. During use of the multiple LOD sensors to detect objects (e.g., living object), the sensors can measure signals to provide a data array x, for example, in a similar manner according to Eqs. (1), (2), (17), (22) and (23). In this case, capacitance or capacitance changes measured by the multiple LOD sensors are used to determine the array x. After the calibration step, for a new measurement x, techniques described in relation to Eqs. (1)-(23) can be used to calculate a likelihood y and/or probability $\Psi$ to determine a presence of the living object that induces a capacitance change measured by the multiple LOD sensors. It is understood that the determination of the presence of the living object can be implemented in a similar manner to the techniques described in relation to FOD detection processing but the data array x is obtained from the multiple sensors based on capacitive sensing instead of amplitude and phase data from magnetic field sensors. In certain embodiments, a large likelihood y may indicate a presence of the living object. Based on an input, calculated, measured, or predetermined threshold for the likelihood y, a power transfer system may identify that LOD is present when calculated values of likelihood y is the threshold for the likelihood y.

Referring back to FIG. 42, control electronics (e.g., a controller) can be connected to the sensor 4210 and shield 4208. The control electronics can be tuned so that the combined control electronics and sensor 4210 system can have a minimum parasitic capacitance ($C_p$), which is the capacitance with no live objects (e.g., a person or animal) present. This tuning step can improve the sensitivity of the sensor 4210 by allowing the controller to detect a smaller capacitance change measured by the sensor 4210 due to a higher SNR. The capacitance change can occur by dielectric objects such as live objects approaching the sensor 4210. This approach can increase the maximum range of capacitance change detection of the sensor 4210. In some embodiments, the control electronics can be installed at a location that is isolated from metallic components to reduce parasitic capacitance. The control electronics can be located at a corner of the source 4200. The parasitic capacitance can be reduced by reducing the routing connection length from the control electronics to sensors. Instead of using extended wires to connect the control electronics and the sensors, long sensors such as sensors 4310-4315 which trace ends close to the control electronics can be used to reduce the connection length. This approach may reduce the parasitic capacitance by reducing the need for routing connections to the controller while increasing the area where objects may be detected. In some embodiments, the controller can be turned off when a power source connected to a source coil is turning on in order to avoid the controller detecting false peaks.

In certain embodiments, increasing the amplitude of voltages applied to the sensors can increase their SNR. The control electronics may operate at its highest voltage (e.g., 5 V) to apply the highest voltage possible to the sensors. This approach may reduce noise intrinsic to the circuitry of the control electronics.

Figure 45:
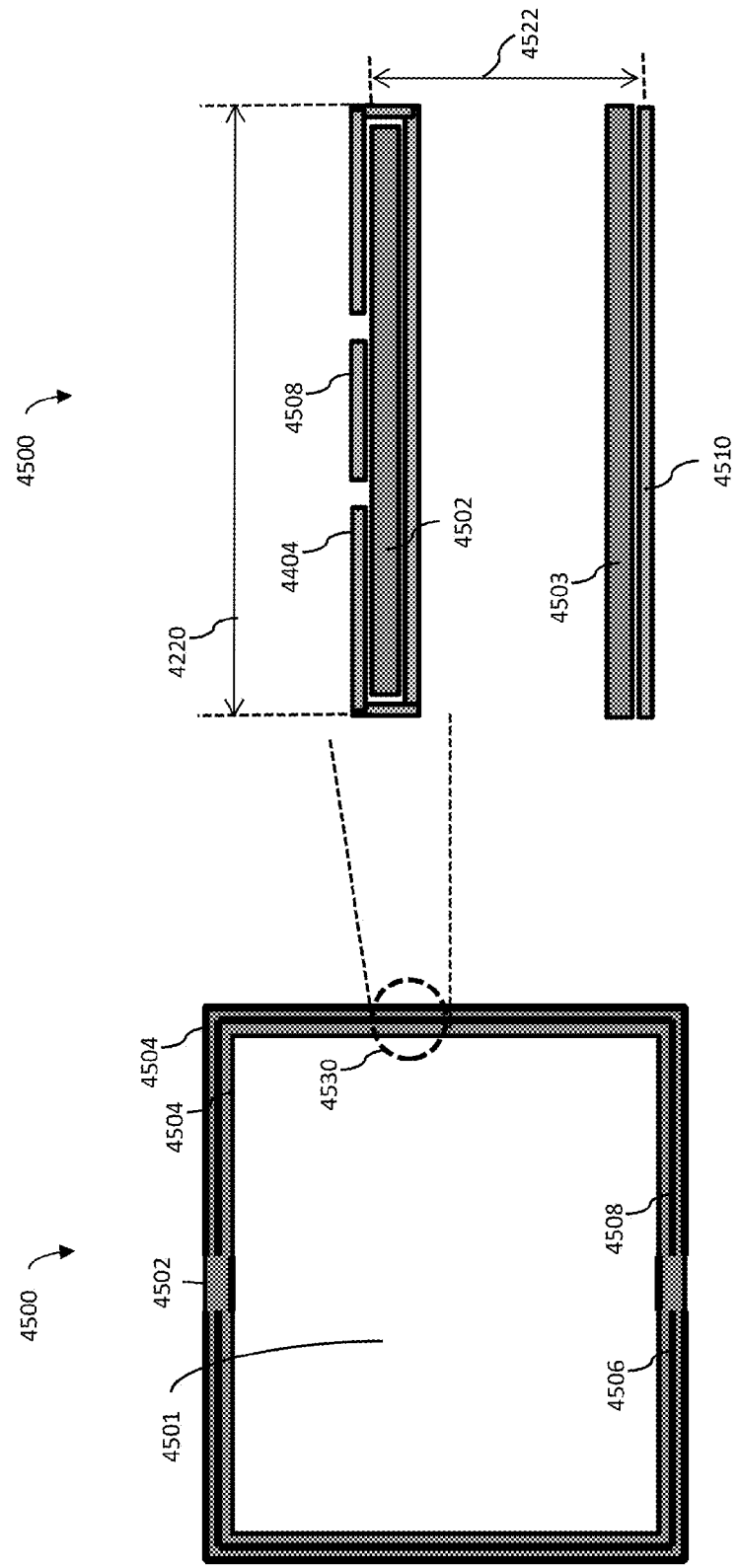
FIG. 45 is a schematic diagram of a source.

FIG. 45 is a schematic diagram of a source 4500 used to wirelessly transmit power, which includes sensors for detecting foreign objects. In this example, the sensors are LOD sensors where each sensor measures a voltage signal induced by a capacitive change in the sensor by the presence of an object (e.g., living object.) In the left view of FIG. 45, the source 4500 may include a PCB 4502 which is rectangular shaped (e.g., square shaped) stripe enclosing an open space 4501. Sensor 4506 is positioned above the PCB 4502 and extends as a strip along the left half of the PCB 4502. Sensor 4508 is positioned above the PCB 4502 and extends as a strip along the right half of the PCB 4502. Shield 4504 runs along the outer perimeter as well as the inner perimeter of the PCB 4502. In the right view of FIG. 45, a cross-section of a portion 4530 of the source 4500 shows that the shield 4504 partially wraps around the PCB 4502 which has a width 4220. For example, the width 4220 can be 1.5 inches. In some embodiments, another PCB 4503 can be positioned below the PCB 4502 with a distance 4522. For example, the distance 4522 can 1 inch. A ground electrode 4510 can be formed below the another PCB 4503. This approach may provide a lower parasitic capacitance of the source 4500 to improve the signal-to-noise ratio of measured signals by sensors 4506 and 4508.

Although the features described above in connection with FIGS. 40-45 relate to a source (e.g., a power source that transfers power wirelessly), some or all of the features can also be implemented in a power receiver that receives power wirelessly from a source. In particular, such a power receiver can include one or more resonators which can in turn include one or more coils and one or more sensors which can be configured for operation in the manner described above.

It is understood that the methods and steps described in relation to FIGS. 28-45 can be implemented in control electronics including a variety of processing hardware components such as one or more electronic processors and/or dedicated electronic circuits. For example, the control electronics can be configured to compare different pattern of voltages to calibration data stored in data storage. As another example, the control electronics can be configured to analyze correlation between capacitance change measurement signals from two different LOD sensors to reduce noise contribution as discussed in relation to FIG. 44.

It is understood that a source coil and a device coil described in relation to FIGS. 28-45 may be implemented in wireless power transfer systems which do not utilize resonator for power transfer. The disclosed techniques may be applied to wireless power transfer systems.

Figure 27:
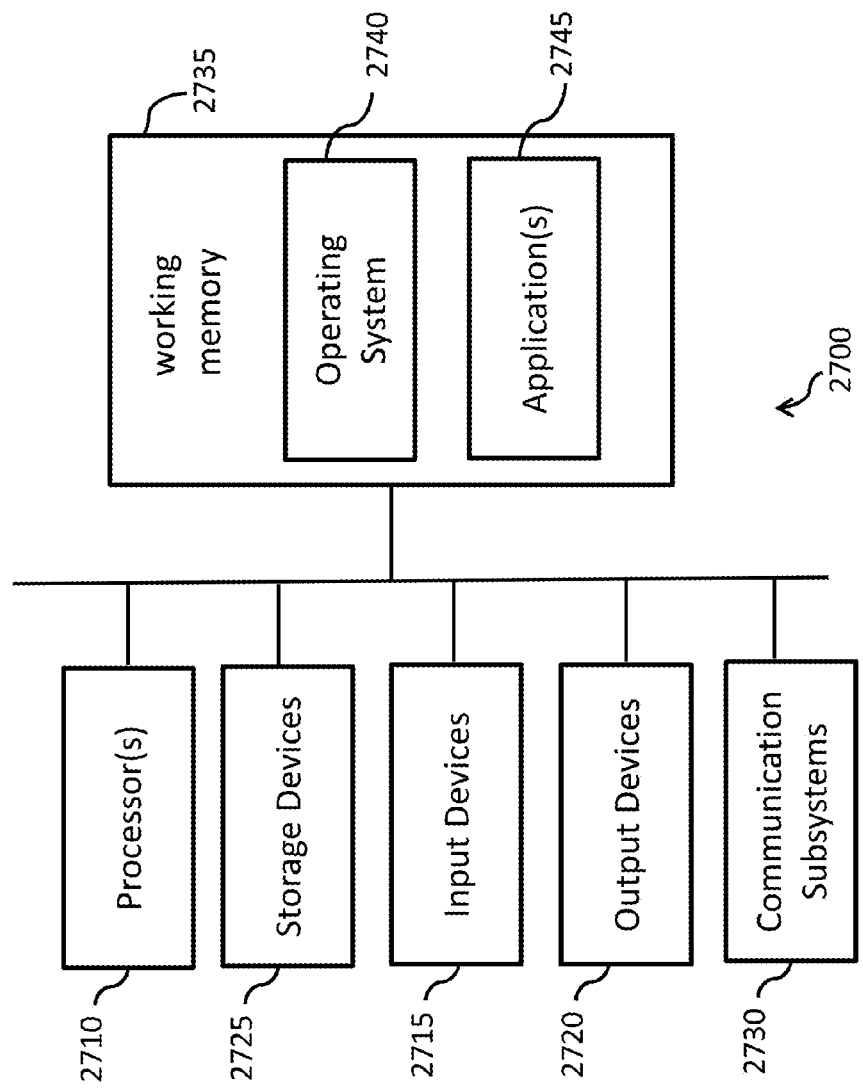
FIG. 27 is a schematic diagram of an embodiment of control electronics that include a computer system for detecting foreign object debris and/or living object debris.

FIG. 27 illustrates an embodiment of a computer system that may be incorporated as part of the previously described computerized and electronic devices such as the FOD/LOD detection systems, calibration engine, detection engine, etc. FIG. 27 provides a schematic illustration of one embodiment of a computer system 600 that can perform various steps of the methods provided by various embodiments. It should be noted that FIG. 27 is meant only to provide a generalized illustration of various components, any or all of which may be utilized as appropriate. FIG. 27, therefore, broadly illustrates how individual system elements may be implemented in a relatively separated or relatively more integrated manner.

Computer system 2700 may comprise hardware elements that can be electrically coupled via a bus 2705 (or may otherwise be in communication, as appropriate). The hardware elements may include one or more processors 2710, including without limitation one or more general-purpose processors and/or one or more special-purpose processors (such as digital signal processing chips, graphics acceleration processors, video decoders, and/or the like); one or more input devices 2715, which can include without limitation a remote control, and/or the like; and one or more output devices 2720, which can include without limitation a display device, audio device, and/or the like.

Computer system 2700 may further comprise (and/or be in communication with) one or more non-transitory storage devices 2725, which can include, without limitation, local and/or network accessible storage, and/or can include, without limitation, a disk drive, a drive array, an optical storage device, a solid-state storage device, such as a random access memory ("RAM"), and/or a read-only memory ("ROM"), which can be programmable, flash-updateable and/or the like. Such storage devices may be configured to implement any appropriate data stores, including without limitation, various file systems, database structures, and/or the like.

Computer system 2700 may also comprise a communications subsystem 2730, which can include without limitation a modem, a network card (wireless or wired), an infrared communication device, a wireless communication device, and/or a chipset (such as a Bluetooth device, an 802.11 device, a WiFi device, a WiMax device, cellular communication device, etc.), and/or the like. The communications subsystem 2730 may permit data to be exchanged with a network (such as the network described below, to name one example), other computer systems, and/or any other devices described herein. In many embodiments, the computer system 2700 will further include a working memory 2735, which can include a RAM or ROM device, as described above.

Computer system 2700 also may comprise software elements, shown as being currently located within the working memory 2735, including an operating system 2740, device drivers, executable libraries, and/or other code, such as one or more application programs 2745, which may include computer programs provided by various embodiments, and/or may be designed to implement methods, and/or configure systems, provided by other embodiments, as described herein. Merely by way of example, one or more procedures described with respect to the method(s) discussed above might be implemented as code and/or instructions executable by a computer (and/or a processor within a computer); in an aspect, then, such code and/or instructions can be used to configure and/or adapt a general purpose computer (or other device) to perform one or more operations in accordance with the described methods.

A set of these instructions and/or code might be stored on a non-transitory computer-readable storage medium, such as the non-transitory storage device(s) 2725 described above. In some cases, the storage medium might be incorporated within a computer system, such as computer system 2700. In other embodiments, the storage medium might be separate from a computer system (e.g., a removable medium, such as a compact disc), and/or provided in an installation package, such that the storage medium can be used to program, configure, and/or adapt a general purpose computer with the instructions/code stored thereon. These instructions might take the form of executable code, which is executable by the computer system 2700 and/or might take the form of source and/or installable code, which, upon compilation and/or installation on the computer system 2700 (e.g., using any of a variety of generally available compilers, installation programs, compression/decompression utilities, etc.), then takes the form of executable code.

It will be apparent to those skilled in the art that substantial variations may be made in accordance with specific requirements. For example, customized hardware might also be used, and/or particular elements might be implemented in hardware, software (including portable software, such as applets, etc.), or both. Further, connection to other computing devices such as network input/output devices may be employed.

As mentioned above, in one aspect, some embodiments may employ a computer system (such as the computer system 2700) to perform methods in accordance with various embodiments of the disclosed techniques. According to a set of embodiments, some or all of the procedures of such methods are performed by the computer system 2700 in response to processor 2710 executing one or more sequences of one or more instructions (which might be incorporated into the operating system 2740 and/or other code, such as an application program 2745) contained in the working memory 2735. Such instructions may be read into the working memory 2735 from another computer-readable medium, such as one or more of the non-transitory storage device(s) 2725. Merely by way of example, execution of the sequences of instructions contained in the working memory 2735 might cause the processor(s) 2710 to perform one or more procedures of the methods described herein.

The terms "machine-readable medium," "computer-readable storage medium" and "computer-readable medium," as used herein, refer to any medium that participates in providing data that causes a machine to operate in a specific fashion. These mediums may be non-transitory. In an embodiment implemented using the computer system 2700, various computer-readable media might be involved in providing instructions/code to processor(s) 2710 for execution and/or might be used to store and/or carry such instructions/code. In many implementations, a computer-readable medium is a physical and/or tangible storage medium. Such a medium may take the form of a non-volatile media or volatile media. Non-volatile media include, for example, optical and/or magnetic disks, such as the non-transitory storage device(s) 2725. Volatile media include, without limitation, dynamic memory, such as the working memory 2735.

Common forms of physical and/or tangible computer-readable media include, for example, a floppy disk, a flexible disk, hard disk, magnetic tape, or any other magnetic medium, a CD-ROM, any other optical medium, any other physical medium with patterns of marks, a RAM, a PROM, EPROM, a FLASH-EPROM, any other memory chip or cartridge, or any other medium from which a computer can read instructions and/or code.

Various forms of computer-readable media may be involved in carrying one or more sequences of one or more instructions to the processor(s) 2710 for execution. Merely by way of example, the instructions may initially be carried on a magnetic disk and/or optical disc of a remote computer. A remote computer might load the instructions into its dynamic memory and send the instructions as signals over a transmission medium to be received and/or executed by the computer system 2700.

The communications subsystem 2730 (and/or components thereof) generally will receive signals, and the bus 2705 then might carry the signals (and/or the data, instructions, etc. carried by the signals) to the working memory 2735, from which the processor(s) 2710 retrieves and executes the instructions. The instructions received by the working memory 2735 may optionally be stored on a non-transitory storage device 2725 either before or after execution by the processor(s) 2710.

The methods, systems, and devices discussed above are examples. Various configurations may omit, substitute, or add various procedures or components as appropriate. For instance, in alternative configurations, the methods may be performed in an order different from that described, and/or various stages may be added, omitted, and/or combined. Also, features described with respect to certain configurations may be combined in various other configurations. Different aspects and elements of the configurations may be combined in a similar manner. Also, technology evolves and, thus, many of the elements are examples and do not limit the scope of the disclosure or claims.

Specific details are given in the description to provide a thorough understanding of example configurations (including implementations). However, configurations may be practiced without these specific details. For example, well-known circuits, processes, algorithms, structures, and techniques have been shown without unnecessary detail in order to avoid obscuring the configurations. This description provides example configurations only, and does not limit the scope, applicability, or configurations of the claims. Rather, the preceding description of the configurations will provide those skilled in the art with an enabling description for implementing described techniques. Various changes may be made in the function and arrangement of elements without departing from the spirit or scope of the disclosure.

Also, configurations may be described as a process which is depicted as a flow diagram or block diagram. Although each may describe the operations as a sequential process, many of the operations can be performed in parallel or concurrently. In addition, the order of the operations may be rearranged. A process may have additional steps not included in the figure. Furthermore, examples of the methods may be implemented by hardware, software, firmware, middleware, microcode, hardware description languages, or any combination thereof. When implemented in software, firmware, middleware, or microcode, the program code or code segments to perform the necessary tasks may be stored in a non-transitory computer-readable medium such as a storage medium. Processors may perform the described tasks.

In this disclosure, terms such as "adjustment", "evaluation", "computation", "regulation", and/or "algorithm" may be used to describe some portion of a calibration procedure or as synonymous with calibration. Additionally, in this disclosure, terms that are part of a method, or part of a procedure, may be used interchangeably with the method itself. For example, an algorithm may be referred to as a computation, as a regulation, and the like.

While the disclosed techniques have been described in connection with certain preferred embodiments, other embodiments will be understood by one of ordinary skill in the art and are intended to fall within the scope of this disclosure. For example, designs, methods, configurations of components, etc. related to transmitting wireless power have been described above along with various specific applications and examples thereof. Those skilled in the art will appreciate where the designs, components, configurations or components described herein can be used in combination, or interchangeably, and that the above description does not limit such interchangeability or combination of components to only that which is described herein.

Note that the techniques described here may be applied to any wireless power system that transmits power using electromagnetic fields. In cases where we have described source and device resonators of highly resonant wireless power systems, one of skill in the art will understand that the same sensors, detectors, algorithms, subsystems and the like could be described for inductive systems using primary and secondary coils.

All documents referenced herein are hereby incorporated by reference.

What is claimed is:

1. A wireless power transfer system, comprising:
    a power source comprising at least one resonator;
    a power receiver comprising at least one resonator, wherein the power receiver is configured to receive electrical power transmitted wirelessly by the power source;
    a detector positioned between the power source and the power receiver, wherein the detector is configured to generate an electrical signal based on a magnetic field between the power source and the power receiver; and
    control electronics coupled to the power source and detector, wherein the control electronics are configured to:
        activate the power source to generate a magnetic field between the power source and the power receiver;

measure the electrical signal of the detector; and
determine whether debris is positioned between the power source and the power receiver by comparing baseline information to the measured electrical signal,
wherein the baseline information comprises information about an electrical signal generated by the detector when no debris is positioned between the power source and the power receiver; and
wherein the control electronics are configured to compare the baseline information to the measured signal by determining mean and covariance matrices for the baseline information and determining whether debris is positioned between the power source and the power receiver based on the mean and covariance matrices.

2. The system of claim 1, wherein the control electronics are configured to calculate a likelihood value that debris is positioned between the power source and the power receiver based on the mean and covariance matrices.

3. The system of claim 2, wherein the control electronics are configured to calculate a probability value between 0 and 1 that debris is positioned between the power source and the power receiver, based on the likelihood value.

4. The system of claim 2, wherein the control electronics are configured to determine whether debris is positioned between the power source and the power receiver by comparing the likelihood value to a threshold likelihood value.

5. The system of claim 1, wherein the control electronics are configured to obtain the baseline information.

6. The system of claim 5, wherein the control electronics are configured to obtain the baseline information by retrieving the information from an electronic storage unit.

7. The system of claim 5, wherein the control electronics are configured to obtain the baseline information by activating the power source with no debris in the vicinity of the power source to generate a magnetic flux through the detector, and measuring the electrical signal of the detector in response to the magnetic flux.

8. The system of claim 7, wherein the control electronics are configured to activate the power source and to measure the electrical signal of the detector with the power source and the power receiver at least partially aligned.

9. The system of claim 7, wherein the control electronics are configured to activate the power source and to measure the electrical signal of the detector without power transfer occurring between the power source and the power receiver.

10. The system of claim 1, wherein the baseline information comprises information about electrical signals generated by the detector that correspond to different operating states of the system.

11. The system of claim 10, wherein the different operating states correspond to different energy transfer rates between the power source and the power receiver.

12. The system of claim 10, wherein the different operating states correspond to different alignments between the power source and the power receiver.

13. The system of claim 10, wherein the different operating states correspond to different spacings between the power source and the power receiver measured along a direction orthogonal to a plane defined by the at least one resonator of the power source.

14. The system of claim 7, wherein the control electronics are configured to obtain the baseline information by measuring the electrical signal of the detector multiple times in response to the magnetic flux, and wherein the mean and covariance matrices include contributions from the multiple measurements of the electrical signal.

15. The system of claim 10, wherein the control electronics are configured to generate mean and covariance matrices that correspond to each of the different operating states.

16. The system of claim 15, wherein the control electronics are configured to determine the operating state of the system by comparing the measured electrical signal of the detector to the mean and covariance matrices corresponding to each of the different operating states.

17. The system of claim 1, wherein the power source is a component of a vehicle charging station.

18. The system of claim 1, wherein the power receiver is a component of a vehicle.

19. The system of claim 1, wherein the electrical signal generated by the detector comprises at least one of a voltage and a current.

20. The system of claim 1, wherein the detector comprises multiple loops of conductive material positioned between the power source and the power receiver.

21. The system of claim 20, wherein the multiple loops are spaced from one another in the plane, and wherein a spacing between adjacent loops varies.

22. The system of claim 21, wherein a magnetic flux density generated by the power source in a first region of the plane is larger than a magnetic flux density in a second region of the plane, and wherein the spacing between adjacent loops is smaller in the first region than in the second region.

23. The system of claim 1, wherein the detector is positioned closer to the power receiver than to the power source.

24. The system of claim 1, wherein a total cross-sectional area of the at least one resonator of the power receiver is 80% or more of a full-width at half maximum cross-sectional area of a magnetic field generated by the power source at a position of the power receiver.

25. The system of claim 1, wherein the power source is configured to transfer 1 kW or more of power to the power receiver.

26. The system of claim 10, wherein the control electronics are configured to compare the measured signal to a portion of the baseline information that corresponds to the operating state of the system.

27. The system of claim 1, wherein the power source is configured to generate a magnetic flux of 6.25 µT or more between the power source and the power receiver.

28. The system of claim 12, wherein the detector comprises multiple loops of conductive material each configured to generate an electrical signal when the power source generates a magnetic field, and wherein the control electronics are configured to measure the electrical signals generated by at least some of the multiple loops and to determine information about misalignment between the power source and the power receiver based on the measured electrical signals.

29. The system of claim 28, wherein the at least some of the multiple loops are positioned adjacent to an edge of the power source.

30. The system of claim 29, wherein the control electronics are configured to determine the information about misalignment by comparing electrical signals generated by the at least some of the multiple loops.

31. The system of claim 1, wherein the control electronics are configured so that if debris is positioned between the power source and the power receiver, the control electronics interrupt wireless power transfer between the power source and the power receiver.

32. The system of claim 1, wherein the control electronics are configured so that if debris is positioned between the power source and the power receiver, the control electronics reduce an energy transfer rate between the power source and the power receiver.

33. The system of claim 1, wherein the control electronics are configured so that if debris is positioned between the power source and the power receiver, the control electronics provide a warning indicator to a user of the wireless power transfer system.

34. The system of claim 1, wherein each resonator in the power source is an electromagnetic resonator having a resonant frequency $f=\omega/2\pi$, an intrinsic loss rate $\Gamma$, and a Q-factor $Q=\omega/(2\Gamma)$, and wherein the Q-factor for at least one of the resonators in the power source is greater than 100.

35. The system of claim 34, wherein each resonator in the power source has a capacitance and an inductance that define the resonant frequency f.

36. The system of claim 34, wherein the Q-factor for at least one of the resonators in the power source is greater than 300.

37. A method, comprising:
activating a power source to generate a magnetic field between the power source and a power receiver of a wireless power transfer system;
measuring an electrical signal generated by a detector positioned between the power source and the power receiver; and
determining whether debris is positioned between the power source and the power receiver by comparing baseline information to the measured electrical signal,
wherein the baseline information comprises information about an electrical signal generated by the detector when no debris is positioned between the power source and the power receiver; and
wherein comparing the baseline information to the measured signal comprises determining mean and covariance matrices for the baseline information and determining whether debris is positioned between the power source and the power receiver based on the mean and covariance matrices.

38. The method of claim 37, further comprising determining a likelihood value that debris is positioned between the power source and the power receiver based on the mean and covariance matrices.

39. The method of claim 38, further comprising determining a probability value between 0 and 1 that debris is positioned between the power source and the power receiver, based on the likelihood value.

40. The method of claim 38, further comprising determining whether debris is positioned between the power source and the power receiver by comparing the likelihood value to a threshold likelihood value.

41. The method of claim 37, further comprising obtaining the baseline information by retrieving the information from an electronic storage unit.

42. The method of claim 37, further comprising obtaining the baseline information by activating the power source with no debris in the vicinity of the power source to generate a magnetic flux through the detector, and measuring the electrical signal of the detector in response to the magnetic flux.

43. The method of claim 42, further comprising activating the power source and measuring the electrical signal of the detector with the power source and the power receiver at least partially aligned.

44. The method of claim 42, further comprising activating the power source and measuring the electrical signal of the detector without power transfer occurring between the power source and the power receiver.

45. The method of claim 37, wherein the baseline information comprises information about electrical signals generated by the detector that correspond to different operating states of the system.

46. The method of claim 45, wherein the different operating states correspond to at least one of different energy transfer rates between the power source and the power receiver, different alignments between the power source and the power receiver, and different spacings between the power source and the power receiver measured along a direction orthogonal to a plane defined by the at least one resonator of the power source.

47. The method of claim 42, further comprising obtaining the baseline information by measuring the electrical signal of the detector multiple times in response to the magnetic flux, wherein the mean and covariance matrices include contributions from the multiple measurements of the electrical signal.

48. The method of claim 45, further comprising generating mean and covariance matrices that correspond to each of the different operating states.

49. The method of claim 48, further comprising determining the operating state of the system by comparing the measured electrical signal of the detector to the mean and covariance matrices corresponding to each of the different operating states.

50. The method of claim 37, further comprising using the power source to transfer electrical power to a power receiver in a vehicle.

51. The method of claim 37, further comprising using the power source to transfer 1 kW or more of power to the power receiver.

52. The method of claim 45, further comprising comparing the measured signal to a portion of the baseline information that corresponds to the operating state of the system.

53. The method of claim 37, further comprising using the power source to generate a magnetic flux of 6.25 µT or more between the power source and the power receiver.

54. The method of claim 37, further comprising interrupting wireless power transfer between the power source and the power receiver if debris is positioned between the power source and the power receiver.

55. The method of claim 37, further comprising reducing an energy transfer rate between the power source and the power receiver if debris is positioned between the power source and the power receiver.

56. The method of claim 37, further comprising providing a warning indicator if debris is positioned between the power source and the power receiver.

57. An apparatus for detecting debris, the apparatus comprising:
a detector, wherein the detector is configured so that when the detector is positioned between a power source and a power receiver of a wireless power transfer system, the detector generates an electrical signal based on a magnetic field between the power source and the power receiver; and
control electronics coupled to the detector, wherein the control electronics are configured to:
measure the electrical signal of the detector in response to a magnetic field between the power source and the power receiver; and
determine whether debris is positioned between the power source and the power receiver by comparing baseline information to the measured electrical signal, wherein the baseline information comprises information about an electrical signal generated by the detector when no debris is positioned between the power source and the power receiver; and wherein the control electronics are configured to compare the baseline information to the measured signal by determining mean and covariance matrices for the baseline information and determining whether debris is positioned between the power source and the power receiver based on the mean and covariance matrices.

* * * * *